United States Patent
Iwata et al.

(10) Patent No.: US 6,724,653 B1
(45) Date of Patent: Apr. 20, 2004

(54) MAGNETIC RANDOM ACCESS MEMORY

(75) Inventors: Yoshihisa Iwata, Yokohama (JP); Tomoki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/160,058

(22) Filed: Jun. 4, 2002

(30) Foreign Application Priority Data

Dec. 21, 2001 (JP) ........................................ 2001-390518

(51) Int. Cl.⁷ .............................................. G11C 11/00
(52) U.S. Cl. ...................................... 365/158; 365/145
(58) Field of Search .............................. 365/158, 171, 365/173, 157

(56) References Cited

U.S. PATENT DOCUMENTS

| | | | |
|---|---|---|---|
| 4,829,476 A | * 5/1989 | Dupuis et al. | 365/158 |
| 5,282,104 A | 1/1994 | Coutellier et al. | 360/115 |
| 5,424,976 A | 6/1995 | Cuppens | 365/145 |
| 5,894,447 A | 4/1999 | Takashima | 365/158 |
| 6,169,688 B1 | 1/2001 | Noguchi | 365/171 |
| 6,198,651 B1 | 3/2001 | Lee et al. | 365/145 |
| 6,356,477 B1 | 3/2002 | Tran | 365/158 |
| 6,363,000 B2 | * 3/2002 | Perner et al. | 365/173 |
| 2001/0035545 A1 | 11/2001 | Schuster-Woldan et al. | |

FOREIGN PATENT DOCUMENTS

| | | |
|---|---|---|
| EP | 1 096 502 | 5/2001 |
| JP | 2000-132961 | 5/2000 |
| JP | 2001-217398 | 8/2001 |
| JP | 2001-357666 | 12/2001 |
| WO | WO 99/14760 | 3/1999 |
| WO | WO 99/18578 | 4/1999 |
| WO | WO 00/19441 | 4/2000 |
| WO | WO 00/60600 | 10/2000 |

OTHER PUBLICATIONS

R. Scheuerlein, et al., ISSCC 2000 / Session 7 / TD: Emerging Memory & Device Technologies / Paper TA 7.2, pp. 128–129, "A 10ns Read and Write Non–Volatile Memory Array Using a Magnetic Tunnel Junction and FET Switch in Each Cell", 2000.

M. Durlam, et al., ISSCC 2000 / Session 7 / TD: Emerging Memory & Device Technologies / Paper TA 7.3, pp. 130–131, "Nonvolatile RAM Based on Magnetic Junction Elements", 2000.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A read block is constituted of a plurality of TMR elements arranged in a lateral direction. One end of each of the TMR elements in the read block is connected in common, and connected to a source line via a read select switch. The other ends of TMR elements are independently connected to read bit lines/write word lines. The read bit lines/write word lines are connected to common data lines via a row select switch. The common data lines are connected to a read circuit.

55 Claims, 79 Drawing Sheets

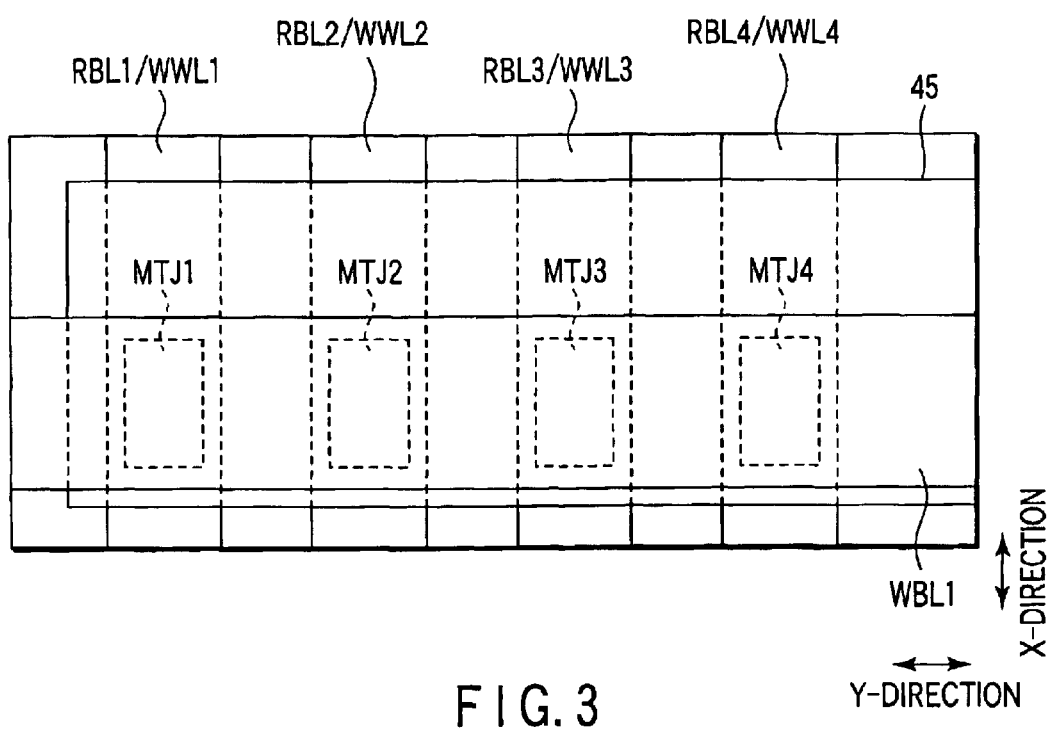
F I G. 3

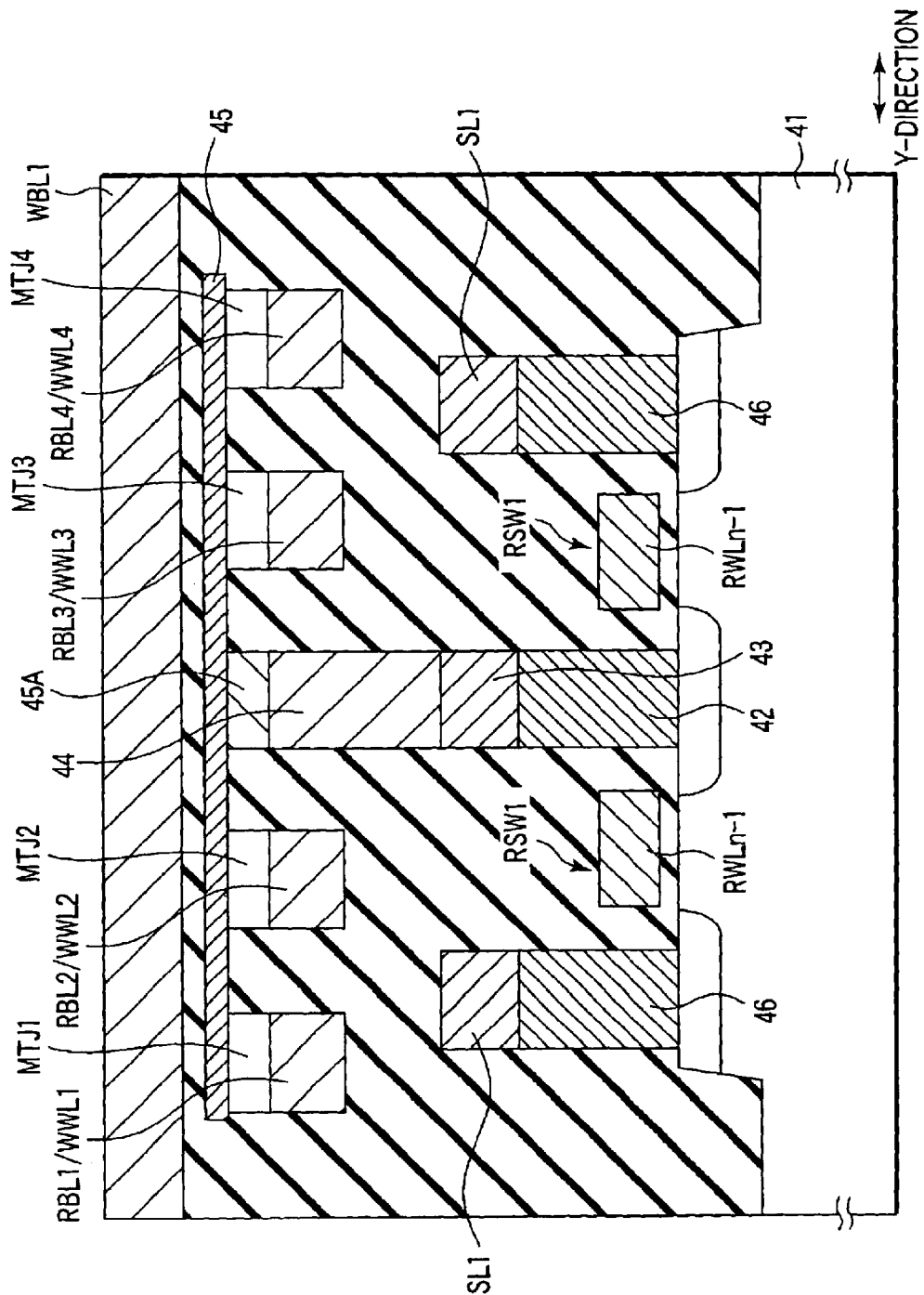
F I G. 9

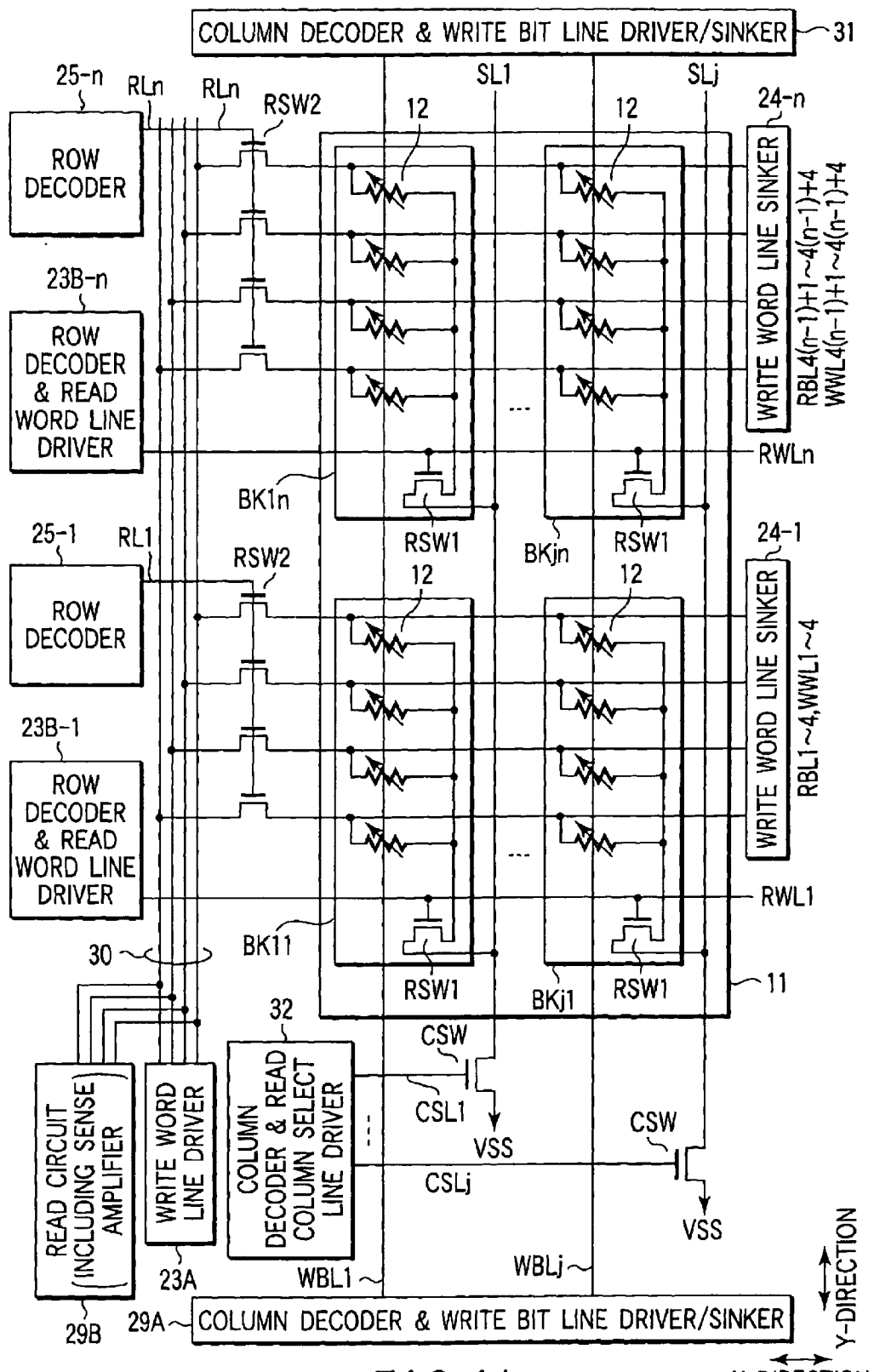
F I G. 14

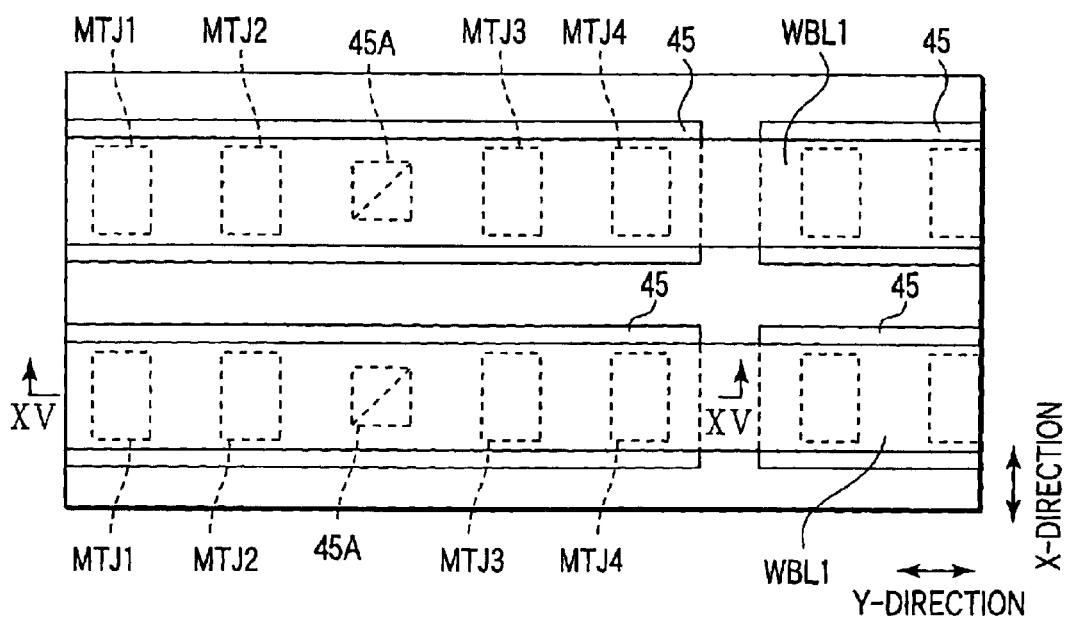
F I G. 19

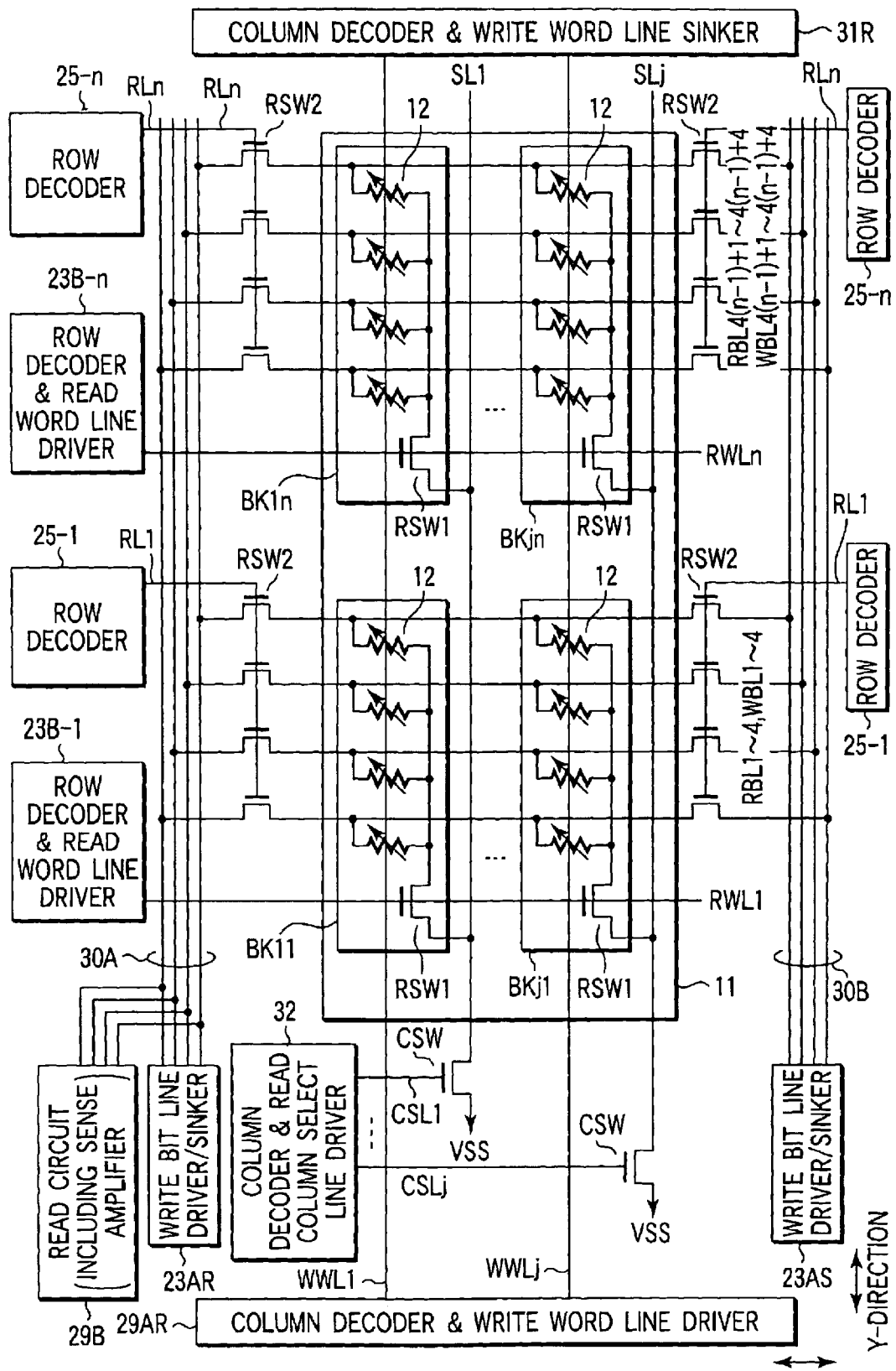
F I G. 20

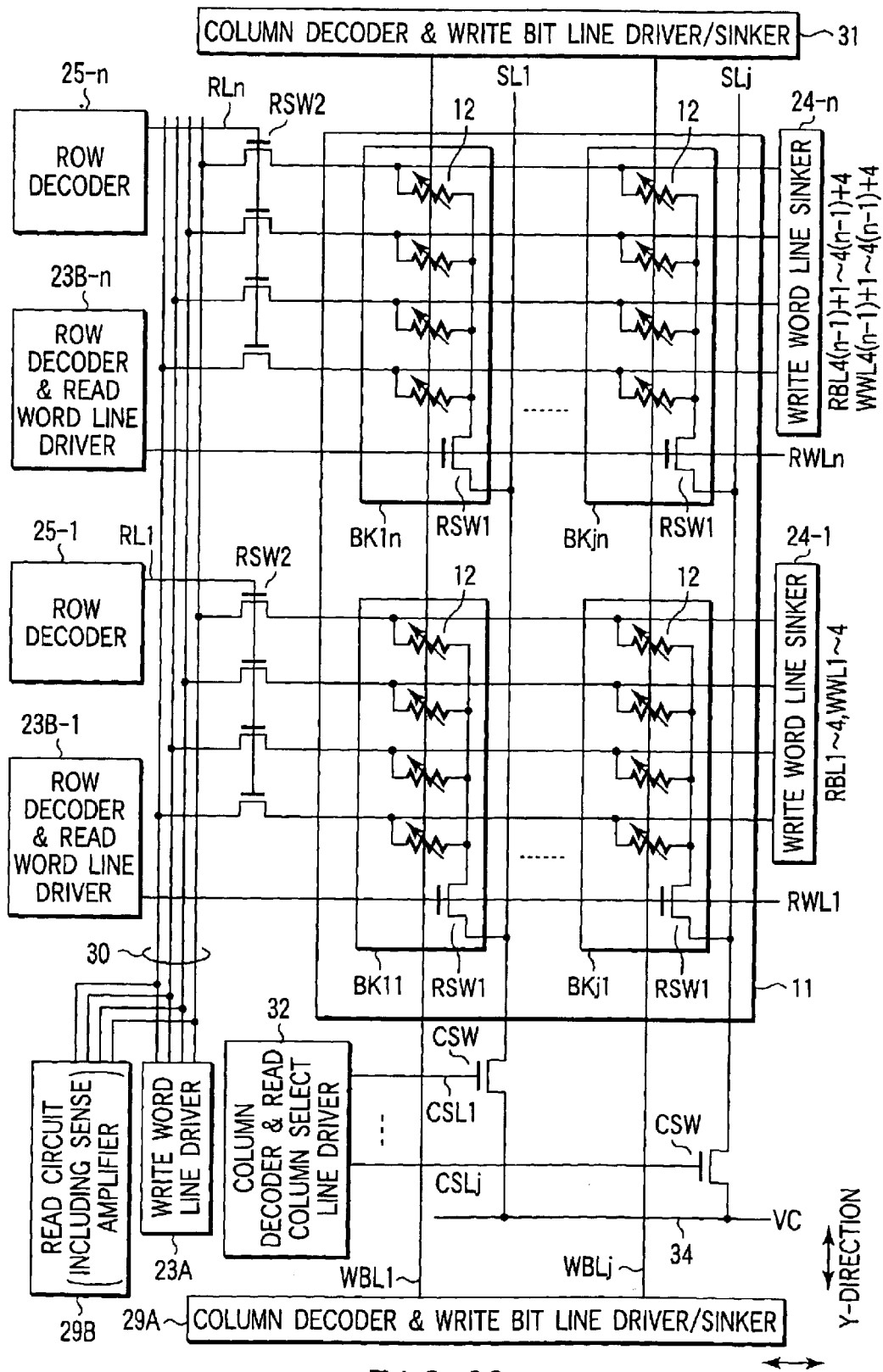
F I G. 26

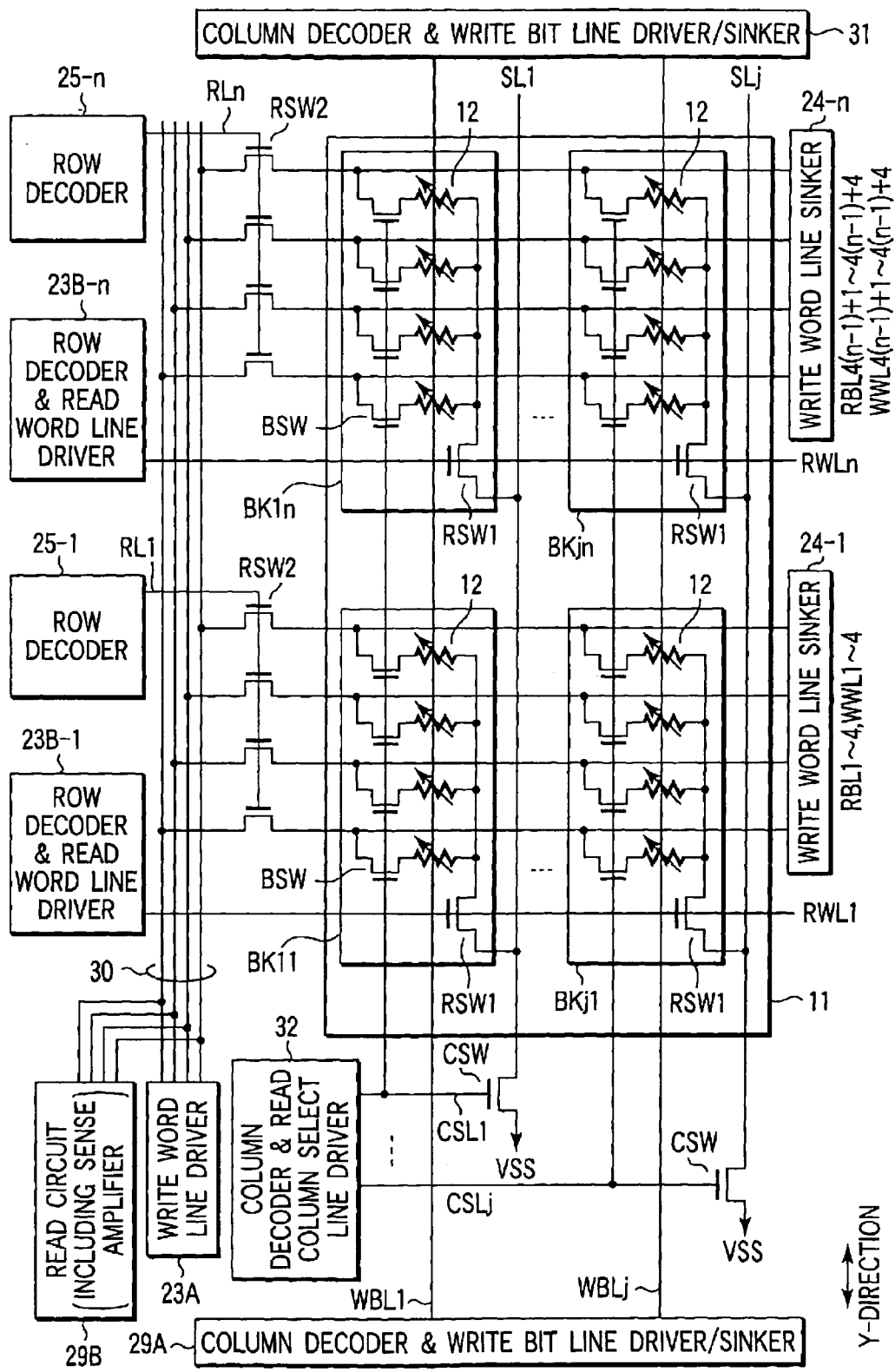
F I G. 28

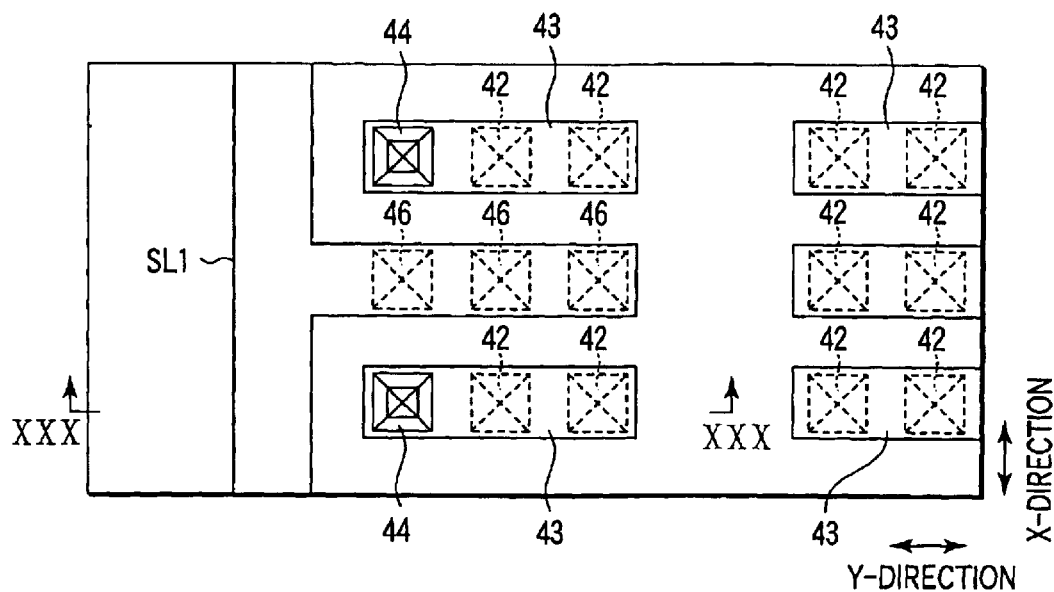
F I G. 32
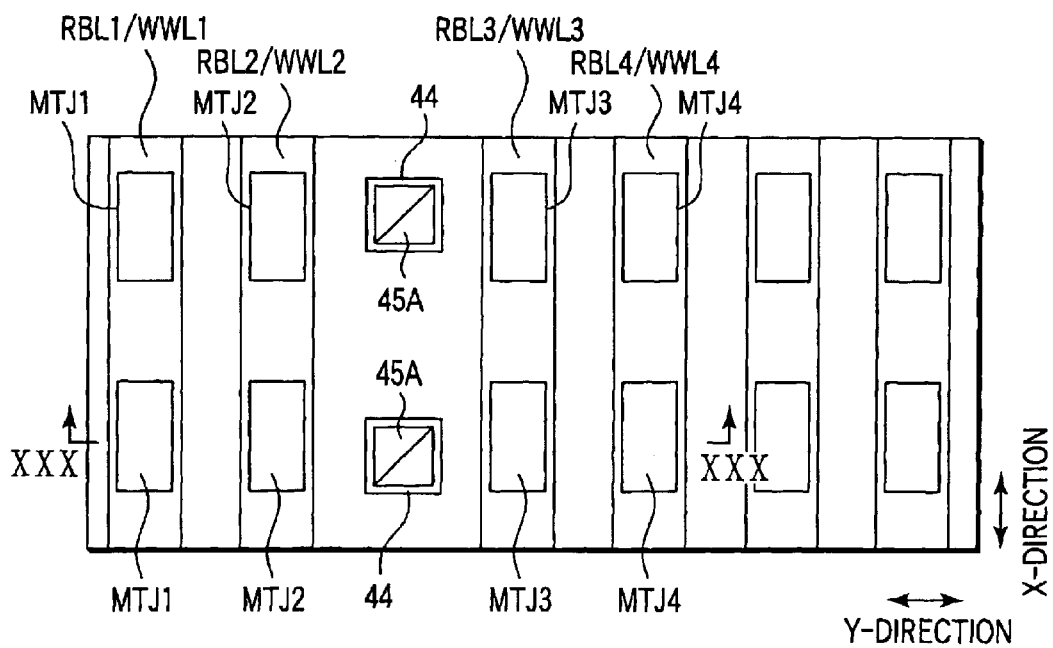
F I G. 33

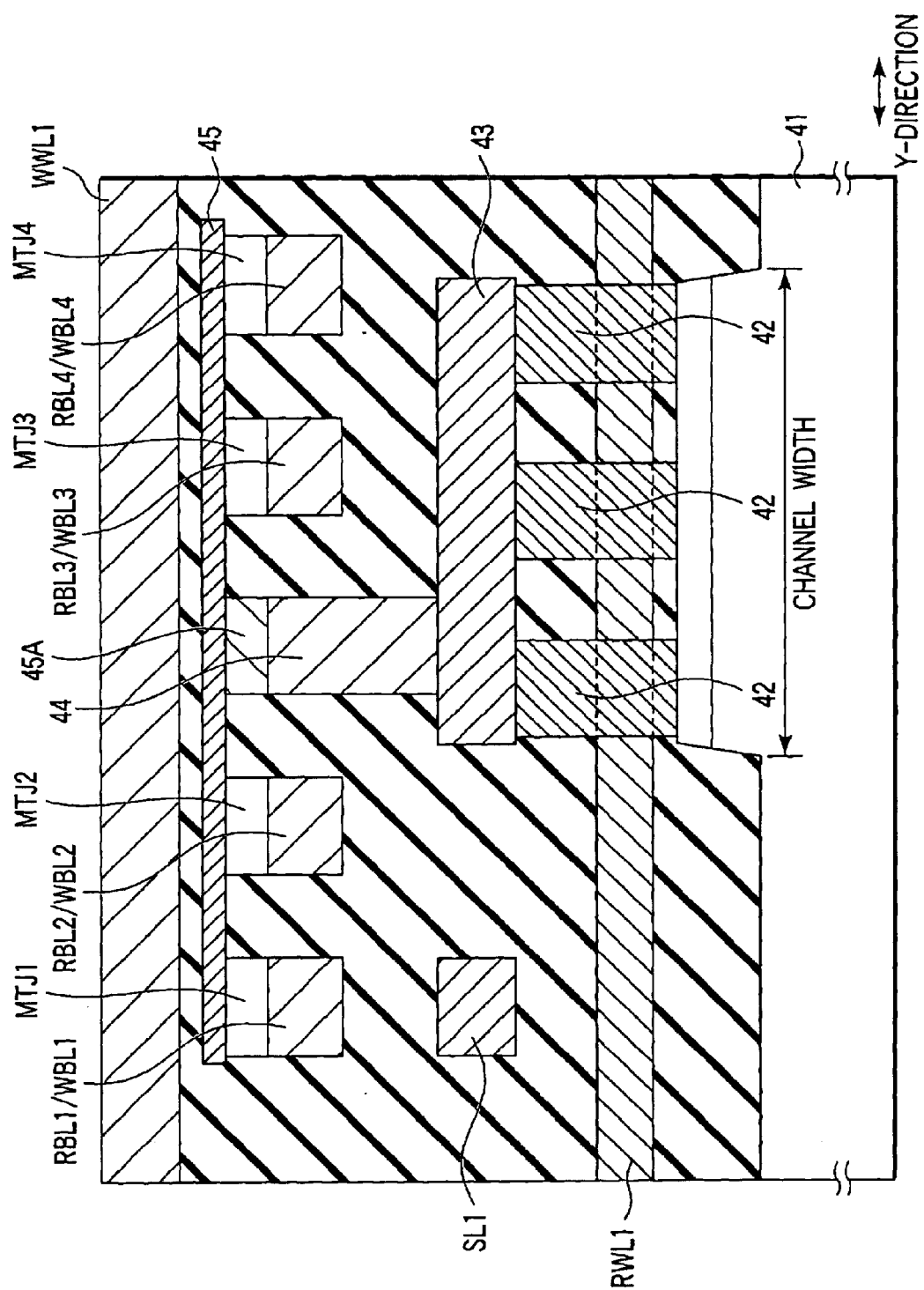
F I G. 36

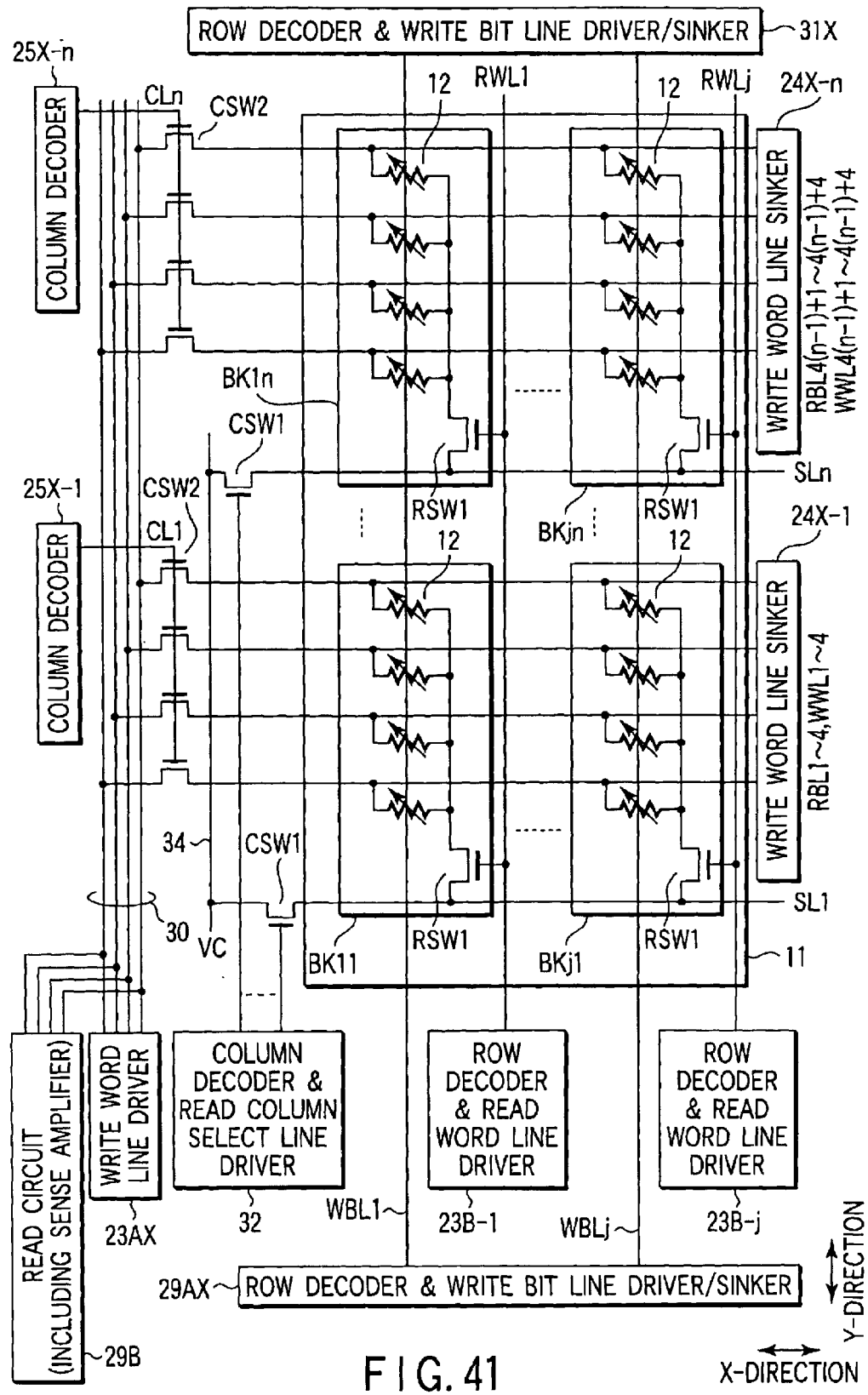
F I G. 41

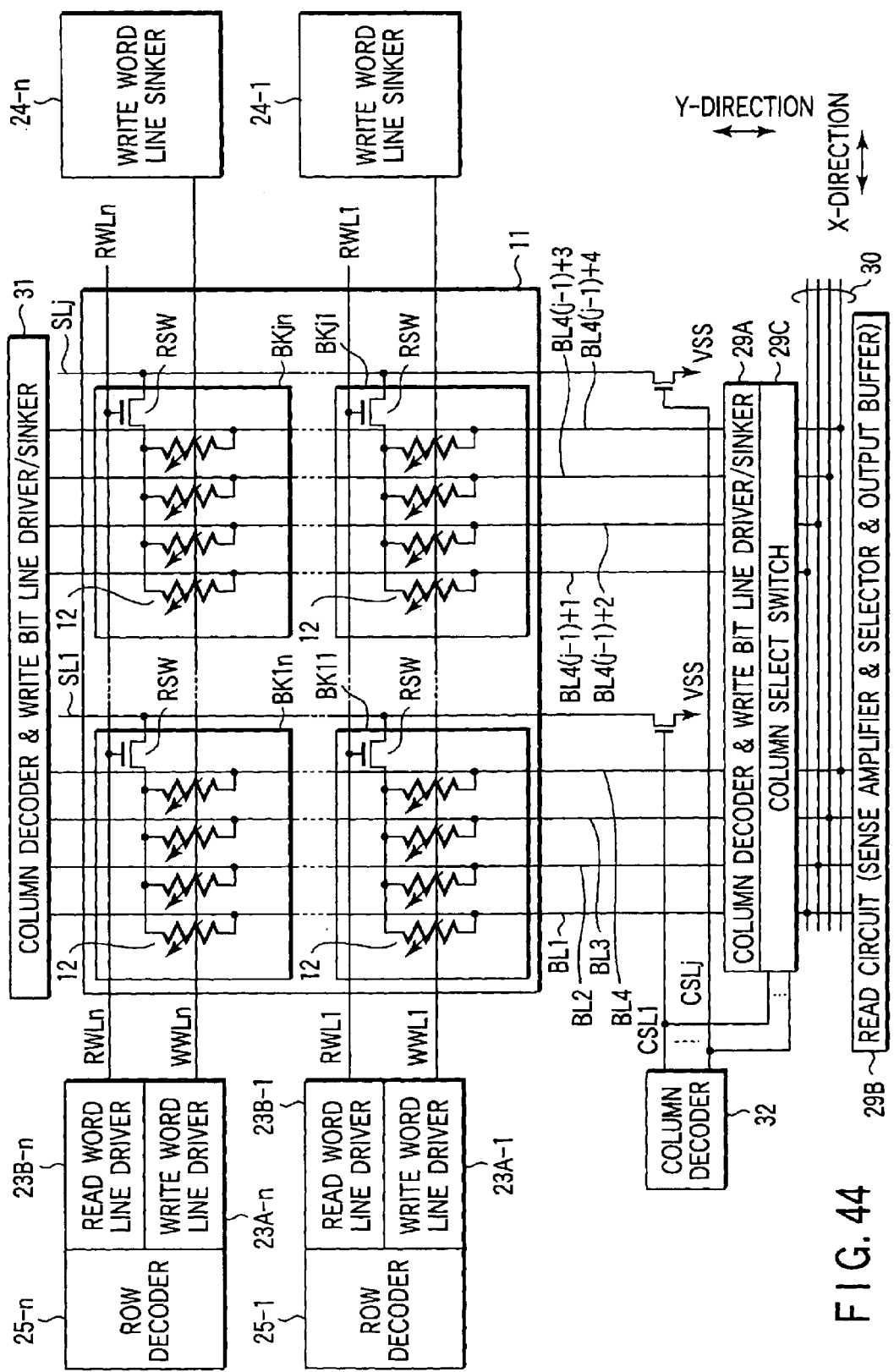
F I G. 44

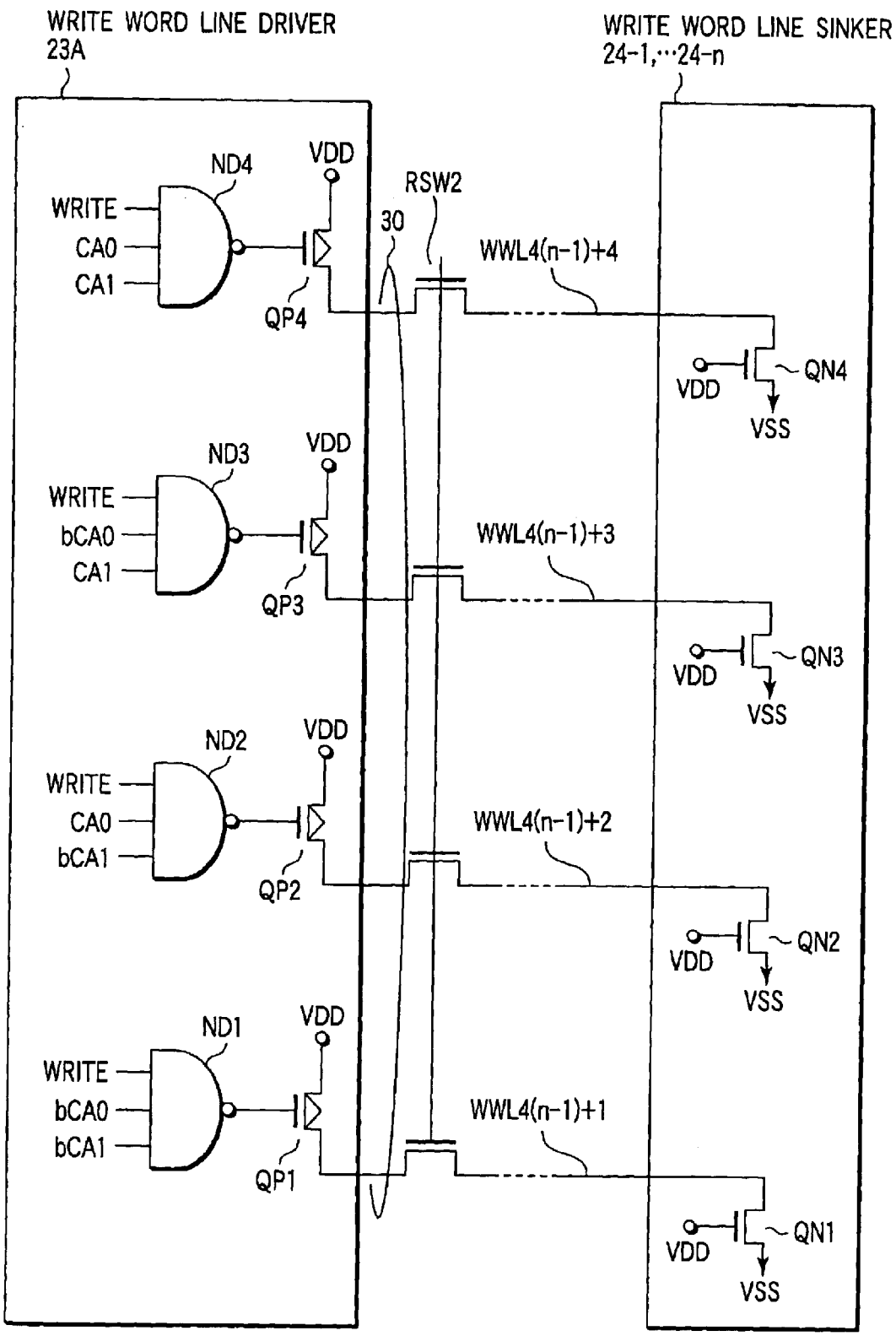
F I G. 50

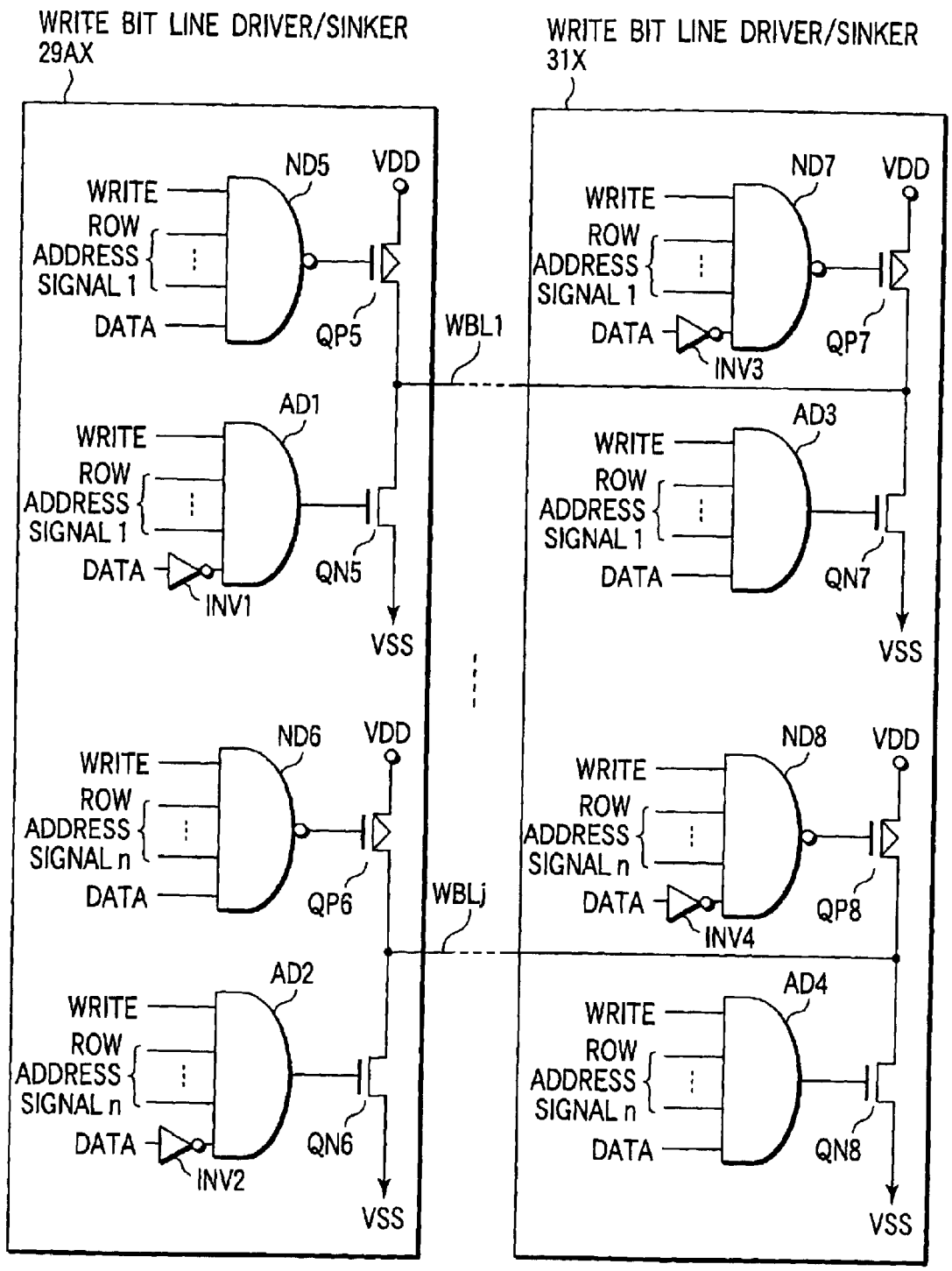
F I G. 51

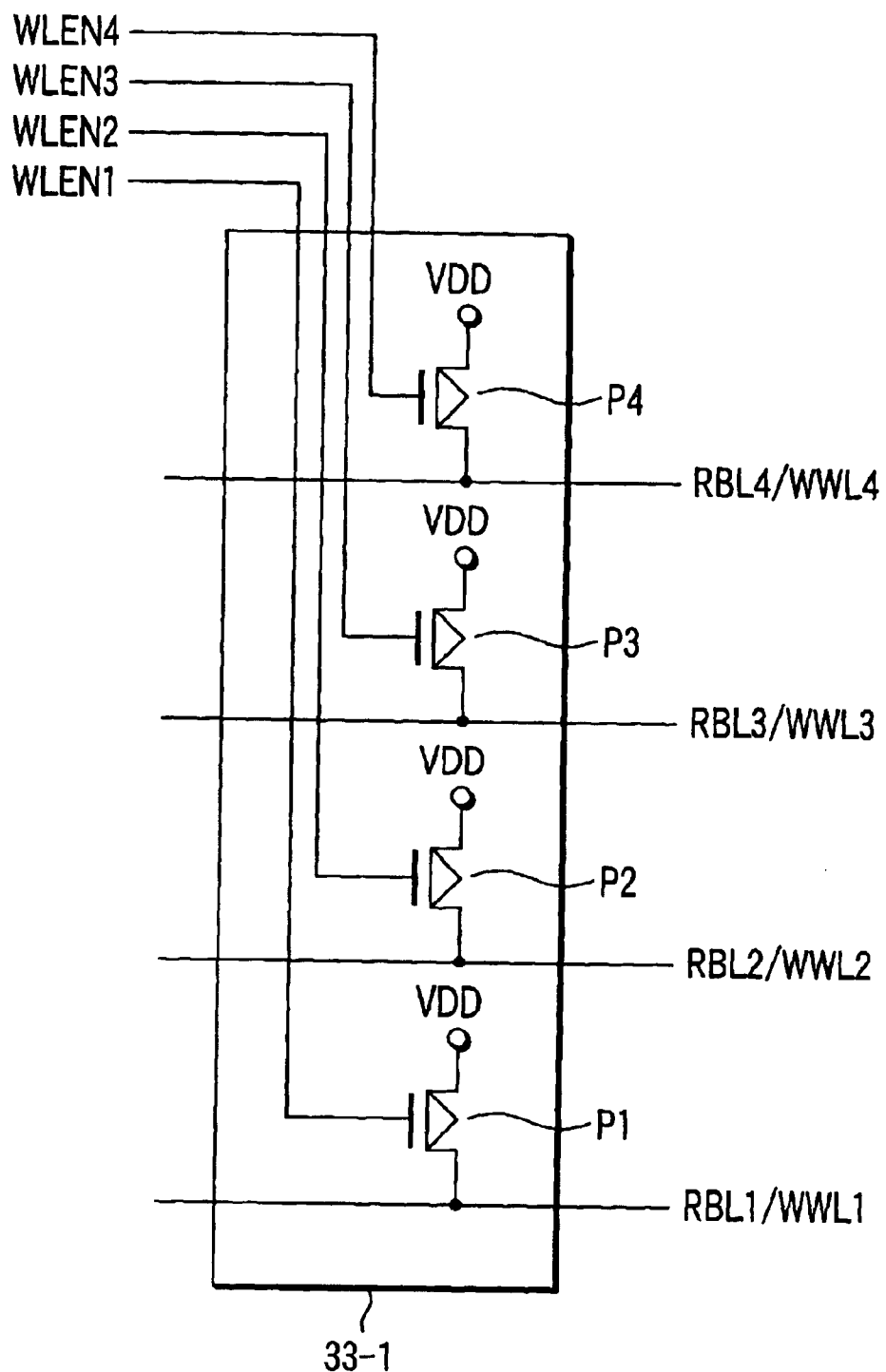
F I G. 52

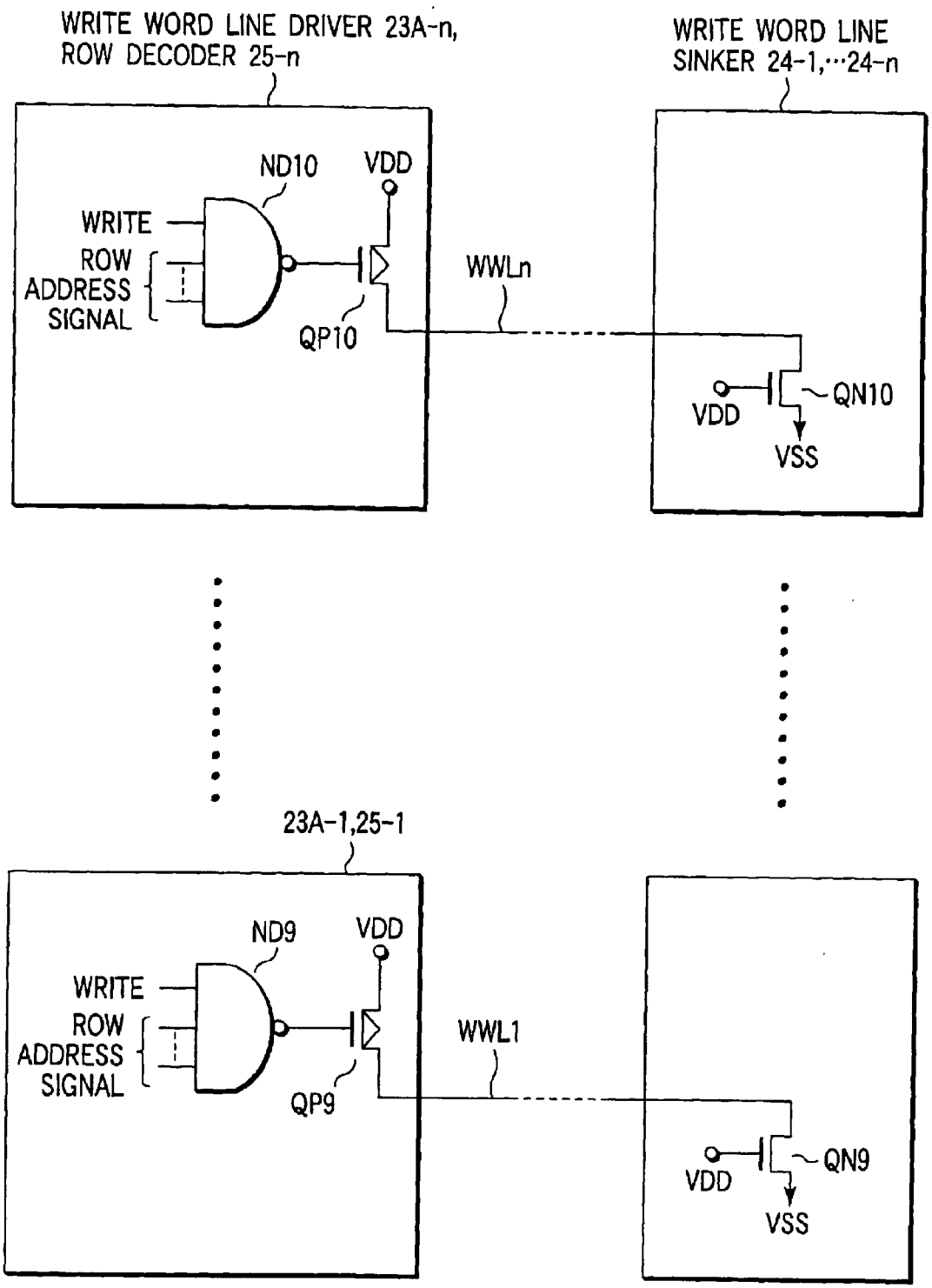
F I G. 53

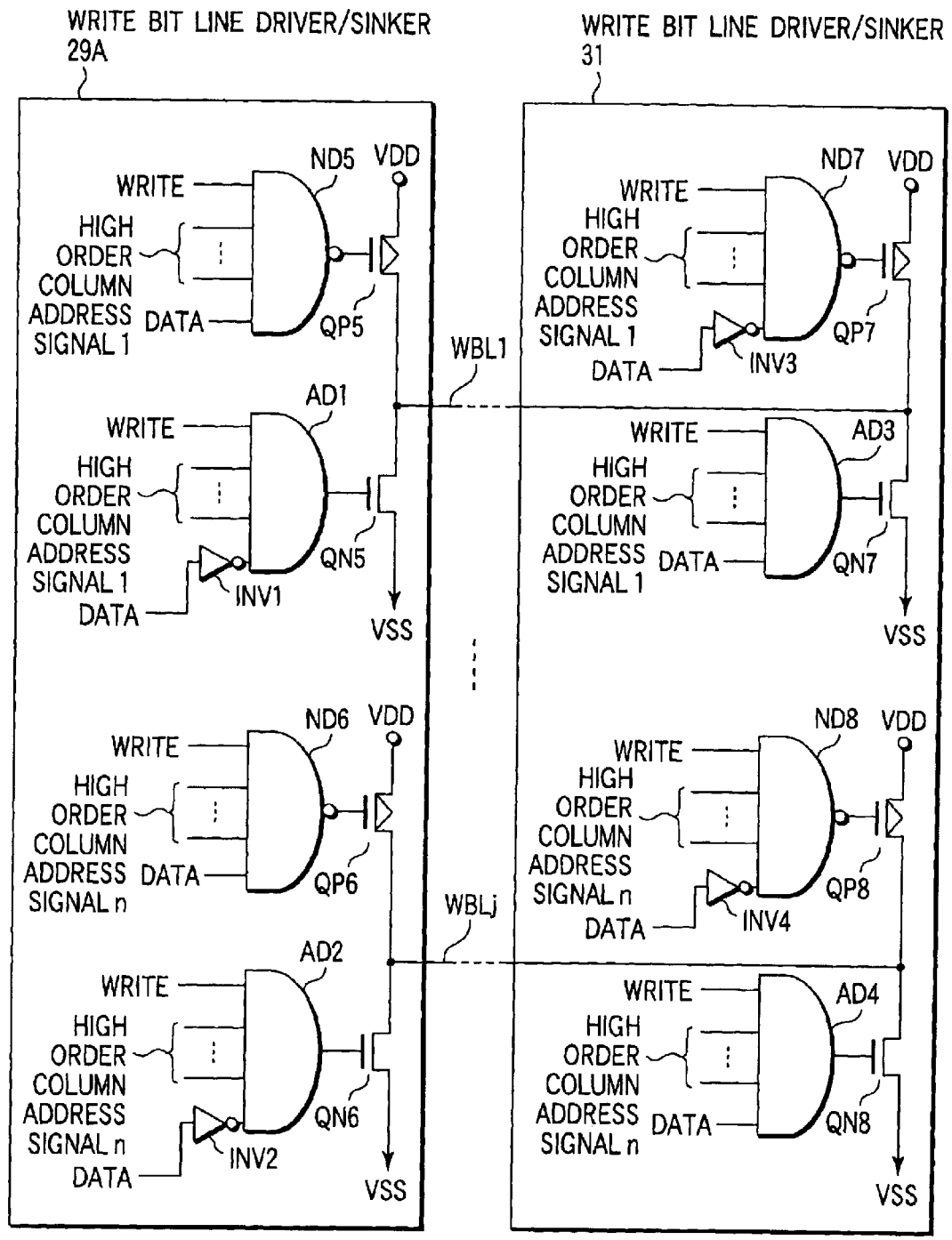
F I G. 54

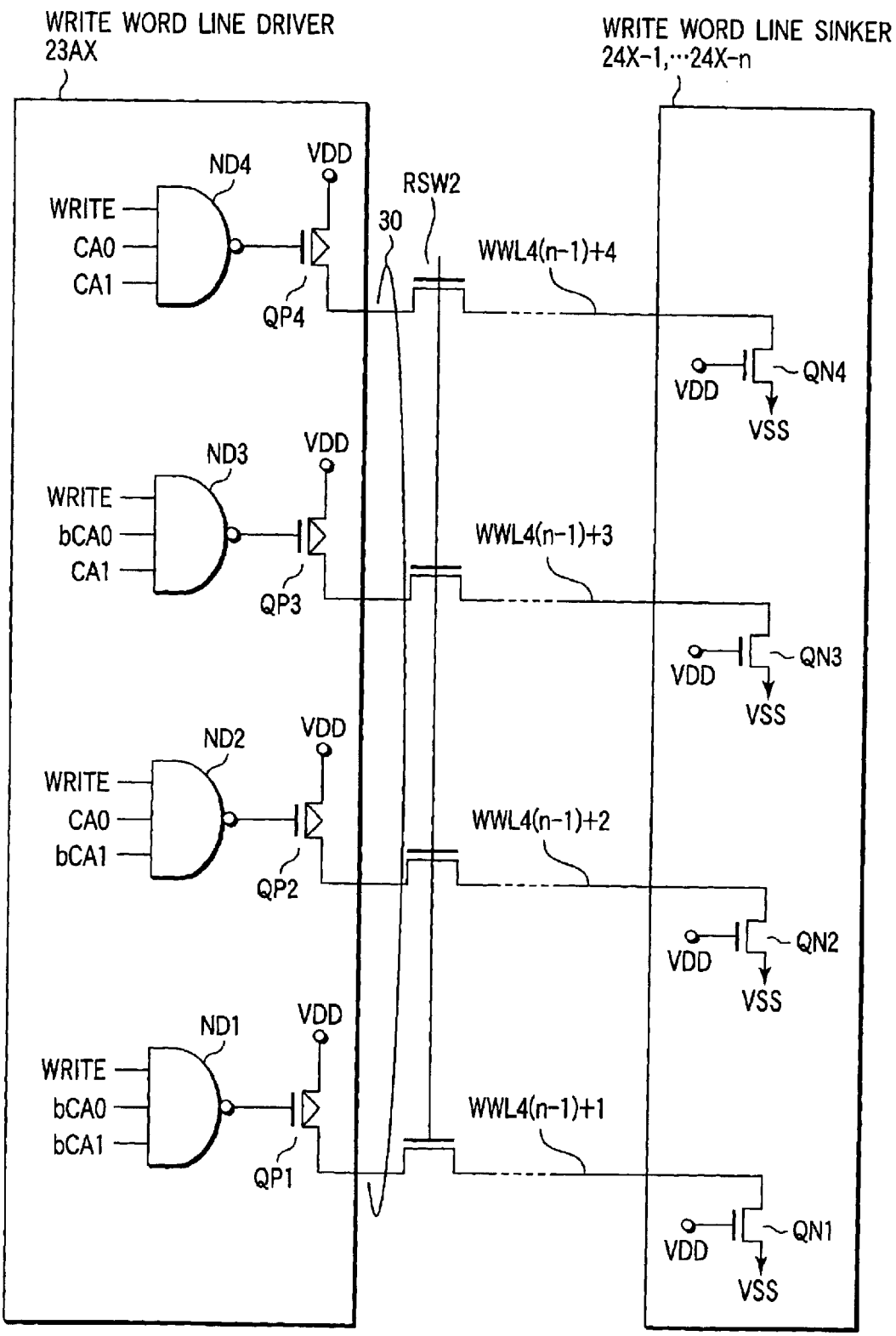
F I G. 55

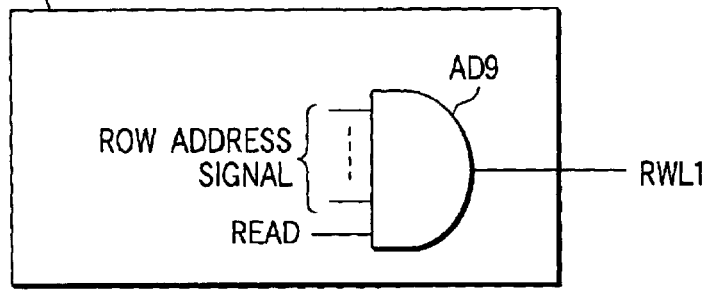
F I G. 59
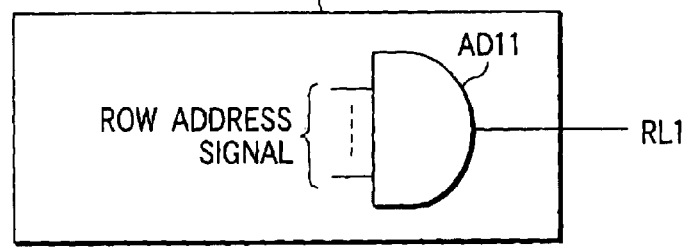
F I G. 60
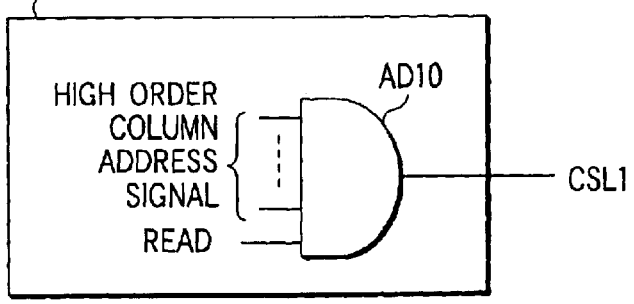
F I G. 61

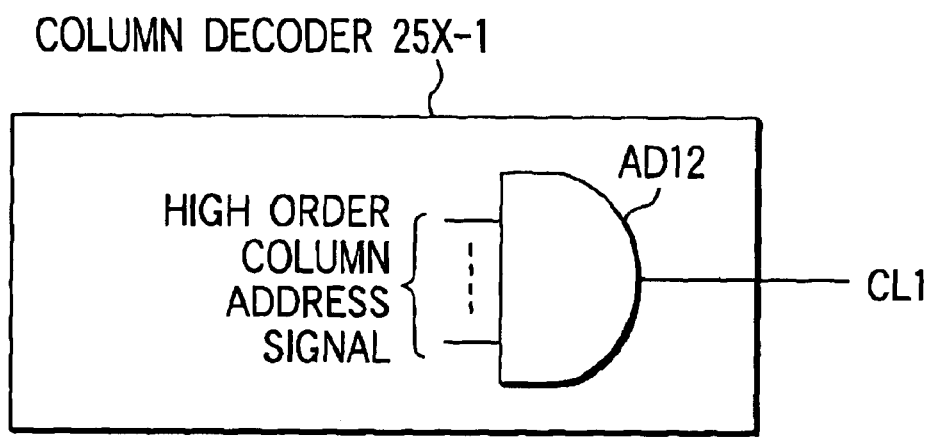
F I G. 62

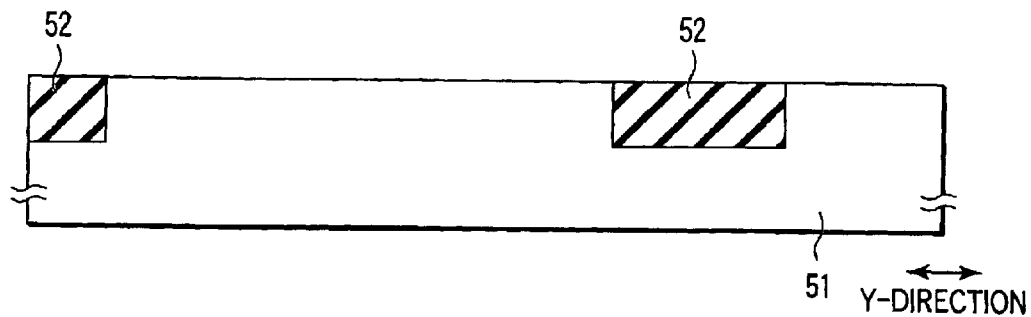
F I G. 73
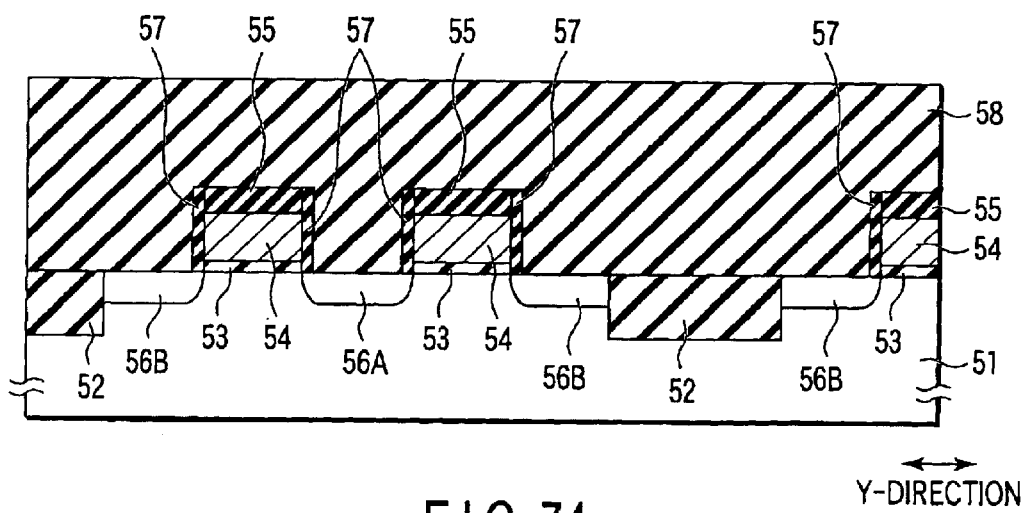
F I G. 74

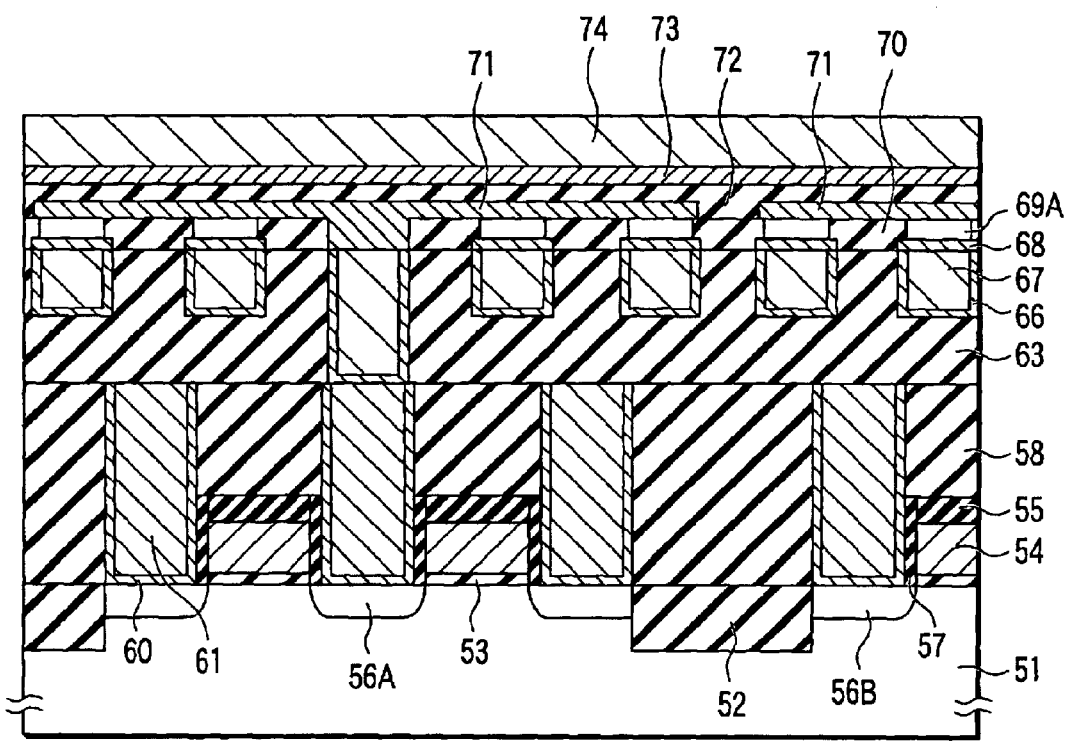
F I G. 83

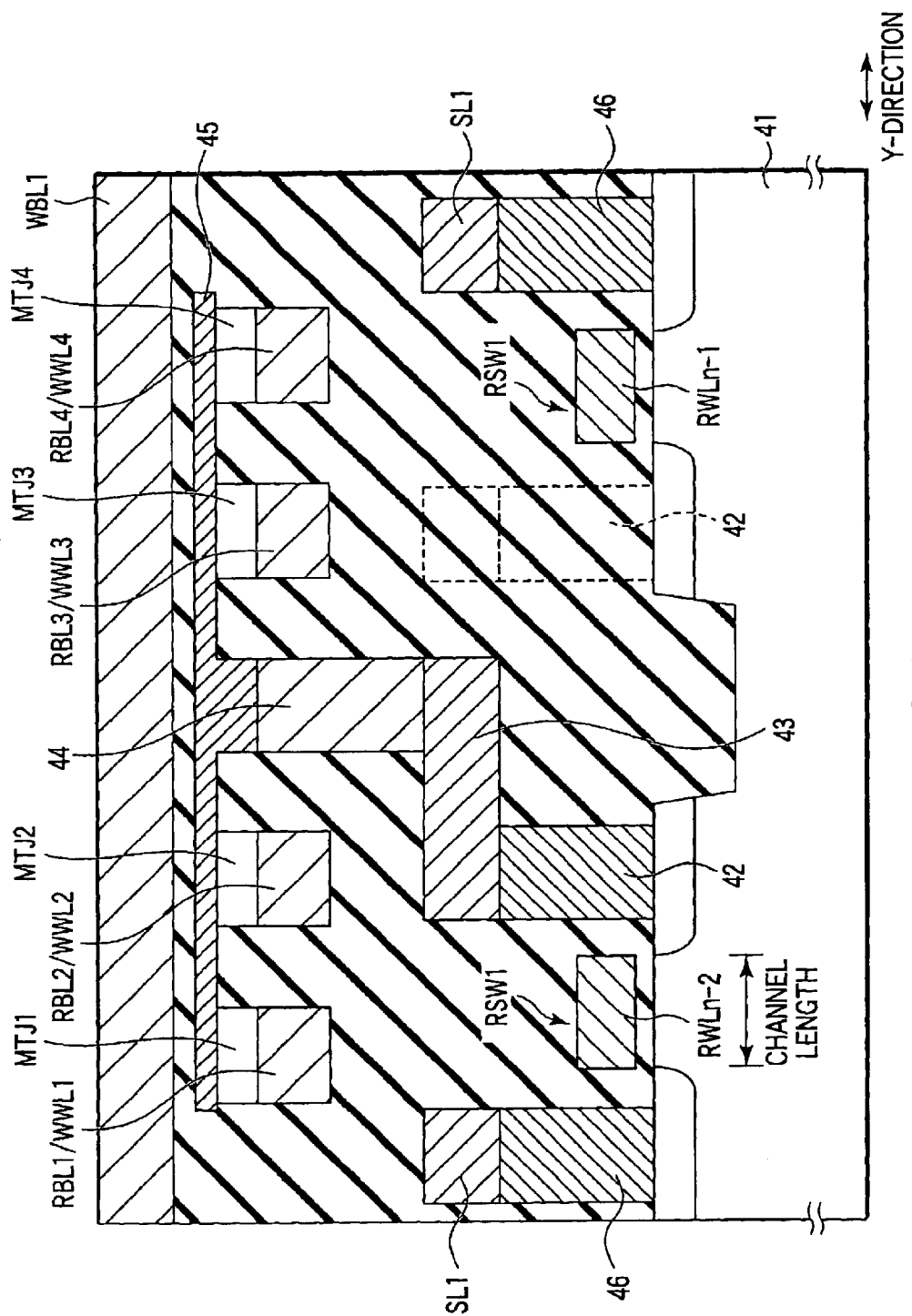
F I G. 85

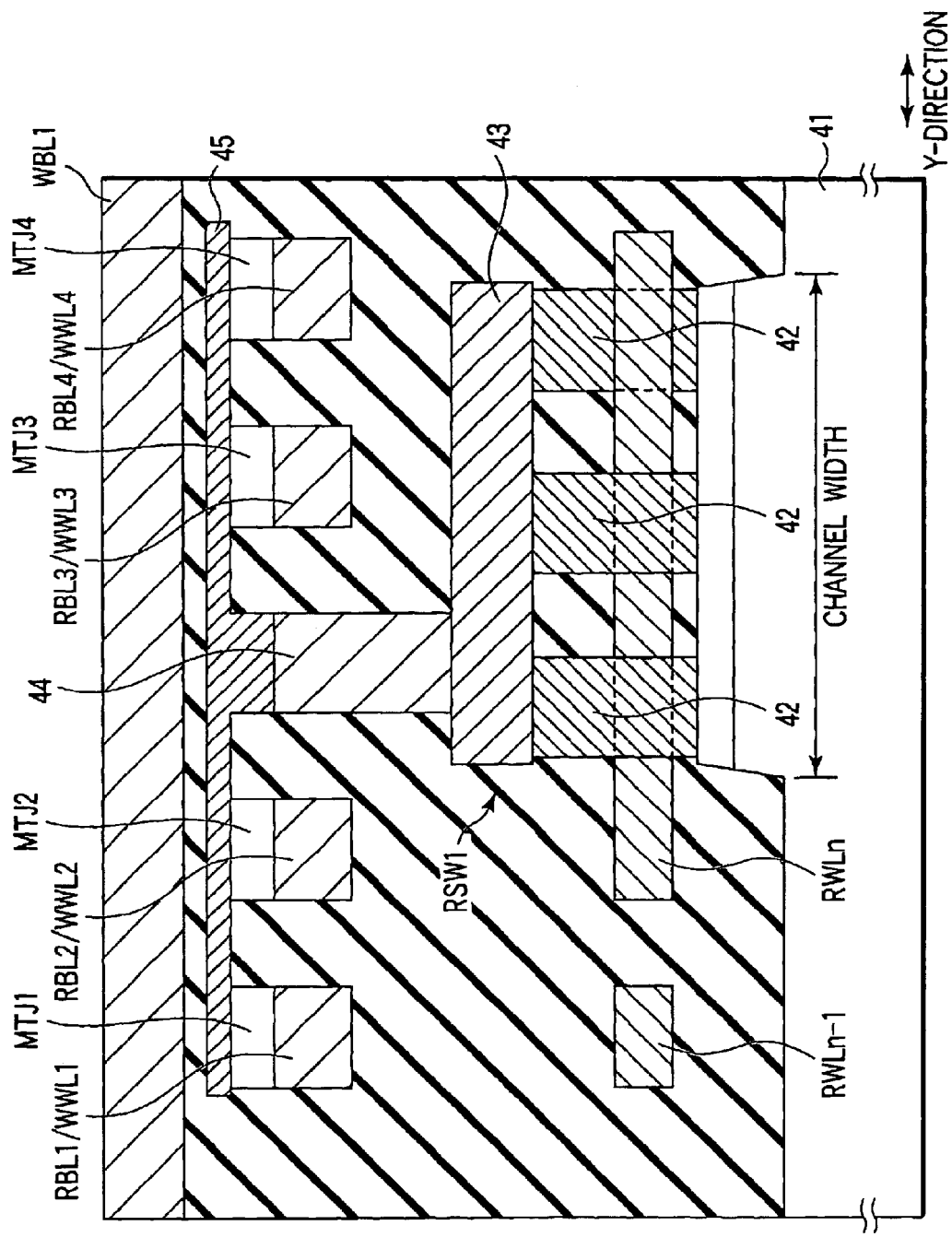
F I G. 89

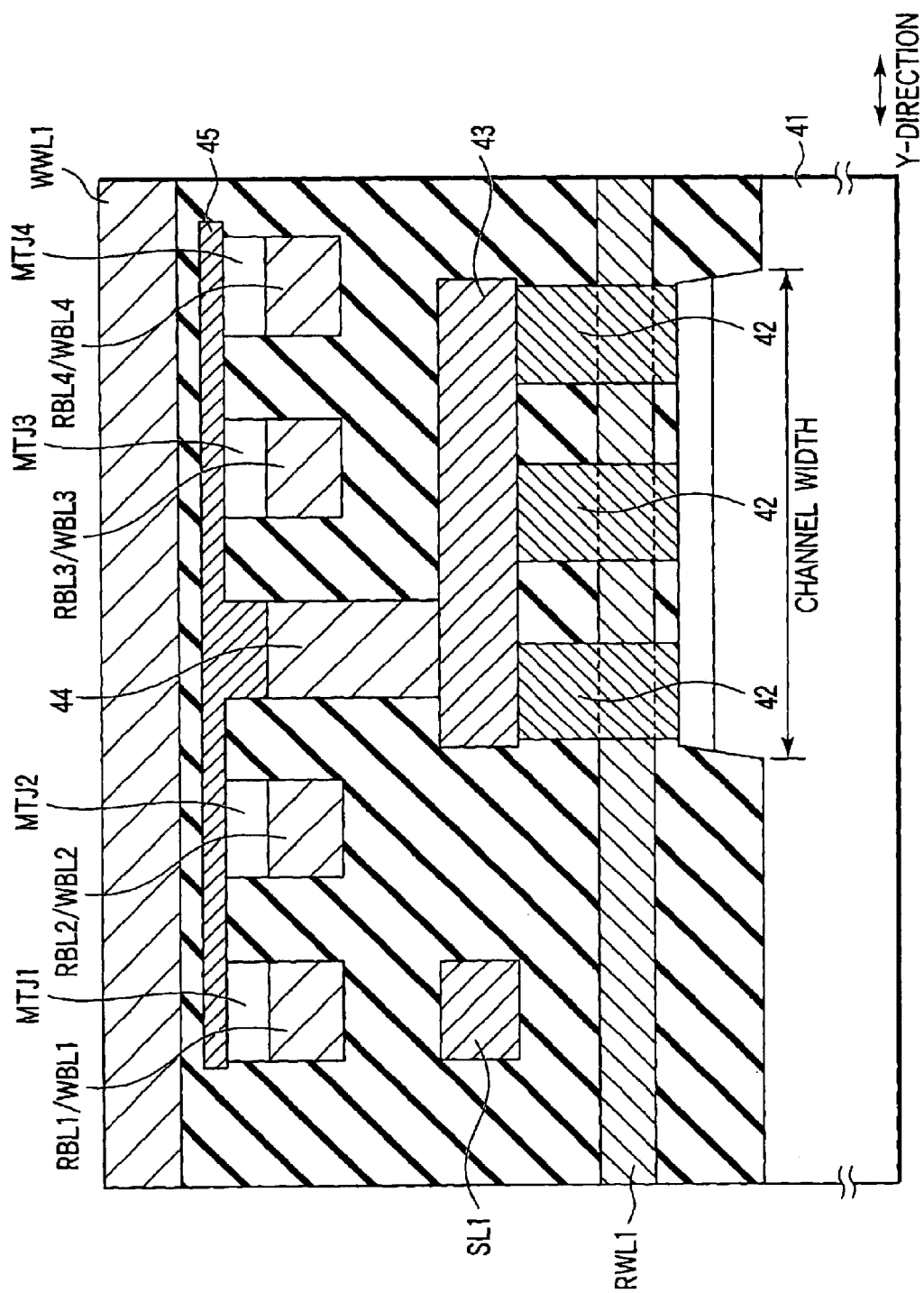
F I G. 95

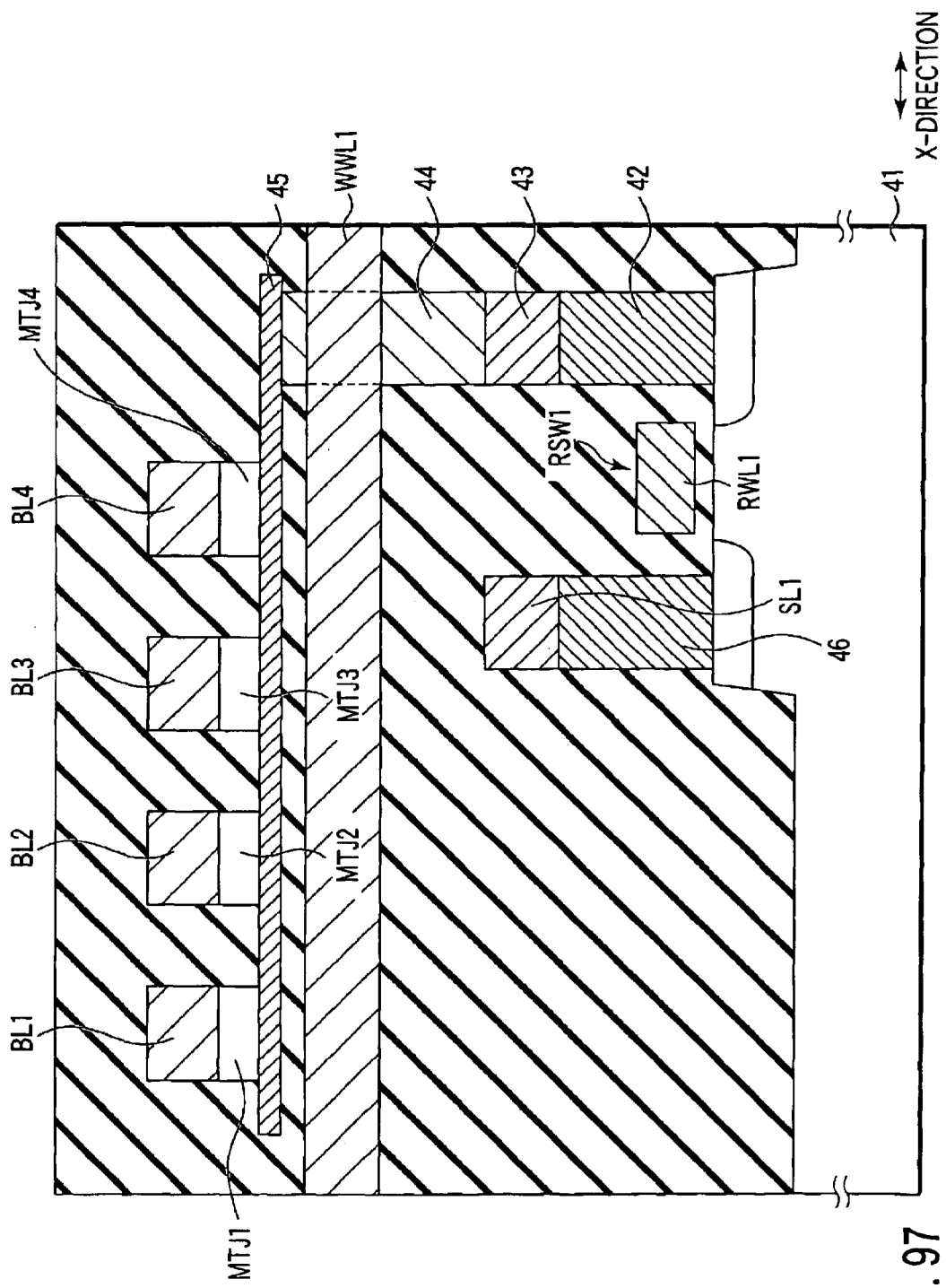
F I G. 97

MAGNETIC RANDOM ACCESS MEMORY

CROSS-REFERENCE TO RELATED APPLICATIONS

This application is based upon and claims the benefit of priority from the prior Japanese Patent Application No. 2001-390518, filed Dec. 21, 2001, the entire contents of which are incorporated herein by reference.

BACKGROUND OF THE INVENTION

1. Field of the Invention

The present invention relates to a magnetic random access memory (MRAM) which uses a magneto resistive effect to store data "1", "0".

2. Description of the Related Art

In recent years, a large number of memories have been proposed in which data is stored according to a new principle. Examples of the memories include a magnetic random access memory which uses a tunneling magneto resistive (hereinafter referred to as TMR) effect to store data "1", "0".

A known proposal of the magnetic random access memory is, for example, "A 10 ns Read and Write Nonvolatile Memory Array using a Magnetic Tunnel Junction and FET Switch in each Cell", ISSCC2000 Technical Digest p.128 by Roy Scheuerlein et al.

The magnetic random access memory stores the data "1", "0" by a TMR element. In a basic structure of the TMR element, a tunneling barrier is held between two magnetic layers (ferromagnetic layers).

The data stored in the TMR element is determined by judging whether magnetizing states of two magnetic layers are parallel or antiparallel.

Here, term "parallel" means that two magnetic layers have the same magnetizing direction, and "antiparallel" means that two magnetic layers are opposite to each other in the magnetizing direction.

Usually, an antiferromagnetic layer is disposed on one (fixed layer) of two magnetic layers. The antiferromagnetic layer is a member for fixing the magnetizing direction of the fixed layer. Therefore, in actual, the data ("1" or "0") to be stored in the TMR element is determined in accordance with the magnetizing direction of the other one (free layer) of two magnetic layers.

When the magnetizing state of the TMR element is parallel, the tunneling barrier held between two magnetic layers constituting the TMR element has a lowest resistance. For example, this state is regarded as state "1". Moreover, when the magnetizing state of the TMR element is antiparallel, the tunneling barrier held between two magnetic layers constituting the TMR element has a highest resistance. For example, this state is regarded as state "0".

For a cell array structure of the magnetic random access memory, at present various structures have been studied from viewpoints of enlargement of a memory capacity, stabilization of a write/read operation, and the like.

For example, at present, a cell array structure is known in which one memory cell is constituted of one MOS transistor and one TMR element (or a magnetic tunnel junction (MTJ) element). Moreover, another magnetic random access memory is also known in which the cell array structure is disposed and two memory cell arrays are used to store one bit data in order to stabilize the read operation.

However, in these magnetic random access memories, it is difficult to enlarge the memory capacity. This is because one MOS transistor corresponds to one TMR element in these cell array structures.

BRIEF SUMMARY OF THE INVENTION

According to an aspect of the present invention, there is provided a magnetic random access memory comprising: a plurality of memory cells which use a magneto resistive effect to store data; a read select switch connected in common to one end of each of the plurality of memory cells; and a plurality of bit lines which are disposed for the plurality of memory cells, and which extend in a first direction, wherein the other ends of the plurality of memory cells are independently connected to one of the plurality of bit lines.

According to another aspect of the present invention, there is provided a manufacturing method of a magnetic random access memory comprising: forming a read select switch in a surface region of a semiconductor substrate; forming a plurality of bit lines which extend in a first direction on the read select switch; forming a plurality of MTJ elements connected to the plurality of bit lines right above the plurality of bit lines; forming an electrode connected in common to the plurality of MTJ elements, and connected to the read select switch right above the plurality of MTJ elements; and forming a write line which extends in a second direction intersecting the first direction in the vicinity of the plurality of MTJ elements.

BRIEF DESCRIPTION OF THE SEVERAL VIEWS OF THE DRAWING

FIG. 3 is a plan view showing Device Structure 1 according to Structure Example 1.

FIG. 9 is a sectional view showing Device Structure 3 according to Structure Example 1.

FIG. 14 is a circuit diagram according to Structure Example 2 of the magnetic random access memory of the present invention.

FIG. 19 is a plan view showing a layout of TMR's upper common electrodes and write bit lines of the device structure according to Structure Example 2.

FIG. 20 is a circuit diagram according to Structure Example 3 of the magnetic random access memory of the present invention.

FIG. 26 is a circuit diagram according to Structure Example 4 of the magnetic random access memory of the present invention.

FIG. 28 is a circuit diagram according to Structure Example 6 of the magnetic random access memory of the present invention.

FIG. 32 is a plan view showing a layout of a source line and intermediate connections of the device structure according to Structure Example 7.

FIG. 33 is a plan view showing a layout of read bit lines or write word lines and TMRs of the device structure according to Structure Example 7.

FIG. 36 is a sectional view showing the device structure according to Structure Example 8.

FIG. 41 is a circuit diagram according to Structure Example 9 of the magnetic random access memory of the present invention.

FIG. 44 is a circuit diagram according to Structure Example 12 of the magnetic random access memory of the present invention.

FIG. 50 is a diagram showing a circuit example of a write word line driver/sinker.

FIG. 51 is a diagram showing a circuit example of a write word line driver/sinker.

FIG. 52 is a diagram showing the circuit example of the write word line driver.

FIG. 53 is a diagram showing the circuit example of the write word line driver/sinker.

FIG. 54 is a diagram showing the circuit example of a write bit line driver/sinker.

FIG. 55 is a diagram showing the circuit example of the write word line driver/sinker.

FIG. 59 is a diagram showing the circuit example of a row decoder & read word line driver.

FIG. 60 is a diagram showing the circuit example of the row decoder.

FIG. 61 is a diagram showing the circuit example of a column decoder & read select line driver.

FIG. 62 is a diagram showing the circuit example of the column decoder.

FIG. 73 is a sectional view showing one step of the manufacturing method of the present invention.

FIG. 74 is a sectional view showing one step of the manufacturing method of the present invention.

FIG. 83 is a plan view showing one step of the manufacturing method of the present invention.

FIG. 85 is a sectional view showing the modification example of Device Structure 2 according to Structure Example 1.

FIG. 89 is a sectional view showing the modification example of the device structure according to Structure Example 2.

FIG. 95 is a sectional view showing the modification example of the device structure according to Structure Example 8.

FIG. 97 is a sectional view showing the modification example of the device structure according to Structure Example 12.

DETAILED DESCRIPTION OF THE INVENTION

A magnetic random access memory of an aspect of the present invention will be described hereinafter in detail with reference to the drawings.

1. Cell Array Structure

First, a cell array structure of the magnetic random access memory of the present invention will be described.

(1) Structure Example 1

Structure Example 1 indicates an example in which one read block is constituted of four TMR elements. In this example, a case in which the number of TMR elements is four in the read block will be described, but the number of TMR elements in the read block is not limited to four, and can freely be set.

(1)-1 Circuit Structure

First, a circuit structure will be described.

Figure 1:
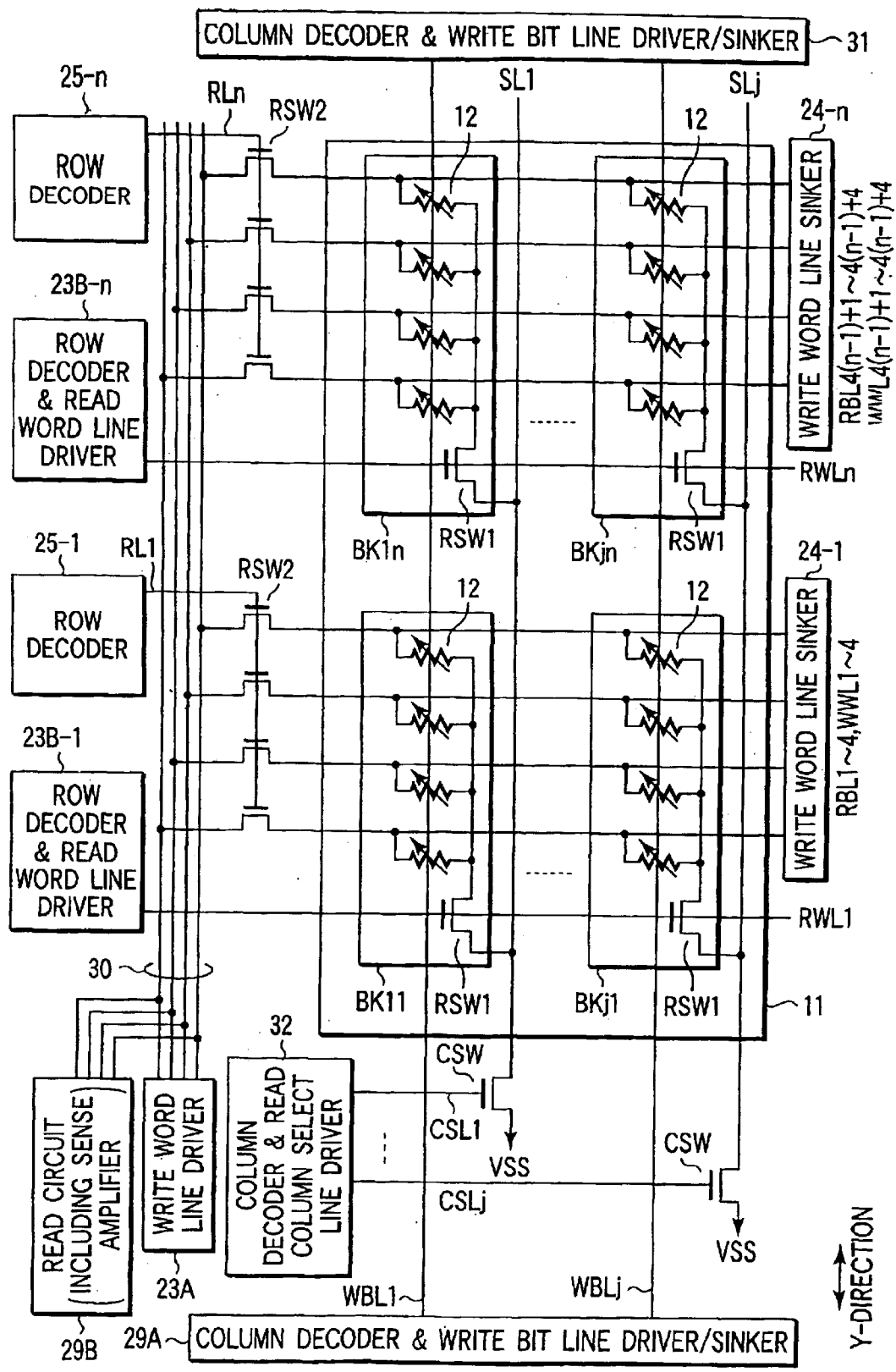
FIG. 1 is a circuit diagram according to Structure Example 1 of a magnetic random access memory of the present invention.

FIG. 1 shows a main part of the magnetic random access memory as Structure Example 1 of the present invention.

A memory cell array 11 has a plurality of TMR elements 12 arranged in an array in X and Y-directions. In the X-direction, j TMR elements 12 are arranged, and in the Y-direction, 4×n TMR elements 12 are arranged.

Four TMR elements 12 arranged in the Y-direction constitute one read block BKik (i=1, ... j, k=1, ... n), and j read blocks BKik arranged in the X-direction constitute one row. The memory cell array 11 has n rows. Moreover, n read blocks BKik arranged in the Y-direction constitute one column. The memory cell array 11 has j columns.

One end of each of four TMR elements 12 in the block BKik is connected in common to a source line SLi (i=1, ... j), for example, via a read select switch RSW1 constituted of an MOS transistor. The source lines SLi extend in the Y-direction, and only one source line is disposed in one column.

Each source line SLi is connected to a ground point VSS, for example, via a column select switch CSW constituted of the MOS transistor.

During a read operation, the read select switch RSW1 is turned on in the read block BKik in the selected row. Moreover, since the column select switch CSW is turned on in the selected column, the source line SLi is supplied with the ground potential VSS. That is, a read current flows only through the TMR elements 12 in the read block BKik positioned in an intersection of the selected row and column.

Additionally, during the read operation, since the read select switch RSW1 is off in an unselected row, the other ends of the TMR elements 12 in the read block BKik of the unselected row are short-circuited from one another.

In this case, when read bit lines RBL4(n−1)+1, RBL4(n−1)+2, RBL4(n−1)+3, RBL4(n−1)+4 in the unselected row have different potentials, the read operation is sometimes influenced. Therefore, the read bit lines RBL4(n−1)+1, RBL4(n−1)+2, RBL4(n−1)+3, RBL4(n−1)+4 in the unselected column are set to the same potential (e.g., the ground potential).

During the read operation, since the column select switch CSW is off in the unselected column, the other ends of the TMR elements 12 in the read block BKik of the unselected column are also short-circuited from one another.

The other ends of four TMR elements 12 in the read block BKik are independently connected to the read bit lines RBL4(n−1)+1, RBL4(n−1)+2, RBL4(n−1)+3, RBL4(n−1)+4. That is, for the four TMR elements 12 in one read block BKik, four read bit lines RBL4(n−1)+1, RBL4(n−1)+2, RBL4(n−1)+3, RBL4(n−1)+4 are arranged.

The read bit lines RBL4(n−1)+1, RBL4(n−1)+2, RBL4(n−1)+3, RBL4(n−1)+4 extend in the X-direction, and one end of each read bit line is connected to a common data line 30 via a row select switch (MOS transistor) RSW2. The common data line 30 is connected to a read circuit (including, for example, a sense amplifier, selector and output buffer) 29B.

Row select line signals RLi (i=1, . . . n) are inputted into row select switches RSW2. Row decoders 25-1, . . . , 25-n output row select line signals RLi.

In this example, the read bit lines RBL4(n−1)+1, RBL4(n−1)+2, RBL4(n−1)+3, RBL4(n−1)+4 extend in the X-direction (row direction), and also function as write word lines WWL4(n−1)+1, WWL4(n−1)+2, WWL4(n−1)+3, WWL4(n−1)+4.

One end of each of the write word lines WWL4(n−1)+1, WWL4(n−1)+2, WWL4(n−1)+3, WWL4(n−1)+4 is connected to a write word line driver 23A via the row select switch RSW2 and common data line 30, and the other ends are connected to write word line sinkers 24-1, . . . 24-n.

One write bit line WBLi (i=1, . . . j) shared by these four TMR elements and extending in the Y-direction is disposed in the vicinity of four TMR elements 12 constituting the read block BKik. Only one write bit line WBLi is disposed in one column.

One end of the write bit line WBLi is connected to a circuit block 29A including a column decoder and write bit line driver/sinker, and the other end thereof is connected to a circuit block 31 including the column decoder and write bit line driver/sinker.

During the write operation, the circuit blocks 29A, 31 are brought to an operation state. Moreover, a write current flows toward the circuit block 29A or 31 in accordance with write data.

A gate of the read select switch (MOS transistor) RSW1 is connected to a read word line RWLn (n=1, 2, . . . ). Only one read word line RWLn is disposed in one row, and is common to a plurality of blocks BKjk arranged in the X-direction.

For example, when one column is constituted of four blocks, the number of read word lines RWLn is four. Each read word line RWLn extends in the X-direction, and one end thereof is connected to a circuit block 23B-n including the row decoder and read word line driver.

During a write operation, the row decoder 25-n selects one of a plurality of rows based on a row address signal. The write word line driver 23A supplies the write current to the write word lines WWL4(n−1)+1, WWL4(n−1)+2, WWL4(n−1)+3, WWL4(n−1)+4 in the selected row. The write current is absorbed by the write word line sinker 24-n.

During the read operation, the row decoder 25-n selects one of a plurality of rows based on the row address signal. Similarly, the circuit block 23B-n including the row decoder and read word line driver supplies a read voltage (="H") to the read word line RWLn in the selected row.

During the read operation, a column decoder 32 selects one of a plurality of columns based on column address signals CSL1, . . . CSLj, and turns on the column select switches CSW arranged in the selected column.

In the magnetic random access memory of this example, one end of each of the plurality of TMR elements in the read block is connected in common, and the other ends are connected to different read bit lines RBL4(n−1)+1, RBL4(n−1)+2, RBL4(n−1)+3, RBL4 (n−1)+4.

Therefore, data of the plurality of TMR elements in the read block can be read at once by one read step.

Moreover, the read bit lines RBL4(n−1)+1, RBL4(n−1)+2, RBL4(n−1)+3, RBL4(n−1)+4 also function as the write word lines WWL4(n−1)+1, WWL4(n−1)+2, WWL4(n−1)+3, WWL4(n−1)+4. That is, since it is unnecessary to separately dispose a wiring functioning only as the write word line in the cell array, the cell array structure can be simplified.

(1)-2 Device Structure 1

Device Structure 1 will next be described.

[1] Sectional Structure

Figure 2:
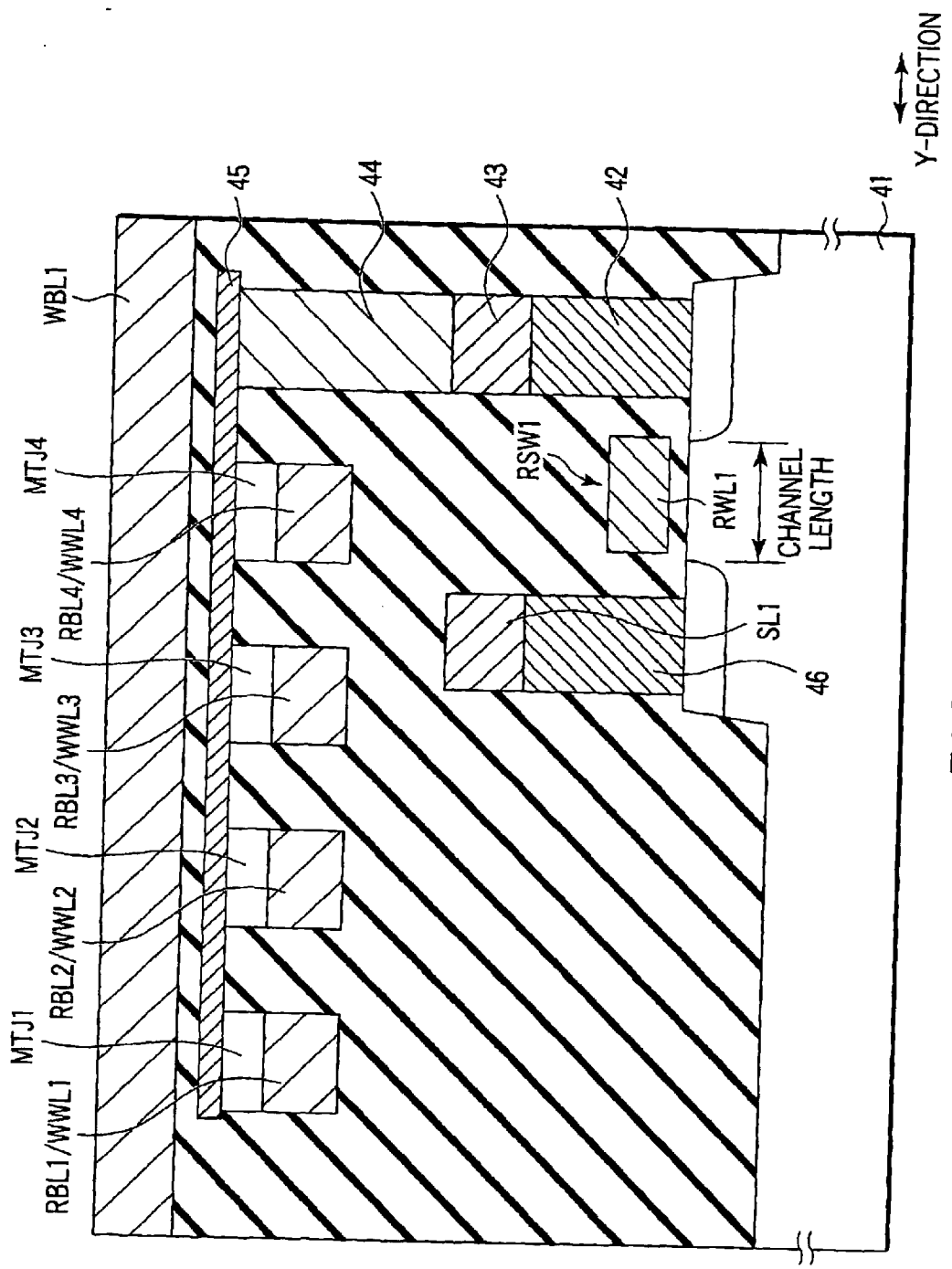
FIG. 2 is a sectional view showing Device Structure 1 according to Structure Example 1.

FIG. 2 shows Device Structure 1 for one block of the magnetic random access memory as Structure Example 1 of the present invention.

Additionally, for the correspondence to the elements of the circuit of FIG. 1, the elements shown in FIG. 2 are denoted with the same reference numerals as those of FIG. 1.

The read select switch (MOS transistor) RSW1 is disposed in a surface region of a semiconductor substrate 41. A source of the read select switch RSW1 is connected to a source line SL1 via a contact plug 46. The source line SL1 linearly extends, for example, in the Y-direction (column direction), and is connected to the ground supply VSS via the column select switch in the periphery of a memory cell array region.

The gate of the read select switch (MOS transistor) RSWL forms the read word line RWL1. The read word line RWL1 extends in the X-direction. On the read select switch RSW1, four TMR elements (magnetic tunnel junction (MTJ) elements) MTJ1, MTJ2, MTJ3, MTJ4 are arranged in the Y-direction.

One end (upper end in this example) of each of the TMR elements MTJ1, MTJ2, MTJ3, MTJ4 is connected in common to an upper electrode 45. Contact plugs 42, 44 and intermediate layer 43 electrically connect the upper electrode 45 to a drain of the read select switch RSW1.

The other ends (lower ends in this example) of the TMR elements MTJ1, MTJ2, MTJ3, MTJ4 are electrically connected to the read bit lines RBL1, RBL2, RBL3, RBL4 (write word lines WWL1, WWL2, WWL3, WWL4). The read bit lines RBL1, RBL2, RBL3, RBL4 extend in the X-direction (row direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write bit line WBL1 is disposed right above the TMR elements MTJ1, MTJ2, MTJ3, MTJ4 and in the vicinity of the elements. The write bit line WBL1 extends in the Y-direction (column direction).

In this example, one write bit line WBL1 is disposed for four TMR elements MTJ1, MTJ2, MTJ3, MTJ4 constituting the read block. Additionally, instead, for example, four TMR elements MTJ1, MTJ2, TJ3, MTJ4 are piled up, and four write bit lines may be disposed for the four TMR elements MTJ1, MTJ2, MTJ3, MTJ4.

Moreover, in this example, with respect to the TMR elements MTJ1, MTJ2, MTJ3, MTJ4, the write bit line WBL1 extending in the Y-direction is disposed in an upper portion, and the read bit lines RBL1, RBL2, RBL3, RBL4 extending in the X-direction are disposed in a lower portion.

Additionally, a positional relation of the write bit line WBL1 and read bit lines RBL1, RBL2, RBL3, RBL4 with respect to the TMR elements MTJ1, MTJ2, MTJ3, MTJ4 is not limited to this.

Figure 84:
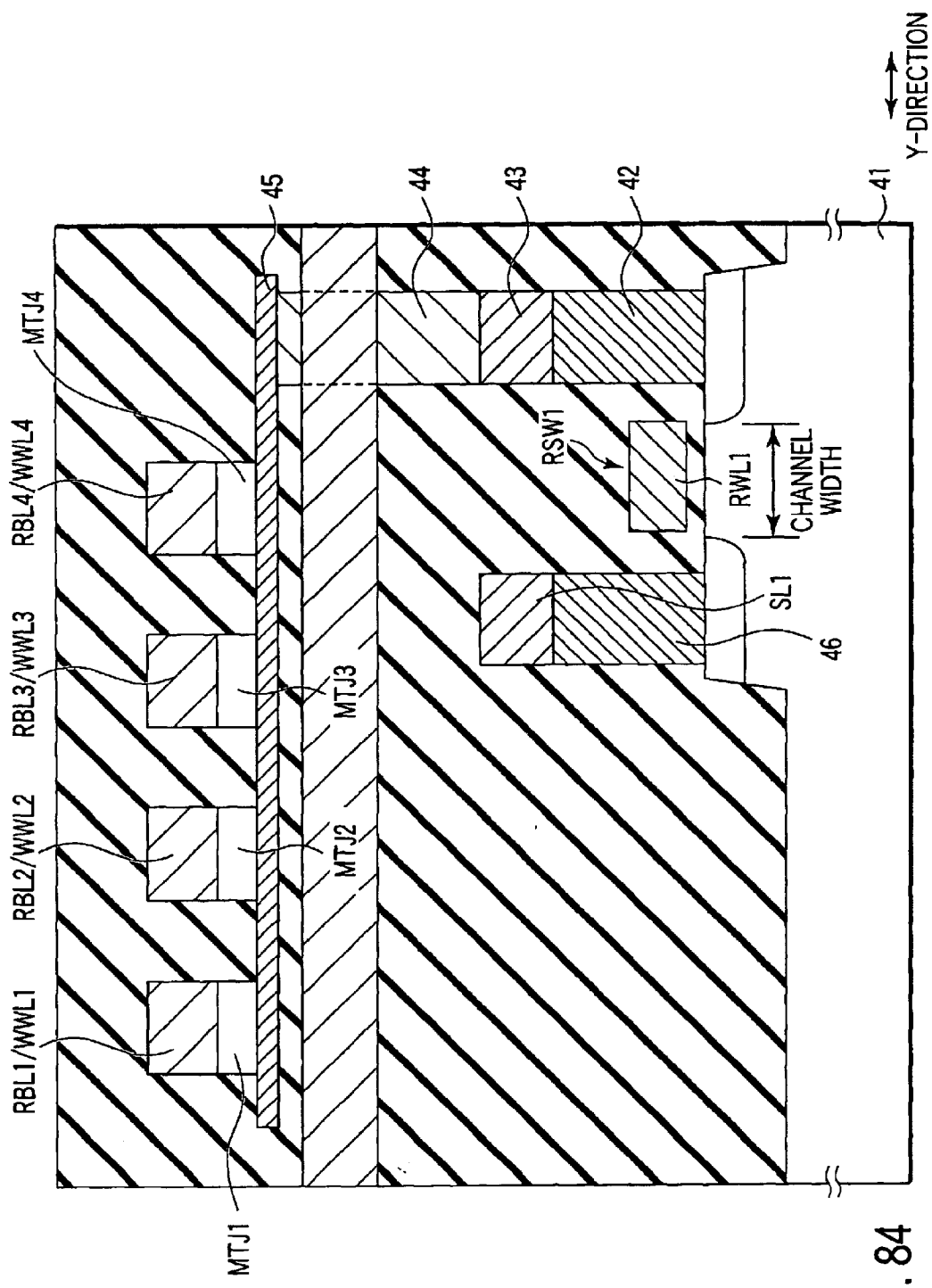
FIG. 84 is a sectional view showing a modification example of Device Structure 1 according to Structure Example 1.

For example, as shown in FIG. 84, with respect to the TMR elements MTJ1, MTJ2, MTJ3, MTJ4, the write bit line WBL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to respective different read bit lines RBL1, RBL2, RBL3, RBL4 (write word lines WWL1, WWL2, WWL3, WWL4).

Therefore, the data of the plurality of TMR elements MTJ1, MTJ2, MTJ3, MTJ4 in the read block can be read out at once by one read step.

Moreover, one end of each of the plurality of TMR elements MTJ1, MTJ2, MTJ3, MTJ4 in the read block is connected in common to one read select switch RSW1. Furthermore, the write bit line WBL1 extending in the Y-direction is shared by the plurality of TMR elements MTJ1, MTJ2, MTJ3, MTJ4 in the read block. Therefore, the cell array structure is prevented from being complicated.

[Planar Structure]

FIG. 3 shows the positional relation of the TMR elements, write word lines and read bit lines (write word lines) in the device structure of FIG. 2.

The upper electrode 45 of the TMR elements MTJ1, MTJ2, MTJ3, MTJ4 is, for example, a rectangular pattern, and a contact region for the contact plug is disposed in a part of the pattern.

The TMR elements MTJ1, MTJ2, MTJ3, MTJ4 are arranged in the Y-direction, and an axis of easy magnetization turns to the X-direction. That is, each of the TMR elements MTJ1, MTJ2, MTJ3, MTJ4 is a rectangular shape which is long in the X-direction.

The TMR elements MTJ1, MTJ2, MTJ3, MTJ4 are arranged in the intersections of the write word line WWL1 and read bit lines RBL1, RBL2, RBL3, RBL4 (write word lines WWL1, WWL2, WWL3, WWL4).

(1)-3 Device Structure 2

Device Structure 2 will next be described.

[1] Sectional Structure

Figure 4:
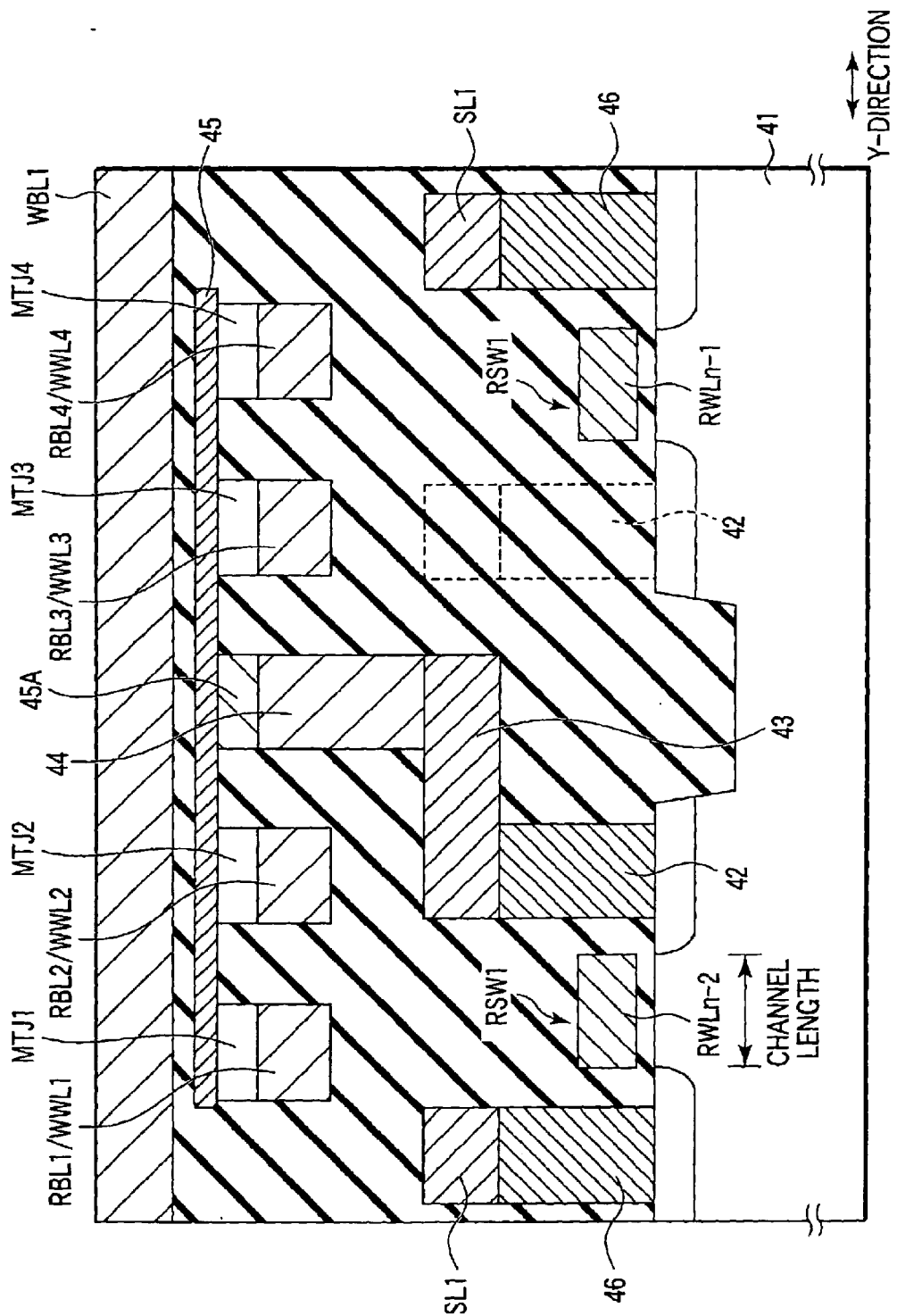
FIG. 4 is a sectional view showing Device Structure 2 according to Structure Example 1.

FIG. 4 shows Device Structure 2 for one block of the magnetic random access memory as Structure Example 1 of the present invention.

Additionally, for the correspondence to the elements of the circuit of FIG. 1, the elements shown in FIG. 4 are denoted with the same reference numerals as those of FIG. 1.

The read select switch (MOS transistor) RSW1 is disposed in the surface region of the semiconductor substrate 41. In Device Structure 2, the position of the read select switch RSW1 is slightly different from the position of the read select switch RSW1 in Device Structure 1.

The source of the read select switch RSW1 is connected to the source line SL1 via the contact plug 46. The source line SL1 linearly extends, for example, in the Y-direction (column direction), and is connected to the ground supply VSS via the column select switch in the periphery of the memory cell array region.

The gate of the read select switch (MOS transistor) RSW1 forms the read word line RWL1. The read word line RWL1 extends in the X-direction. On the read select switch RSW1, four TMR elements (magnetic tunnel junction (MTJ) elements) MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

In Device Structure 2, a contact portion of the upper electrode 45 and read select switch RSW1 is disposed in a region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, a noise during the read operation by a wiring resistance can be minimized.

Additionally, an intermediate layer 45A may be formed integrally with the upper electrode 45. That is, the intermediate layer 45A and upper electrode 45 may be formed of the same material at the same time. In this case, the device of FIG. 4 is formed as shown in FIG. 85.

The other ends (lower ends in this example) of the TMR elements MTJ1, MTJ2, MTJ3, MTJ4 are electrically connected to the read bit lines RBL1, RBL2, RBL3, RBL4 (write word lines WWL1, WWL2, WWL3, WWL4). The read bit lines RBL1, RBL2, RBL3, RBL4 extend in the X-direction (row direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write bit line WBL1 is disposed right above the TMR elements MTJ1, MTJ2, MTJ3, MTJ4 and in the vicinity of the elements. The write bit line WBL1 extends in the Y-direction (column direction).

In this example, one write bit line WBL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write bit lines may be disposed for the four TMR elements MTJ1, MTJ2, MTJ3, MTJ4.

Moreover, in this example, with respect to the TMR elements MTJ1, MTJ2, MTJ3, MTJ4, the write bit line WBL1 extending in the Y-direction is disposed in the upper portion, and the read bit lines RBL1, RBL2, RBL3, RBL4 extending in the X-direction are disposed in the lower portion.

Additionally, the positional relation of the write bit line WBL1 and read bit lines RBL1, RBL2, RBL3, RBL4 with respect to the TMR elements MTJ1, MTJ2, MTJ3, MTJ4 is not limited to this.

Figure 86:
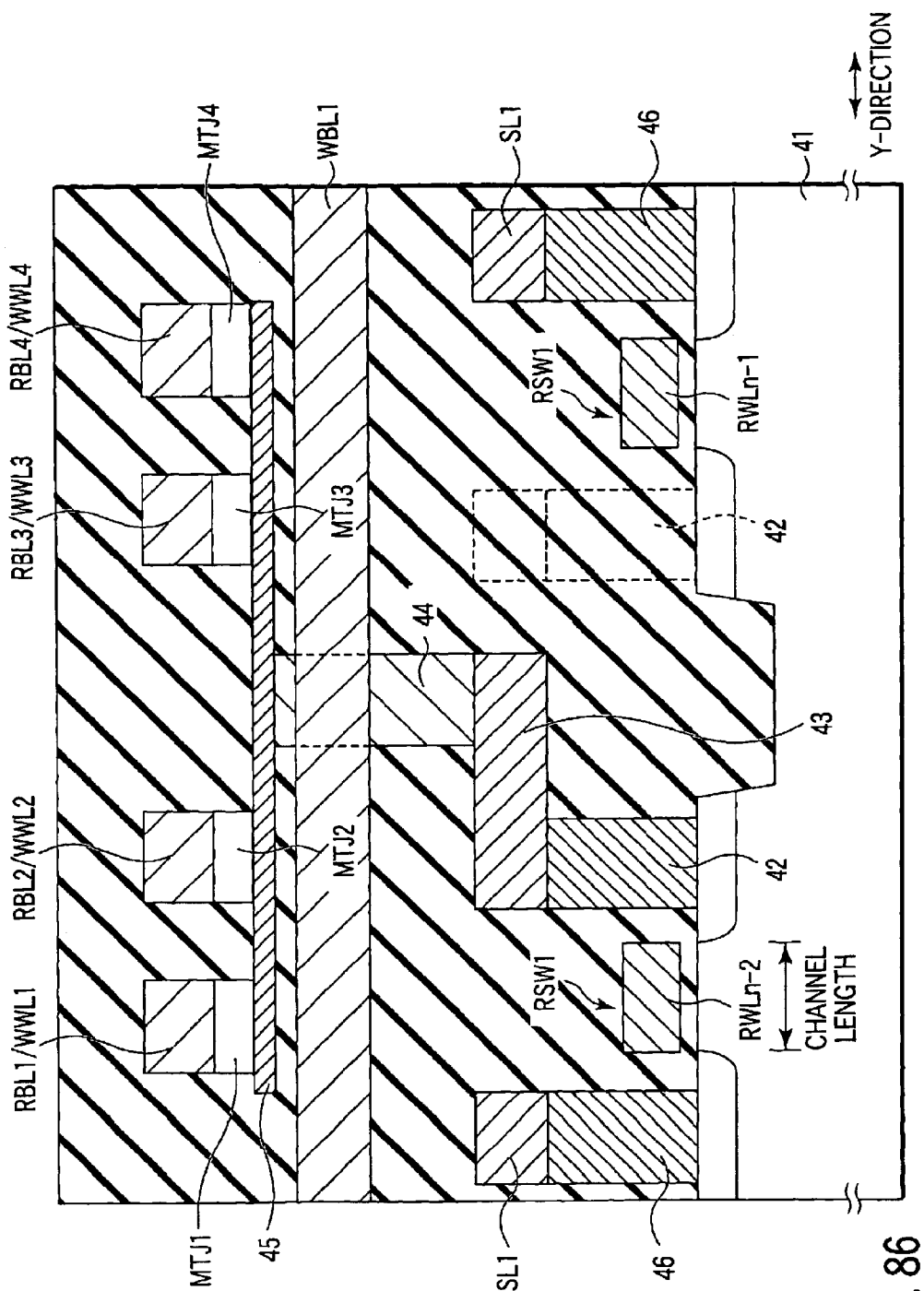
FIG. 86 is a sectional view showing the modification example of Device Structure 2 according to Structure Example 1.

For example, as shown in FIG. 86, with respect to the TMR elements MTJ1, MTJ2, MTJ3, MTJ4, the write bit line WBL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to the respective different read bit lines RBL1, RBL2, RBL3, RBL4 (write word lines WWL1, WWL2, WWL3, WWL4).

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW1. Furthermore, the write bit line WBL1 extending in the Y-direction is shared by the plurality of TMR elements MTJ1, MTJ2, MTJ3, MTJ4 in the read block. Therefore, the cell array structure is prevented from being complicated.

[Planar Structure]

FIGS. 5 to 8 show a layout of respective wiring layers in Device Structure 2 of FIG. 4. Additionally, a sectional area of FIG. 4 corresponds to a sectional area taken along line IV—IV in FIGS. 5 to 8.

Figure 5:
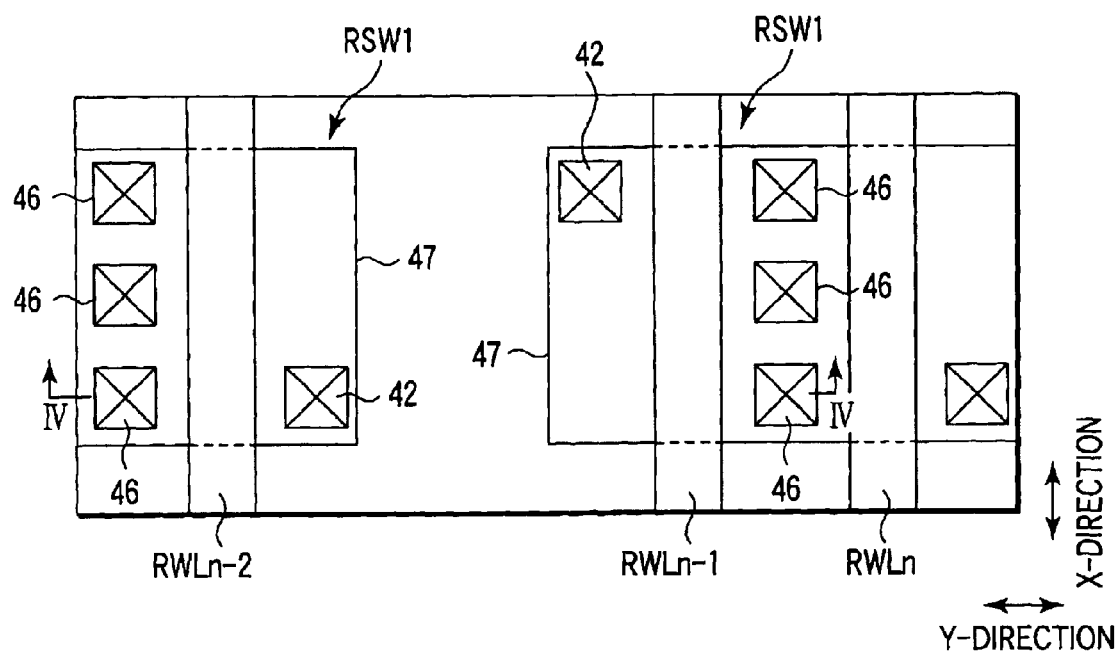
FIG. 5 is a plan view showing a layout of active regions and read word lines of Device Structure 2 according to Structure Example 1.

FIG. 5 shows a layout of the read word lines as a first wiring layer.

The read select switch (MOS transistor) RSW1 is disposed in active areas 47. The contact plug 42 is disposed on the drain of the read select switch RSW1, and the contact plugs 46 are arranged on the source.

Additionally, in this example, two read select switches RSW1 adjacent to each other in the X-direction (row direction) share one source.

On channel regions between the drains and sources of the read select switches RSW1, the gates of the read select switches RSW1, that is, read word lines RWLn-2, RWLn-1, RWLn are arranged. The read word lines RWLn-2, RWLn-1, RWLn extend in the X-direction.

Figure 6:
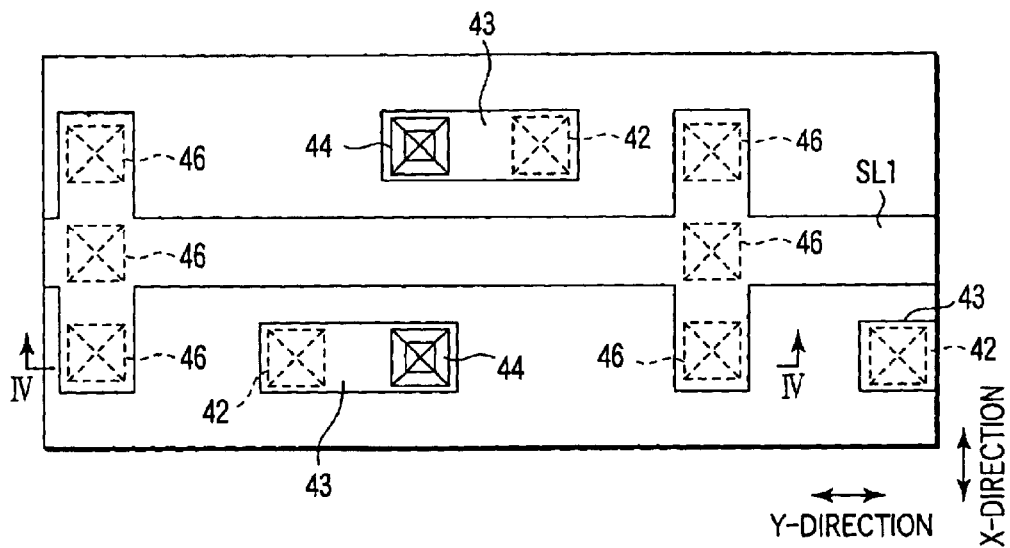
FIG. 6 is a plan view showing a layout of a source line and intermediate connections of Device Structure 2 according to Structure Example 1.

FIG. 6 shows the layout of a source line as a second wiring layer and the intermediate layer.

The source line SL1 extends in the Y-direction (column direction), and is connected to the contact plugs 46. In this example, two read select switches RSW1 disposed adjacent to each other in the X-direction (row direction) share one source line SL1. That is, one source line SL1 is disposed for two columns.

The source line SL1 is connected to the source shared by two read select switches RSW1 disposed adjacent to each other in the X-direction via the contact plugs 46. The intermediate layer 43 is connected to the contact plug 42 on the drain of the read select switch RSW1. The contact plug 44 is disposed on the intermediate layer 43.

Figure 7:
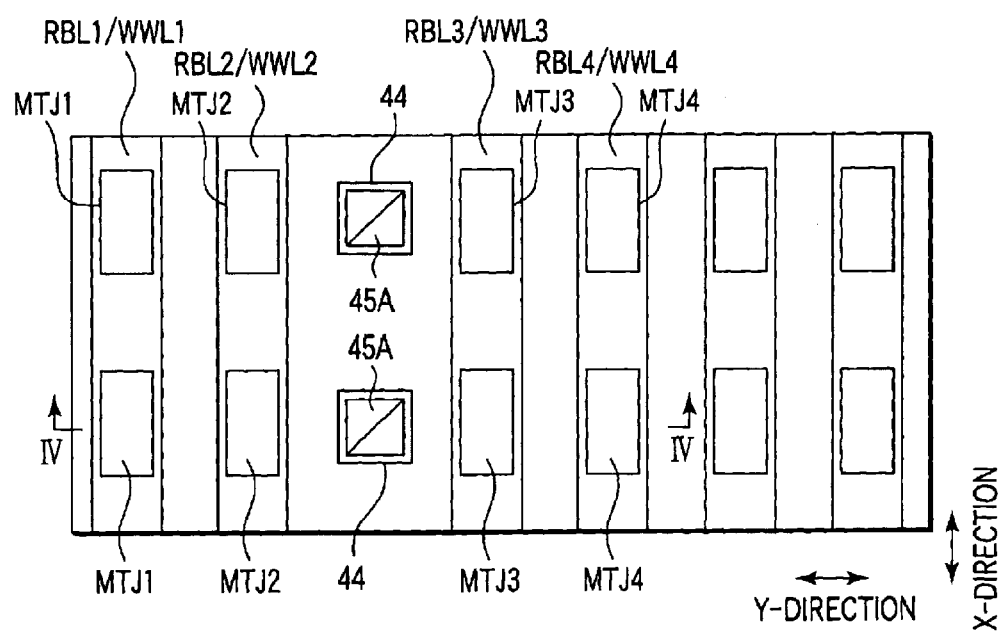
FIG. 7 is a plan view showing a layout of read bit lines or write word lines and TMRs of Device Structure 2 according to Structure Example 1.

FIG. 7 shows a layout of the read bit lines as a third wiring layer and the TMR elements.

The read bit lines RBL1, RBL2, RBL3, RBL4 (write word lines WWL1, WWL2, WWL3, WWL4) extend in the X-direction.

The TMR elements MTJ1, MTJ2, MTJ3, MTJ4 are arranged on the read bit lines RBL1, RBL2, RBL3, RBL4.

The read bit line RBL1 is connected in common to the TMR elements MTJ1 arranged in the X-direction, and the read bit line RBL2 is connected in common to the TMR elements MTJ2 arranged in the X-direction. The read bit line RBL3 is connected in common to the TMR elements MTJ3 arranged in the X-direction, and the read bit line RBL4 is connected in common to the TMR elements MTJ4 arranged in the X-direction.

The axes of easy magnetization of the TMR elements MTJ1, MTJ2, MTJ3, MTJ4 turn to the X-direction. That is, the TMR elements MTJ1, MTJ2, MTJ3, MTJ4 have rectangular shapes elongated in the X-direction. The intermediate layers 45A are disposed on the contact plugs 44.

Figure 8:
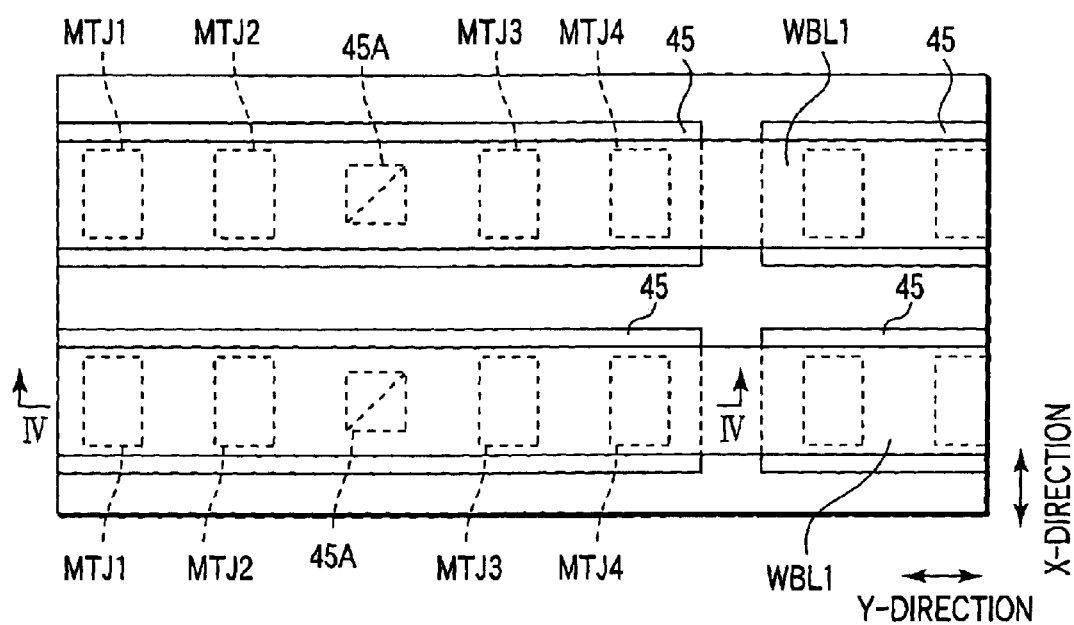
FIG. 8 is a plan view showing a layout of TMR's upper common electrodes and write bit lines of Device Structure 2 according to Structure Example 1.

FIG. 8 shows a layout of the write bit line as a fourth wiring layer.

The upper electrode 45 having a rectangular pattern is disposed on the TMR elements MTJ1, MTJ2, MTJ3, MTJ4 and intermediate layer 45A. The upper electrode 45 contacts the TMR elements MTJ1, MTJ2, MTJ3, MTJ4 and intermediate layer 45A.

Moreover, the write bit lines WBL1, WBL2 extending in the Y-direction are arranged right on the upper electrodes 45.

(1)-4 Device Structure 3

Device Structure 3 will next be described.

[1] Sectional Structure

FIG. 9 shows Device Structure 3 for one block of the magnetic random access memory as Structure Example 1 of the present invention.

Additionally, for the correspondence to the elements of the circuit of FIG. 1, the elements shown in FIG. 9 are denoted with the same reference numerals as those of FIG. 1.

The read select switch (MOS transistor) RSW1 is disposed in the surface region of the semiconductor substrate 41. Device Structure 3 is different from Device Structure 2 in that the read select switch RSW1 is constituted of a so-called comb type MOS transistor.

The source of the read select switch RSW1 is connected to the source line SL1 via the contact plug 46. The source line SL1 linearly extends, for example, in the Y-direction (column direction), and is connected to the ground supply VSS via the column select switch in the periphery of the memory cell array region.

The gate of the read select switch (MOS transistor) RSW1 forms a read word line RWLn-1. The read word line RWLn-1 has a comb shape. Two read word lines RWLn-1 shown in FIG. 9 are connected to each other.

On the read select switches RSW1, four TMR elements (magnetic tunnel junction (MTJ) elements) MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

In Device Structure 3, similarly as Device Structure 2, the contact portion of the upper electrode 45 and read select switch RSW1 is disposed in the region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, the noise during the read operation by the wiring resistance can be minimized.

Figure 87:
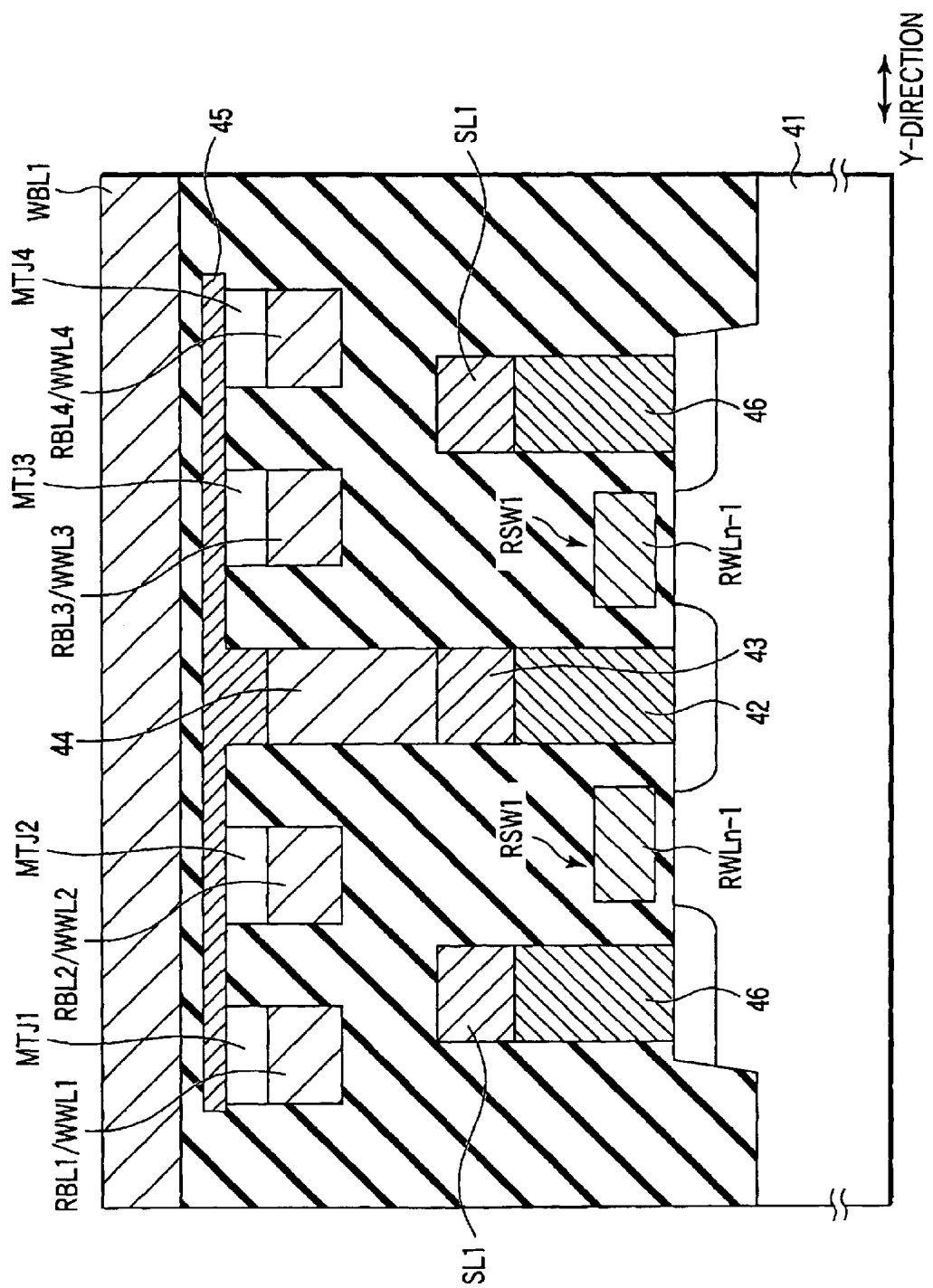
FIG. 87 is a sectional view showing the modification example of Device Structure 3 according to Structure Example 1.

Additionally, the intermediate layer 45A may be formed integrally with the upper electrode 45. That is, the intermediate layer 45A and upper electrode 45 may be formed of the same material at the same time. In this case, the device of FIG. 9 is formed as shown in FIG. 87.

The other ends (lower ends in this example) of the TMR elements MTJ1, MTJ2, MTJ3, MTJ4 are electrically connected to the read bit lines RBL1, RBL2, RBL3, RBL4 (write word lines WWL1, WWL2, WWL3, WWL4). The read bit lines RBL1, RBL2, RBL3, RBL4 extend in the X-direction (row direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write bit line WBL1 is disposed right above the TMR elements MTJ1, MTJ2, MTJ3, MTJ4 and in the vicinity of the elements. The write bit line WBL1 extends in the Y-direction (column direction).

In this example, one write bit line WBL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write bit lines may be disposed for the four TMR elements MTJ1, MTJ2, MTJ3, MTJ4.

Moreover, in this example, with respect to the TMR elements MTJ1, MTJ2, MTJ3, MTJ4, the write bit line WBL1 extending in the Y-direction is disposed in the upper portion, and the read bit lines RBL1, RBL2, RBL3, RBL4 extending in the X-direction are disposed in the lower portion.

However, the positional relation of the write bit line WBL1 and read bit lines RBL1, RBL2, RBL3, RBL4 with respect to the TMR elements MTJ1, MTJ2, MTJ3, MTJ4 is not limited to this.

Figure 88:
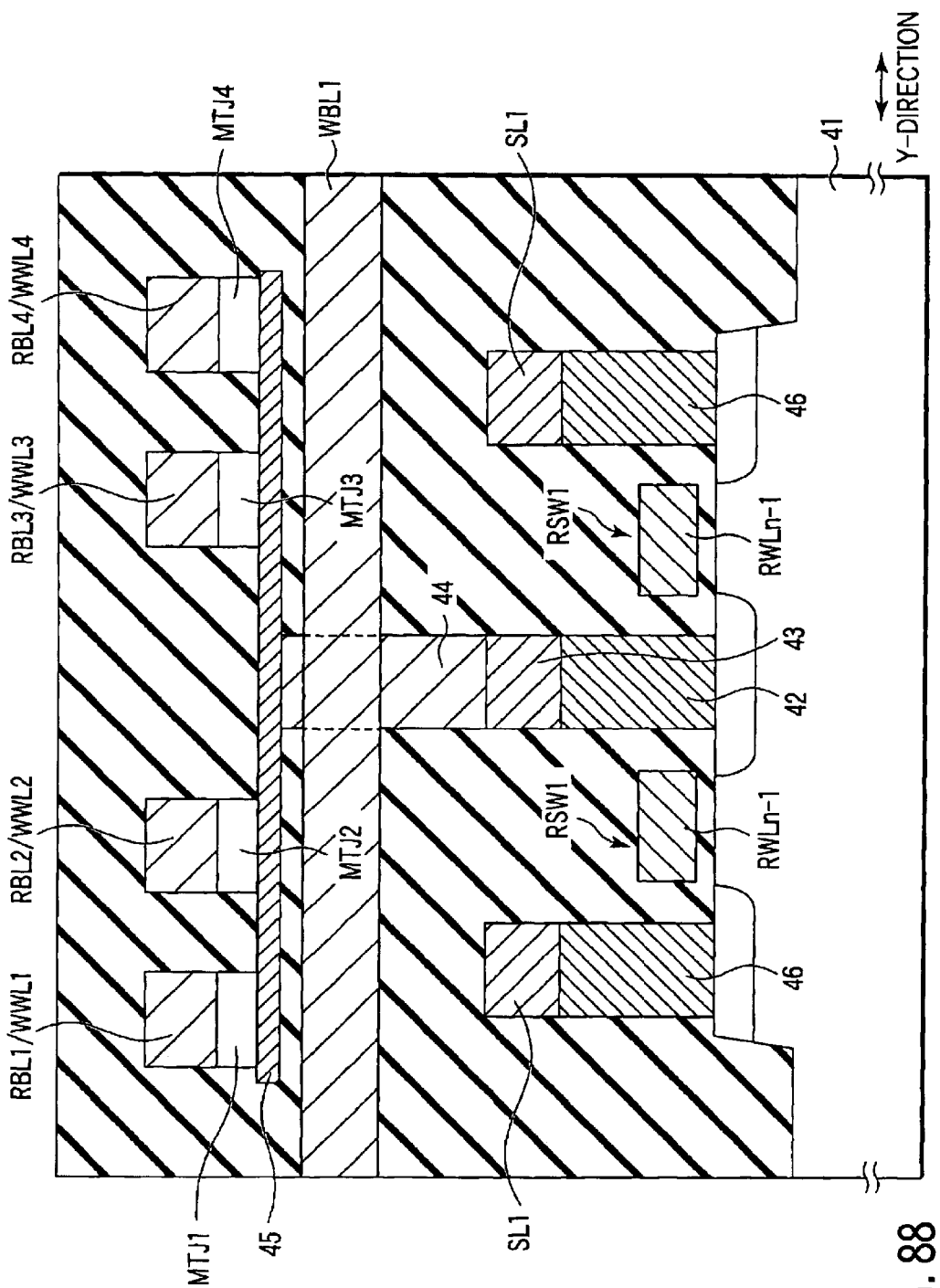
FIG. 88 is a sectional view showing the modification example of Device Structure 3 according to Structure Example 1.

For example, as shown in FIG. 88, with respect to the TMR elements MTJ1, MTJ2, MTJ3, MTJ4, the write bit line WBL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to the respective different read bit lines RBL1, RBL2, RBL3, RBL4 (write word lines WWL1, WWL2, WWL3, WWL4).

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW1. Furthermore, the write bit line WBL1 extending in the Y-direction is shared by the plurality of TMR elements MTJ1, MTJ2, MTJ3, MTJ4 in the read block. Therefore, the cell array structure is prevented from being complicated.

Moreover, since the read select switch RSW1 is constituted of a comb type MOS transistor, a substantially large channel width can be secured, and a large read current can be passed in order to stabilize the read operation.

[Planar Structure]

FIGS. 10 to 13 show a layout of the respective wiring layers in Device Structure 3 of FIG. 9. Additionally, the sectional area of FIG. 9 corresponds to a sectional area taken along line IX—IX in FIGS. 10 to 13.

Figure 10:
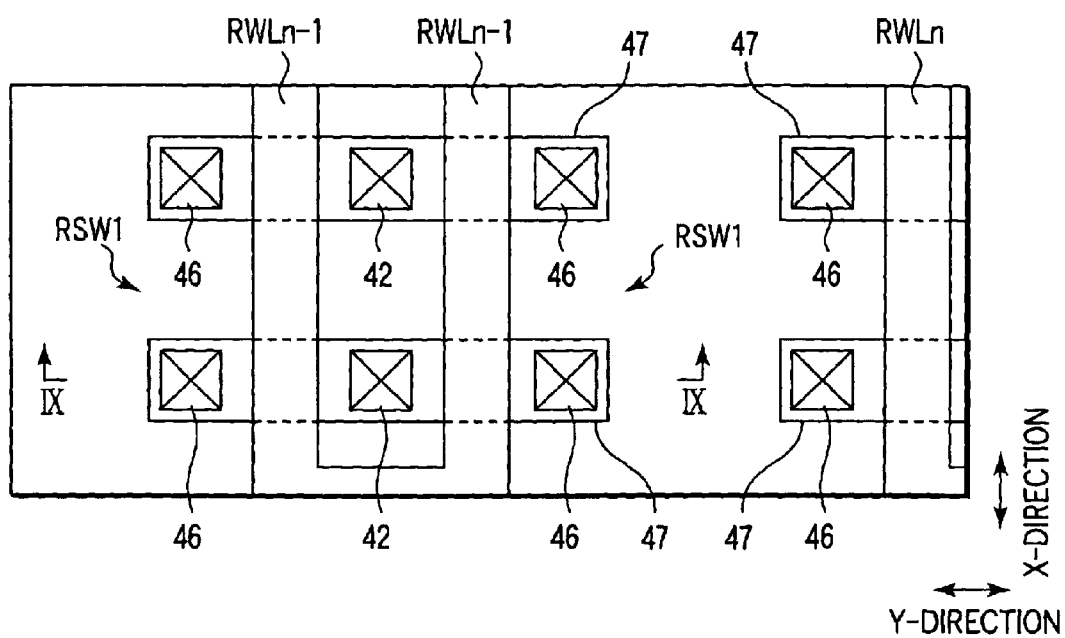
FIG. 10 is a plan view showing a layout of active regions and read word lines of Device Structure 3 according to Structure Example 1.

FIG. 10 shows a layout of the read word lines as the first wiring layer.

The read select switch (MOS transistor) RSW1 is disposed in active areas 47. The contact plug 42 is disposed on the drain of the read select switch RSW1, and the contact plugs 46 are arranged on the source.

On the channel regions between the drains and sources of the read select switches RSW1, the gates of the read select switches RSW1, that is, the read word lines RWLn-1 are arranged. The read word lines RWLn-1 have the comb shapes and extend in the X-direction.

Figure 11:
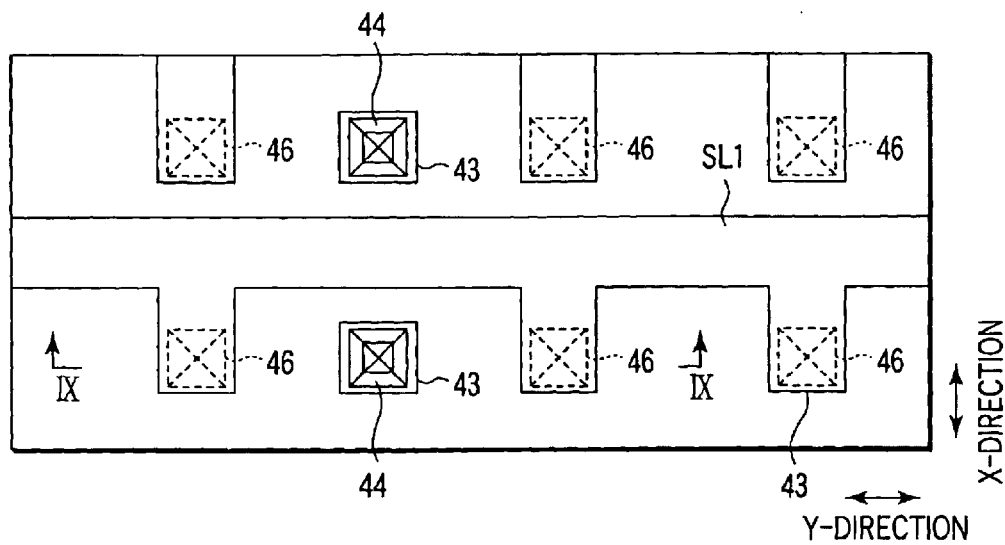
FIG. 11 is a plan view showing a layout of a source line and intermediate connections of Device Structure 3 according to Structure Example 1.

FIG. 11 shows the layout of the source line as the second wiring layer and the intermediate layer.

The source line SL1 extends in the Y-direction (column direction), and is connected to the contact plugs 46. In this example, one source line SL1 is disposed for one column. The source line SL1 is connected to the source of the read select switch RSW1 via the contact plugs 46.

The intermediate layer 43 is connected to the contact plug 42 on the drain of the read select switch RSW1. The contact plug 44 is disposed on the intermediate layer 43.

Figure 12:
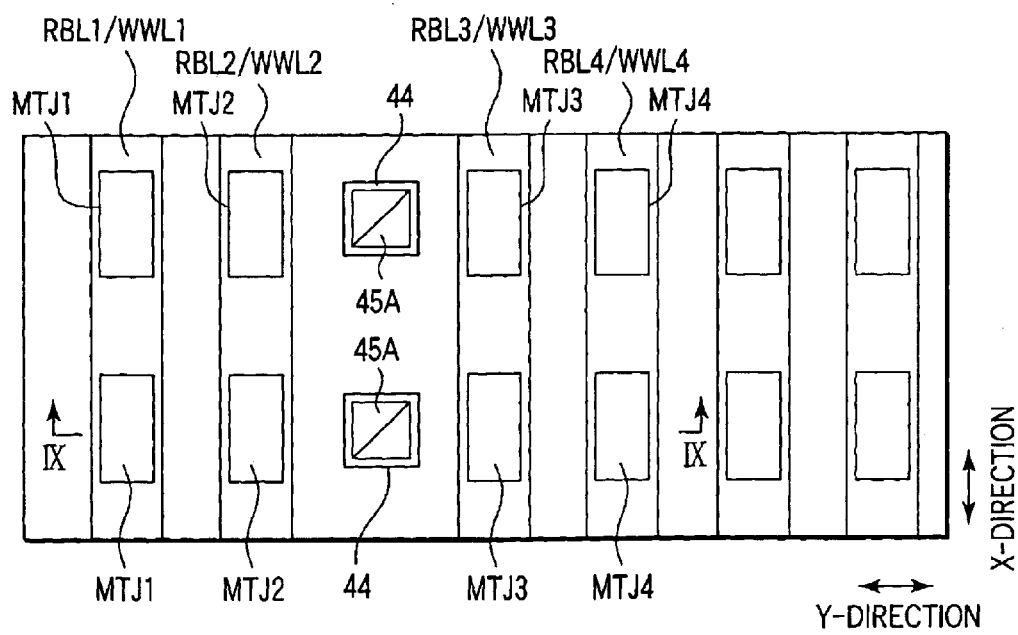
FIG. 12 is a plan view showing a layout of read bit lines or write word lines and TMRs of Device Structure 3 according to Structure Example 1.

FIG. 12 shows a layout of the read bit lines as the third wiring layer and the TMR elements.

The read bit lines RBL1, RBL2, RBL3, RBL4 (write word lines WWL1, WWL2, WWL3, WWL4) extend in the X-direction.

The TMR elements MTJ1, MTJ2, MTJ3, MTJ4 are arranged on the read bit lines RBL1, RBL2, RBL3, RBL4.

The read bit line RBL1 is connected in common to the TMR elements MTJ1 arranged in the X-direction, and the read bit line RBL2 is connected in common to the TMR elements MTJ2 arranged in the X-direction. The read bit line RBL3 is connected in common to the TMR elements MTJ3 arranged in the X-direction, and the read bit line RBL4 is connected in common to the TMR elements MTJ4 arranged in the X-direction.

The axes of easy magnetization of the TMR elements MTJ1, MTJ2, MTJ3, MTJ4 turn to the X-direction. That is, the TMR elements MTJ1, MTJ2, MTJ3, MTJ4 have the rectangular shapes elongated in the X-direction. The intermediate layers 45A are disposed on the contact plugs 44.

Figure 13:
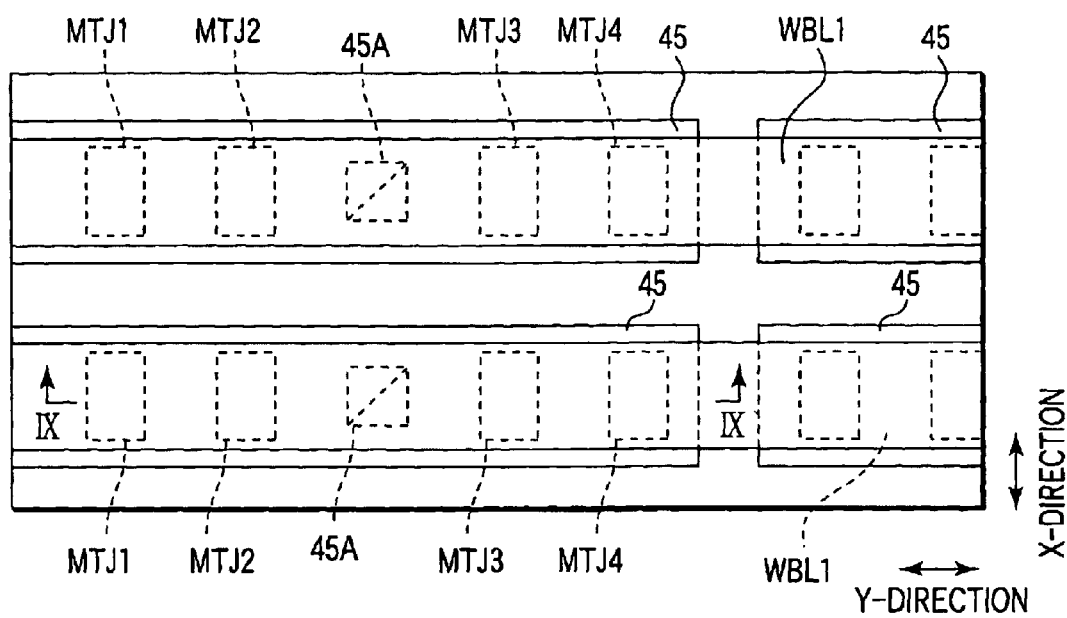
FIG. 13 is a plan view showing a layout of TMR's upper common electrodes and write bit lines of Device Structure 3 according to Structure Example 1.

FIG. 13 shows a layout of the write bit line as the fourth wiring layer.

The upper electrode 45 having the rectangular pattern is disposed on the TMR elements MTJ1, MTJ2, MTJ3, MTJ4 and intermediate layer 45A. The upper electrode 45 contacts the TMR elements MTJ1, MTJ2, MTJ3, MTJ4 and intermediate layer 45A.

Moreover, the write bit lines WBL1, WBL2 extending in the Y-direction are arranged right on the upper electrodes 45.

(2) Structure Example 2

Structure Example 2 is different from Structure Example 1 in that the direction of the read select switch (MOS transistor) RSWL disposed in the read block is rotated by 90°.

In the Structure Example 2, since the channel width of the read select switch RSW1 is equal to the width of the Y-direction, the channel width of the read select switch RSW1 is easily enlarged. That is, in Structure Example 2, the channel width of the read select switch RSW1 is enlarged, the read current is increased, and the read operation can be stabilized.

(2)-1 Circuit Structure

The circuit structure will first be described.

FIG. 14 shows the main part of the magnetic random access memory as Structure Example 2 of the present invention.

The memory cell array 11 has a plurality of TMR elements 12 arranged in an array in the X and Y-directions. In the X-direction, the j TMR elements 12 are arranged, and in the Y-direction, 4×n TMR elements 12 are arranged.

Four TMR elements 12 arranged in the Y-direction constitute one read block BKik (i=1, . . . j, k=1, . . . n), and j read blocks BKik arranged in the X-direction constitute one row. The memory cell array 11 has n rows Moreover, n read blocks BKik arranged in the Y-direction constitute one column. The memory cell array 11 has j columns.

One end of each of four TMR elements 12 in the block BKik is connected in common to the source line SLi (i=1, . . . j), for example, via the read select switch RSW1 constituted of the MOS transistor. The source lines SLi extend in the Y-direction, and only one source line is disposed in one column.

Each source line SLi is connected to the ground point VSS, for example, via the column select switch CSW constituted of the MOS transistor.

During the read operation, the read select switch RSW1 is turned on in the read block BKik in the selected row. Moreover, since the column select switch CSW is turned on in the selected column, the source line SLi is supplied with the ground potential VSS. That is, the read current flows only through the TMR elements 12 in the read block BKik positioned in the intersection of the selected row and column.

Additionally, during the read operation, since the read select switch RSW1 is turned off in the unselected row, the other ends of the TMR elements 12 in the read block BKik of the unselected row are short-circuited from one another.

In this case, when the read bit lines RBL4(n−1)+1, RBL4(n−1)+2, RBL4(n−1)+3, RBL4(n−1)+4 in the unselected row have different potentials, the read operation is sometimes influenced. Therefore, the read bit lines RBL4(n−1)+1, RBL4(n−1)+2, RBL4(n−1)+3, RBL4(n−1)+4 in the unselected column are set to the same potential (e.g., the ground potential).

During the read operation, since the column select switch CSW is off in the unselected column, the other ends of the TMR elements 12 in the read block BKik of the unselected column are also short-circuited from one another.

The other ends of four TMR elements 12 in the read block BKik are independently connected to the read bit lines RBL4(n−1)+1, RBL4(n−1)+2, RBL4(n−1)+3, RBL4(n−1)+4. That is, for the four TMR elements 12 in one read block BKik, four read bit lines RBL4(n−1)+1, RBL4(n−1)+2, RBL4(n−1)+3, RBL4(n−1)+4 are arranged.

The read bit lines RBL4(n−1)+1, RBL4(n−1)+2, RBL4(n−1)+3, RBL4(n−1)+4 extend in the X-direction, and one end of each read bit line is connected to the common data line 30 via the row select switch (MOS transistor) RSW2. The common data line 30 is connected to the read circuit (including, for example, the sense amplifier, selector and output buffer) 29B.

The row select line signals RLi (i=1, . . . n) are inputted into the row select switches RSW2. The row decoders 25-1, . . . , 25-n output row select line signals RLi.

In this example, the read bit lines RBL4(n−1)+1, RBL4(n−1)+2, RBL4(n−1)+3, RBL4(n−1)+4 extend in the X-direction (row direction), and also function as the write word lines WWL4(n−1)+1, WWL4(n−1)+2, WWL4(n−1)+3, WWL4(n−1)+4.

One end of each of the write word lines WWL4(n−1)+1, WWL4(n−1)+2, WWL4(n−1)+3, WWL4(n−1)+4 is connected to the write word line driver 23A via the row select switch RSW2 and common data line 30, and the other ends are connected to the write word line sinkers 24-1, . . . 24-n.

One write bit line WBL1 (i=1, . . . j) shared by these four TMR elements and extending in the Y-direction is disposed in the vicinity of four TMR elements 12 constituting the read block BKik. Only one write bit line WBLi is disposed in one column.

One end of the write bit line WBLi is connected to the circuit block 29A including the column decoder and write bit line driver/sinker, and the other end thereof is connected to the circuit block 31 including the column decoder and write bit line driver/sinker.

During the write operation, the circuit blocks 29A, 31 are brought in the operation state. Moreover, the write current flows toward the circuit block 29A or 31 in the write bit line WBLi in accordance with the write data.

The gate of the read select switch (MOS transistor) RSW1 is connected to the read word line RWLn (n=1, 2, . . . ). Only one read word line RWLn is disposed in one row, and is common to a plurality of blocks BKjk arranged in the X-direction.

For example, when one column is constituted of four blocks, the number of read word lines RWLn is four. Each read word line RWLn extends in the X-direction, and one end thereof is connected to the circuit block 23B-n including the row decoder and read word line driver.

During the write operation, the row decoder 25-n selects one of a plurality of rows based on the row address signal. The write word line driver 23A supplies the write current to the write word lines WWL4(n−1)+1, WWL4(n−1)+2, WWL4(n−1)+3, WWL4(n−1)+4 in the selected row. The write current is absorbed by the write word line sinker 24-n.

During the read operation, the row decoder 25-n selects one of a plurality of rows based on the row address signal. Similarly, the circuit block 23B-n including the row decoder and read word line driver supplies the read voltage (="H") to the read word line RWLn in the selected row.

During the read operation, the column decoder 32 selects one of a plurality of columns based on the column address signals CSL1, . . . CSLj, and turns on the column select switches CSW arranged in the selected column.

In the magnetic random access memory of this example, one end of each of the plurality of TMR elements in the read block is connected in common, and the other ends are connected to the respective different read bit lines RBL4(n−1)+1, RBL4(n−1)+2, RBL4(n−1)+3, RBL4(n−1)+4.

Therefore, the data of the plurality of TMR elements in the read block can be read at once by one read step.

Moreover, the read bit lines RBL4(n−1)+1, RBL4(n−1)+2, RBL4(n−1)+3, RBL4(n−1)+4 also function as the write word lines WWL4(n−1)+1, WWL4(n−1)+2, WWL4(n−1)+3, WWL4(n−1)+4. That is, since it is unnecessary to separately dispose the wiring functioning only as the write word line in the cell array, the cell array structure can be simplified.

(2)-2 Device Structure

The device structure will next be described.

[1] Sectional Structure

Figure 15:
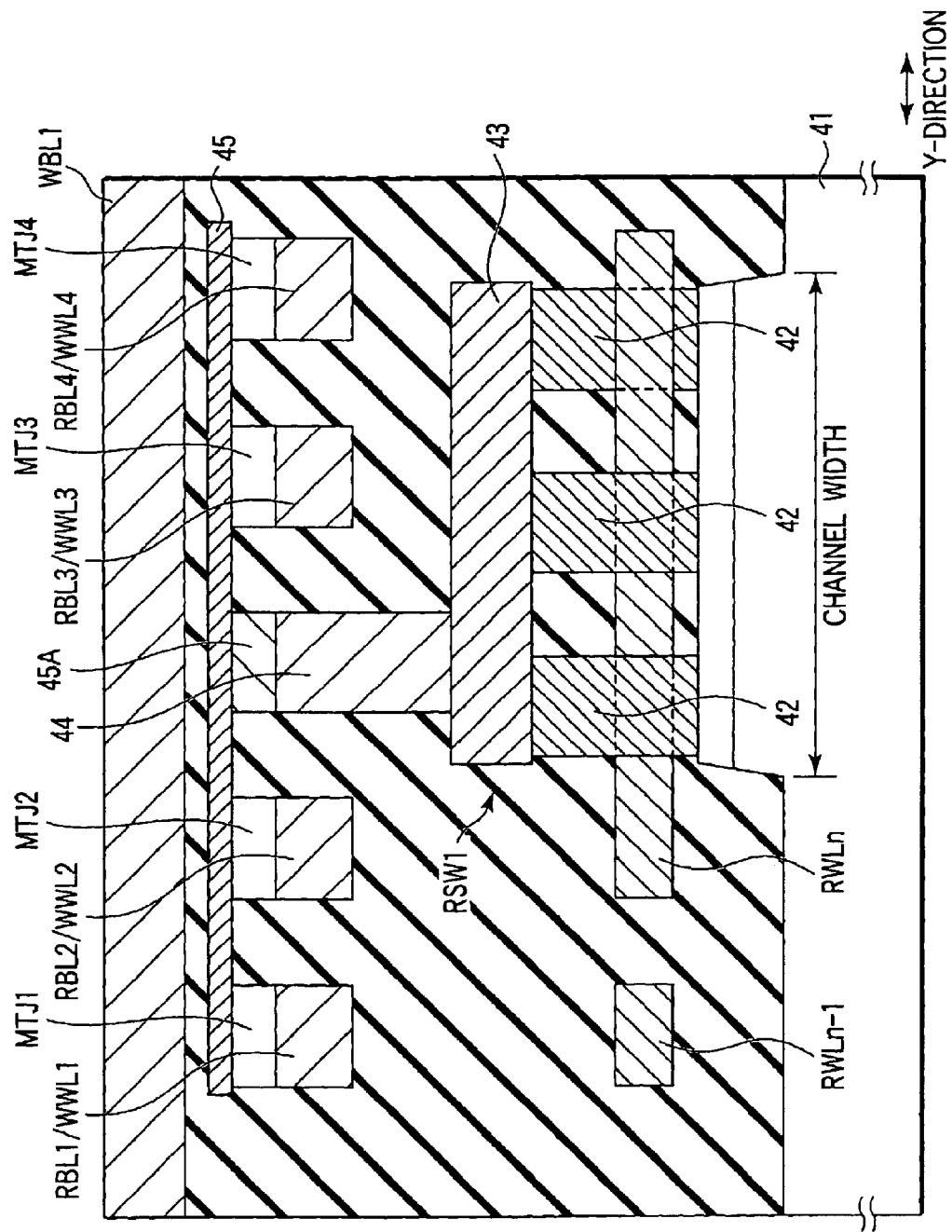
FIG. 15 is a sectional view showing the device structure according to Structure Example 2.

FIG. 15 shows the device structure for one block of the magnetic random access memory as Structure. Example 2 of the present invention.

Additionally, for the correspondence to the elements of the circuit of FIG. 14, the elements shown in FIG. 15 are denoted with the same reference numerals as those of FIG. 14.

The read select switch (MOS transistor) RSW1 is disposed in the surface region of the semiconductor substrate 41. The device structure of Structure Example 2 is different from Device Structures 1, 2, 3 of Structure Example 1 in that the direction of the read select switch RSW1 is rotated by 90°.

That is, the channel width of the read select switch RSW1 corresponds to the width of the Y-direction (column direction), and a channel length corresponds to the length of the X-direction.

Usually, the read select switch is disposed right under the TMR elements (magnetic tunnel junction (MTJ) elements) MTJ1, MTJ2, MTJ3, MTJ4. Moreover, the TMR elements MTJ1, MTJ2, MTJ3, MTJ4 are arranged in the Y-direction. That is, the region right under the TMR elements MTJ1, MTJ2, MTJ3, MTJ4 is short in the X-direction, and long in the Y-direction.

Therefore, when the channel width of the read select switch RSW1 is regarded as the width of the Y-direction (column direction), the channel width of the read select switch RSW1 can be enlarged, the read current is increased, and the read operation can be stabilized.

The source of the read select switch RSWL is connected to the source line via the contact plug. The source line linearly extends, for example, in the Y-direction (column direction), and is connected to the ground supply VSS via the column select switch in the periphery of the memory cell array region.

The gate of the read select switch (MOS transistor) RSW1 forms a read word line RWLn-2. The read word line RWLn-2 extends in the Y-direction. The read word line RWLn-2 extends in the Y-direction right under the TMR elements MTJ1, MTJ2, MTJ3, MTJ4, but is bent substantially at right angles in a predetermined portion, and extends in the X-direction.

On the read select switch RSW1, four TMR elements MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

In this example, the contact portion of the upper electrode 45 and read select switch RSW1 is disposed in the region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, the noise during the read operation by the wiring resistance can be minimized.

Additionally, the intermediate layer 45A may be formed integrally with the upper electrode 45. That is, the intermediate layer 45A and upper electrode 45 may be formed of the same material at the same time. In this case, the device of FIG. 15 is formed as shown in FIG. 89.

The other ends (lower ends in this example) of the TMR elements MTJ1, MTJ2, MTJ3, MTJ4 are electrically connected to the read bit lines RBL1, RBL2, RBL3, RBL4 (write word lines WWL1, WWL2, WWL3, WWL4). The read bit lines RBL1, RBL2, RBL3, RBL4 extend in the X-direction (row direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write bit line WBL1 is disposed right above the TMR elements MTJ1, MTJ2, MTJ3, MTJ4 and in the vicinity of the elements. The write bit line WBL1 extends in the Y-direction (column direction).

In this example, one write bit line WBL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write bit lines may be disposed for the four TMR elements MTJ1, MTJ2, MTJ3, MTJ4.

Moreover, in this example, with respect to the TMR elements MTJ1, MTJ2, MTJ3, MTJ4, the write bit line WBL1 extending in the Y-direction is disposed in the upper portion, and the read bit lines RBL1, RBL2, RBL3, RBL4 extending in the X-direction are disposed in the lower portion.

However, the positional relation of the write bit line WBL1 and read bit lines RBL1, RBL2, RBL3, RBL4 with respect to the TMR elements MTJ1, MTJ2, MTJ3, MTJ4 is not limited to this.

Figure 90:
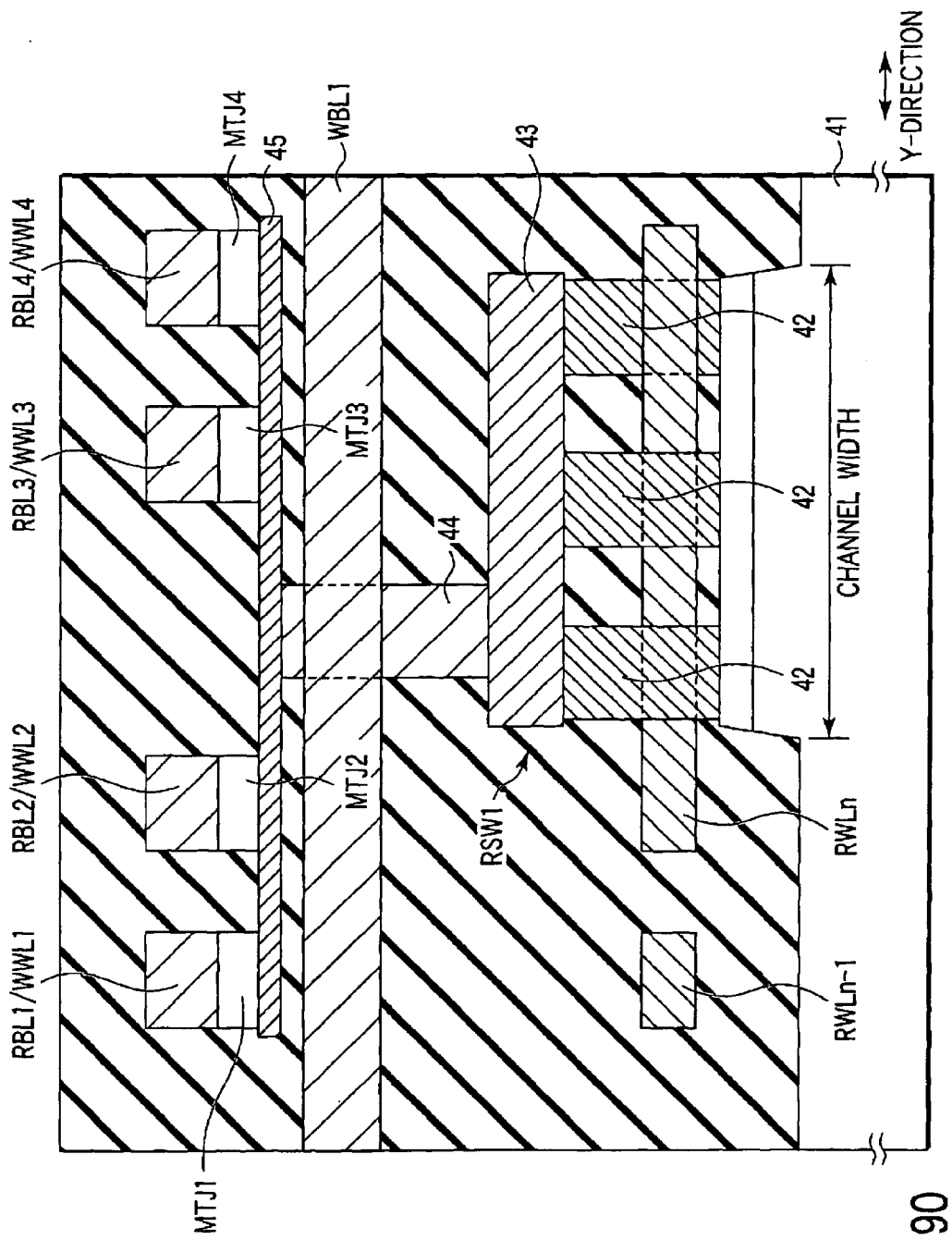
FIG. 90 is a sectional view showing the modification example of the device structure according to Structure Example 2.

For example, as shown in FIG. 90, with respect to the TMR elements MTJ1, MTJ2, MTJ3, MTJ4, the write bit line WBL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to the respective different read bit lines RBL1, RBL2, RBL3, RBL4 (write word lines WWL1, WWL2, WWL3, WWL4).

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW1. Furthermore, the write bit line WBL1 extending in the Y-direction is shared by the plurality of TMR elements MTJ1, MTJ2, MTJ3, MTJ4 in the read block. Therefore, the cell array structure is prevented from being complicated.

Furthermore, the layout of the read select switch RSW1 is determined in such a manner that the channel width of the read select switch (MOS transistor) RSW1 corresponds to the width of the Y-direction (column direction). Therefore, the channel width of the read select switch RSW1 can be broadened, the read current is increased, and the read operation can be stabilized.

[Planar Structure]

FIGS. 16 to 19 show the layouts of the respective wiring layers in the device structure of FIG. 15. Additionally, the sectional area of FIG. 15 corresponds to a sectional area taken along line XV—XV in FIGS. 16 to 19.

Figure 16:
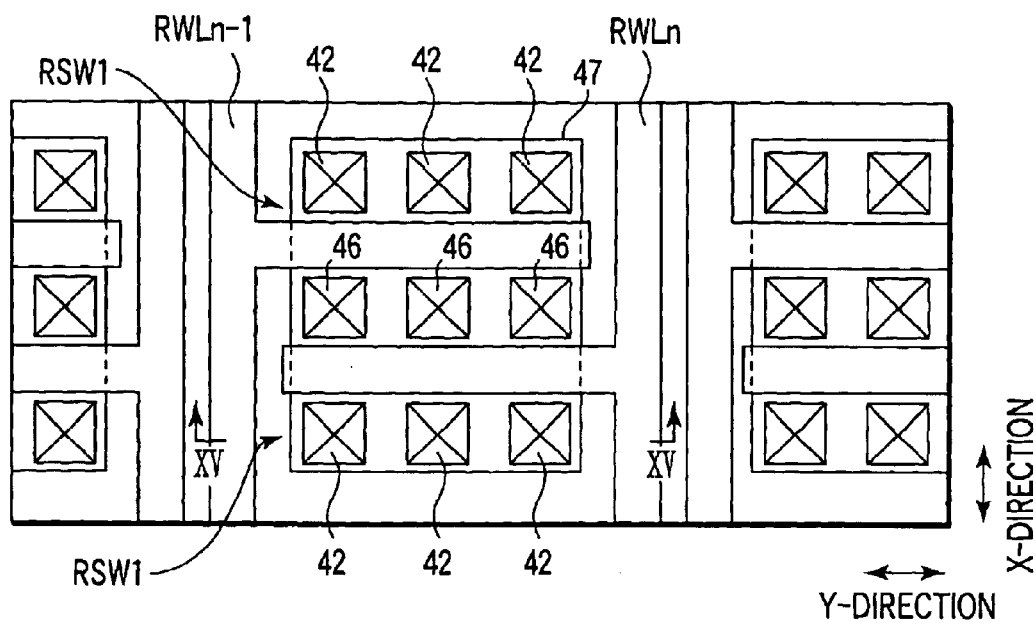
FIG. 16 is a plan view showing a layout of active regions and read word lines of the device structure according to Structure Example 2.

FIG. 16 shows the layout of the read word lines as the first wiring layer.

The read select switch (MOS transistor) RSWL is disposed in the element region 47. The contact plugs 42 are disposed on the drain of the read select switch RSW1, and the contact plugs 46 are arranged on the source.

Additionally, in this example, two read select switches RSW1 disposed adjacent to each other in the X-direction (row direction) share one source.

On the channel regions between the drains and sources of the read select switches RSW1, the gates of the read select switches RSW1, that is, the read word lines RWLn-2 are arranged. The read word lines RWLn-2 extend in the Y-direction on the element region 47, but extend in the X-direction in the regions other than the element region 47.

Figure 17:
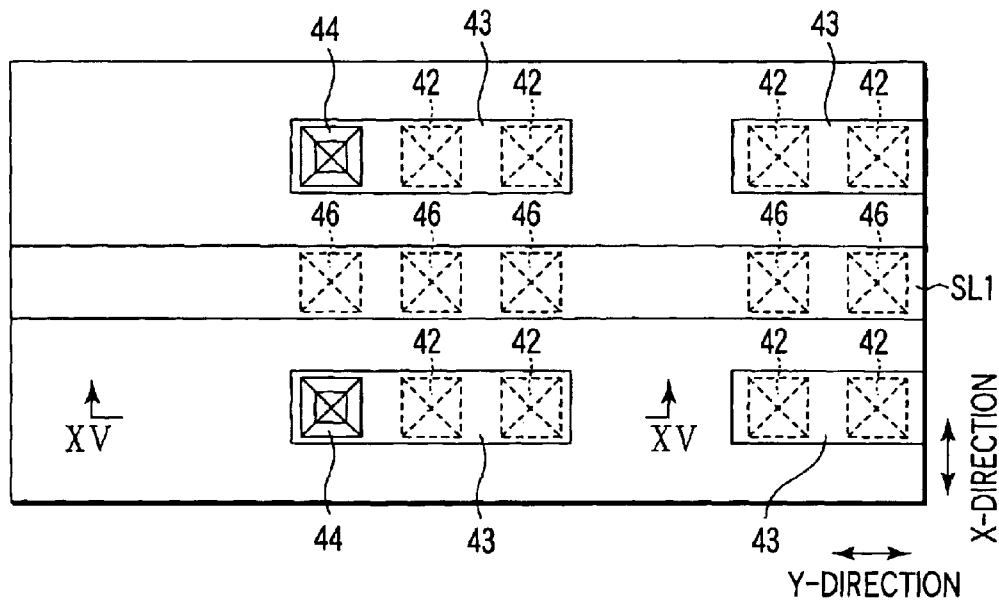
FIG. 17 is a plan view showing a layout of a source line and intermediate connections of the device structure according to Structure Example 2.

FIG. 17 shows the layout of the source line as the second wiring layer and the intermediate layer.

The source line SL1 extends in the Y-direction (column direction), and is connected to the contact plugs 46. In this example, two read select switches RSW1 adjacent to each other in the X-direction (row direction) share one source line SL1. That is, one source line SL1 is disposed with respect to two columns.

The source line SL1 is connected to the source shared by two read select switches RSW1 disposed adjacent to each other via the contact plugs 46. The intermediate layer 43 is connected to the contact plug 42 on the drain of the read select switch RSW1. The contact plug 44 is disposed on the intermediate layer 43.

Figure 18:
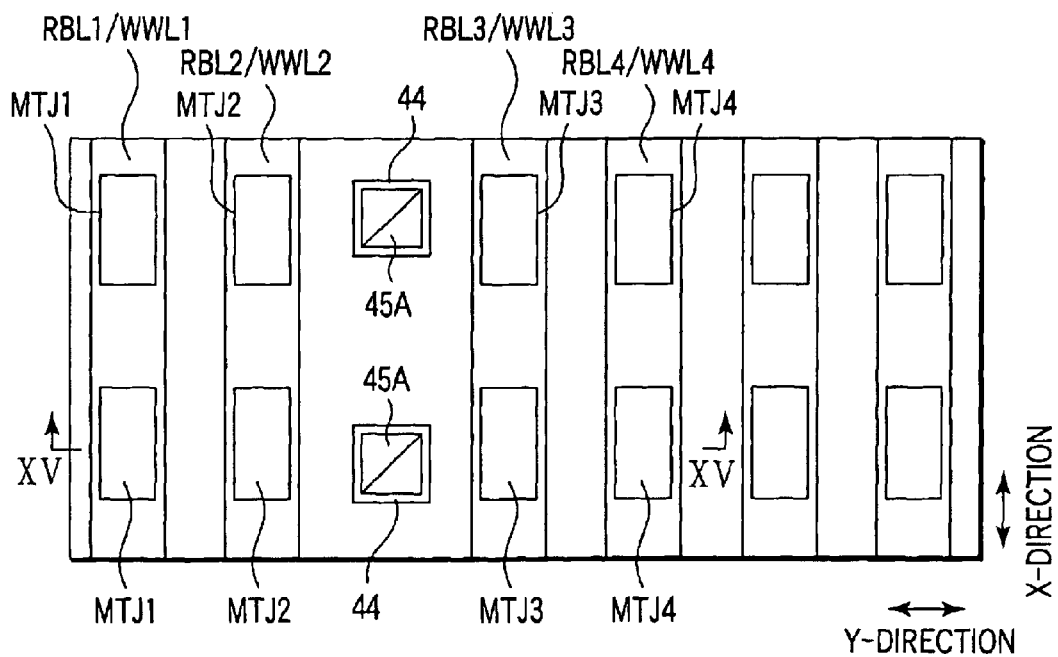
FIG. 18 is a plan view showing a layout of read bit lines or write word lines and TMRs of the device structure according to Structure Example 2.

FIG. 18 shows the layout of the read bit lines as the third wiring layer and the TMR elements.

The read bit lines RBL1, RBL2, RBL3, RBL4 (write word lines WWL1, WWL2, WWL3, WWL4) extend in the X-direction.

The TMR elements MTJ1, MTJ2, MTJ3, MTJ4 are arranged on the read bit lines RBL1, RBL2, RBL3, RBL4.

The read bit line RBL1 is connected in common to the TMR elements MTJ1 arranged in the X-direction, and the read bit line RBL2 is connected in common to the TMR elements MTJ2 arranged in the X-direction. The read bit line RBL3 is connected in common to the TMR elements MTJ3 arranged in the X-direction, and the read bit line RBL4 is connected in common to the TMR elements MTJ4 arranged in the X-direction.

The axes of easy magnetization of the TMR elements MTJ1, MTJ2, MTJ3, MTJ4 turn to the X-direction. That is, the TMR elements MTJ1, MTJ2, MTJ3, MTJ4 have the rectangular shapes elongated in the X-direction. The intermediate layers 45A are disposed on the contact plugs 44.

FIG. 19 shows the layout of the write bit line as the fourth wiring layer.

The upper electrode 45 having the rectangular pattern is disposed on the TMR elements MTJ1, MTJ2, MTJ3, MTJ4 and intermediate layer 45A. The upper electrode 45 contacts the TMR elements MTJ1, MTJ2, MTJ3, MTJ4 and intermediate layer 45A.

Moreover, the write bit lines WBL1, WBL2 extending in the Y-direction are arranged right on the upper electrodes 45.

(3) Structure Example 3

Structure Example 3 is a modification example of Structure Example 1 in that the axis of easy magnetization of the TMR element of Structure Example 1is rotated by 90°.

In Structure Examples 1, 2, each axis of easy magnetization of each TMR element turns to the X-direction, and an axis of difficult magnetization turns to the Y-direction (column direction). That is, the TMR element has the rectangular shape elongated in the X-direction. On the other hand, in Structure Example 3, the axis of easy magnetization of the TMR element turns to the Y-direction, and the axis of difficult magnetization turns to the X-direction. That is, Structure Example 3 has a characteristic that the TMR element has the rectangular shape elongated in the Y-direction.

With the magnetic random access memory, the direction of the write current flowing through a write line extending in a direction parallel to the axis of difficult magnetization, and the data is written in the memory cell (the direction of magnetization of a pinning layer is determined).

Therefore, in this example, during the write operation, the direction of the write current flowing through each write bit line (read bit line) extending in the X-direction is controlled, the data to be written in the memory cell is determined.

Additionally, in general, the write line extending along the axis of difficult magnetization (direction parallel to a short axis of MTJ) is referred to as the write bit line.

(3)-1 Circuit Structure

FIG. 20 shows the main part of the magnetic random access memory as Structure Example 3 of the present invention.

The memory cell array 11 has a plurality of TMR elements 12 arranged in the array in the X and Y-directions. In the X-direction, the j TMR elements 12 are arranged, and in the Y-direction, 4×n TMR elements 12 are arranged.

Four TMR elements 12 arranged in the Y-direction constitute one read block BKik (i=1, . . . j, k=1, . . . n), and the j read blocks BKik arranged in the X-direction constitute one row. The memory cell array 11 has the n rows. Moreover, the n read blocks BKik arranged in the Y-direction constitute one column. The memory cell array 11 has the j columns.

One end of each of four TMR elements 12 in the block BKik is connected in common to the source line SLi (i=1, . . . j), for example, via the read select switch RSW1 constituted of the MOS transistor. The source lines SLi extend in the Y-direction, and only one source line is disposed in one column.

Each source line SLi is connected to the ground point VSS, for example, via the column select switch CSW constituted of the MOS transistor.

During the read operation, the read select switch RSW1 is turned on in the read block BKik in the selected row. Moreover, since the column select switch CSW is turned on in the selected column, the source line SLi is supplied with the ground potential VSS. That is, the read current flows only through the TMR elements 12 in the read block BKik positioned in the intersection of the selected row and column.

Additionally, during the read operation, since the read select switch RSW1 is off in the unselected row, the other ends of the TMR elements 12 in the read block BKik of the unselected row are short-circuited from one another.

In this case, when the read bit lines RBL4(n−1)+1, RBL4(n−1)+2, RBL4(n−1)+3, RBL4(n−1)+4 in the unselected row have different potentials, the read operation is sometimes influenced. Therefore, the read bit lines RBL4(n−1)+1, RBL4(n−1)+2, RBL4(n−1)+3, RBL4(n−1)+4 in the unselected column are set to the same potential (e.g., the ground potential).

During the read operation, since the column select switch CSW is off in the unselected column, the other ends of the TMR elements 12 in the read block BKik of the unselected column are also short-circuited from one another.

The other ends of four TMR elements 12 in the read block BKik are independently connected to the read bit lines RBL4(n−1)+1, RBL4(n−1)+2, RBL4(n−1)+3, RBL4(n−1)+4. That is, for the four TMR elements 12 in one read block BKik, four read bit lines RBL4(n−1)+1, RBL4(n−1)+2, RBL4(n−1)+3, RBL4(n−1)+4 are arranged.

The read bit lines RBL4(n−1)+1, RBL4(n−1)+2, RBL4(n−1)+3, RBL4(n−1)+4 extend in the X-direction, and one end of each read bit line is connected to a common data line 30A via the row select switch (MOS transistor) RSW2. The common data line 30A is connected to the read circuit (including, for example, the sense amplifier, selector and output buffer) 29B.

The row select line signals RLi (i=1, . . . n) are inputted into row select switches RSW2. The row decoders 25-1, . . . , 25-n output the row select line signals RLi.

In this example, the read bit lines RBL4(n−1)+1, RBL4(n−1)+2, RBL4(n−1)+3, RBL4(n−1)+4 extend in the X-direction (row direction), and also function as the write bit lines WBL4(n−1)+1, WBL4(n−1)+2, WBL4(n−1)+3, WBL4(n−1)+4.

One end of each of the write bit lines WBL4(n−1)+1, WBL4(n−1)+2, WBL4(n−1)+3, WBL4(n−1)+4 is connected to a write bit line driver/sinker 23AR via the row select switch RSW2 and common data line 30A, and the other ends are connected to a write bit line driver/sinker 23AS via the row select switch RSW2 and common data line 30B.

One write word line WWLi (i=1, . . . j) shared by these four TMR elements and extending in the Y-direction is disposed in the vicinity of four TMR elements 12 constituting the read block BKik. Only one write word line WWLi is disposed in one column.

One end of the write word line WWLi is connected to a circuit block 29AR including the column decoder and write bit line driver, and the other end thereof is connected to a circuit block 31R including the column decoder and write word line sinker.

During the write operation, the circuit blocks 29A, 31R are brought in the operation state. Moreover, the write current flows toward the circuit block 31R from the circuit block 29A in the write word line WWLi.

The gate of the read select switch (MOS transistor) RSW1 is connected to the read word line RWLn (n=1, 2, . . . ). Only one read word line RWLn is disposed in one row, and is common to a plurality of blocks BKjk arranged in the X-direction.

For example, when one column is constituted of four blocks, the number of read word lines RWLn is four. Each read word line RWLn extends in the X-direction, and one end thereof is connected to the circuit block 23B-n including the row decoder and read word line driver.

During the write operation, the row decoder 25-n selects one of a plurality of rows based on the row address signal. Write bit line drivers/sinkers 23AR, 23AS supply write currents to the write bit lines WBL4(n−1)+1, WBL4(n−1)+2, WBL4(n−1)+3, WBL4(n−1)+4 in the selected row in accordance with the write data.

During the read operation, the row decoder 25-n selects one of a plurality of rows based on the row address signal. Similarly, the circuit block 23B-n including the row decoder and read word line driver supplies the read voltage (="H") to the read word line RWLn in the selected row.

During the read operation, the column decoder 32 selects one of a plurality of columns based on the column address signals CSL1, . . . CSLj, and turns on the column select switches CSW arranged in the selected column.

In the magnetic random access memory of this example, one end of each of the plurality of TMR elements in the read block is connected in common, and the other ends are connected to the respective different read bit lines RBL4(n−1)+1, RBL4(n−1)+2, RBL4(n−1)+3, RBL4(n−1)+4.

Therefore, the data of the plurality of TMR elements in the read block can be read at once by one read step.

Moreover, the read bit lines RBL4(n−1)+1, RBL4(n−1)+2, RBL4(n−1)+3, RBL4(n−1)+4 also function as the write bit lines WBL4(n−1)+1, WBL4(n−1)+2, WBL4(n−1)+3, WBL4(n−1)+4. That is, since it is unnecessary to separately dispose the wiring functioning only as the write bit line in the cell array, the cell array structure can be simplified.

(3)-2 Device Structure

The device structure will next be described.

[1] Sectional Structure

Figure 21:
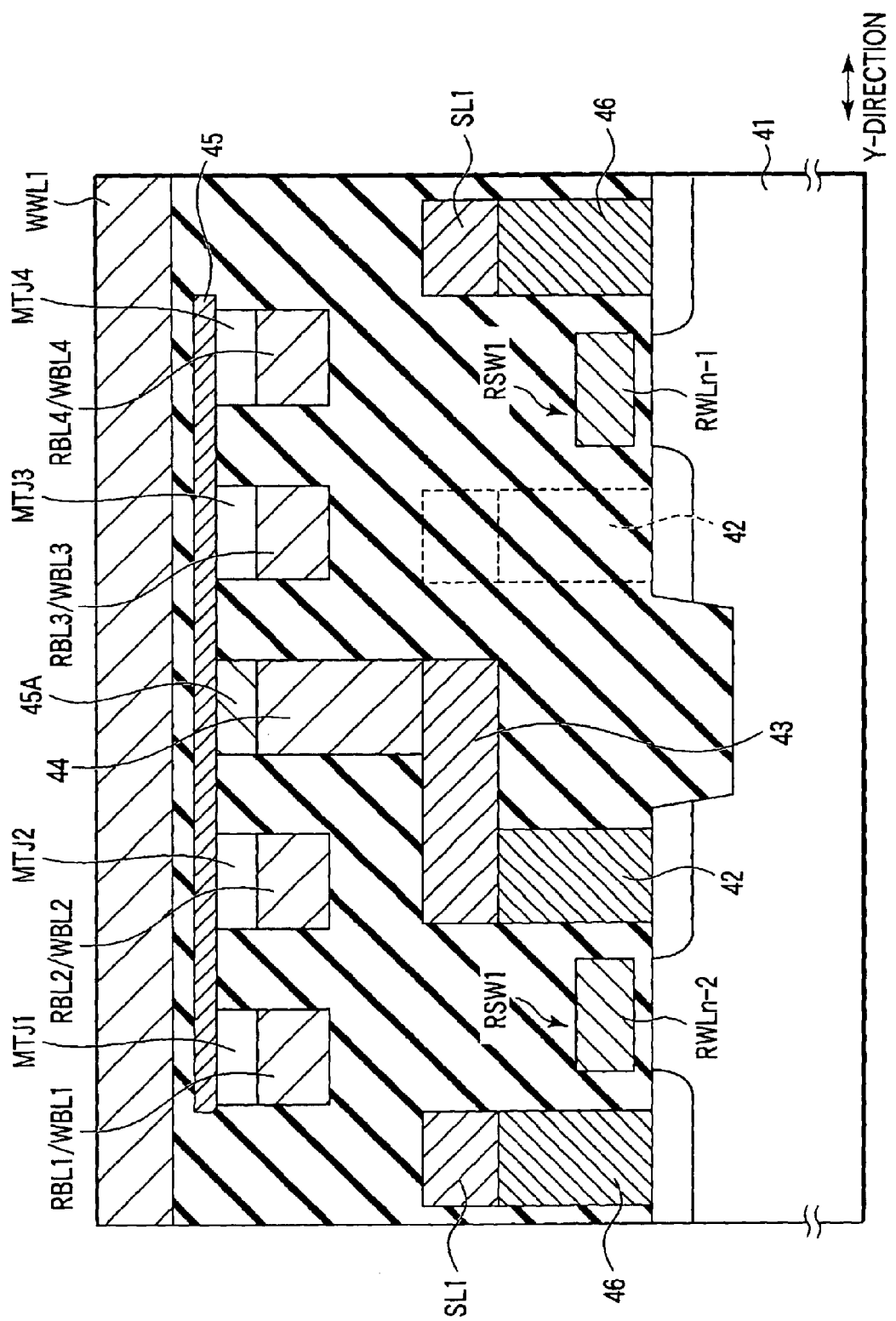
FIG. 21 is a sectional view showing the device structure according to Structure Example 3.

FIG. 21 shows the device structure for one block of the magnetic random access memory as Structure Example 3 of the present invention.

Additionally, for the correspondence to the elements of the circuit of FIG. 20, the elements shown in FIG. 21 are denoted with the same reference numerals as those of FIG. 20.

The read select switch (MOS transistor) RSW1 is disposed in the surface region of the semiconductor substrate 41. The device structure of Structure Example 2 is slightly different from Device Structure 1 in the position of the read select switch RSW1.

The source of the read select switch RSW1 is connected to the source line via the contact plug. The source line linearly extends, for example, in the Y-direction (column direction), and is connected to the ground point VSS via the column select switch in the periphery of the memory cell array region.

The gate of the read select switch (MOS transistor) RSW1 forms a read word line RWL1. The read word line RWL1 extends in the X-direction. On the read select switch RSW1, four TMR elements MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

In Device Structure 2, the contact portion of the upper electrode 45 and read select switch RSWL is disposed in the region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, the noise during the read operation by the wiring resistance can be minimized.

Figure 91:
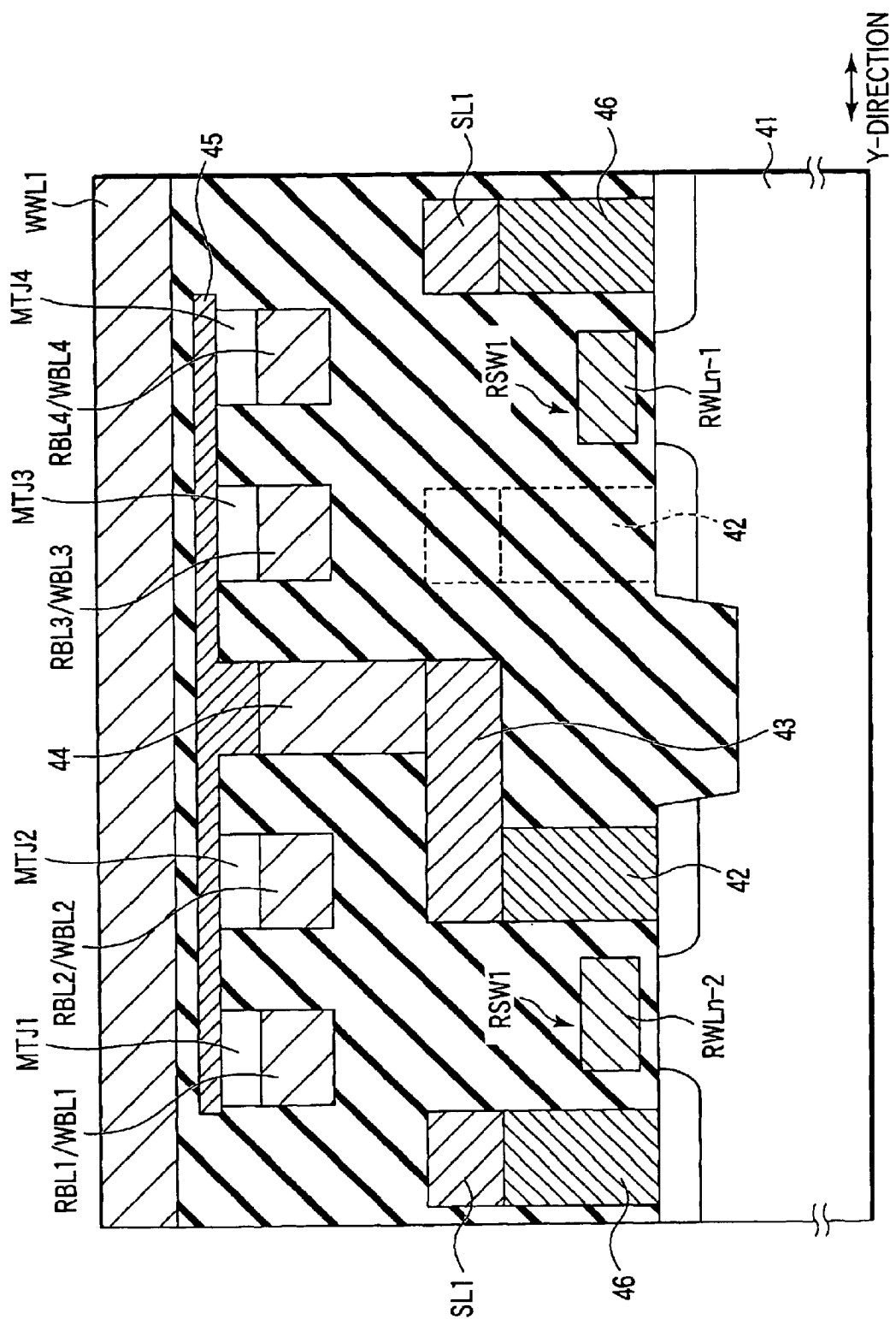
FIG. 91 is a sectional view showing the modification example of the device structure according to Structure Example 3.

Additionally, the intermediate layer 45A may be formed integrally with the upper electrode 45. That is, the intermediate layer 45A and upper electrode 45 may be formed of the same material at the same time. In this case, the device of FIG. 21 is formed as shown in FIG. 91.

The other ends (lower ends in this example) of the TMR elements MTJ1, MTJ2, MTJ3, MTJ4 are electrically connected to the read bit lines RBL1, RBL2, RBL3, RBL4 (write bit lines WBL1, WBL2, WBL3, WBL4). The read bit lines RBL1, RBL2, RBL3, RBL4 extend in the X-direction (row direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write word line WWL1 is disposed right above the TMR elements MTJ1, MTJ2, MTJ3, MTJ4 and in the vicinity of the elements. The write word line WWL1 extends in the Y-direction (column direction).

In this example, one write word line WWL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write word lines may be disposed for the four TMR elements MTJ1, MTJ2, MTJ3, MTJ4.

Moreover, in this example, with respect to the TMR elements MTJ1, MTJ2, MTJ3, MTJ4, the write word line WWL1 extending in the Y-direction is disposed in the upper portion, and the read bit lines RBL1, RBL2, RBL3, RBL4 extending in the X-direction are disposed in the lower portion.

However, the positional relation of the write word line WWL1 and read bit lines RBL1, RBL2, RBL3, RBL4 with respect to the TMR elements MTJ1, MTJ2, MTJ3, MTJ4 is not limited to this.

Figure 92:
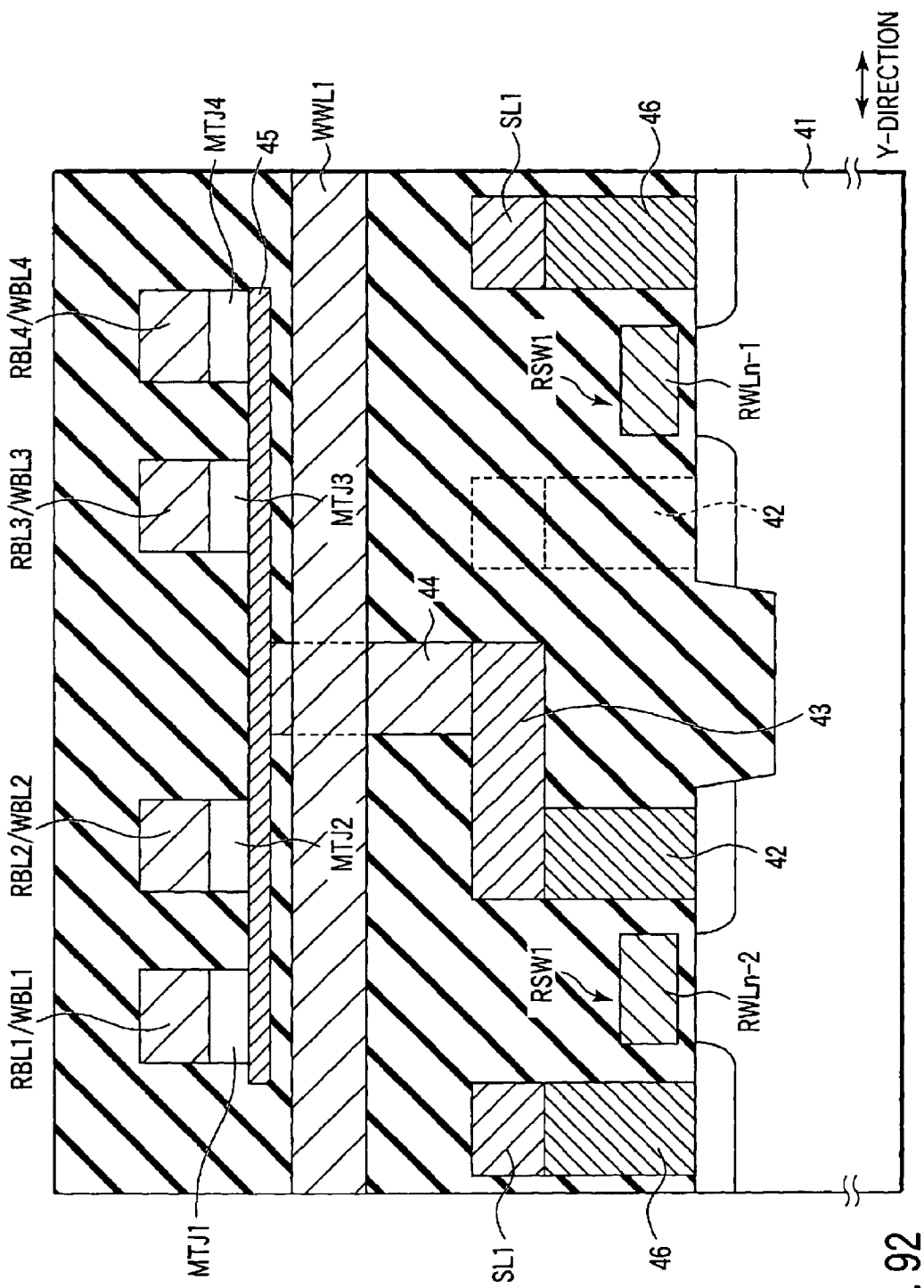
FIG. 92 is a sectional view showing the modification example of the device structure according to Structure Example 3.

For example, as shown in FIG. 92, with respect to the TMR elements MTJ1, MTJ2, MTJ3, MTJ4, the write word line WWL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to the respective different read bit lines RBL1, RBL2, RBL3, RBL4 (write bit lines WBL1, WBL2, WBL3, WBL4).

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW1. Furthermore, the write word line WWL1 extending in the Y-direction is shared by the plurality of TMR elements MTJ1, MTJ2, MTJ3, MTJ4 in the read block. Therefore, the cell array structure is prevented from being complicated.

[Planar Structure]

FIGS. 22 to 25 show the layouts of the respective wiring layers in the device structure of FIG. 21. Additionally, the sectional area of FIG. 21 corresponds to a sectional area taken along line XXI—XXI in FIGS. 22 to 25.

Figure 22:
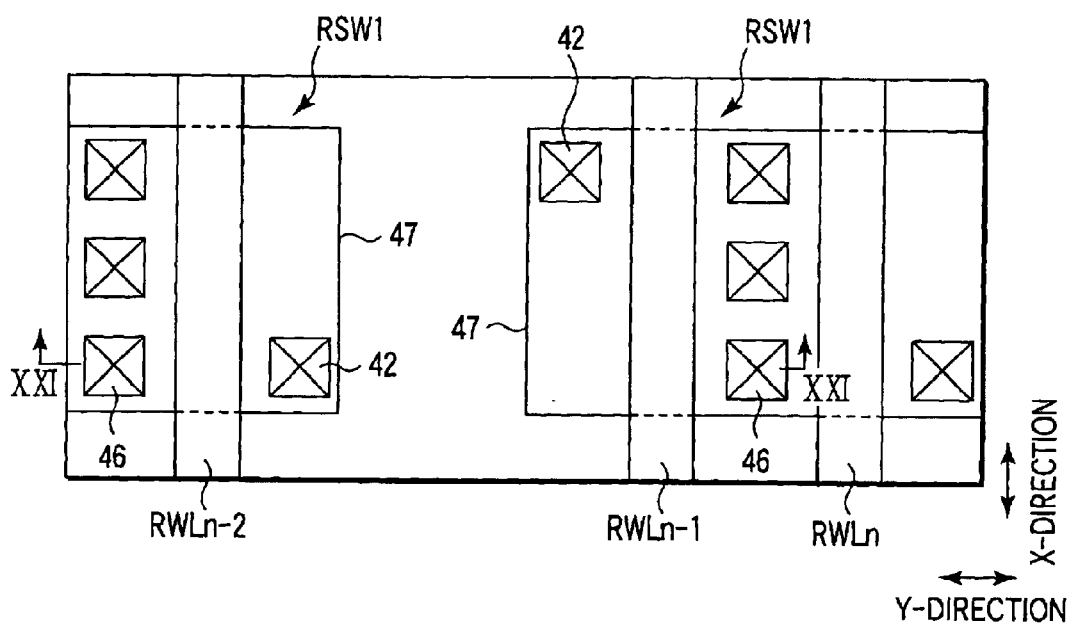
FIG. 22 is a plan view showing a layout of active regions and read word lines of the device structure according to Structure Example 3.

FIG. 22 shows the layout of the read word lines as the first wiring layer.

The read select switch (MOS transistor) RSW1 is disposed in active areas 47. The contact plug 42 is disposed on the drain of the read select switch RSW1, and the contact plugs 46 are arranged on the source.

Additionally, in this example, two read select switches RSW1 disposed adjacent to each other in the X-direction (row direction) share one source.

On the channel regions between the drains and sources of the read select switches RSW1, the gates of the read select switches RSW1, that is, the read word lines RWLn-2, RWLn-1, RWLn are arranged. The read word lines RWLn-2, RWLn-1, RWLn extend in the X-direction.

Figure 23:
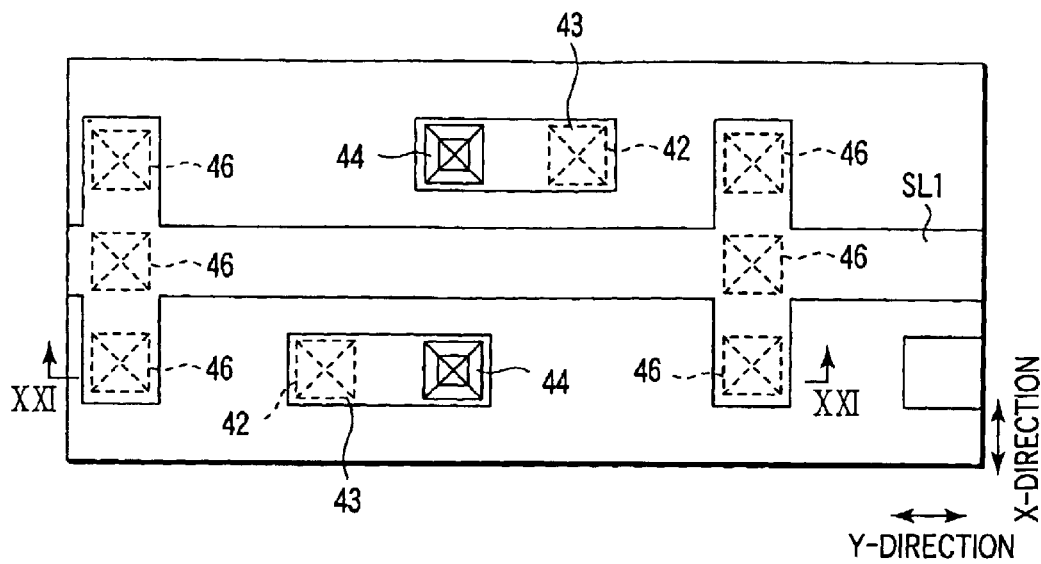
FIG. 23 is a plan view showing a layout of a source line and intermediate connections of the device structure according to Structure Example 3.

FIG. 23 shows the layout of the source line as the second wiring layer and the intermediate layer.

The source line SL1 extends in the Y-direction (column direction), and is connected to the contact plugs 46. In this example, two read select switches RSW1 adjacent to each other in the X-direction (row direction) share one source line SL1. That is, one source line SL1 is disposed with respect to two columns.

The source line SL1 is connected to the source shared by two read select switches RSW1 disposed adjacent to each other in the X-direction via the contact plugs 46. The intermediate layer 43 is connected to the contact plug 42 on the drain of the read select switch RSW1. The contact plug 44 is disposed on the intermediate layer 43.

Figure 24:
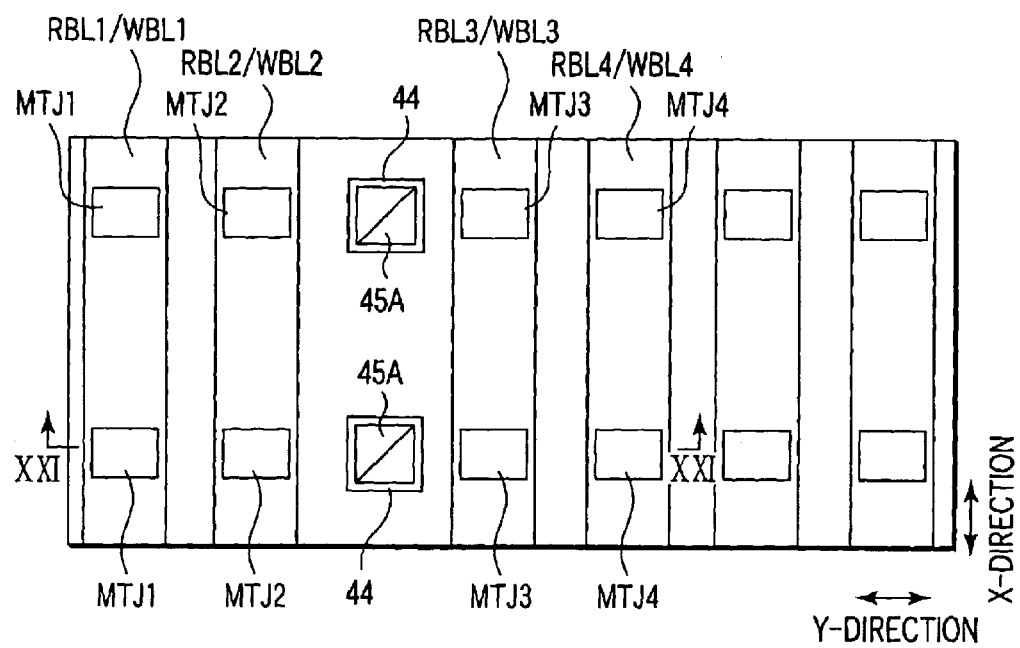
FIG. 24 is a plan view showing a layout of read bit lines or write bit lines and TMRs of the device structure according to Structure Example 3.

FIG. 24 shows the layout of the read bit lines as the third wiring layer and the TMR elements.

The read bit lines RBL1, RBL2, RBL3, RBL4 (write bit lines WBL1, WBL2, WBL3, WBL4) extend in the X-direction.

The TMR elements MTJ1, MTJ2, MTJ3, MTJ4 are arranged on the read bit lines RBL1, RBL2, RBL3, RBL4.

The read bit line RBL1 is connected in common to the TMR elements MTJ1 arranged in the X-direction, and the read bit line RBL2 is connected in common to the TMR elements MTJ2 arranged in the X-direction. The read bit line RBL3 is connected in common to the TMR elements MTJ3 arranged in the X-direction, and the read bit line RBL4 is connected in common to the TMR elements MTJ4 arranged in the X-direction.

The axes of easy magnetization of the TMR elements MTJ1, MTJ2, MTJ3, MTJ4 turn to the Y-direction. That is, the TMR elements MTJ1, MTJ2, MTJ3, MTJ4 have the rectangular shapes elongated in the Y-direction. The intermediate layers 45A are disposed on the contact plugs 44.

Figure 25:
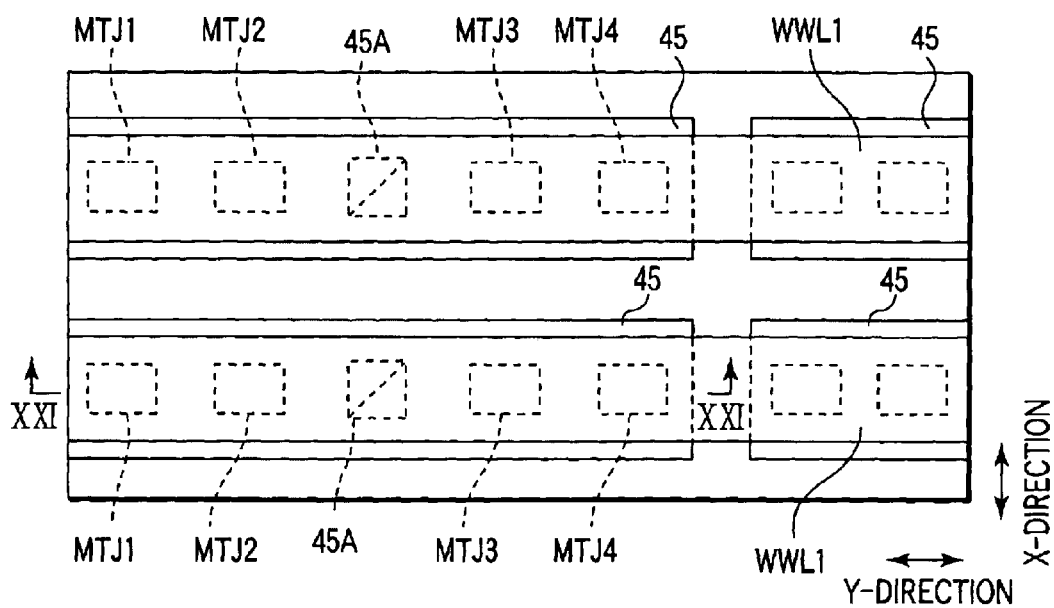
FIG. 25 is a plan view showing a layout of TMR's upper common electrodes and write word lines of the device structure according to Structure Example 3.

FIG. 25 shows the layout of the write word line as the fourth wiring layer.

The upper electrode 45 having the rectangular pattern is disposed on the TMR elements MTJ1, MTJ2, MTJ3, MTJ4 and intermediate layer 45A. The upper electrode 45 contacts the TMR elements MTJ1, MTJ2, MTJ3, MTJ4 and intermediate layer 45A.

Moreover, the write word lines WWL1 extending in the Y-direction are arranged right on the upper electrodes 45.

(4) Structure Examples 4, 5, 6

Structure Examples 4, 5, 6 constituted by improving Structure Example 1 will next be described.

(4)-1 Structure Example 4

FIG. 26 shows the main part of the magnetic random access memory as Structure Example 4 of the present invention.

Structure Example 4 is characterized in that a bias potential VC is given to one end of each of four TMR elements 12 constituting the read block BKik.

That is, in Structure Example 1 (FIG. 1), the source line SLi is connected to the ground point VSS via the column select switch CSW. Therefore, in Structure Example 1, during the read operation, the read circuit 29B generates the bias potential VC, and the read current is supplied to the TMR element 12 from the read circuit 29B.

On the other hand, in Structure Example 4, the source line SLi connected in common to one end of each of four TMR elements 12 constituting the read block BKik is connected to a bias line 34 via the column select switch CSW.

Therefore, during the read operation, the bias potential VC is given to the bias line 34, and the read current is given to the TMR element 12 via the bias line 34. Additionally, during the operations (e.g., the write operation) other than the read operation, the ground potential VSS is given to the bias line 34.

In this manner, Structure Example 4 is constituted such that the potential of the source line SLi can be changed. Therefore, for example, during the read operation, the bias potential VC is given to the TMR element 12 via the source line SLi, and the read current can be passed through the TMR elements 12 in the read block BKik.

(4)-2 Structure Example 5

Figure 27:
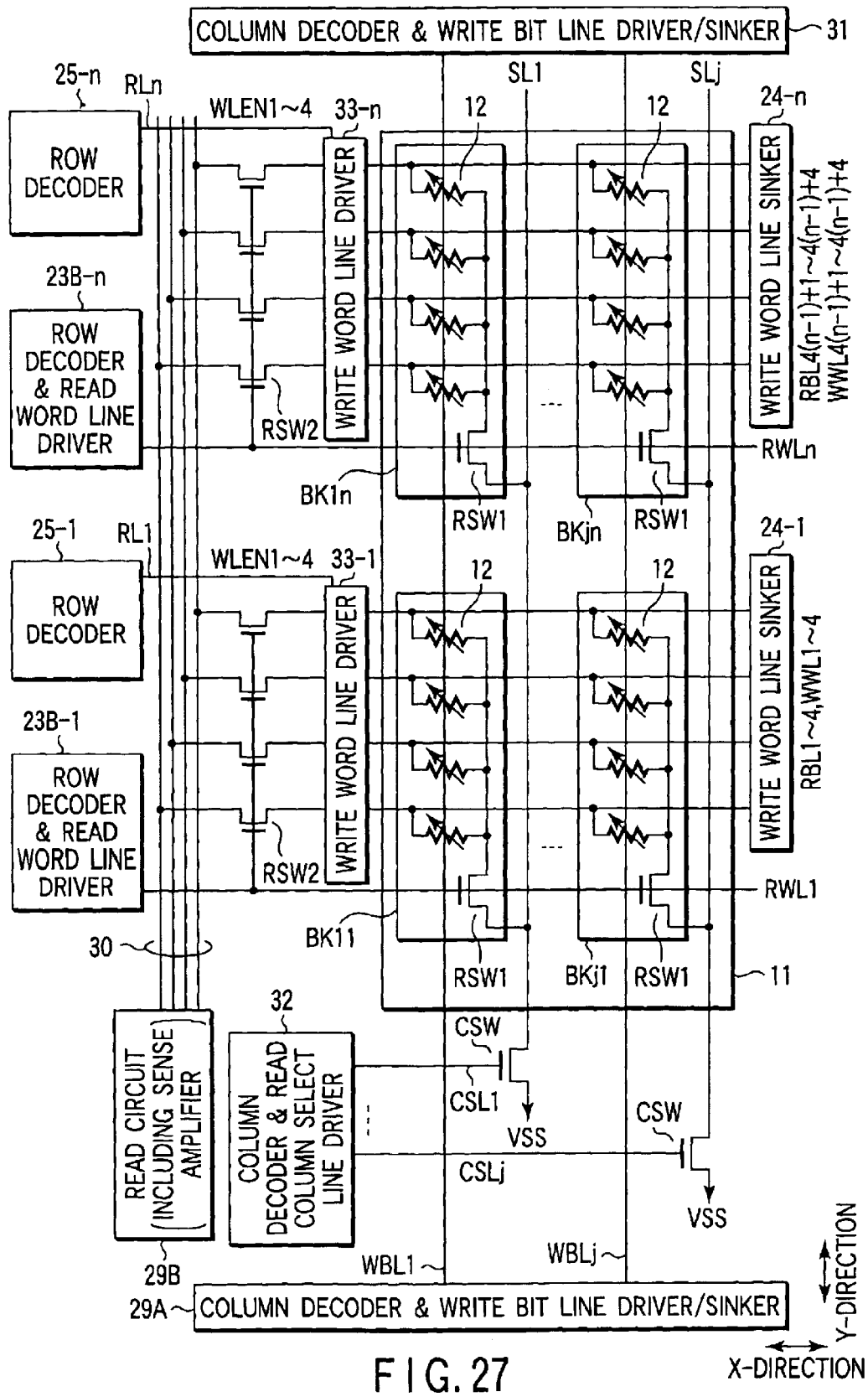
FIG. 27 is a circuit diagram according to Structure Example 5 of the magnetic random access memory of the present invention.

FIG. 27 shows the main part of the magnetic random access memory as Structure Example 5 of the present invention.

Structure Example 5 is characterized in that one write word line driver is disposed in one row of the memory cell array.

In Structure Example 1 (FIG. 1), only one write word line driver 23A is disposed in common to all the rows of the memory cell array 11, and connected to the common data line (common driver line) 30. However, in this case, since elements having resistance, that is, the common data line and row select switch are connected between the write word line driver and the write word line, a voltage drop by these elements increases, and the write current is reduced.

To solve the problem, in Structure Example 5, one of write word line drivers 33-1, . . . 33-n is disposed in one row of the memory cell array 11.

That is, in the respective rows of the memory cell arrays 11, the write word line drivers 33-1, . . . 33-n are connected between the row select switch RSW2 and the write word lines WWL4(n−1)+1, WWL4(n−1)+2, WWL4(n−1)+3, WWL4(n−1)+4.

In this case, the write word line drivers 33-1, . . . 33-n may drive only the write word lines WWL4(n−1)+1, WWL4(n−1)+2, WWL4(n−1)+3, WWL4(n−1)+4.

Therefore, driving forces of the write word line drivers 33-1, . . . 33-n can be reduced, and this example can also contribute to lower power consumption and high-speed operation.

Additionally, since the read current is much smaller than the write current, the driving force of the row select switch RSW2 does not have to be enlarged.

The write word line drivers 33-1, . . . 33-n are controlled by output signals (word line enable signals) WLEN1, . . . WLEN4 of the row decoders 25-1, . . . 25-n. That is, during the write operation, the row decoders 25-1, . . . 25-n are activated, and select one row. In the selected row, one of the output signals (word line enable signals) WLEN1, . . . WLEN4 is "H".

Moreover, in Structure Example 1, the row select switch RSW2 is controlled by the output signals of the row decoders 25-1, . . . 25-n activated only during the write operation. However, in Structure Example 5, the switch is controlled by the output signals of circuit blocks 23B-1, . . . 23B-n including the row decoders and read word line drivers.

That is, since the gate of the row select switch (MOS transistor) RSW2 is connected to the read word lines RWL1, . . . RWLn, the row select switch RSW2 performs the same operation as that of the read select switch RSW1.

The reason why this example is structured in this manner is that in Structure Example 5, each of the write word line drivers 33-1, . . . 33-n is disposed for each row, and therefore during the write operation all of the write word lines WWL4(n−1)+1, WWL4(n−1)+2, WWL4(n−1)+3, WWL4(n−1)+4 need to be separated from the common data line 30.

That is, since the circuit blocks 23B-1, . . . 23B-n including the row decoders and read word line drivers are activated only during the read operation, the row select switches RSW2 of all the rows are turned off, and all the write word lines WWL4(n−1)+1, WWL4(n−1)+2, WWL4(n−1)+3, WWL4(n−1)+4 are separated from the common data line 30 during the write operation.

(4)-3 Structure Example 6

FIG. 28 shows the main part of the magnetic random access memory as Structure Example 6 of the present invention.

Structure Example 6 is characterized in that a block select switch BSW constituted of the MOS transistor is newly disposed in the read block, and only the read blocks belonging to the selected row and column are electrically connected to the read bit lines during the read operation.

Since the memory cell is enlarged in this structure, the structure is disadvantageous for high integration of the memory cell. However, one example of the cell array structure will be described hereinafter.

The gates of the block select switches (MOS transistors) BSW are connected to column select lines CSLi (i=1, . . . j), and the block select switches BSW are controlled by the column address signals. That is, during the read operation, only the block select switches BSW in the read block BKik belonging to the selected column are in the on state.

When Structure Example 6 is used, during the read operation, the column select switch CSW off in the unselected column, and therefore the other ends of the TMR elements 12 in the read block BKik of the unselected column are short-circuited from one another. However, at the same time, the block select switch BSW also off in the read block BKik of the unselected column.

Therefore, during the read operation, only the TMR elements MTJ1, MTJ2, MTJ3, MTJ4 in the selected read block BKik are electrically connected to the read bit lines RBL4(n−1)+1, RBL4(n−1)+2, RBL4(n−1)+3, RBL4(n−1)+4 in the selected row.

(5) Structure Example 7

Structure Example 7 shows that one read block is constituted of four TMR elements. Structure Example 7 is different from Structure Example 1 in the direction in which the read word line and source line connected to the read select transistor in the read block extend.

In Structure Example 7, the read word line extends in the Y-direction, and the source line extends in the X-direction. Accordingly, it should be noted that the row and column directions of Structure Example 7 are replaced as compared with Structure Example 1. That is, the row decoder corresponds to the Y-direction, and the column direction corresponds to the X-direction.

(5)-1 Circuit Structure

First, a circuit structure will be described.

Figure 29:
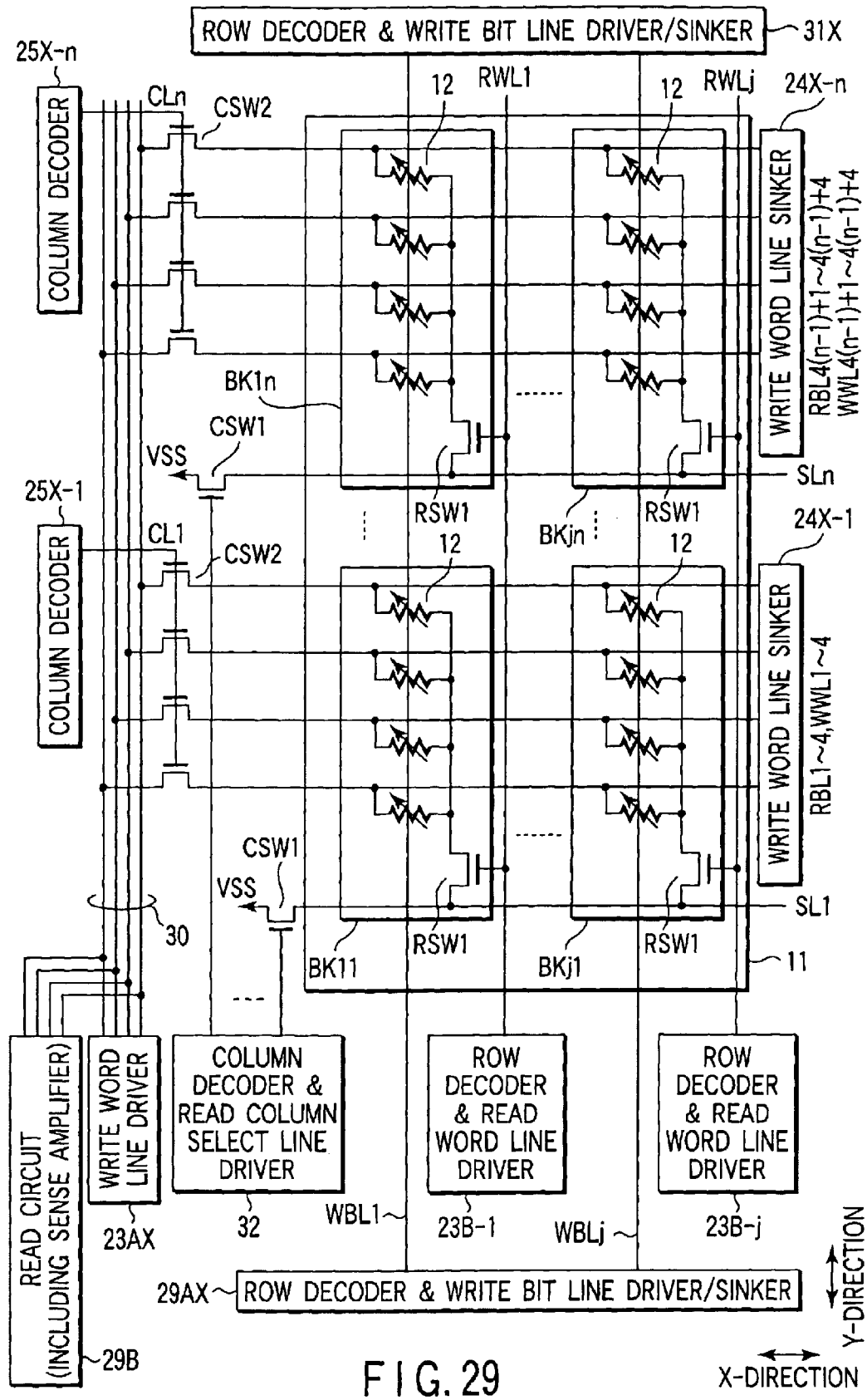
FIG. 29 is a circuit diagram according to Structure Example 7 of the magnetic random access memory of the present invention.

FIG. 29 shows the main part of the magnetic random access memory as Structure Example 7 of the present invention.

The memory cell array 11 has a plurality of TMR elements 12 arranged in the array in the X and Y-directions. In the X-direction, the j TMR elements 12 are arranged, and in the Y-direction, 4×n TMR elements 12 are arranged.

Four TMR elements 12 arranged in the Y-direction constitute one read block BKik (i=1, . . . j, k=1, . . . n). The j read blocks BKik arranged in the X-direction constitute one column. The memory cell array 11 has n columns. Moreover, the n read blocks BKik arranged in the Y-direction constitute one row. The memory cell array 11 has the j rows.

One end of each of four TMR elements 12 in the block BKik is connected in common to the source line SLk (k=1, . . . n), for example, via the read select switch RSW1 constituted of the MOS transistor. The source lines SLk extend in the X-direction, and only one source line is disposed in one column.

Each source line SLk is connected to the ground supply VSS, for example, via a column select switch CSW1 constituted of the MOS transistor.

During the read operation, the read select switch RSW1 is turned on in the read block BKik in the selected row. Moreover, since the column select switch CSW1 is turned on in the selected column, the source line SLk is supplied with the ground potential VSS. That is, the read current flows only through the TMR elements 12 in the read block BKik positioned in the intersection of the selected row and column.

Additionally, during the read operation, since the column select switch CSWL is off in the unselected column, the other ends of the TMR elements 12 in the read block BKik of the unselected column are short-circuited from one another.

In this case, when the read bit lines RBL4(n−1)+1, RBL4(n−1)+2, RBL4(n−1)+3, RBL4(n−1)+4 in the unselected column have different potentials, the read operation is sometimes influenced. Therefore, the read bit lines RBL4(n−1)+1, RBL4(n−1)+2, RBL4(n−1)+3, RBL4(n−1)+4 in the unselected column are set to the same potential (e.g., the ground potential).

Moreover, during the read operation, since the read select switch RSW1 is off in the unselected row, the other ends of the TMR elements 12 in the read block BKik of the unselected row are also short-circuited from one another.

The other ends of four TMR elements 12 in the read block BKik are independently connected to the read bit lines RBL4(n−1)+1, RBL4(n−1)+2, RBL4(n−1)+3, RBL4(n−1)+4. That is, for the four TMR elements 12 in one read block BKik, four read bit lines RBL4(n−1)+1, RBL4(n−1)+2, RBL4(n−1)+3, RBL4(n−1)+4 are arranged.

The read bit lines RBL4(n−1)+1, RBL4(n−1)+2, RBL4(n−1)+3, RBL4(n−1)+4 extend in the X-direction, and one end of each read bit line is connected to the common data line 30 via the column select switch (MOS transistor) CSW2. The common data line 30 is connected to the read circuit (including, for example, the sense amplifier, selector and output buffer) 29B.

Column select line signals CLi (i=1, . . . n) are inputted into column select switches CSW2. Column decoders 25X-1, . . . , 25X-n output column select line signals CLi.

In this example, the read bit lines RBL4(n−1)+1, RBL4(n−1)+2, RBL4(n−1)+3, RBL4(n−1)+4 extend in the X-direction (column direction), and also function as the write word lines WWL4(n−1)+1, WWL4(n−1)+2, WWL4(n−1)+3, WWL4(n−1)+4.

One end of each of the write word lines WWL4(n−1)+1, WWL4(n−1)+2, WWL4(n−1)+3, WWL4(n−1)+4 is connected to a write word line driver 23AX via the column select switch CSW2 and common data line 30, and the other ends are connected to write word line sinkers 24X-1, . . . 24X-n.

One write bit line WBLi (i=1, . . . j) shared by these four TMR elements and extending in the Y-direction (row direction) is disposed in the vicinity of four TMR elements 12 constituting the read block BKik. Only one write bit line WBLi is disposed in one row.

One end of the write bit line WBLi is connected to a circuit block 29AX including the row decoder and write bit line driver/sinker, and the other end thereof is connected to a circuit block 31X including the row decoder and write bit line driver/sinker.

During the write operation, the circuit blocks 29AX, 31X are brought in the operation state. Moreover, the write current flows toward the circuit block 29AX or 31X in the write bit line WBLi in accordance with the write data.

The gate of the read select switch (MOS transistor) RSW1 is connected to the read word line RWLi (i=1, . . . j). Only one read word line RWLi is disposed in one row, and is common to a plurality of blocks BKjk arranged in the Y-direction.

For example, when one column is constituted of four blocks, the number of read word lines RWLi is four. Each read word line RWLi extends in the Y-direction, and one end thereof is connected to the circuit block 23B-i including the row decoder and read word line driver.

During the write operation, the column decoder 25X-n selects one of a plurality of columns based on the column address signal. The write word line driver 23AX supplies the write current to the write word lines WWL4(n−1)+1, WWL4(n−1)+2, WWL4(n−1)+3, WWL4(n−1)+4 in the selected column. The write current is absorbed by the write word line sinker 24X-n.

During the read operation, the column decoder 25X-n selects one of a plurality of columns based on the column address signal. Similarly, the circuit block 23B-i including the row decoder and read word line driver supplies the read voltage (="H") to the read word line RWLi in the selected row.

During the read operation, the column decoder 32 selects one of a plurality of columns based on the column address signals CSL1, . . . CSLj, and turns on the column select switches CSW1 arranged in the selected column.

In the magnetic random access memory of this example, one end of each of the plurality of TMR elements in the read block is connected in common, and the other ends are connected to the respective different read bit lines RBL4(n−1)+1, RBL4(n−1)+2, RBL4(n−1)+3, RBL4(n−1)+4.

Therefore, the data of the plurality of TMR elements in the read block can be read at once by one read step.

Moreover, the read bit lines RBL4(n−1)+1, RBL4(n−1)+2, RBL4(n−1)+3, RBL4(n−1)+4 also function as the write word lines WWL4(n−1)+1, WWL4(n−1)+2, WWL4(n−1)+3, WWL4(n−1)+4. That is, since it is unnecessary to separately dispose the wiring functioning only as the write word line in the cell array, the cell array structure can be simplified.

(5)-2 Device Structure

The device structure will next be described.

[1] Sectional Structure

Figure 30:
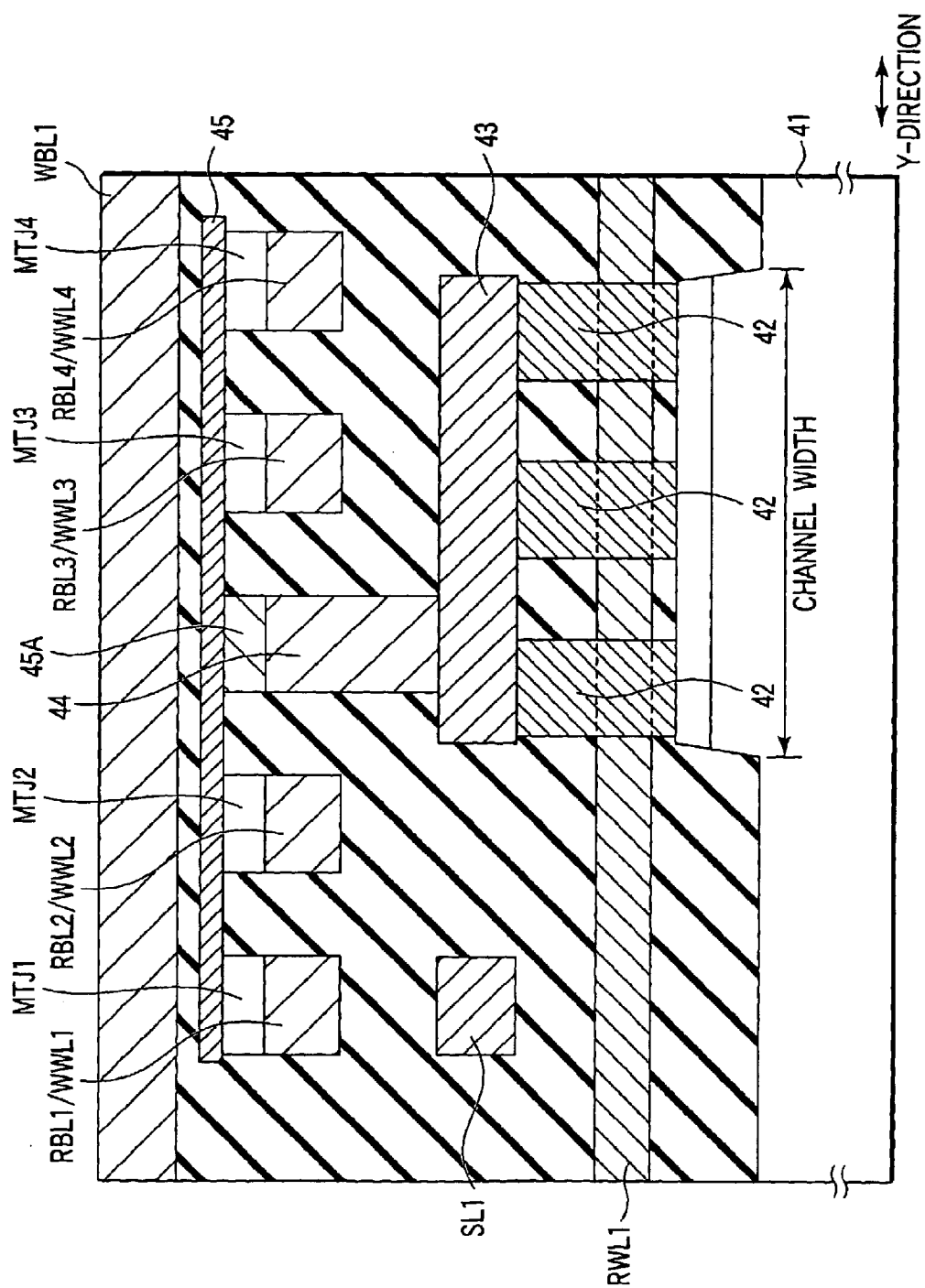
FIG. 30 is a sectional view showing the device structure according to Structure Example 7.

FIG. 30 shows the device structure for one block of the magnetic random access memory as Structure Example 7 of the present invention.

Additionally, for the correspondence to the elements of the circuit of FIG. 29, the elements shown in FIG. 30 are denoted with the same reference numerals as those of FIG. 29.

The read select switch (MOS transistor) RSW1 is disposed in the surface region of the semiconductor substrate 41. The channel width of the read select switch RSW1 corresponds to the width of the Y-direction (row direction), and the channel length corresponds to the length of the X-direction (column direction).

Usually, the read select switch is disposed right under the TMR elements (magnetic tunnel junction (MTJ) elements) MTJ1, MTJ2, MTJ3, MTJ4. Moreover, the TMR elements MTJ1, MTJ2, MTJ3, MTJ4 are arranged in the Y-direction. That is, the region right under the TMR elements MTJ1, MTJ2, MTJ3, MTJ4 is short in the X-direction and long in the Y-direction.

Therefore, when the channel width of the read select switch RSW1 is set to the width of the Y-direction (column direction), the channel width of the read select switch RSW1 can be broadened, the read current is increased, and the read operation can be stabilized.

The source of the read select switch RSWL is connected to the source line SL1 via the contact plug. The source line SL1 linearly extends, for example, in the X-direction (column direction), and is connected to the ground point VSS via the column select switch in the periphery of the memory cell array region.

The gate of the read select switch (MOS transistor) RSW1 forms the read word line RWL1. The read word line RWL1 extends in the Y-direction. On the read select switch RSW1, four TMR elements MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

In this example, the contact portion with the read select switch RSW1 is disposed in the region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, the noise during the read operation by the wiring resistance can be minimized.

Figure 93:
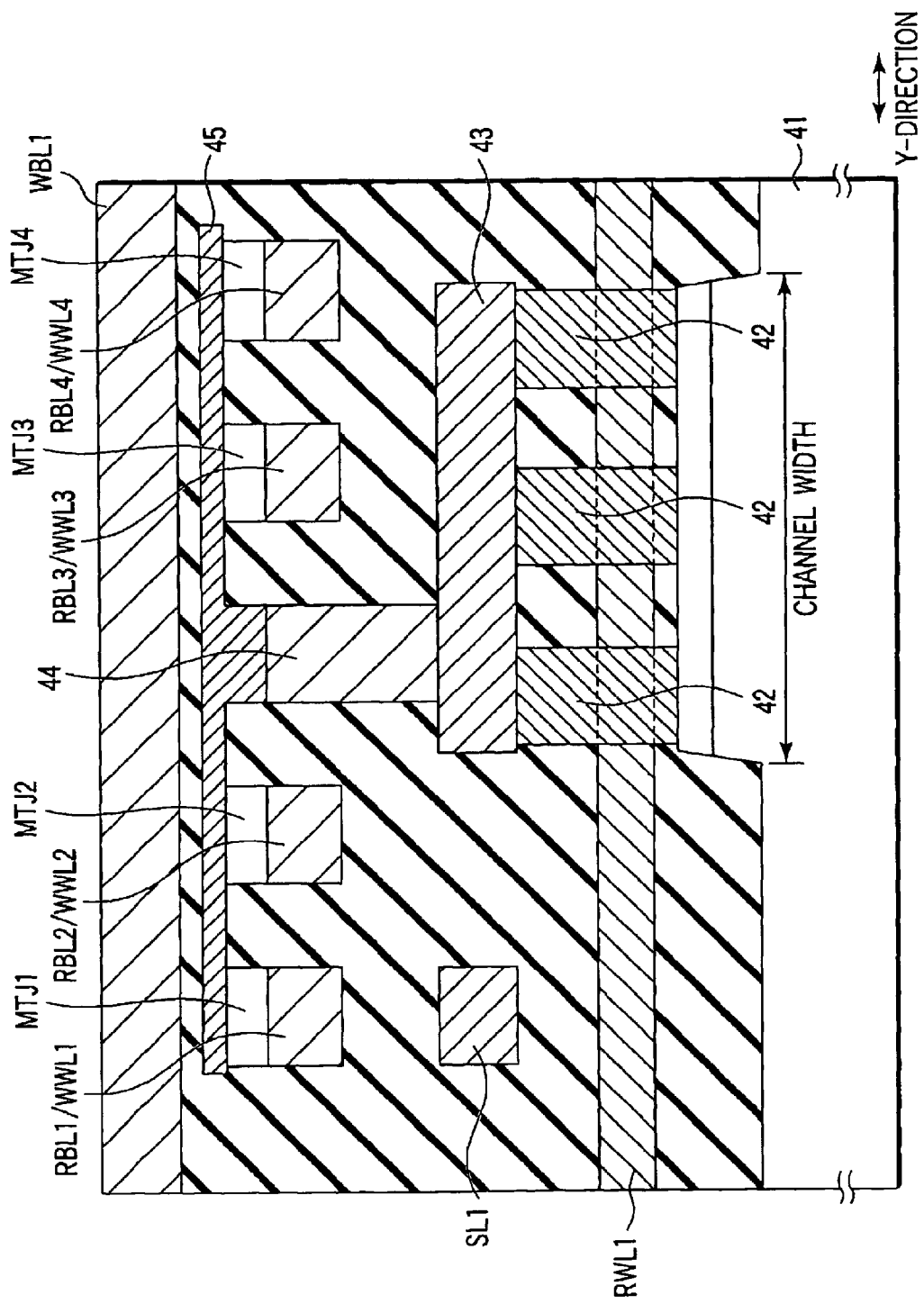
FIG. 93 is a sectional view showing the modification example of the device structure according to Structure Example 7.

Additionally, the intermediate layer 45A may be formed integrally with the upper electrode 45. That is, the intermediate layer 45A and upper electrode 45 may be formed of the same material at the same time. In this case, the device of FIG. 30 is formed as shown in FIG. 93.

The other ends (lower ends in this example) of the TMR elements MTJ1, MTJ2, MTJ3, MTJ4 are electrically connected to the read bit lines RBL1, RBL2, RBL3, RBL4 (write word lines WWL1, WWL2, WWL3, WWL4). The read bit lines RBL1, RBL2, RBL3, RBL4 extend in the X-direction (column direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write bit line WBL1 is disposed right above the TMR elements MTJ1, MTJ2, MTJ3, MTJ4 and in the vicinity of the elements. The write bit line WBL1 extends in the Y-direction (row direction).

In this example, one write bit line WBL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write bit lines may be disposed for the four TMR elements MTJ1, MTJ2, MTJ3, MTJ4.

Moreover, in this example, with respect to the TMR elements MTJ1, MTJ2, MTJ3, MTJ4, the write bit line WBL1 extending in the Y-direction is disposed in the upper portion, and the read bit lines RBL1, RBL2, RBL3, RBL4 extending in the X-direction are disposed in the lower portion.

However, the positional relation of the write bit line WBL1 and read bit lines RBL1, RBL2, RBL3, RBL4 with respect to the TMR elements MTJ1, MTJ2, MTJ3, MTJ4 is not limited to this.

Figure 94:
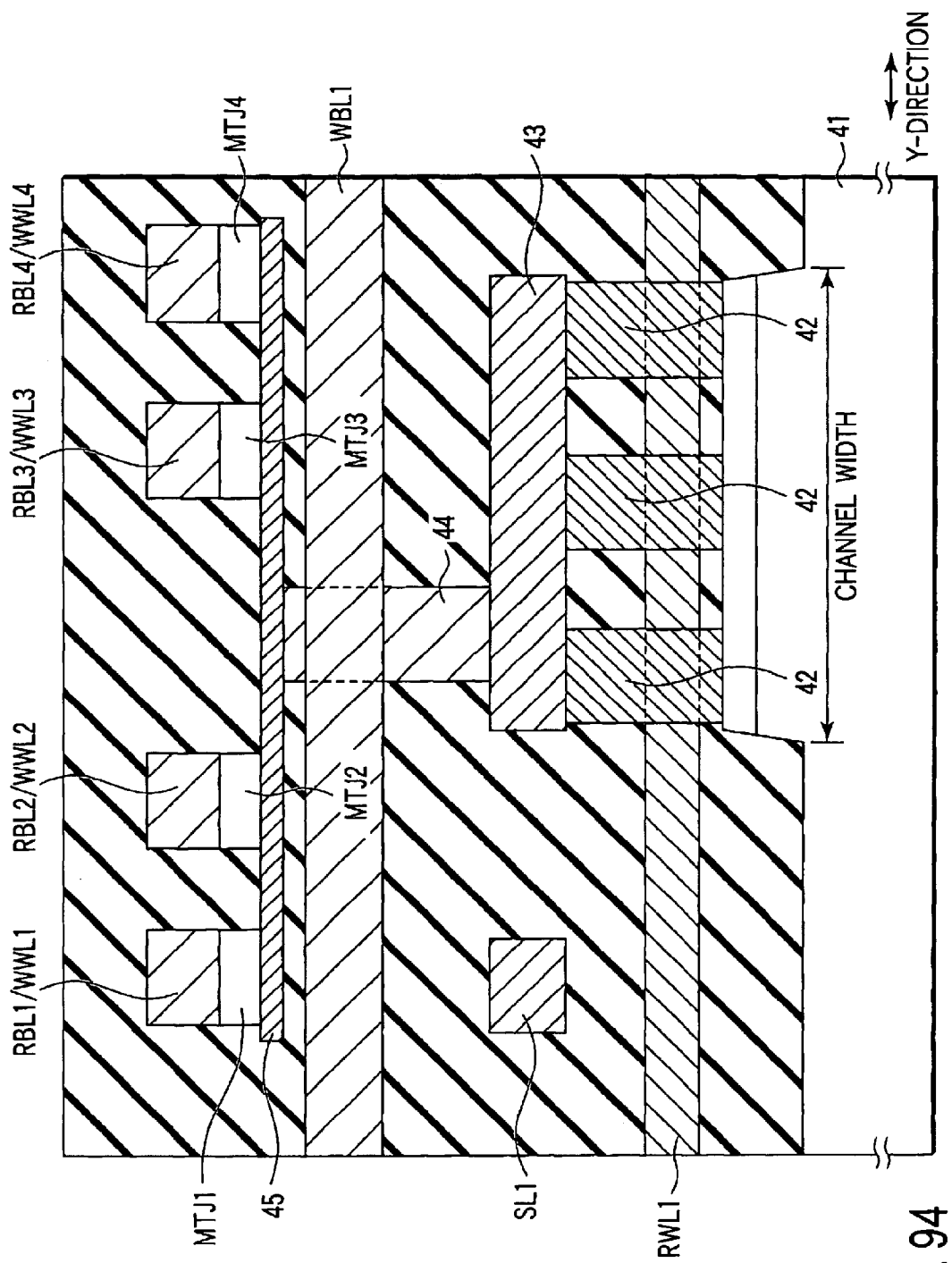
FIG. 94 is a sectional view showing the modification example of the device structure according to Structure Example 7.

For example, as shown in FIG. 94, with respect to the TMR elements MTJ1, MTJ2, MTJ3, MTJ4, the write bit line WBL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to the respective different read bit lines RBL1, RBL2, RBL3, RBL4 (write word lines WWL1, WWL2, WWL3, WWL4).

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW1. Furthermore, the write bit line WBL1 extending in the Y-direction is shared by the plurality of TMR elements MTJ1, MTJ2, MTJ3, MTJ4 in the read block. Therefore, the cell array structure is prevented from being complicated.

Furthermore, the layout of the read select switch RSW1 is determined in such a manner that the channel width of the read select switch (MOS transistor) RSW1 corresponds to the width of the Y-direction (row direction), so that the channel width of the read select switch RSW1 can be broadened, the read current is increased, and the read operation can be stabilized.

[Planar Structure]

FIGS. 31 to 34 show the layouts of the respective wiring layers in the device structure of FIG. 30. Additionally, the sectional area of FIG. 30 corresponds to a sectional area taken along line XXX—XXX in FIGS. 31 to 34.

Figure 31:
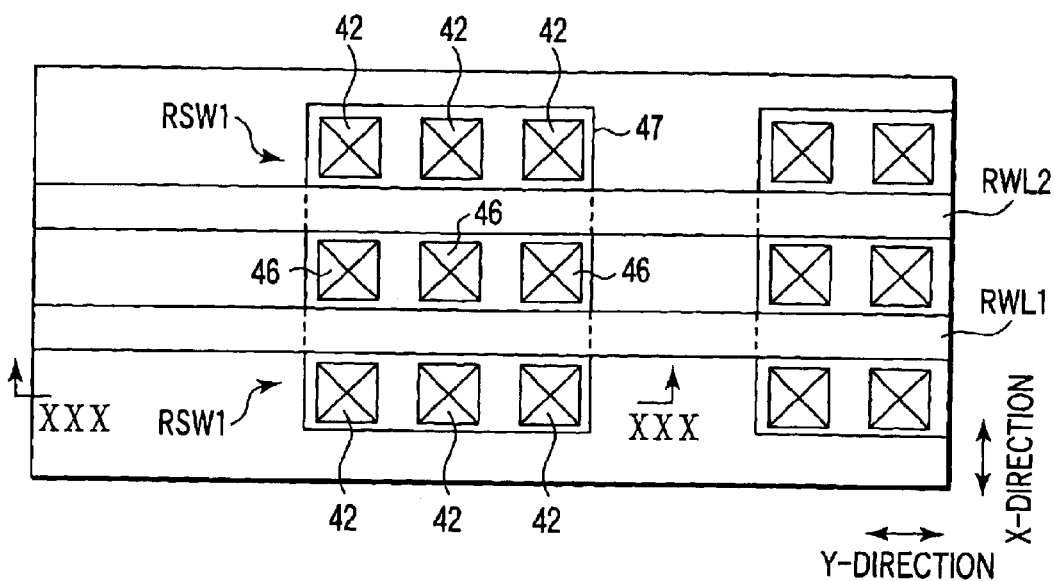
FIG. 31 is a plan view showing a layout of active regions and read word lines of the device structure according to Structure Example 7.

FIG. 31 shows the layout of the read word lines as the first wiring layer.

The read select switch (MOS transistor) RSW1 is disposed in active areas 47. The contact plugs 42 are disposed on the drain of the read select switch RSW1, and the contact plugs 46 are arranged on the source.

Additionally, in this example, two read select switches RSW1 disposed adjacent to each other in the X-direction (column direction) share one source.

On the channel regions between the drains and sources of the read select switches RSW1, the gates of the read select switches RSW1, that is, the read word lines RWL1, RWL2 are arranged. The read word lines RWL1, RWL2 extend in the Y-direction.

FIG. 32 shows the layout of the source line as the second wiring layer and the intermediate layer.

The source line SL1 extends in the Y-direction (row direction) on the element region 47, but is vertically bent in the regions other than the element region 47, and extends in the X-direction (column direction). The source line SL1 is connected to the contact plugs 46. In this example, two read select switches RSW1 disposed adjacent to each other in the X-direction (column direction) share one source line SL1.

The source line SL1 is connected to the source shared by two read select switches RSWL disposed adjacent to each other in the X-direction via the contact plugs 46. The intermediate layer 43 is connected to the contact plugs 42 on the drain of the read select switch RSW1. The contact plug 44 is disposed on the intermediate layer 43.

FIG. 33 shows the layout of the read bit lines as the third wiring layer and the TMR elements.

The read bit lines RBL1, RBL2, RBL3, RBL4 (write word lines WWL1, WWL2, WWL3, WWL4) extend in the X-direction.

The TMR elements MTJ1, MTJ2, MTJ3, MTJ4 are arranged on the read bit lines RBL1, RBL2, RBL3, RBL4.

The read bit line RBL1 is connected in common to the TMR elements MTJ1 arranged in the X-direction, and the read bit line RBL2 is connected in common to the TMR elements MTJ2 arranged in the X-direction. The read bit line RBL3 is connected in common to the TMR elements MTJ3 arranged in the X-direction, and the read bit line RBL4 is connected in common to the TMR elements MTJ4 arranged in the X-direction.

The axes of easy magnetization of the TMR elements MTJ1, MTJ2, MTJ3, MTJ4 turn to the X-direction. That is, the TMR elements MTJ1, MTJ2, MTJ3, MTJ4 have the rectangular shapes elongated in the X-direction. The intermediate layers 45A are disposed on the contact plugs 44.

Figure 34:
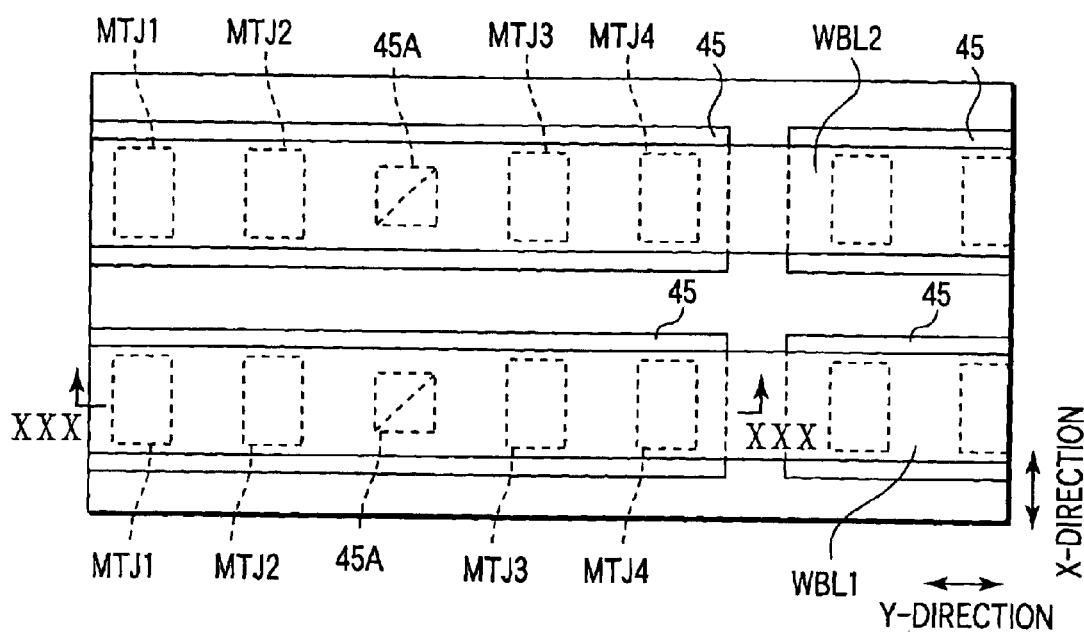
FIG. 34 is a plan view showing a layout of TMR's upper common electrodes and write bit lines of the device structure according to Structure Example 7.

FIG. 34 shows the layout of the write word line as the fourth wiring layer.

The upper electrode 45 having the rectangular pattern is disposed on the TMR elements MTJ1, MTJ2, MTJ3, MTJ4 and intermediate layer 45A. The upper electrode 45 contacts the TMR elements MTJ1, MTJ2, MTJ3, MTJ4 and intermediate layer 45A.

Moreover, the write bit lines WBL1, WBL2 extending in the Y-direction are arranged right on the upper electrodes 45.

(6) Structure Example 8

Structure Example 8 is a modification example of Structure Example 7 constituted by rotating the axis of easy magnetization of the TMR element of Structure Example 7 by 90°.

In Structure Example 7, the axis of easy magnetization of the TMR element turns to the X-direction (column direction), and the axis of difficult magnetization turns to the Y-direction (row direction). That is, the TMR element has the rectangular shape elongated in the X-direction. On the other hand, in Structure Example 8, the axis of easy magnetization of the TMR element turns to the Y-direction, and the axis of difficult magnetization turns to the X-direction. That is, Structure Example 8 is characterized in that the TMR element has the rectangular shape elongated in the Y-direction.

With the magnetic random access memory, basically, the direction of the write current flowing through the write line extending in parallel to the axis of difficult magnetization is changed, so that the data is written in the memory cell (the direction of magnetization of the pinning layer is determined).

Therefore, in this example, during the write operation, the direction of the write current flowing through the write bit line (read bit line) extending in the X-direction is controlled, so that the data to be written in the memory cell is determined.

Additionally, in general, the write line extending along the axis of difficult magnetization (in parallel to the short axis of MTJ) is referred to as the write bit line.

(6)-1 Circuit Structure

First, the circuit structure will be described.

Figure 35:
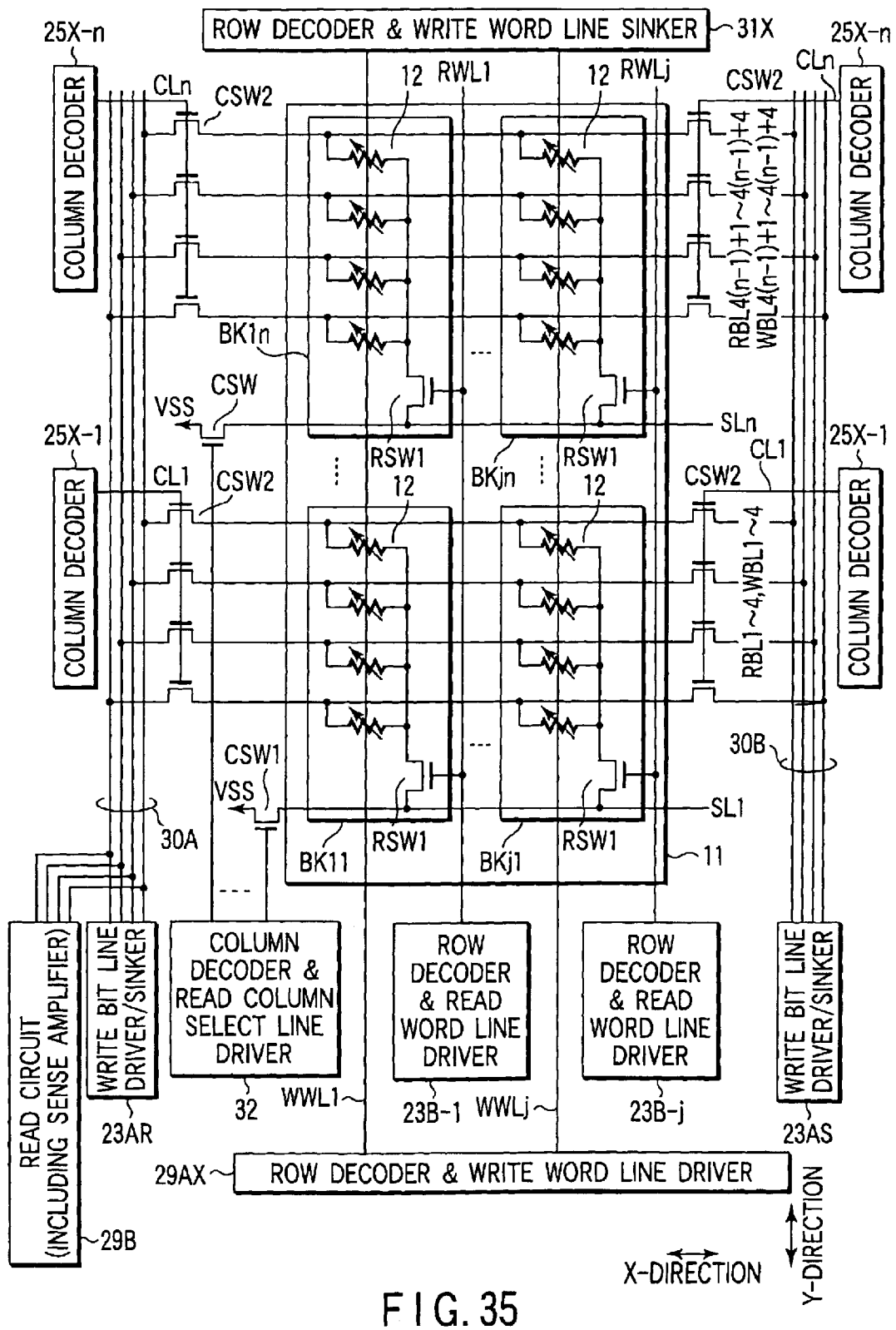
FIG. 35 is a circuit diagram according to Structure Example 8 of the magnetic random access memory of the present invention.

FIG. 35 shows the main part of the magnetic random access memory as Structure Example 8 of the present invention.

The memory cell array 11 has a plurality of TMR elements 12 arranged in the array in the X and Y-directions. In the X-direction, the j TMR elements 12 are arranged, and in the Y-direction, 4×n TMR elements 12 are arranged.

Four TMR elements 12 arranged in the Y-direction constitute one read block BKik (i=1, ... j, k=1, ... n). The j read blocks BKik arranged in the X-direction constitute one column. The memory cell array 11 has n columns. Moreover, the n read blocks BKik arranged in the Y-direction constitute one row. The memory cell array 11 has the j rows.

One end of each of four TMR elements 12 in the block BKik is connected in common to the source line SLk (k=1, ... n), for example, via the read select switch RSW1 constituted of the MOS transistor. The source lines SLk extend in the X-direction, and only one source line is disposed in one column.

Each source line SLk is connected to the ground point VSS, for example, via the column select switch CSW1 constituted of the MOS transistor.

During the read operation, the read select switch RSW1 is turned on in the read block BKik in the selected row. Moreover, since the column select switch CSW1 is turned on in the selected column, the source line SLk has the ground potential VSS. That is, the read current flows only through the TMR elements 12 in the read block BKik positioned in the intersection of the selected row and column.

Additionally, during the read operation, since the column select switch CSW1 is off in the unselected column, the other ends of the TMR elements 12 in the read block BKik of the unselected column are short-circuited from one another.

In this case, when the read bit lines RBL4(n−1)+1, RBL4(n−1)+2, RBL4(n−1)+3, RBL4(n−1)+4 in the unselected column have different potentials, the read operation is sometimes influenced. Therefore, the read bit lines RBL4(n−1)+1, RBL4(n−1)+2, RBL4(n−1)+3, RBL4(n−1)+4 in the unselected column are set to the same potential (e.g., the ground potential).

Moreover, during the read operation, since the read select switch RSW1 is off in the unselected row, the other ends of the TMR elements 12 in the read block BKik of the unselected row are also short-circuited from one another.

The other ends of four TMR elements 12 in the read block BKik are independently connected to the read bit lines RBL4(n−1)+1, RBL4(n−1)+2, RBL4(n−1)+3, RBL4(n−1)+4. That is, for the four TMR elements 12 in one read block BKik, four read bit lines RBL4(n−1)+1, RBL4(n−1)+2, RBL4(n−1)+3, RBL4(n−1)+4 are arranged.

The read bit lines RBL4(n−1)+1, RBL4(n−1)+2, RBL4(n−1)+3, RBL4(n−1)+4 extend in the X-direction, and one end of each read bit line is connected to the common data line 30A via the column select switch (MOS transistor) CSW2. The common data line 30A is connected to the read circuit (including, for example, the sense amplifier, selector and output buffer) 29B.

The column select line signals CLi (i=1, ... n) are inputted into the column select switches CSW2. The column decoders 25X-1, ... , 25X-n output the column select line signals CLi.

In this example, the read bit lines RBL4(n−1)+1, RBL4(n−1)+2, RBL4(n−1)+3, RBL4(n−1)+4 extend in the X-direction (column direction), and also function as the write word lines WWL4(n−1)+1, WWL4(n−1)+2, WWL4(n−1)+3, WWL4(n−1)+4.

One end of each of the write word lines WWL4(n−1)+1, WWL4(n−1)+2, WWL4(n−1)+3, WWL4(n−1)+4 is connected to the write bit line driver/sinker 23AR via the column select switch CSW2 and common data line 30A, and the other ends are connected to write bit line driver/sinker 23AS via the column select switch CSW2 and common data line 30B.

One write word line WWLi (i=1, ... j) shared by these four TMR elements and extending in the Y-direction (row direction) is disposed in the vicinity of four TMR elements 12 constituting the read block BKik. Only one write word line WWLi is disposed in one row.

One end of the write word line WWLi is connected to the circuit block 29AX including the row decoder and write word line driver, and the other end thereof is connected to the circuit block 31X including the row decoder and write word line sinker.

During the write operation, the circuit blocks 29AX, 31X are brought in the operation state. Moreover, the write current flows toward the circuit block 31X from the circuit block 29AX in the write word line WWLi.

The gate of the read select switch (MOS transistor) RSW1 is connected to the read word line RWLi (i=1, ... j). Only one read word line RWLi is disposed in one row, and is common to a plurality of blocks BKjk arranged in the Y-direction.

For example, when one column is constituted of four blocks, the number of read word lines RWLi is four. Each read word line RWLi extends in the Y-direction, and one end thereof is connected to the circuit block 23B-i including the row decoder and read word line driver.

During the write operation, the column decoder 25X-n selects one of a plurality of columns based on the column address signal. The write bit line drivers/sinkers 23AR, 23AS supply the write current to the write bit lines WBL4(n−1)+1, WBL4(n−1)+2, WBL4(n−1)+3, WBL4(n−1)+4 in the selected column in accordance with the write data.

During the read operation, the column decoder 25X-n selects one of a plurality of columns based on the column address signal. Similarly, the circuit block 23B-i including the row decoder and read word line driver supplies the read voltage (="H") to the read word line RWLi in the selected row.

During the read operation, the column decoder 32 selects one of a plurality of columns based on the column address signals CSL1, ... CSLj, and turns on the column select switches CSW1 arranged in the selected column.

In the magnetic random access memory of this example, one end of each of the plurality of TMR elements in the read block is connected in common, and the other ends are connected to the respective different read bit lines RBL4(n−1)+1, RBL4(n−1)+2, RBL4(n−1)+3, RBL4(n−1)+4.

Therefore, the data of the plurality of TMR elements in the read block can be read at once by one read step.

Moreover, the read bit lines RBL4(n−1)+1, RBL4(n−1)+2, RBL4(n−1)+3, RBL4(n−1)+4 also function as the write bit lines WBL4(n−1)+1, WBL4(n−1)+2, WBL4(n−1)+3, WBL4(n−1)+4. That is, since it is unnecessary to separately dispose the wiring functioning only as the write bit line in the cell array, the cell array structure can be simplified.

(6)-2 Device Structure

The device structure will next be described.

[1] Sectional Structure

FIG. 36 shows the device structure for one block of the magnetic random access memory as Structure Example 8 of the present invention.

Additionally, for the correspondence to the elements of the circuit of FIG. 35, the elements shown in FIG. 36 are denoted with the same reference numerals as those of FIG. 35.

The read select switch (MOS transistor) RSW1 is disposed in the surface region of the semiconductor substrate 41. The channel width of the read select switch RSW1 corresponds to the width of the Y-direction (row direction), and the channel length corresponds to the length of the X-direction (column direction).

Usually, the read select switch is disposed right under the TMR elements (magnetic tunnel junction (MTJ) elements) MTJ1, MTJ2, MTJ3, MTJ4. Moreover, the TMR elements MTJ1, MTJ2, MTJ3, MTJ4 are arranged in the Y-direction. That is, the region right under the TMR elements MTJ1, MTJ2, MTJ3, MTJ4 is short in the X-direction and long in the Y-direction.

Therefore, when the channel width of the read select switch RSW1 is set to the width of the Y-direction (column direction), the channel width of the read select switch RSW1 can be broadened, the read current is increased, and the read operation can be stabilized.

The source of the read select switch RSW1 is connected to the source line SL1 via the contact plug. The source line SL1 linearly extends, for example, in the X-direction (column direction), and is connected to the ground point VSS via the column select switch in the periphery of the memory cell array region.

The gate of the read select switch (MOS transistor) RSW1 forms the read word line RWL1. The read word line RWL1 extends in the Y-direction. On the read select switch RSW1, four TMR elements MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

In this example, the contact portion of the upper electrode 45 and read select switch RSW1 is disposed in the region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, the noise during the read operation by the wiring resistance can be minimized.

Additionally, the intermediate layer 45A may be formed integrally with the upper electrode 45. That is, the intermediate layer 45A and upper electrode 45 may be formed of the same material at the same time. In this case, the device of FIG. 36 is formed as shown in FIG. 95.

The other ends (lower ends in this example) of the TMR elements MTJ1, MTJ2, MTJ3, MTJ4 are electrically connected to the read bit lines RBL1, RBL2, RBL3, RBL4 (write bit lines WBL1, WBL2, WBL3, WBL4). The read bit lines RBL1, RBL2, RBL3, RBL4 extend in the X-direction (column direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write word line WWL1 is disposed right above the TMR elements MTJ1, MTJ2, MTJ3, MTJ4 and in the vicinity of the elements. The write word line WWL1 extends in the Y-direction (row direction).

In this example, one write word line WWL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write word lines may be disposed for the four TMR elements MTJ1, MTJ2, MTJ3, MTJ4.

Moreover, in this example, with respect to the TMR elements MTJ1, MTJ2, MTJ3, MTJ4, the write word line WWL1 extending in the Y-direction is disposed in the upper portion, and the read bit lines RBL1, RBL2, RBL3, RBL4 extending in the X-direction are disposed in the lower portion.

However, the positional relation of the write word line WWL1 and read bit lines RBL1, RBL2, RBL3, RBL4 with respect to the TMR elements MTJ1, MTJ2, MTJ3, MTJ4 is not limited to this.

Figure 96:
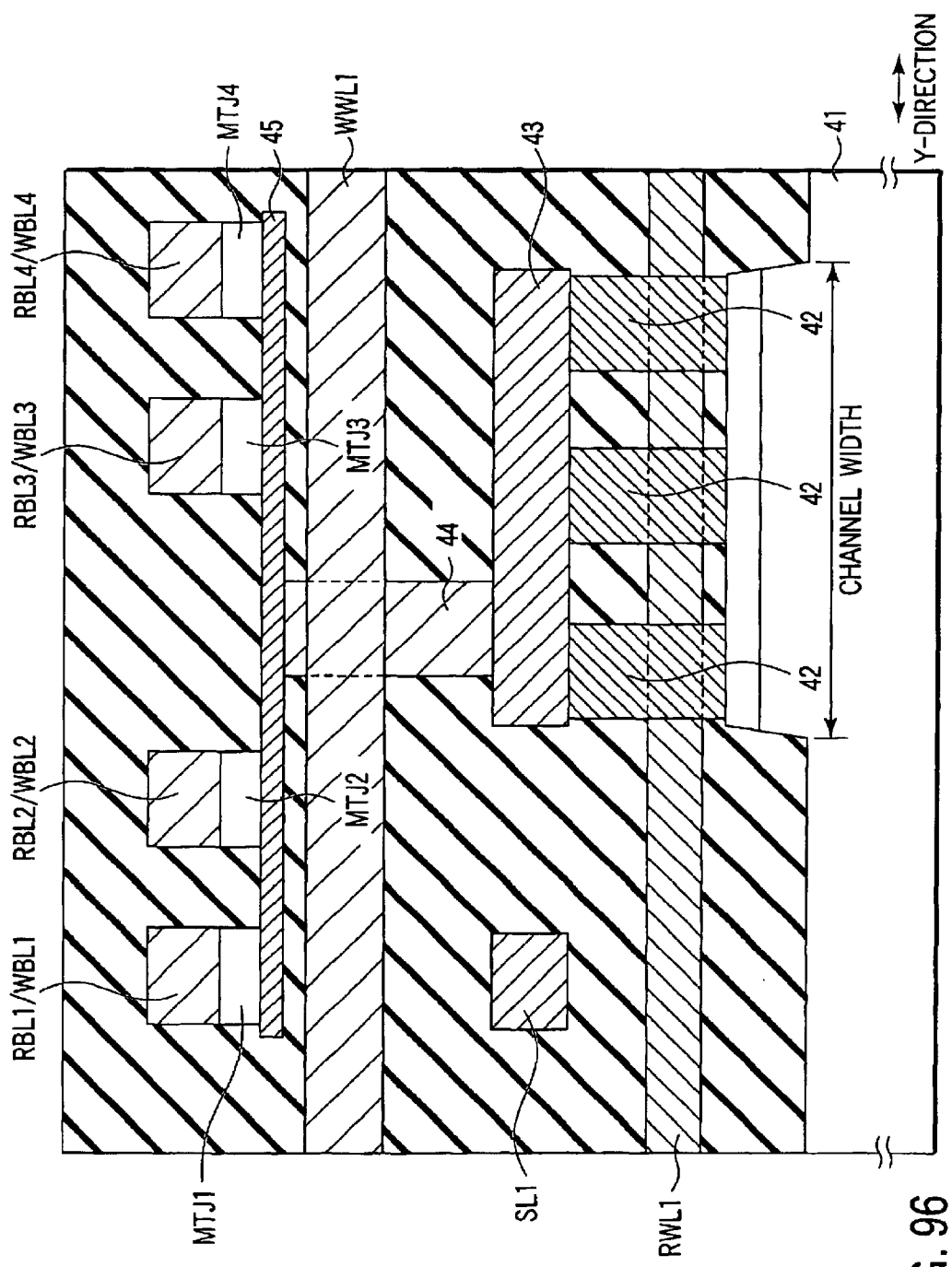
FIG. 96 is a sectional view showing the modification example of the device structure according to Structure Example 8.

For example, as shown in FIG. 96, with respect to the TMR elements MTJ1, MTJ2, MTJ3, MTJ4, the write word line WWL1 extending in the Y-direction is disposed in the lower portion, and the read bit lines RBL1, RBL2, RBL3, RBL4 extending in the X-direction are arranged in the upper portion.

According to the device structure, the plurality of TMR elements MTJ1, MTJ2, MTJ3, MTJ4 in the read block are electrically connected to the respective different read bit lines RBL1, RBL2, RBL3, RBL4 (write bit lines WBL1, WBL2, WBL3, WBL4).

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW1. Furthermore, the write word line WWL1 extending in the Y-direction is shared by the plurality of TMR elements MTJ1, MTJ2, MTJ3, MTJ4 in the read block. Therefore, the cell array structure is prevented from being complicated.

Furthermore, the layout of the read select switch RSW1 is determined in such a manner that the channel width of the read select switch (MOS transistor) RSW1 corresponds to the width of the Y-direction (row direction), so that the channel width of the read select switch RSW1 can be broadened, the read current is increased, and the read operation can be stabilized.

[Planar Structure]

FIGS. 37 to 40 show the layouts of the respective wiring layers in the device structure of FIG. 36. Additionally, the sectional area of FIG. 36 corresponds to a sectional area taken along line XXXVI—XXXVI in FIGS. 37 to 40.

Figure 37:
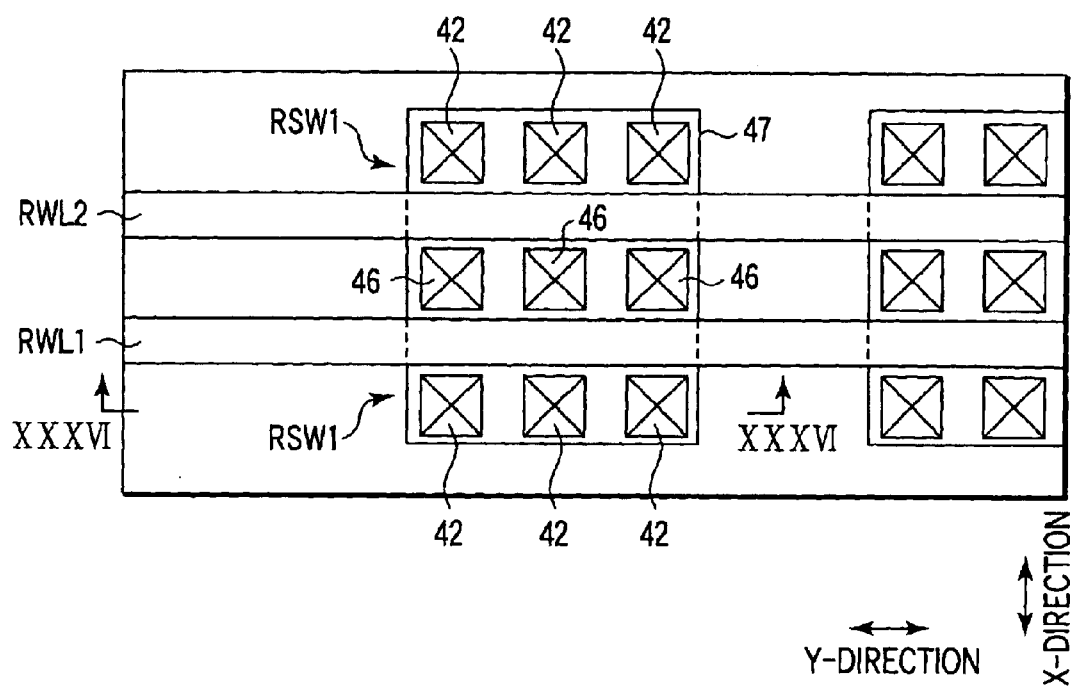
FIG. 37 is a plan view showing a layout of active regions and read word lines of the device structure according to Structure Example 8.

FIG. 37 shows the layout of the read word lines as the first wiring layer.

The read select switch (MOS transistor) RSW1 is disposed in active areas 47. The contact plugs 42 are disposed on the drain of the read select switch RSW1, and the contact plugs 46 are arranged on the source.

Additionally, in this example, two read select switches RSW1 disposed adjacent to each other in the X-direction (column direction) share one source.

On the channel regions between the drains and sources of the read select switches RSW1, the gates of the read select switches RSW1, that is, the read word lines RWL1, RWL2 are arranged. The read word lines RWL1, RWL2 extend in the Y-direction.

Figure 38:
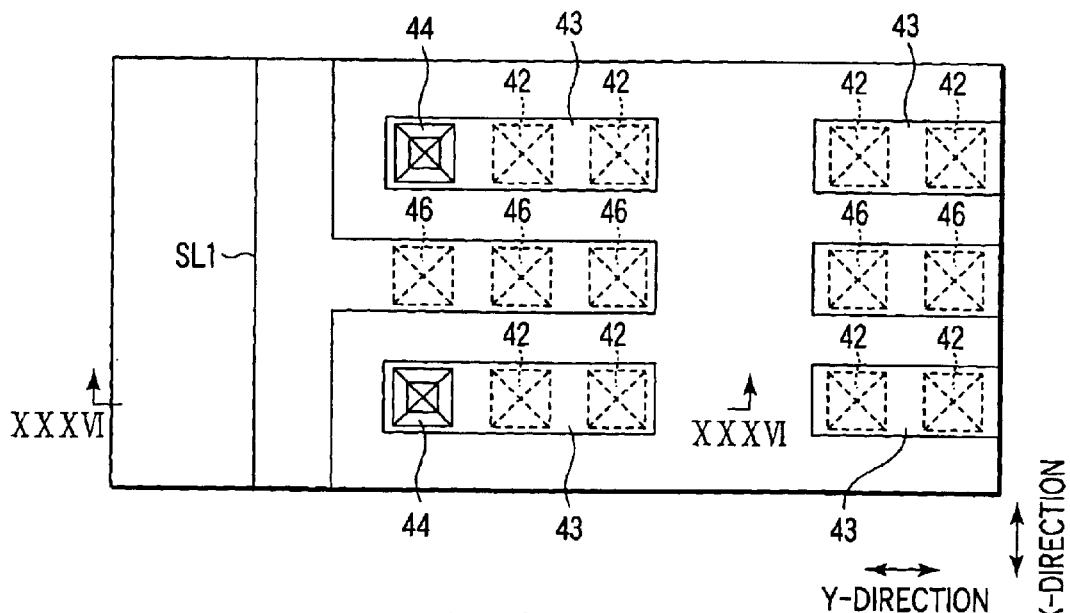
FIG. 38 is a plan view showing a layout of a source line and intermediate connections of the device structure according to Structure Example 8.

FIG. 38 shows the layout of the source line as the second wiring layer and the intermediate layer.

The source line SL1 extends in the Y-direction (row direction) on the element region 47, but is vertically bent in the regions other than the element region 47, and extends in the X-direction (column direction). The source line SL1 is connected to the contact plugs 46. In this example, two read select switches RSW1 disposed adjacent to each other in the X-direction (column direction) share one source line SL1.

The source line SL1 is connected to the source shared by two read select switches RSW1 disposed adjacent to each other in the X-direction via the contact plugs 46. The intermediate layer 43 is connected to the contact plugs 42 on the drain of the read select switch RSW1. The contact plug 44 is disposed on the intermediate layer 43.

Figure 39:
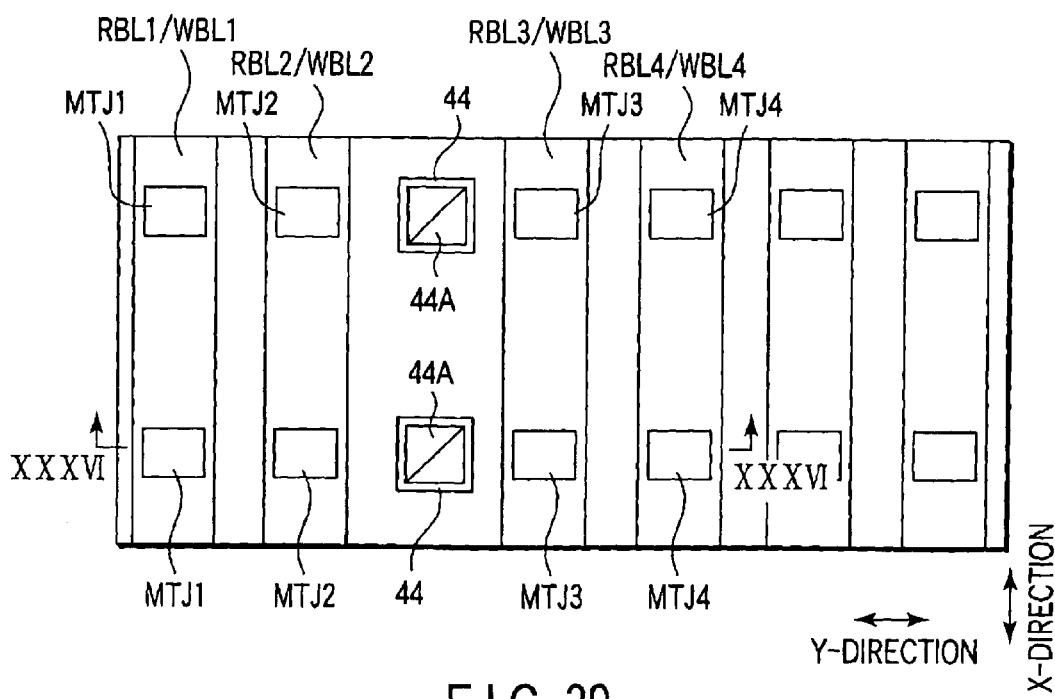
FIG. 39 is a plan view showing a layout of read bit lines or write bit lines and TMRs of the device structure according to Structure Example 8.

FIG. 39 shows the layout of the read bit lines as the third wiring layer and the TMR elements.

The read bit lines RBL1, RBL2, RBL3, RBL4 (write bit lines WBL1, WBL2, WBL3, WBL4) extend in the X-direction.

The TMR elements MTJ1, MTJ2, MTJ3, MTJ4 are arranged on the read bit lines RBL1, RBL2, RBL3, RBL4.

The read bit line RBL1 is connected in common to the TMR elements MTJ1 arranged in the X-direction, and the read bit line RBL2 is connected in common to the TMR elements MTJ2 arranged in the X-direction. The read bit line RBL3 is connected in common to the TMR elements MTJ3 arranged in the X-direction, and the read bit line RBL4 is connected in common to the TMR elements MTJ4 arranged in the X-direction.

The axes of easy magnetization of the TMR elements MTJ1, MTJ2, MTJ3, MTJ4 turn to the Y-direction. That is, the TMR elements MTJ1, MTJ2, MTJ3, MTJ4 have the rectangular shapes elongated in the Y-direction. The intermediate layers 45A are disposed on the contact plugs 44.

Figure 40:
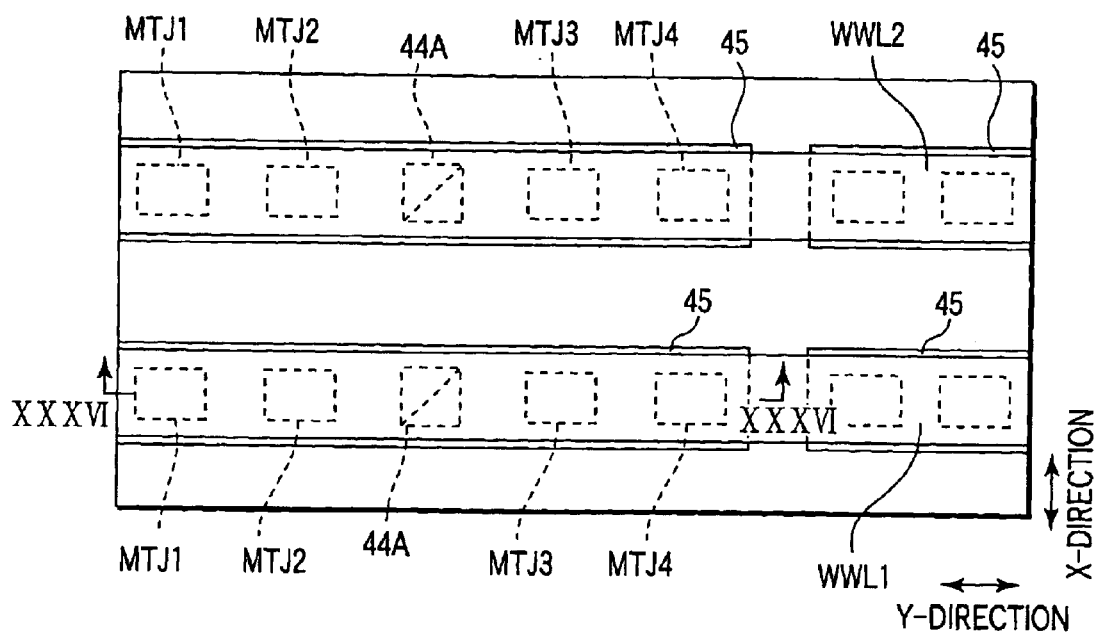
FIG. 40 is a plan view showing a layout of TMR's upper common electrodes and write word lines of the device structure according to Structure Example 8.

FIG. 40 shows the layout of the write word line as the fourth wiring layer.

The upper electrode 45 having the rectangular pattern is disposed on the TMR elements MTJ1, MTJ2, MTJ3, MTJ4 and intermediate layer 45A. The upper electrode 45 contacts the TMR elements MTJ1, MTJ2, MTJ3, MTJ4 and intermediate layer 45A.

Moreover, the write word lines WWL1, WWL2 extending in the Y-direction are arranged right on the upper electrodes 45.

(7) Structure Examples 9, 10, 11

Structure Examples 9, 10, 11 constituted by improving Structure Example 7 will next be described.

(7)-1 Structure Example 9

FIG. 41 shows the main part of the magnetic random access memory as Structure Example 9 of the present invention.

Structure Example 9 is characterized in that the bias potential VC is given to one end of each of four TMR elements 12 constituting the read block BKik.

That is, in Structure Example 7 (FIG. 29), the source line SLi is connected to the ground point VSS via the column select switch CSW1. Therefore, in Structure Example 7, during the read operation, the read circuit 29B generates the bias potential VC, and the read current is supplied to the TMR element 12 from the read circuit 29B.

On the other hand, in Structure Example 9, the source line SLi connected in common to one end of each of four TMR elements 12 constituting the read block BKik is connected to the bias line 34 via the column select switch CSW1.

Therefore, during the read operation, the bias potential VC is given to the bias line 34, and the read current is given to the TMR element 12 via the bias line 34. Additionally, during the operations (e.g., the write operation) other than the read operation, the ground potential VSS is given to the bias line 34.

In this manner, Structure Example 9 is constituted such that the potential of the source line SLi can be changed.

Therefore, for example, during the read operation, the bias potential VC is given to the TMR element 12 via the source line SLi, and the read current can be passed through the TMR elements 12 in the read block BKik.

(7)-2 Structure Example 10

Figure 42:
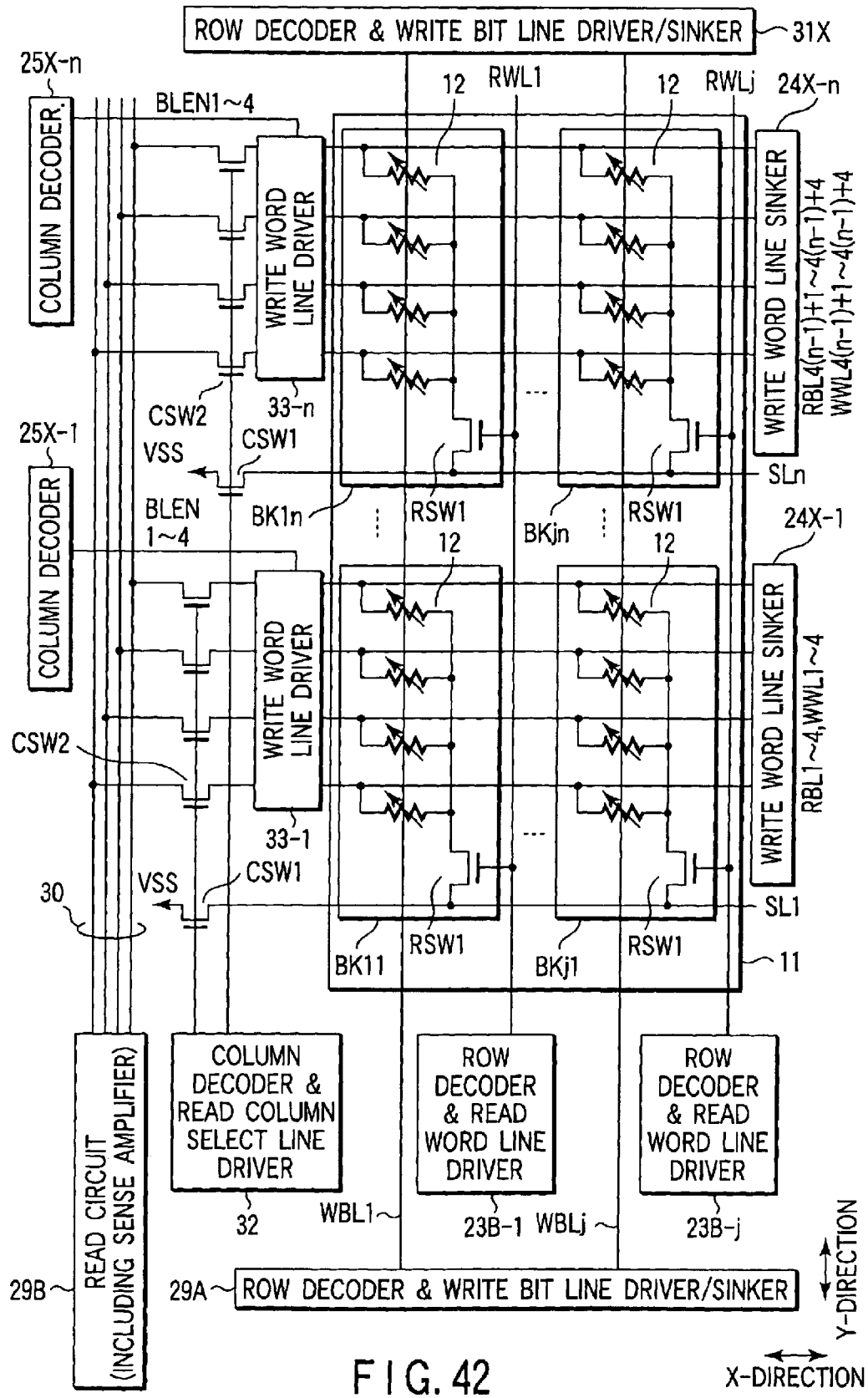
FIG. 42 is a circuit diagram according to Structure Example 10 of the magnetic random access memory of the present invention.

FIG. 42 shows the main part of the magnetic random access memory as Structure Example 10 of the present invention.

Structure Example 10 is characterized in that one write word line driver is disposed in one row of the memory cell array.

In Structure Example 7 (FIG. 29), only one write word line driver 23AX is disposed in common to all the columns of the memory cell array 11, and connected to the common data line (common driver line) 30. However, in this case, since the elements having resistance, that is, the common data line and row select switch are connected between the write word line driver and the write word line, the voltage drop by these elements increases, and the write current is reduced.

To solve the problem, in Structure Example 10, one of write word line drivers 33-1, . . . 33-n is disposed in one column of the memory cell array 11.

That is, in the respective columns of the memory cell arrays 11, the write word line drivers 33-1, . . . 33-n are connected between the column select switch CSW2 and the write word lines WWL4(n−1)+1, WWL4(n−1)+2, WWL4(n−1)+3, WWL4(n−1)+4.

In this case, the write word line drivers 33-1, . . . 33-n may drive only the write word lines WWL4(n−1)+1, WWL4(n−1)+2, WWL4(n−1)+3, WWL4(n−1)+4.

Therefore, the driving forces of the write word line drivers 33-1, . . . 33-n can be reduced, and this example can also contribute to the low power consumption and high-speed operation.

Additionally, since the read current is much smaller than the write current, the driving force of the column select switch CSW2 does not have to be enlarged.

The write word line drivers 33-1, . . . 33-n are controlled by output signals (word line enable signals) WLEN1, . . . WLEN4 of the column decoders 25X-1, . . . 25X-n. That is, during the write operation, the column decoders 25X-1, . . . 25X-n are activated, and select one column. In the selected column, one of the output signals (word line enable signals) WLEN1, . . . WLEN4 is "H".

Moreover, in Structure Example 7, the column select switch CSW2 is controlled by the output signals of the column decoders 25X-1, . . . 25X-n activated only during the write operation. However, in Structure Example 10, the switch is controlled by the output signal of the circuit block 32 including the column decoders and read column select line drivers.

That is, since the gate of the column select switch (MOS transistor) CSW2 is connected to the column select lines CSL1, . . . CSLj, the column select switch CSW2 performs the same operation as that of the column select switch CSW1.

The reason why this example is structured in this manner is that in Structure Example 10, each of the write word line drivers 33-1, . . . 33-n is disposed for each column, and therefore during the write operation all of the write word lines WWL4(n−1)+1, WWL4(n−1)+2, WWL4(n−1)+3, WWL4(n−1)+4 need to be separated from the common data line 30.

That is, since the circuit blocks 23B-1, . . . .23B-j including the row decoders and read word line drivers are activated only during the read operation, the column select switches CSW2 of all the columns are turned off, and all the write word lines WWL4(n−1)+1, WWL4(n−1)+2, WWL4 (n−1)+3, WWL4(n−1)+4 are separated from the common data line 30 during the write operation.

(7)-3 Structure Example 11

Figure 43:
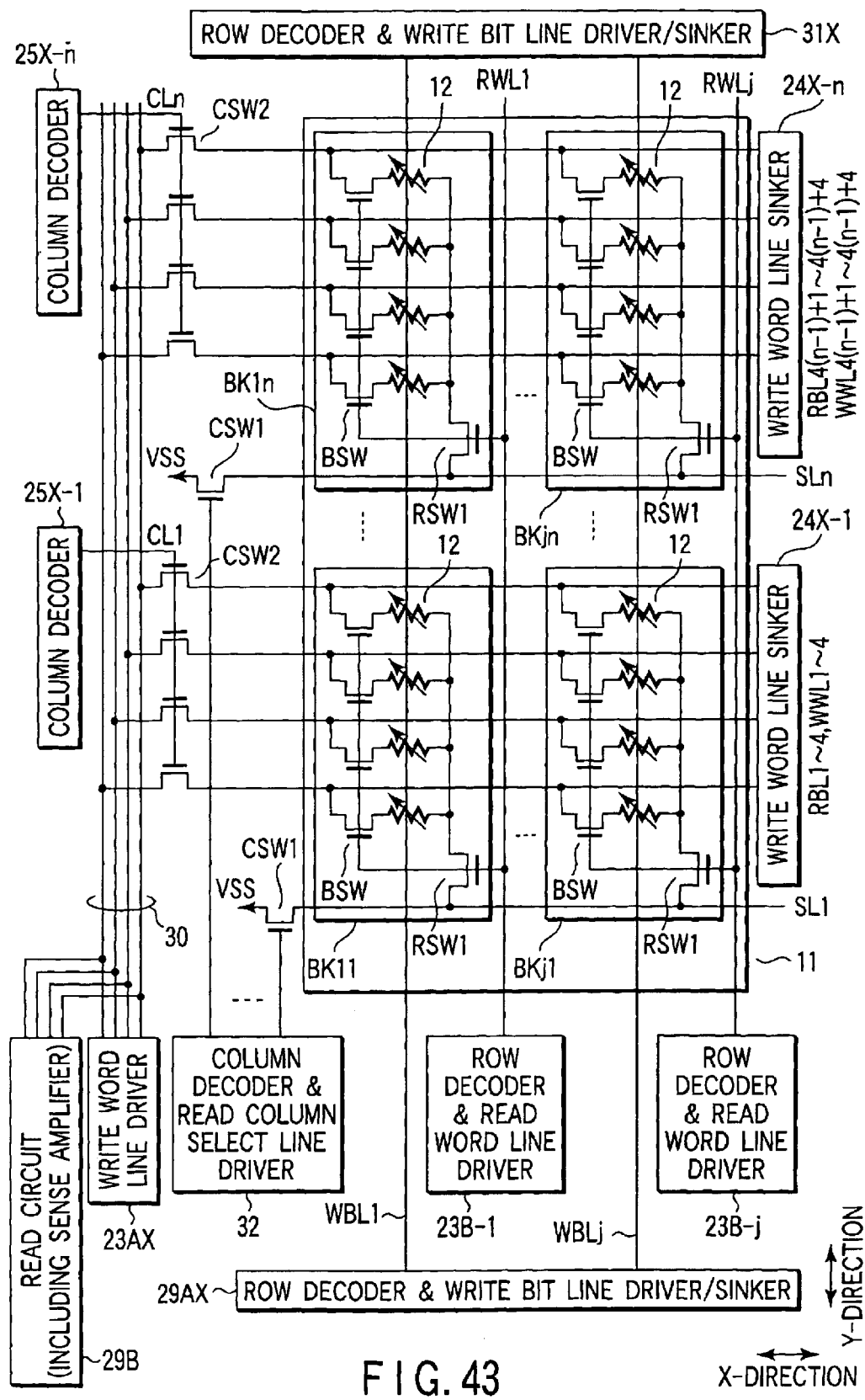
FIG. 43 is a circuit diagram according to Structure Example 11 of the magnetic random access memory of the present invention.

FIG. 43 shows the main part of the magnetic random access memory as Structure Example 11 of the present invention.

Structure Example 11 is characterized in that the block select switch BSW constituted of the MOS transistor is newly disposed in the read block, and only the read blocks belonging to the selected row and column are electrically connected to the read bit lines during the read operation.

Since the memory cell is enlarged in this structure, the structure is disadvantageous for high integration of the memory cell. However, one example of the cell array structure will be described hereinafter.

The gates of the block select switches (MOS transistors) BSW are connected to the read word lines RWLi (i=1, ... j), and the block select switches BSW are controlled by the row address signals. That is, during the read operation, only the block select switches BSW in the read block BKik belonging to the selected row are in the on state.

When Structure Example 11 is used, during the read operation, the read select switch RSW1 off in the unselected row, and therefore the other ends of the TMR elements 12 in the read block BKik of the unselected row are short-circuited from one another. However, at the same time, the block select switch BSW also off in the read block BKik of the unselected row.

Therefore, during the read operation, only the TMR elements MTJ1, MTJ2, MTJ3, MTJ4 in the selected read block BKik are electrically connected to the read bit lines RBL4(n−1)+1, RBL4(n−1)+2, RBL4(n−1)+3, RBL4(n−1)+4 in the selected column.

(8) Structure Example 12

Structure Example 12 shows an example in which one read block is constituted of four TMR elements. Structure Example 12 is a modification example of Structure Example 8 and the relationship of Structure Example 12 and Structure Example 8 is corresponds to that of Structure Example 10 and Structure Example 7.

(8)-1 Circuit Structure

First, the circuit structure will be described.

FIG. 44 shows the main part of the magnetic random access memory as Structure Example 12 of the present invention.

The memory cell array 11 has a plurality of TMR elements 12 arranged in the array in the X and Y-directions. The memory cell array 11 has a cell array structure constituted of 4×j TMR elements 12 arranged in the X-direction, and n TMR elements 12 arranged in the Y-direction.

Four TMR elements 12 arranged in the X-direction constitute one read block BKik (i=0, 1, ... j, k=0, 1, ... n). The j read blocks BKik arranged in the X-direction constitute one row. The memory cell array 11 has n rows. Moreover, the n read blocks BKik arranged in the Y-direction constitute one column. The memory cell array 11 has the j columns.

One end of each of four TMR elements 12 in the block BKik is connected in common to the source line SLi (i=0, 1, ... j), for example, via the read select switch RSW constituted of the MOS transistor. The source lines SLi extend in the Y-direction, and only one source line is disposed in one column.

Each source line SLi is connected to the ground point, for example, via a column select switch 29C constituted of the MOS transistor.

During the read operation, the read select switch RSW is turned on in the read block BKik in the selected row. Moreover, since the column select switch 29C is turned on in the selected column, the source line SLi is supplied with the ground potential. That is, the read current flows only through the TMR elements 12 in the read block BKik positioned in the intersection of the selected row and column.

Additionally, during the read operation, since the column select switch 29C is off in the unselected column, the other ends of the TMR elements 12 in the read block BKik of the unselected column are short-circuited from one another.

In this case, when read bit lines BL4(j−1)+1, BL4(j−1)+2, BL4(j−1)+3, BL4(j−1)+4 in the unselected column have different potentials, the read operation is sometimes influenced. Therefore, the read bit lines BL4(j−1)+1, BL4(j−1)+2, BL4(j−1)+3, BL4(j−1)+4 in the unselected column are set to the same potential (e.g., the ground potential).

Moreover, during the read operation, since the read select switch RSW is off in the unselected row, the other ends of the TMR elements 12 in the read block BKik of the unselected row are also short-circuited from one another.

The other ends of four TMR elements 12 in the read block BKik are independently connected to the read bit lines BL4(j−1)+1, BL4(j−1)+2, BL4(j−1)+3, BL4(j−1)+4. That is, for the four TMR elements 12 in one read block BKik, four read bit lines BL4(j−1)+1, BL4(j−1)+2, BL4(j−1)+3, BL4(j−1)+4 are arranged.

The read bit lines BL4(j−1)+1, BL4(j−1)+2, BL4(j−1)+3, BL4(j−1)+4 extend in the Y-direction, and one end of each read bit line is connected to the common data line 30 via the column select switch (MOS transistor) 29C. The common data line 30 is connected to the read circuit (including, for example, the sense amplifier, selector and output buffer) 29B.

The column select line signals CSLi (i=0, 1, ... j) are inputted into the column select switch 29C. The column decoder 32 outputs the column select line signals CSLi.

In this example, the read bit lines BL4(j−1)+1, BL4(j−1)+2, BL4(j−1)+3, BL4(j−1)+4 and also function as the write bit lines.

That is, one end of each of the read/write bit lines BL4(j−1)+1, BL4(j−1)+2, BL4(j−1)+3, BL4(j−1)+4 is connected to the circuit block 29A including the column decoder and write bit line driver/sinker, and the other ends are connected to the circuit block 31 including the column decoder and write bit driver/sinker.

During the write operation, the circuit blocks 29A, 31 are brought in the operation state. Moreover, the write current flows toward the circuit block 29A or 31 in the read/write bit lines BL4(j−1)+1, BL4(j−1)+2, BL4(j−1)+3, BL4(j−1)+4 in accordance with the write data.

Write word lines WWLk (k=1, ... n) extending in the X-direction are arranged in the vicinity of four TMR elements 12 constituting the read block BKik. In this example, only one write word line extending in the X-direction is disposed in one row.

One end of each write word line WWLk is connected to a write word line driver 23A-k, and the other end thereof is connected to a write word line sinker 24-k.

The gate of the read select switch (MOS transistor) RSW and the gate of the block select switch (MOS transistor) BSW are both connected to read word lines RWLk (k=1, ... n). Only one read word line RWLk is disposed in one row, and is common to a plurality of blocks Bkjk arranged in the X-direction.

Each row decoder 25-k (k=1, ... n) selects one of a plurality of rows based on the row address signal during the write operation. The write word line driver 23A-k supplies the write current to the write word lines WWLk in the selected row. The write current is absorbed by the write word line sinker 24-k.

The row decoder 25-k selects one of the plurality of rows based on the row address signal during the read operation. The read word line driver 23B-k supplies the read voltage (="H") to the read word lines RWLk in the selected row.

In the magnetic random access memory of this example, one column is constituted of a plurality of read blocks, and a plurality of TMR elements in each read block are connected to the respective different read bit lines. Therefore, the data of the plurality of TMR elements in the read block can be read at once by one read step.

Moreover, one end of each of the plurality of TMR elements in the read block is connected in common. Moreover, each read bit line also functions as the write bit line, and it is unnecessary to dispose the wiring which functions only as the write bit line in the cell array. Therefore, the cell array structure can be simplified.

(8)-2 Device Structure

The device structure will next be described.

[1] Sectional Structure

Figure 45:
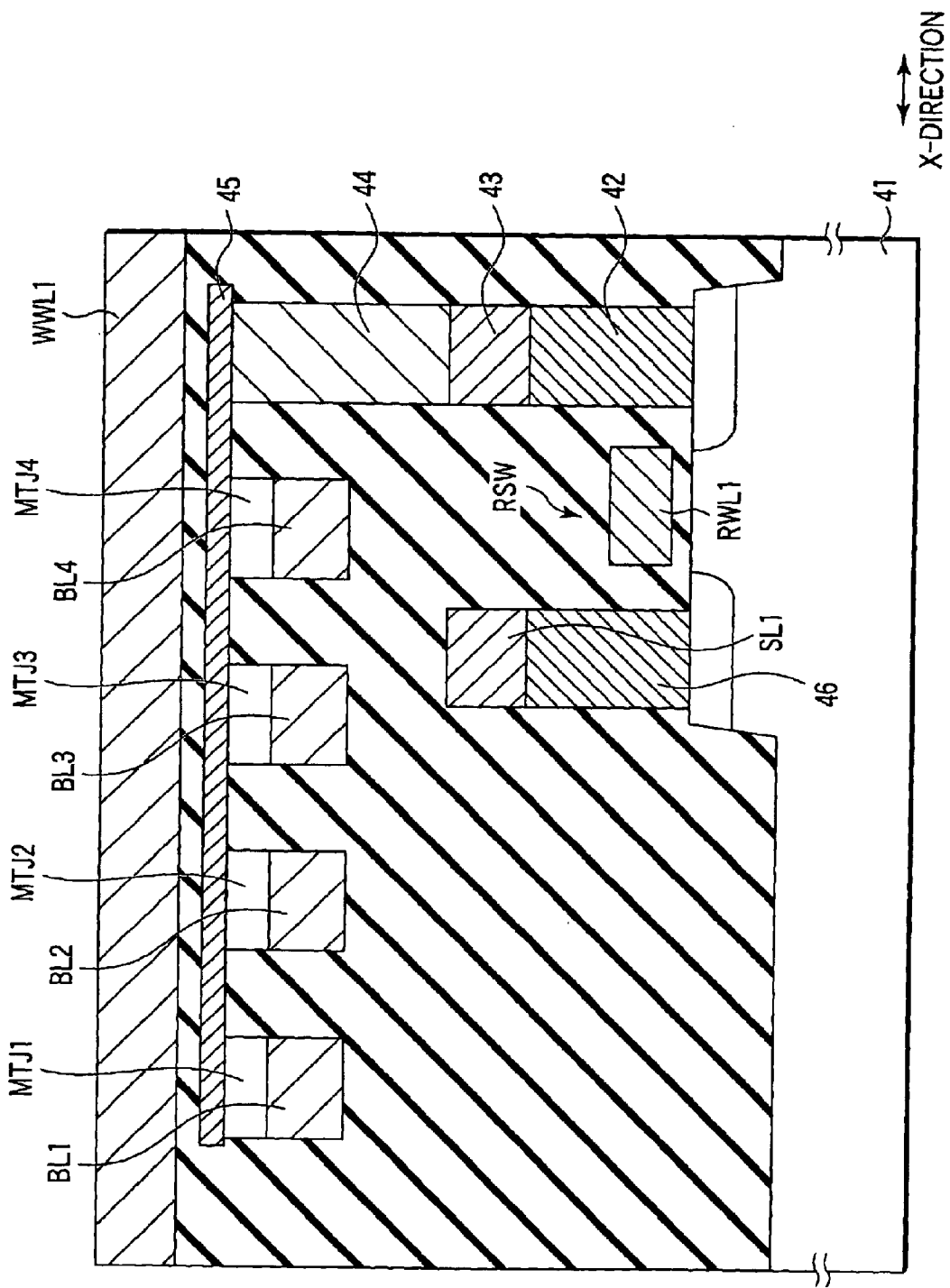
FIG. 45 is a sectional view showing the device structure according to Structure Example 12.

FIG. 45 shows the device structure for one block of the magnetic random access memory as Structure Example 12 of the present invention.

Additionally, for the correspondence to the elements of the circuit of FIG. 44, the elements shown in FIG. 45 are denoted with the same reference numerals as those of FIG. 44. Moreover, in the sectional structure of FIG. 45, the block select transistor BSW in FIG. 44 is omitted.

The read select switch (MOS transistor) RSW is disposed in the surface region of the semiconductor substrate 41. The source of the read select switch RSW is connected to the source line SL1 via the contact plug 46. The source line SL1 linearly extends, for example, in the Y-direction (column direction), and is connected to the ground point VSS via the column select switch in the periphery of the memory cell array region.

The gate of the read select switch (MOS transistor) RSW forms the read word line RWL1. The read word line RWL1 extends in the X-direction. Above the read select switch RSW, four TMR elements (magnetic tunnel junction (MTJ) elements) MTJ1, MTJ2, MTJ3, MTJ4 are arranged in the Y-direction.

One end (upper end in this example) of each of the TMR elements MTJ1, MTJ2, MTJ3, MTJ4 is connected in common to the upper electrode 45. The contact plugs 42, 44 and intermediate layer 43 electrically connect the upper electrode 45 to the drain of the read select switch RSW.

The other ends (lower ends in this example) of the TMR elements MTJ1, MTJ2, MTJ3, MTJ4 are electrically connected to the read bit lines (write bit lines) BL1, BL2, BL3, BL4. The read bit lines BL1, BL2, BL3, BL4 extend in the Y-direction (column direction).

The respective TMR elements MTJ1, MTJ2, MTJ3, MTJ4 are independently connected to the read bit lines BL1, BL2, BL3, BL4. That is, four read bit lines BL1, BL2, BL3, BL4 are disposed for four TMR elements MTJ1, MTJ2, MTJ3, MTJ4.

The write word line WWL1 is disposed right above the TMR elements MTJ1, MTJ2, MTJ3, MTJ4 and in the vicinity of the elements. The write word line WWL1 extends in the X-direction (row direction).

In this example, one write word line WWL1 is disposed for four TMR elements MTJ1, MTJ2, MTJ3, MTJ4 constituting the read block. Additionally, instead, for example, four TMR elements MTJ1, MTJ2, MTJ3, MTJ4 are piled up, and four write word lines may be disposed for the four TMR elements MTJ1, MTJ2, MTJ3, MTJ4.

Moreover, in this example, with respect to the TMR elements MTJ1, MTJ2, MTJ3, MTJ4, the write word line WWL1 extending in the X-direction is disposed in the upper portion, and the read bit lines BL1, BL2, BL3, BL4 extending in the Y-direction are disposed in the lower portion.

However, the positional relation of the write word line WWL1 and read bit lines BL1, BL2, BL3, BL4 with respect to the TMR elements MTJ1, MTJ2, MTJ3, MTJ4 is not limited to this.

For example, as shown in FIG. 97, with respect to the TMR elements MTJ1, MTJ2, MTJ3, MTJ4, the write word line WWL1 extending in the X-direction is disposed in the lower portion, and the read bit lines BL1, BL2, BL3, BL4 extending in the Y-direction are arranged in the upper portion.

According to the device structure, the plurality of TMR elements MTJ1, MTJ2, MTJ3, MTJ4 in the read block are electrically connected to the respective different read bit lines (write bit lines) BL1, BL2, BL3, BL4.

Therefore, the data of the plurality of TMR elements MTJ1, MTJ2, MTJ3, MTJ4 in the read block can be read out at once by one read step.

Moreover, one end of each of the plurality of MTJ1, MTJ2, MTJ3, MTJ4 in the read block is connected in common to one read select switch RSW. Furthermore, the write word line WWL1 extending in the X-direction is shared by the plurality of TMR elements MTJ1, MTJ2, MTJ3, MTJ4 in the read block. Therefore, the cell array structure is prevented from being complicated.

[Planar Structure]

Figure 46:
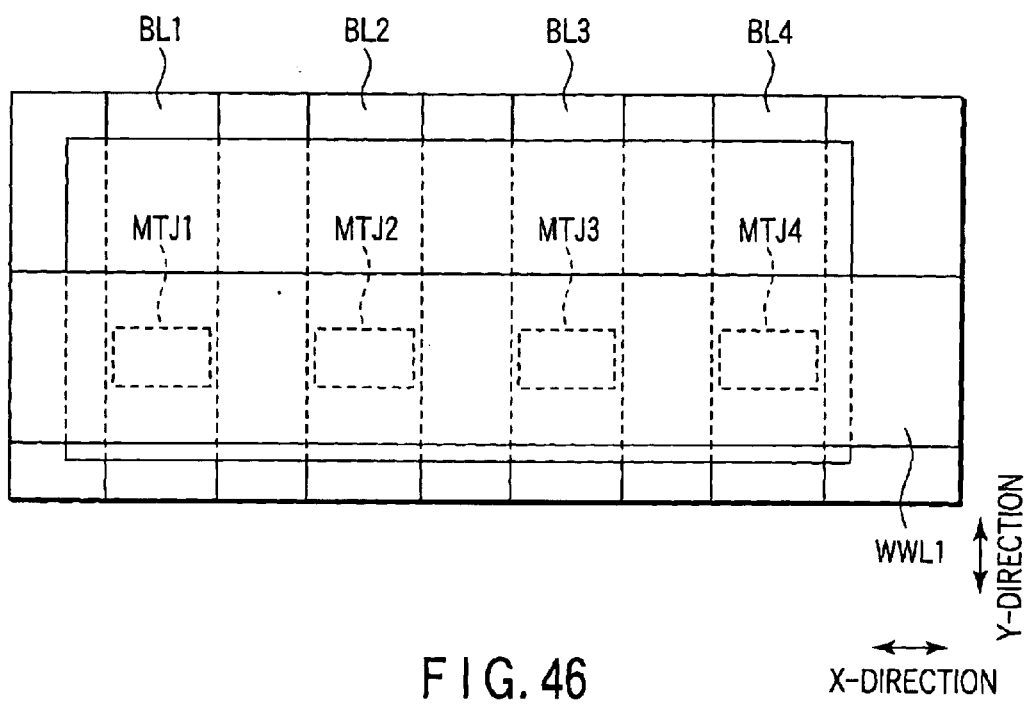
FIG. 46 is a plan view showing the device structure according to Structure Example 12.

FIG. 46 shows the positional relation of the TMR elements, write word line and read bit lines (write bit lines) in the device structure of FIG. 45.

The upper electrode 45 of the TMR elements MTJ1, MTJ2, MTJ3, MTJ4 has, for example, the rectangular pattern, and a contact region with the contact plug is disposed in a part of the pattern.

The TMR elements MTJ1, MTJ2, MTJ3, MTJ4 are arranged in the X-direction, and the axis of easy magnetization turns to the X-direction. That is, the TMR elements MTJ1, MTJ2, MTJ3, MTJ4 have rectangular shapes elongated in the X-direction.

The TMR elements MTJ1, MTJ2, MTJ3, MTJ4 are arranged in the intersections of the write word line WWL1 and the read bit lines (write bit lines) BL1, BL2, BL3, BL4.

(9) Others

In Structure Examples 1 to 12, it is assumed that the MOS transistors are used as the read select switch, row select switch, column select switch and block select switch of the magnetic random access memory. However, other switch elements such as a metal insulator semiconductor (MIS) transistor (including MOSFET), metal semiconductor (MES) transistor, junction transistor, bipolar transistor or diode can also be used as the read select switch.

2. Structure Example of TMR Element

Figure 47:
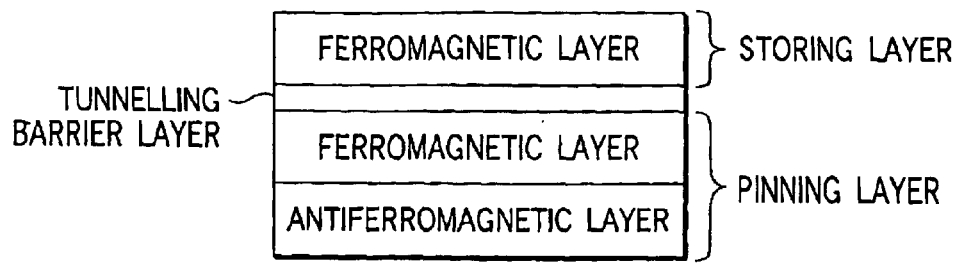
FIG. 47 is a diagram showing a structure example of a TMR element.
Figure 48:
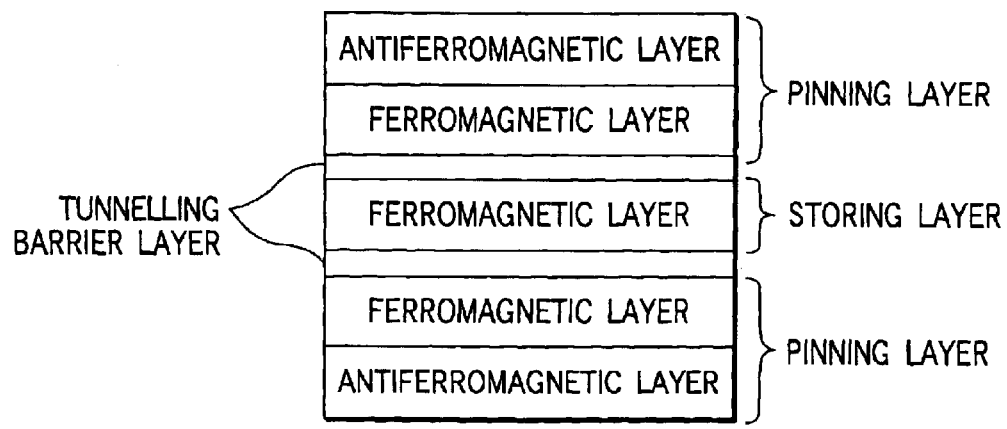
FIG. 48 is a diagram showing a structure example of the TMR element.
Figure 49:
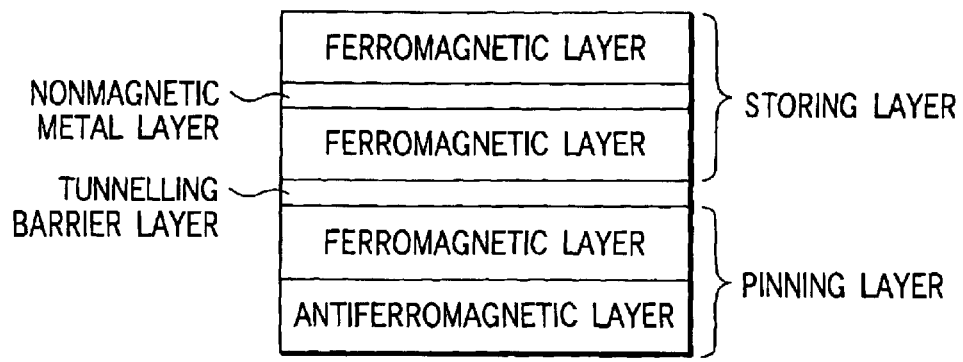
FIG. 49 is a diagram showing a structure example of the TMR element.

FIGS. 47 to 49 show structure examples of the TMR elements.

The TMR element shown in the example of. FIG. 47 has a most basic structure, and has two ferromagnetic layers and a tunneling barrier layer held between the ferromagnetic layers.

For the two ferromagnetic layers, an antiferromagnetic layer for fixing the direction of magnetization is added to a pinning layer whose direction of magnetization is fixed. For the two ferromagnetic layers, a free layer (storing layer) whose direction of magnetization can freely be changed has the direction of magnetization determined by a synthesized magnetic field formed by the write word line and write bit line.

The TMR element shown in the example of FIG. 48 is different from the TMR element of the example of FIG. 47 in that two tunneling barrier layers are disposed in the TMR element for a purpose of increasing the bias voltage.

It can be said that the TMR element of FIG. 48 has a structure (double junction structure) constituted by connecting two TMR elements of FIG. 47 in series.

In this example, the TMR element has three ferromagnetic layers, and the tunneling barrier layers are disposed among the ferromagnetic layers. The respective antiferromagnetic layers are added to two ferromagnetic layers (pinning layers) of opposite ends. Among the three ferromagnetic layers, the free layer (storing layer) whose direction of magnetization can freely be changed forms the middle ferromagnetic layer.

The TMR element shown in the example of FIG. 49 is different from the TMR element of the example of FIG. 47 in that a magnetic force line in the ferromagnetic layer as the storing layer is easily closed.

In the TMR element of this example, it can be said that the storing layer of the TMR element of FIG. 47 is replaced with the storing layer constituted of two ferromagnetic layers and a nonmagnetic metal layer (e.g., aluminum) held between the ferromagnetic layers.

Since the storing layer of the TMR element has a three-layers structure constituted of two ferromagnetic layers and the nonmagnetic metal layer held between the ferromagnetic layers, the magnetic force line is easily closed in two ferromagnetic layers constituting the storing layer. That is, since an antimagnetic component can be prevented from being generated in two ferromagnetic layers constituting the storing layer, an MR ratio can be enhanced.

The structure examples of the TMR elements have been described above. However, for the present invention (circuit structure, device structure, read operation mechanism, read circuit and manufacturing method), the structures of the TMR elements are not particularly limited. The above-described three structure examples are shown merely as typical examples of the structure of the TMR element.

3. Circuit Example of Peripheral Circuit

Circuit examples of the write word line driver/sinker, write bit line driver/sinker, read word line driver, row decoder, column decoder, and read circuit (including the sense amplifier) will successively be described hereinafter.

(1) Write Driver/Sinker (1)-1 For Structure Examples 1, 2, 4, 6

FIG. 50 shows a circuit example of the write word line driver/sinker applied to Structure Examples 1, 2, 4, 6.

It is assumed that the read block is constituted of four TMR elements, and these four TMR elements are selected by two lower bits CA0, CA1 of the column address signal. In FIG. 50, the write word sinker only for one row is shown.

The write word line driver 23A includes P-channel MOS transistors QP1, QP2, QP3, QP4 and NAND gate circuits ND1, ND2, ND3, ND4. The write word line sinker 24-n is constituted of N-channel MOS transistors QN1, QN2, QN3, QN4.

The source of the P-channel MOS transistor QP1 is connected to a power source terminal VDD, and the drain thereof is connected to one end of the write word line WWL4(n−1)+1 via the common data line (common driver line) 30 and row select switch RSW2. An output terminal of the NAND gate circuit ND1 is connected to the gate of the P-channel MOS transistor QP1.

The source of the N-channel MOS transistor QN1 is connected to the ground terminal VSS, and the drain thereof is connected to the other end of the write word line WWL4(n−1)+1.

When an output signal of the NAND gate circuit ND1 is "0", the write current flows through the write word line WWL4(n−1)+1 in the selected row (row in which the row select switch RSW2 has the on state).

The source of the P-channel MOS transistor QP2 is connected to the power source terminal VDD, and the drain thereof is connected to one end of the write word line WWL4(n−1)+2 via the common data line (common driver line) 30 and row select switch RSW2. The output terminal of the NAND gate circuit ND2 is connected to the gate of the P-channel MOS transistor QP2.

The source of the N-channel MOS transistor QN2 is connected to the ground terminal VSS, and the drain thereof is connected to the other end of the write word line WWL4(n−1)+2.

When the output signal of the NAND gate circuit ND2 is "0", the write current flows through the write word line WWL4(n−1)+2 in the selected row (row in which the row select switch RSW2 has the on state).

The source of the P-channel MOS transistor QP3 is connected to the power source terminal VDD, and the drain thereof is connected to one end of the write word line WWL4(n−1)+3 via the common data line (common driver line) 30 and row select switch RSW2. The output terminal of the NAND gate circuit ND3 is connected to the gate of the P-channel MOS transistor QP3. The source of the N-channel MOS transistor QN3 is connected to the ground terminal VSS, and the drain thereof is connected to the other end of the write word line WWL4(n−1)+3.

When the output signal of the NAND gate circuit ND3 is "0", the write current flows through the write word line WWL4(n−1)+3 in the selected row (row in which the row select switch RSW2 has the on state).

The source of the P-channel MOS transistor QP4 is connected to the power source terminal VDD, and the drain thereof is connected to one end of the write word line WWL4(n−1)+4 via the common data line (common driver line) 30 and row select switch RSW2. The output terminal of the NAND gate circuit ND4 is connected to the gate of the P-channel MOS transistor QP4.

The source of the N-channel MOS transistor QN4 is connected to the ground terminal VSS, and the drain thereof is connected to the other end of the write word line WWL4(n−1)+4.

When the output signal of the NAND gate circuit ND4 is "0", the write current flows through the write word line WWL4(n−1)+4 in the selected row (row in which the row select switch RSW2 has the on state).

Write signals WRITE are inputted to the NAND gate circuits ND1, ND2, ND3, ND4. During the write operation, each write signal WRITE becomes "H". Furthermore, respective different lower order column address signals CA0, bCA0, CA1, bCA1 are inputted into the NAND gate circuits ND1, ND2, ND3, ND4.

That is, in this example, the column address signals bCA0, bCA1 are used in selecting one write word line WWL4(n−1)+1 among four write word lines (read bit lines) in the selected row, and inputted into the NAND gate circuit ND1.

The column address signals CA0, bCA1 are used in selecting one write word line WWL4(n−1)+2 among four write word lines (read bit lines) in the selected row, and inputted into the NAND gate circuit ND2.

The column address signals bCA0, CA1 are used in selecting one write word line WWL4(n−1)+3 among four write word lines (read bit lines) in the selected row, and inputted into the NAND gate circuit ND3.

The column address signals CA0, CA1 are used in selecting one write word line WWL4(n−1)+4 among four write word lines (read bit lines) in the selected row, and inputted into the NAND gate circuit ND4.

Additionally, bCA0 and bCA1 are reverse signals which have levels obtained by reversing the levels of CA0 and CA1.

In this write word line driver/sinker, during the write operation, each write signal becomes "H", and the output signal of one of four NAND gate circuits ND1, ND2, ND3, ND4 becomes "L".

For example, when CA0 and CA1 both indicate "0", all input signals of the NAND gate circuit ND1 indicate "1", and the output signal of the NAND gate circuit ND1 indicates "0". As a result, the P-channel MOS transistor QP1 is turned on, and the write current flows through the write word line WWL4(n−1)+1.

Moreover, when CA0 indicates "1" and CA1 indicates "0", all the input signals of the NAND gate circuit ND2 indicate "1", and the output signal of the NAND gate circuit ND2 indicates "0". As a result, the P-channel MOS transistor QP2 is turned on, and the write current flows through the write word line WWL4(n−1)+2.

Furthermore, when CA0 indicates "0" and CA1 indicates "1", all the input signals of the NAND gate circuit ND3 indicate "1", and the output signal of the NAND gate circuit ND3 indicates "0". As a result, the P-channel MOS transistor QP3 is turned on, and the write current flows through the write word line WWL4 (n−1)+3.

Additionally, when CA0 and CA1 both indicate "1", all the input signals of the NAND gate circuit ND4 indicate "1", and the output signal of the NAND gate circuit ND4 indicates "0". As a result, the P-channel MOS transistor QP4 is turned on, and the write current flows through the write word line WWL4(n−1)+4.

(1)-2 For Structure Examples 7, 9, 10, 11

FIG. 51 shows the circuit example of the write bit line driver/sinker applied to Structure Examples 7, 9, 10, 11.

The write bit line driver/sinker 29AX is constituted of P-channel MOS transistors QP5, QP6, N-channel MOS transistors QN5, QN6, NAND gate circuits ND5, ND6, AND gate circuits AD1, AD2 and inverters INV1, INV2.

The P-channel MOS transistor QP5 is connected between the power source terminal VDD and one end of the write bit line WBL1. The output signal of the NAND gate circuit ND5 is supplied to the gate of the P-channel MOS transistor QP5. The N-channel MOS transistor QN5 is connected between one end of the write bit line WBL1 and the ground terminal VSS. The output signal of the AND gate circuit AD1 is supplied to the gate of the N-channel MOS transistor QN5.

The P-channel MOS transistor QP6 is connected between the power source terminal VDD and one end of the write bit line WBLj. The output signal of the NAND gate circuit ND6 is supplied to the gate of the P-channel MOS transistor QP6. The N-channel MOS transistor QN6 is connected between one end of the write bit line WBLj and the ground terminal VSS. The output signal of the AND gate circuit AD2 is supplied to the gate of the N-channel MOS transistor QN6.

The write bit line driver/sinker 31X is constituted of P-channel MOS transistors QP7, QP8, N-channel MOS transistors QN7, QNB, NAND gate circuits ND7, ND8, AND gate circuits AD3, AD4 and inverters INV3, INV4.

The P-channel MOS transistor QP7 is connected between the power source terminal VDD and the other end of the word bit line WBL1. The output signal of the NAND gate circuit ND7 is supplied to the gate of the P-channel MOS transistor QP7. The N-channel MOS transistor QN7 is connected between the other end of the write bit line WBL1 and the ground terminal VSS. The output signal of the AND gate circuit AD3 is supplied to the gate of the N-channel MOS transistor QN7.

The P-channel MOS transistor QP8 is connected between the power source terminal VDD and the other end of the word bit line WBLj. The output signal of the NAND gate circuit ND8 is supplied to the gate of the P-channel MOS transistor QP8. The N-channel MOS transistor QN8 is connected between the other end of the write bit line WBLj and the ground terminal VSS. The output signal of the AND gate circuit AD4 is supplied to the gate of the N-channel MOS transistor QN8.

When the output signal of the NAND gate circuit ND5 indicates "0", and the output signal of the AND gate circuit AD3 indicates "1" in the write bit line drivers/sinkers 29AX, 31X, the write current flows toward the write bit line driver/sinker 31X from the write bit line driver/sinker 29AX in the write bit line WBL1.

Moreover, when the output signal of the NAND gate circuit ND7 indicates "0", and the output signal of the AND gate circuit AD1 indicates "1", the write current flows toward the write bit line driver/sinker 29AX from the write bit line driver/sinker 31X in the write bit line WBL1.

In the write bit line drivers/sinkers 29AX, 31X, during the write operation, the write signal WRITE indicates "1". Moreover, all the bits of the row address signal indicate "1" in the selected row. Therefore, the write current having the direction corresponding to the value of write data DATA flows through the write bit line WBLi (i=1, . . . j) in the selected row.

The direction of the write current flowing through the write bit line WBLi in the selected row is determined in accordance with the value of the write data DATA.

For example, when the write bit line WBL1 is selected, and the write data DATA indicates "1", the output signal of the NAND gate circuit ND5 indicates "0", and the output signal of the AND gate circuit AD3 indicates "1". As a result, the write current flows toward the write bit line driver/sinker 31X from the write bit line driver/sinker 29AX in the write bit line WBL1.

Conversely, when the write data DATA indicates "0", the output signal of the NAND gate circuit ND7 indicates "0", and the output signal of the AND gate circuit AD1 indicates "1". As a result, the write current flows toward the write bit line driver/sinker 29AX from the write bit line driver/sinker 31X in the write bit line WBL1.

(1)-3 For Structure Example 5

FIG. 52 shows the write word line driver applied to Structure Example 5.

Additionally, since the write word line sinker in Structure Example 5 has the same structure as the structures of the write word line sinkers 24-1, . . . 24-n shown in FIG. 50, the description thereof is omitted.

In this example, only the write word line driver for one row is shown.

The write word line driver 33-1 is constituted of P-channel MOS transistors P1, P2, P3, P4 connected to the write word lines WWL1, WWL2, WWL3, WWL4.

The P-channel MOS transistors P1, P2, P3, P4 are connected between the power source terminal VDD, and the write word lines WWL1, WWL2, WWL3, WWL4, and are controlled by word line enable signals WLEN. Each word line enable signal WLEN is a signal obtained by decoding the row address signal by the row decoder.

(1)-4 For Structure Example 12

FIG. 53 shows the circuit example of the write word line driver/sinker applied to Structure Example 12.

In this example, the write word line driver is formed integrally with the row decoder.

The write word line driver 23A-1 and row decoder 25-1 includes the P-channel MOS transistor QP9 and NAND gate circuit ND9. The write word line sinker 24-1 is constituted of the N-channel MOS transistor QN9.

The source of the P-channel MOS transistor QP9 is connected to the power source terminal VDD, and the drain thereof is connected to one end of the write word line WWL1. The output terminal of the NAND gate circuit ND9 is connected to the gate of the P-channel Mos transistor QP9. The source of the N-channel MOS transistor QN9 is connected to the ground terminal VSS, and the drain thereof is connected to the other end of the write word line WWL1.

When the output signal of the NAND gate circuit ND9 indicates "0", the write current flows through the write word line WWL1.

The write word line driver 23A-1 and row decoder 25-n include the P-channel MOS transistor QP10 and NAND gate circuit ND10. The write word line sinker 24-n is constituted of the N-channel MOS transistor QN10.

The source of the P-channel MOS transistor QP10 is connected to the power source terminal VDD, and the drain thereof is connected to one end of the write word line WWL1. The output terminal of the NAND gate circuit ND10 is connected to the gate of the P-channel MOS transistor QP10. The source of the N-channel MOS transistor QN10 is connected to the ground terminal VSS, and the drain thereof is connected to the write word line WWLn.

When the output signal of the NAND gate circuit ND10 indicates "0", the write current flows through the write word line WWLn. The write signals WRITE are inputted into the NAND gate circuits ND9, ND10.

The write signals WRITE become "H" during the write operation.

Since the write signal WRITE becomes "H" during the write operation in the write word line driver/sinker, for example, the output signals of the NAND gate circuits ND9, ND10 in the row selected by the row address signal become "L". As a result, the write current flows through the write word lines WWLk (k=1, . . . n) in the selected row.

(2) Write Driver/Sinker (2)-1 For Structure Examples 1, 2, 4, 5, 6

FIG. 54 shows the circuit example of the write bit line driver/sinker applied to Structure Examples 1, 2, 4, 5, 6.

The write bit line driver/sinker 29A is constituted of the P-channel MOS transistors QP5, QP6, N-channel MOS transistors QN5, QN6, NAND gate circuits ND5, ND6, AND gate circuits AD1, AD2 and inverters INV1, INV2.

The P-channel MOS transistor QP5 is connected between the power source terminal VDD and one end of the word bit line WBL1. The output signal of the NAND gate circuit ND5 is supplied to the gate of the P-channel MOS transistor QP5. The N-channel MOS transistor QN5 is connected between one end of the write bit line WBL1 and the ground terminal VSS. The output signal of the AND gate circuit AD1 is supplied to the gate of the N-channel MOS transistor QN5.

The P-channel MOS transistor QP6 is connected between the power source terminal VDD and one end of the word bit line WBLj. The output signal of the NAND gate circuit ND6 is supplied to the gate of the P-channel MOS transistor QP6. The N-channel MOS transistor QN6 is connected between one end of the write bit line WBLj and the ground terminal VSS. The output signal of the AND gate circuit AD2 is supplied to the gate of the N-channel MOS transistor QN6.

The write bit line driver/sinker 31 is constituted of the P-channel MOS transistors QP7, QP8, N-channel MOS transistors QN7, QN8, NAND gate circuits ND7, ND8, AND gate circuits AD3, AD4 and inverters INV3, INV4.

The P-channel MOS transistor QP7 is connected between the power source terminal VDD and the other end of the word bit line WBL1. The output signal of the NAND gate circuit ND7 is supplied to the gate of the P-channel MOS transistor QP7. The N-channel MOS transistor QN7 is connected between the other end of the write bit line WBL1 and the ground terminal VSS. The output signal of the AND gate circuit AD3 is supplied to the gate of the N-channel MOS transistor QN7.

The P-channel MOS transistor QPB is connected between the power source terminal VDD and the other end of the word bit line WBLj. The output signal of the NAND gate circuit ND8 is supplied to the gate of the P-channel MOS transistor QP8. The N-channel MOS transistor QNB is connected between the other end of the write bit line WBLj and the ground terminal VSS. The output signal of the AND gate circuit AD4 is supplied to the gate of the N-channel MOS transistor QNB.

When the output signal of the NAND gate circuit ND5 indicates "0", and the output signal of the AND gate circuit AD3 indicates "1" in the write bit line drivers/sinkers 29A, 31, the write current flows toward the write bit line driver/sinker 31 from the write bit line driver/sinker 29A in the write bit line WBL1.

Moreover, when the output signal of the NAND gate circuit ND7 indicates "0", and the output signal of the AND gate circuit AD1 indicates "1", the write current flows toward the write bit line driver/sinker 29A from the write bit line driver/sinker 31 in the write bit line WBL1.

In the write bit line drivers/sinkers 29A, 31, during the write operation, the write signal WRITE indicates "1". Moreover, all the bits of the superior column address signal indicate "1" in the selected column. Therefore, the write current having the direction corresponding to the value of the write data DATA flows through the write bit line WBLi (i=1, . . . j) in the selected column.

The direction of the write current flowing through the write bit line WBLi in the selected column is determined in accordance with the value of the write data DATA.

For example, when the write bit line WBL1 is selected, and the write data DATA indicates "1", the output signal of the NAND gate circuit ND5 indicates "0", and the output signal of the AND gate circuit AD3 indicates "1". As a result, the write current flows toward the write bit line driver/sinker 31 from the write bit line driver/sinker 29A in the write bit line WBL1.

Conversely, when the write data DATA indicates "0", the output signal of the NAND gate circuit ND7 indicates "0", and the output signal of the AND gate circuit AD1 indicates "1". As a result, the write current flows toward the write bit line driver/sinker 29A from the write bit line driver/sinker 31 in the write bit line WBL1.

(2)-2 For Structure Examples 7, 9, 11

FIG. 55 shows the circuit example of the write word line driver/sinker applied to Structure Examples 7, 9, 11.

It is assumed that the read block is constituted of four TMR elements, and these four TMR elements are selected by two lower bits CA0, CA1 of the column address signal. In FIG. 55, the write word sinker only for one row is shown.

The write word line driver 23AX includes the P-channel MOS transistors QP1, QP2, QP3, QP4 and NAND gate circuits ND1, ND2, ND3, ND4. The write word line sinker 24X-n is constituted of the N-channel MOS transistors QN1, QN2, QN3, QN4.

The source of the P-channel MOS transistor QP1 is connected to the power source terminal VDD, and the drain thereof is connected to one end of the write word line WWL4(n−1)+1 via the common data line (common driver line) 30 and column select switch CSW2. The output terminal of the NAND gate circuit ND1 is connected to the gate of the P-channel MOS transistor QP1. The source of the N-channel MOS transistor QN1 is connected to the ground terminal VSS, and the drain thereof is connected to the other end of the write word line WWL4(n−1)+1.

When the output signal of the NAND gate circuit ND1 indicates "0", the write current flows through the write word line WWL4(n−1)+1 in the selected column (column in which the column select switch CSW2 has the on state).

The source of the P-channel MOS transistor QP2 is connected to the power source terminal VDD, and the drain thereof is connected to one end of the write word line WWL4(n−1)+2 via the common data line (common driver line) 30 and column select switch CSW2. The output terminal of the NAND gate circuit ND2 is connected to the gate of the P-channel MOS transistor QP2. The source of the N-channel MOS transistor QN2 is connected to the ground terminal VSS, and the drain thereof is connected to the other end of the write word line WWL4(n−1)+2.

When the output signal of the NAND gate circuit ND2 indicates "0", the write current flows through the write word line WWL4(n−1)+2 in the selected column (column in which the column select switch CSW2 has the on state).

The source of the P-channel MOS transistor QP3 is connected to the power source terminal VDD, and the drain thereof is connected to one end of the write word line WWL4(n−1)+3 via the common data line (common driver line) 30 and column select switch CSW2. The output terminal of the NAND gate circuit ND3 is connected to the gate of the P-channel MOS transistor QP3. The source of the N-channel MOS transistor QN3 is connected to the ground terminal VSS, and the drain thereof is connected to the other end of the write word line WWL4(n−1)+3.

When the output signal of the NAND gate circuit ND3 indicates "0", the write current flows through the write word line WWL4(n−1)+3 in the selected column (column in which the column select switch CSW2 has the on state).

The source of the P-channel MOS transistor QP4 is connected to the power source terminal VDD, and the drain thereof is connected to one end of the write word line WWL4(n−1)+4 via the common data line (common driver line) 30 and column select switch CSW2. The output terminal of the NAND gate circuit ND4 is connected to the gate of the P-channel MOS transistor QP4. The source of the N-channel MOS transistor QN4 is connected to the ground terminal VSS, and the drain thereof is connected to the other end of the write word line WWL4(n−1)+4.

When the output signal of the NAND gate circuit ND4 indicates "0", the write current flows through the write word line WWL4(n−1)+4 in the selected column (column in which the column select switch CSW2 has the on state).

The write signals WRITE are inputted into the NAND gate circuits ND1, ND2, ND3, ND4. During the write operation, each write signal WRITE becomes "H". Furthermore, the respective different lower column address signals CA0, bCA0, CA1, bCA1 are inputted into the NAND gate circuits ND1, ND2, ND3, ND4.

That is, in this example, the column address signals bCA0, bCA1 are used in selecting one write word line WWL4(n−1)+1 among four write word lines (read bit lines) in the selected column, and inputted into the NAND gate circuit ND1.

The column address signals CA0, bCA1 are used in selecting one write word line WWL4(n−1)+2 among four write word lines (read bit lines) in the selected column, and inputted into the NAND gate circuit ND2.

The column address signals bCA0, CA1 are used in selecting one write word line WWL4(n−1)+3 among four write word lines (read bit lines) in the selected column, and inputted into the NAND gate circuit ND3.

The column address signals CA0, CA1 are used in selecting one write word line WWL4(n−1)+4 among four write word lines (read bit lines) in the selected column, and inputted into the NAND gate circuit ND4.

Additionally, bCA0 and bCA1 are reverse signals which have levels obtained by reversing the levels of CA0 and CA1.

In this write word line driver/sinker, during the write operation, each write signal becomes "H", and the output signal of one of four NAND gate circuits ND1, ND2, ND3, ND4 becomes "L".

For example, when CA0 and CA1 both indicate "0", all the input signals of the NAND gate circuit ND1 indicate "1", and the output signal of the NAND gate circuit ND1 indicates "0". As a result, the P-channel MOS transistor QP1 is turned on, and the write current flows through the write word line WWL4(n−1)+1.

Moreover, when CA0 indicates "1" and CA1 indicates "0", all the input signals of the NAND gate circuit ND2 indicate "1", and the output signal of the NAND gate circuit ND2 indicates "0". As a result, the P-channel MOS transistor QP2 is turned on, and the write current flows through the write word line WWL4(n−1)+2.

Furthermore, when CA0 indicates "0" and CA1 indicates "1", all the input signals of the NAND gate circuit ND3 indicate "1", and the output signal of the NAND gate circuit ND3 indicates "0". As a result, the P-channel MOS transistor QP3 is turned on, and the write current flows through the write word line WWL4 (n−1)+3.

Additionally, when CAD and CA1 both indicate "1", all the input signals of the NAND gate circuit ND4 indicate "1", and the output signal of the NAND gate circuit ND4 indicates "0". As a result, the P-channel MOS transistor QP4 is turned on, and the write current flows through the write word line WWL4(n−1)+4.

(2)-3 For Structure Example 10

Figure 56:
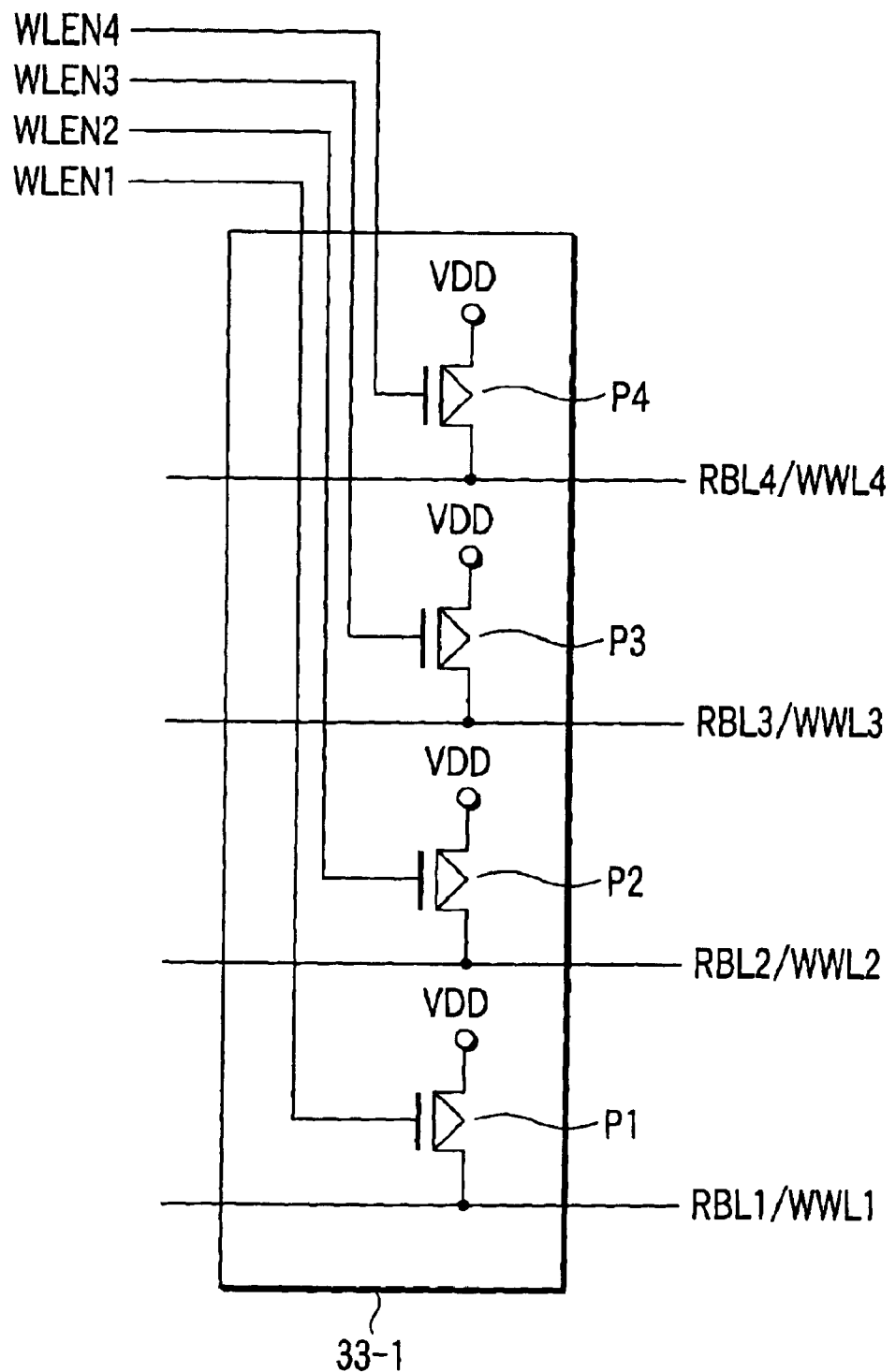
FIG. 56 is a diagram showing the circuit example of the write word line driver.

FIG. 56 shows the write word line driver applied to Structure Example 10.

Additionally, since the write word line sinker in Structure Example 10 has the same structure as the structures of the write word line sinkers 24X-1, . . . 24X-n shown in FIG. 55, the description thereof is omitted.

In this example, only the write word line driver for one column is shown.

The write word line driver 33-1 is constituted of the P-channel MOS transistors P1, P2, P3, P4 connected to the write bit lines WWL1, WWL2, WWL3, WWL4.

The P-channel NOS transistors P1, P2, P3, P4 are connected between the power source terminal VDD and the write bit lines WWL1, WWL2, WWL3, WWL4, and are controlled by bit line enable signals WLEN. Each bit line enable signal WLEN is a signal obtained by decoding the column address signals by the column decoder.

(2)-4 For Structure Example 12

Figure 57:
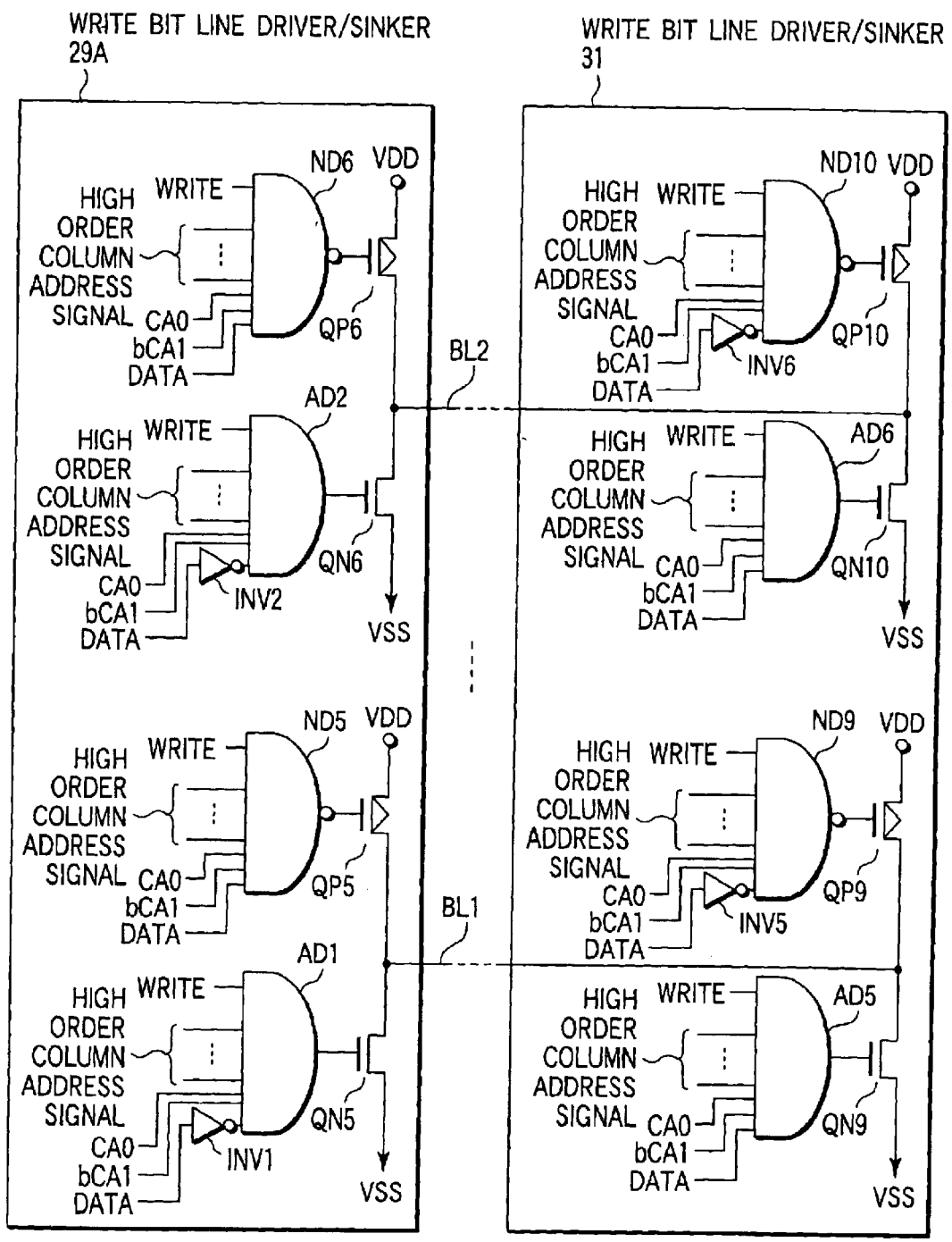
FIG. 57 is a diagram showing the circuit example of the write bit line driver/sinker.
Figure 58:
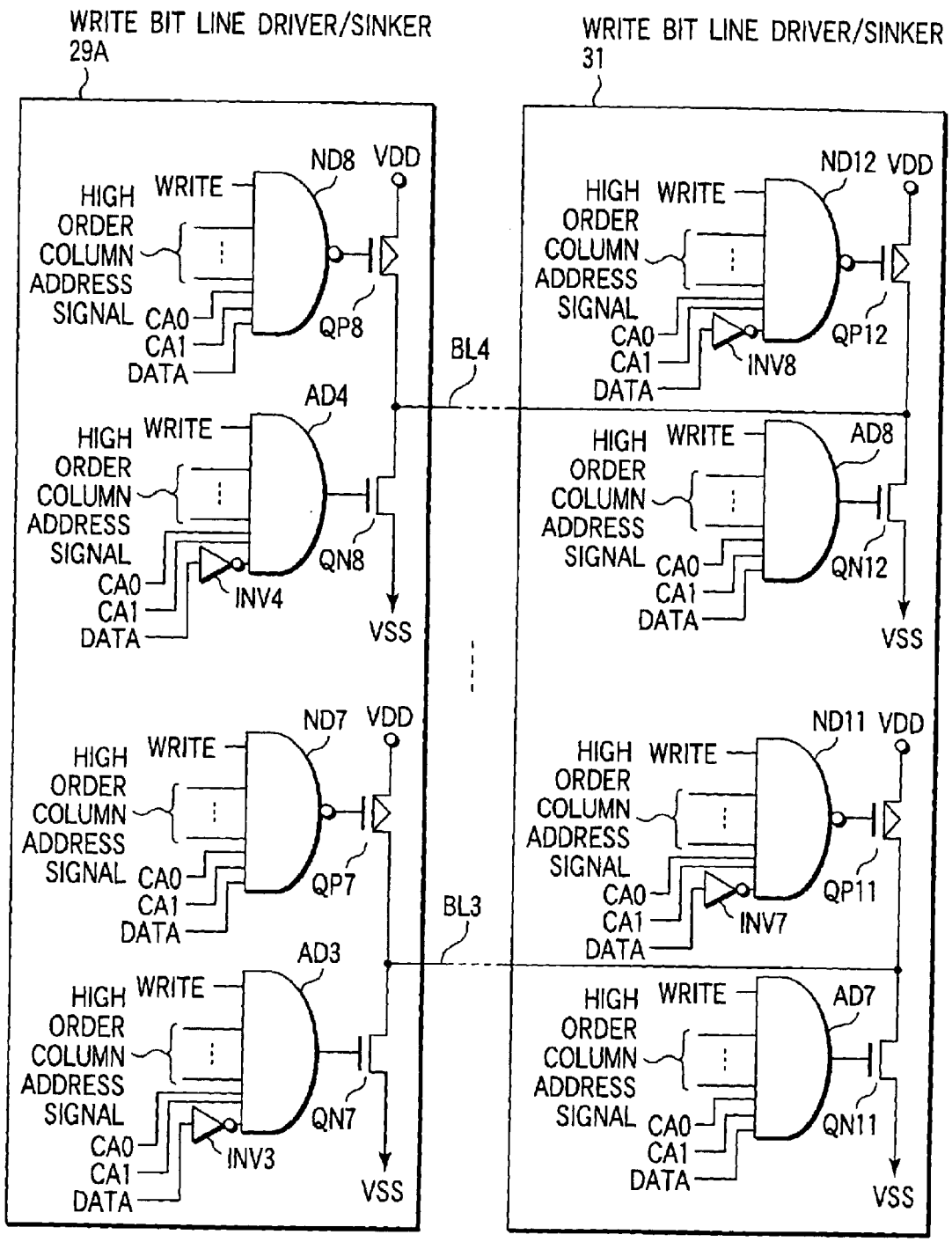
FIG. 58 is a diagram showing the circuit example of the write bit line driver/sinker.

FIGS. 57 and 58 show the circuit examples of the write bit line driver/sinker applied to Structure Example 12.

In this example, it is assumed that the read block is constituted of four TMR elements, and the four TMR elements in the read block are selected by two lower order bits CA0, CA1 of the column address signal. Moreover, the column of the memory cell array is selected by the high order column address signals, that is, the column address signals excluding two lower order bits CA0, CA1 among the column address signals.

Additionally, in the drawings, only the write bit line driver/sinker for one column is shown.

The write bit line driver/sinker 29A is constituted of the P-channel MOS transistors QP5, QP6, QP7, QP8, N-channel MOS transistors QN5, QN6, QN7, QN8, NAND gate circuits ND5, ND6, ND7, ND8, AND gate circuits AD1, AD2, AD3, AD4 and inverters INV1, INV2, 1NV3, INV4.

The P-channel MOS transistor QP5 is connected between the power source terminal VDD and one end of the word bit line BL1. The output signal of the NAND gate circuit ND5 is supplied to the gate of the P-channel MOS transistor QP5. The N-channel MOS transistor QN5 is connected between one end of the write bit line BL1 and the ground terminal VSS. The output signal of the AND gate circuit AD1 is supplied to the gate of the N-channel MOS transistor QN5.

The P-channel MOS transistor QPG is connected between the power source terminal VDD and one end of the word bit line BL2. The output signal of the NAND gate circuit ND6 is supplied to the gate of the P-channel MOS transistor QP6. The N-channel MOS transistor QN6 is connected between one end of the write bit line BL2 and the ground terminal VSS. The output signal of the AND gate circuit AD2 is supplied to the gate of the N-channel MOS transistor QN6.

The P-channel MOS transistor QP7 is connected between the power source terminal VDD and one end of the word bit line BL3. The output signal of the NAND gate circuit ND7 is supplied to the gate of the P-channel MOS transistor QP7. The N-channel MOS transistor QN7 is connected between one end of the write bit line BL3 and the ground terminal VSS. The output signal of the AND gate circuit AD3 is supplied to the gate of the N-channel MOS transistor QN7.

The P-channel MOS transistor QP8 is connected between the power source terminal VDD and one end of the word bit line BL4. The output signal of the NAND gate circuit ND8 is supplied to the gate of the P-channel MOS transistor QP8. The N-channel MOS transistor QN8 is connected between one end of the write bit line BL4 and the ground terminal VSS. The output signal of the AND gate circuit AD4 is supplied to the gate of the N-channel MOS transistor QN8.

The write bit line driver/sinker 31 is constituted of P-channel MOS transistors QP9, QP10, QP11, QP12, N-channel MOS transistors QN9, QN10, QN11, QN12, NAND gate circuits ND9, ND10, ND11, ND12, AND gate circuits AD5, AD6, AD7, AD8 and inverters INV5, INV6, INV7, INV8.

The P-channel MOS transistor QP9 is connected between the power source terminal VDD and the other end of the word bit line BL1. The output signal of the NAND gate circuit ND9 is supplied to the gate of the P-channel MOS transistor QP9. The N-channel MOS transistor QN9 is connected between the other end of the write bit line BL1 and the ground terminal VSS. The output signal of the AND gate circuit AD5 is supplied to the gate of the N-channel MOS transistor QN9.

The P-channel MOS transistor QP10 is connected between the power source terminal VDD and the other end of the write bit line BL2. The output signal of the NAND gate circuit ND10 is supplied to the gate of the P-channel MOS transistor QP10. The N-channel MOS transistor QN10 is connected between the other end of the write bit line BL2 and the ground terminal VSS. The output signal of the AND gate circuit AD6 is supplied to the gate of the N-channel MOS transistor QN10.

The P-channel MOS transistor QP11 is connected between the power source terminal VDD and the other end of the word bit line BL3. The output signal of the NAND gate circuit ND11 is supplied to the gate of the P-channel MOS transistor QP11. The N-channel MOS transistor QN11 is connected between the other end of the write bit line BL3 and the ground terminal VSS. The output signal of the AND gate circuit AD7 is supplied to the gate of the N-channel MOS transistor QN11.

The P-channel MOS transistor QP12 is connected between the power source terminal VDD and the other end of the write bit line BL4. The output signal of the NAND gate circuit ND12 is supplied to the gate of the P-channel MOS transistor QP12. The N-channel MOS transistor QN12 is connected between the other end of the write bit line BL4 and the ground terminal VSS. The output signal of the AND gate circuit AD8 is supplied to the gate of the N-channel MOS transistor QN12.

When the output signal of the NAND gate circuit ND5 indicates "0", and the output signal of the AND gate circuit ADS indicates "1" in the write bit line drivers/sinkers 29A, 31 constituted as described above, the write current flows toward the write bit line driver/sinker 31 from the write bit line driver/sinker 29A in the write bit line BL1.

Moreover, when the output signal of the NAND gate circuit ND9 indicates "0", and the output signal of the AND gate circuit AD1 indicates "1", the write current flows toward the write bit line driver/sinker 29A from the write bit line driver/sinker 31 in the write bit line BL1.

Furthermore, when the output signal of the NAND gate circuit ND6 indicates "0", and the output signal of the AND gate circuit AD6 indicates "1", the write current flows toward the write bit line driver/sinker 31 from the write bit line driver/sinker 29A in the write bit line BL2.

Additionally, when the output signal of the NAND gate circuit ND10 indicates "0", and the output signal of the AND gate circuit AD2 indicates "1", the write current flows toward the write bit line driver/sinker 29A from the write bit line driver/sinker 31 in the write bit line BL2.

Moreover, when the output signal of the NAND gate circuit ND7 indicates "0", and the output signal of the AND gate circuit AD7 indicates "1", the write current flows toward the write bit line driver/sinker 31 from the write bit line driver/sinker 29A in the write bit line BL3.

Furthermore, when the output signal of the NAND gate circuit ND11 indicates "0", and the output signal of the AND gate circuit AD3 indicates "1", the write current flows toward the write bit line driver/sinker 29A from the write bit line driver/sinker 31 in the write bit line BL3.

Additionally, when the output signal of the NAND gate circuit ND8 indicates "0", and the output signal of the AND gate circuit AD8 indicates "1", the write current flows toward the write bit line driver/sinker 31 from the write bit line driver/sinker 29A in the write bit line BL4.

Moreover, when the output signal of the NAND gate circuit ND12 indicates "0", and the output signal of the AND gate circuit AD4 indicates "1", the write current flows toward the write bit line driver/sinker 29A from the write bit line driver/sinker 31 in the write bit line BL4.

In the write bit line drivers/sinkers 29A, 31, during the write operation, the write signal WRITE indicates "1". Moreover, in the selected column, all the bits of the high order column address signal, that is, all the bits of the column address signal excluding two low order bits CA0, CA1 among the column address signals indicate "1".

The low order column address signals CA0, CA1 are signals for selecting one of four write bit lines BL1, BL2, BL3, BL4 in the selected column. The write current having the direction corresponding to the value of the write data DATA flows through the selected bit line.

The direction of the write current flowing through the selected write bit line in the selected column is determined in accordance with the value of the write data DATA.

For example, when the write bit line BL1 is selected (when CA0="0", CA1="0"), and the write data DATA indicates "1", the output signal of the NAND gate circuit ND5 indicates "0", and the output signal of the AND gate circuit AD5 indicates "1". As a result, the write current flows toward the write bit line driver/sinker 31 from the write bit line driver/sinker 29A in the write bit line BL1.

Conversely, when the write data DATA indicates "0", the output signal of the NAND gate circuit ND9 indicates "0", and the output signal of the AND gate circuit AD1 indicates "1". As a result, the write current flows toward the write bit line driver/sinker 29A from the write bit line driver/sinker 31 in the write bit line BL1.

Moreover, when the write bit line BL2 is selected (when CA0="1", CA1="0"), and the write data DATA indicates "1", the output signal of the NAND gate circuit ND6 indicates "0", and the output signal of the AND gate circuit AD6 indicates "1". As a result, the write current flows toward the write bit line driver/sinker 31 from the write bit line driver/sinker 29A in the write bit line BL2.

Conversely, when the write data DATA indicates "0", the output signal of the NAND gate circuit ND10 indicates "0", and the output signal of the AND gate circuit AD2 indicates "1". As a result, the write current flows toward the write bit line driver/sinker 29A from the write bit line driver/sinker 31 in the write bit line BL2.

Furthermore, when the write bit line BL3 is selected (when CA0="0", CA1="1"), and the write data DATA indicates "1", the output signal of the NAND gate circuit ND7 indicates "0", and the output signal of the AND gate circuit AD7 indicates "1". As a result, the write current flows toward the write bit line driver/sinker 31 from the write bit line driver/sinker 29A in the write bit line BL3.

Conversely, when the write data DATA indicates "0", the output signal of the NAND gate circuit ND11 indicates "0", and the output signal of the AND gate circuit AD3 indicates "1". As a result, the write current flows toward the write bit line driver/sinker 29A from the write bit line driver/sinker 31 in the write bit line BL3.

Additionally, when the write bit line BL4 is selected (when CA0="1", CA1="1"), and the write data DATA indicates "1", the output signal of the NAND gate circuit ND8 indicates "0", and the output signal of the AND gate circuit AD8 indicates "1". As a result, the write current flows toward the write bit line driver/sinker 31 from the write bit line driver/sinker 29A in the write bit line BL4.

Conversely, when the write data DATA indicates "0", the output signal of the NAND gate circuit ND12 indicates "0", and the output signal of the AND gate circuit AD4 indicates "1". As a result, the write current flows toward the write bit line driver/sinker 29A from the write bit line driver/sinker 31 in the write bit line BL4.

(3) Read Word Line Driver

FIG. 59 shows a circuit example of a read word line driver.

For the read word line driver, the same structure can be used in all Structure Examples 1 to 12. The read word line driver described hereinafter is a row decoder & read word line driver including the function of the row decoder. FIG. 59 shows only the read word line driver for one row.

The read word line driver 23B-1 is constituted of the AND gate circuit AD9. The read signal READ and row address signal are inputted into the AND gate circuit AD9.

The read signal becomes "H" during the read operation. That is, the potential of the read word line RWL1 does not become "H" in the modes other than a read operation mode. Since all the bits of the row address signal become "H" in the selected row during the read operation, the potential of the read word line RWL1 becomes "H".

(4) Row Decoder

FIG. 60 shows a circuit example of the row decoder.

The row decoders for use in Structure Examples 1 to 4, 6, 12 can be structured, for example, as follows. Additionally, FIG. 60 shows only the row decoder 25-1 for one row.

The row decoder 25-1 is constituted of an AND gate circuit AD11. The row address signal is inputted into the AND gate circuit AD11. Since all the bits of the row address signal become "H" in the selected row, an output signal RL1 of the row decoder 25-1 becomes "H".

Figure 63:
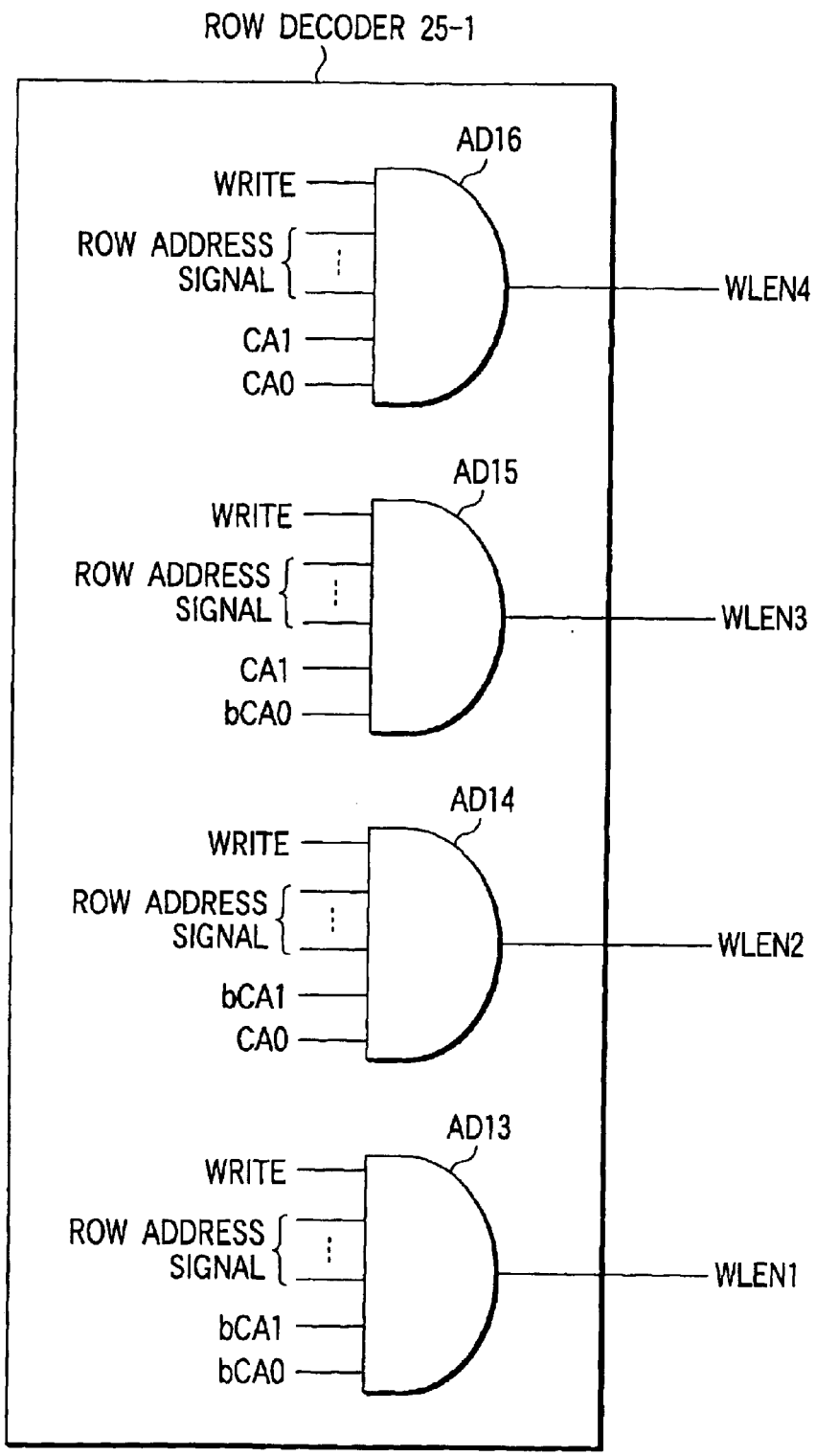
FIG. 63 is a diagram showing the circuit example of the row decoder.

FIG. 63 shows the circuit example of the row decoder.

The row decoder for use in Structure Example 5 can be structured, for example, as follows. Additionally, FIG. 63 shows only the row decoder 25-1 for one row.

The row decoder 25-1 is constituted of four AND gate circuits AD13 to AD16. The write signal WRITE, row address signal, and two low order bits CA0, CA1 of the column address signal are inputted into the AND gate circuits AD13 to AD16.

During the write operation, the write signal WRITE becomes "H", and all the bits of the row address signal become "H" in the selected row. Moreover, in the selected row, one of four write word lines in one row is selected based on the two low order bits CA0, CA1 of the column address signal.

(5) Column Decoder & Read Select Line Driver

FIG. 61 shows the circuit example of a column decoder & read select line driver.

The column decoder & read select line driver can have the same structure in all Structure Examples 1 to 12. FIG. 61 shows only the column decoder & read select line driver for one column.

A column decoder & read select line driver 32 is constituted of the AND gate circuit AD10. The read signal READ and high order column address signal are inputted into the AND gate circuit AD10.

The read signal becomes "H" during the read operation. That is, the potential of the output signal (column select signal) CSL1 of the column decoder & read select line driver 32 does not become "H" in the modes other than the read operation mode. Since all the bits of the column address signal become "H" in the selected column during the read operation, the potential of the output signal CSL1 of the column decoder & read select line driver 32 becomes "H".

(6) Column Decoder

FIG. 62 shows the circuit example of the column decoder.

The column decoders for use in Structure Examples 7 to 9, 11 can be structured, for example, as follows. Additionally, FIG. 62 shows only the column decoder 25X-1 for one row.

The column decoder 25X-1 is constituted of an AND gate circuit AD12. The column address signal is inputted into the AND gate circuit AD12. Since all the bits of the column address signal become "H" in the selected column, an output signal CL1 of the column decoder 25X-1 becomes "H".

Figure 64:
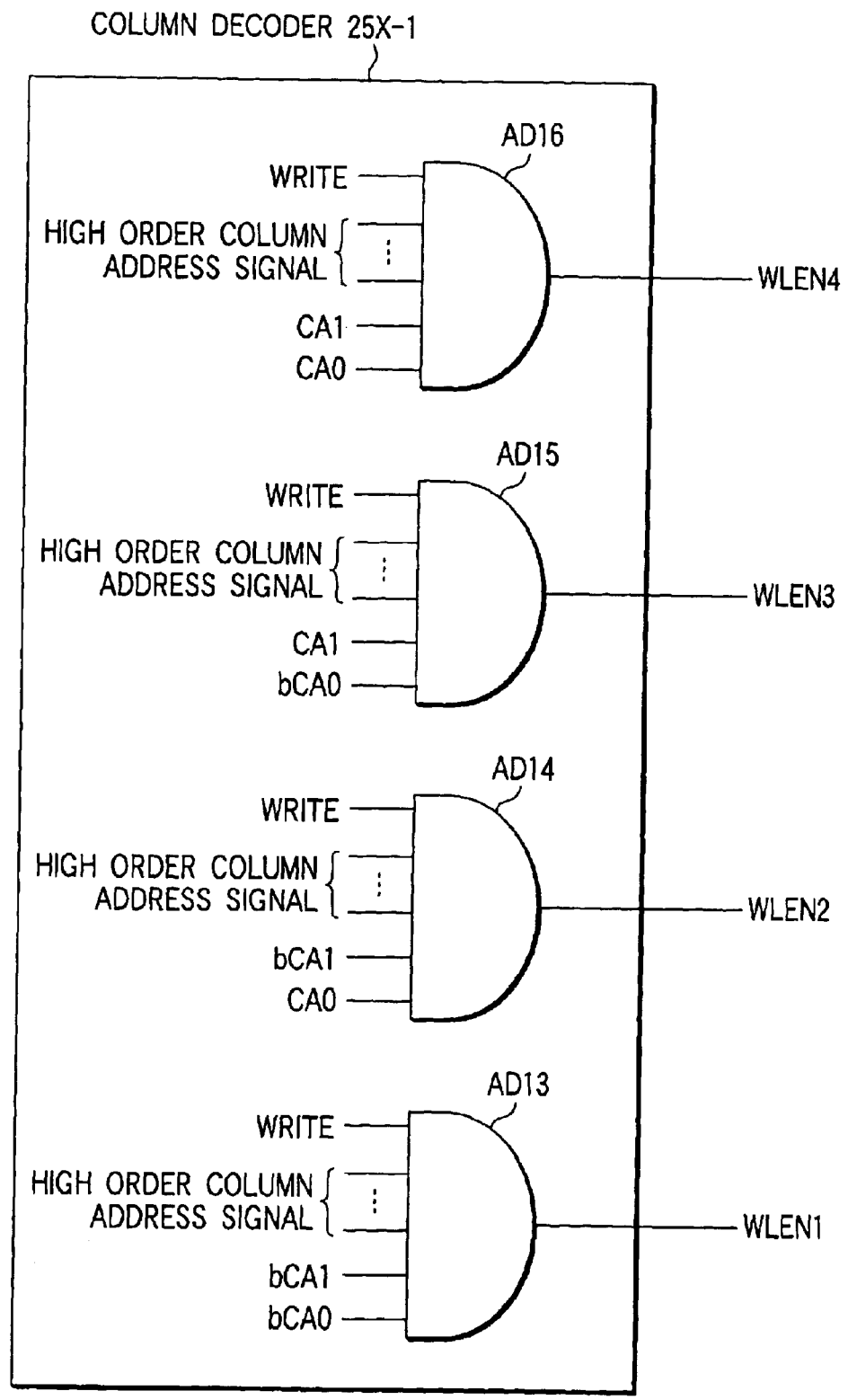
FIG. 64 is a diagram showing the circuit example of the column decoder.

FIG. 64 shows the circuit example of the column decoder.

The column decoder for use in Structure Example 10 can be structured, for example, as follows. Additionally, FIG. 64 shows only the column decoder 25X-1 for one row.

The column decoder 25X-1 is constituted of four AND gate circuits AD13 to AD16. The write signal WRITE and column address signal (high order column address signal and two low order bits CA0, CA1 of the column address signal) are inputted into the AND gate circuits AD13 to AD16.

During the write operation, the write signal WRITE becomes "H", and all the bits of the column address signal become "H" in the selected column. Moreover, in the selected column, one of four write word lines in one column is selected based on the two inferior bits CA0, CA1 of the column address signal.

(7) Read Circuit

Figure 65:
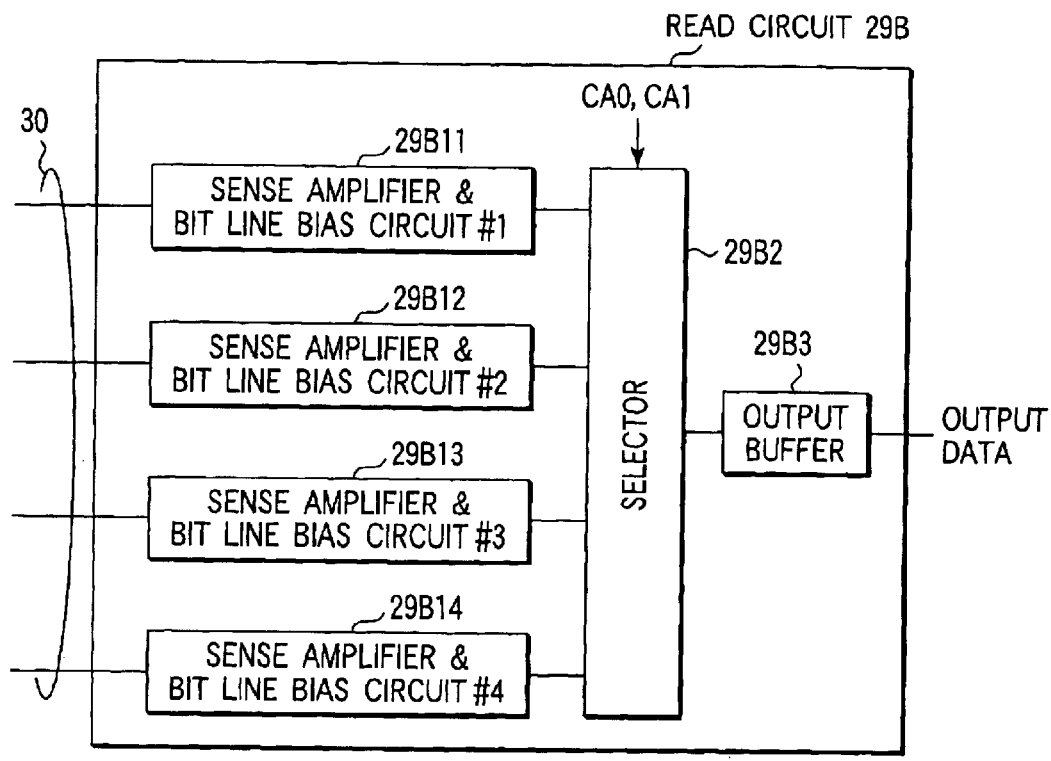
FIG. 65 is a diagram showing the circuit example of a read circuit.

FIG. 65 shows the circuit example of the read circuit.

In this example, it is assumed that in one column, four TMR elements are arranged in the read block, and the respective TMR elements are independently connected to the read bit lines. That is, four read bit lines are arranged in one column. These read bit lines are connected to the read circuit 29B via the column select switch.

The read circuit 29B of this example is applied to one bit type magnetic random access memory which outputs read data bit by bit.

Therefore, the read circuit 29B has four sense amplifier & bit line bias circuits 29B11, 29B12, 29B13, 29B14, selector 29B2, and output buffer 29B3.

During the read operation, the read data is simultaneously read from four TMR elements of the selected read block. These four read data are inputted into the sense amplifier & bit line bias circuits 29B11, 29B12, 29B13, 29B14, and sensed.

The selector 29B2 selects one of four read data outputted from the sense amplifier & bit line bias circuits 29B11, 29B12, 29B13, 29B14 based on the two inferior bits CA0, CA1 of the column address signal. The selected read data is outputted as output data from the magnetic random access memory via the output buffer 29B3.

Additionally, it is assumed in this example that the read circuit 29B is applied to the one bit type magnetic random access memory.

However, when, for example, the read circuit 29B is applied to the four-bits type magnetic random access memory for outputting every four bits of read data, the selector 29B2 becomes unnecessary. On the other hand, four output buffers 29B3 are required corresponding to the sense amplifier & bit line bias circuits 29B11, 29B12, 29B13, 29B14.

Figure 66:
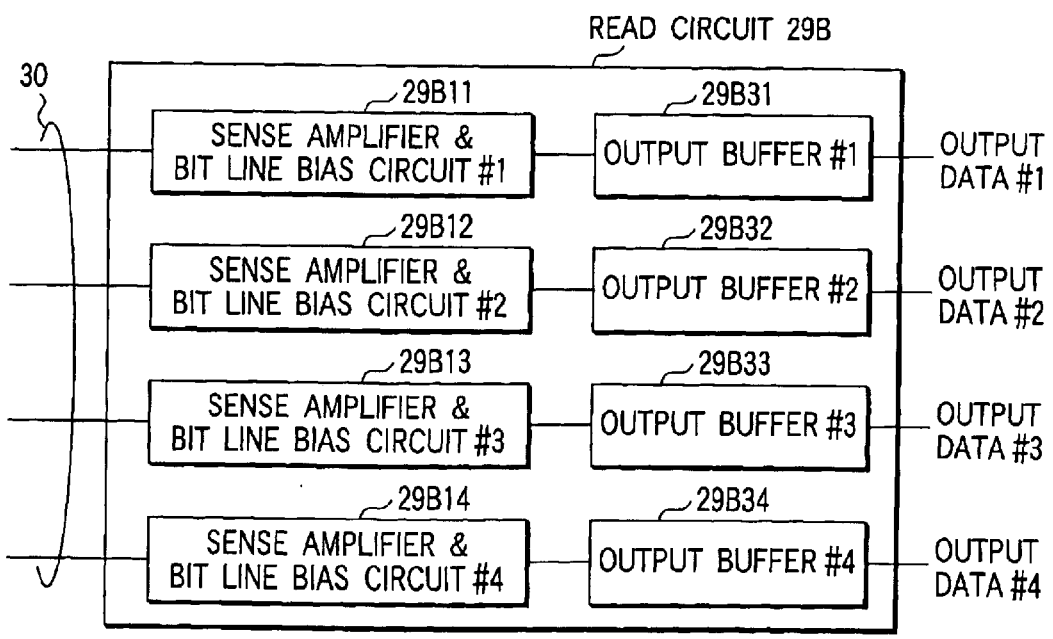
FIG. 66 is a diagram showing the circuit example of the read circuit.

FIG. 66 shows the circuit example of the read circuit applied to the four-bits type magnetic random access memory.

The read circuit 29B has four sense amplifier & bit line bias circuits 29B11, 29B12, 29B13, 29B14, and four output buffers 29B31, 29B32, 29B33, 29B34.

During the read operation, the read data is simultaneously read from four TMR elements of the selected read block. These four read data are inputted into the sense amplifier & bit line bias circuits 29B11, 29B12, 29B13, 29B14, and sensed.

Moreover, the output data of the sense amplifier & bit line bias circuits 29B11, 29B12, 29B13, 29B14 are outputted from the magnetic random access memory via the output buffers 29B31, 29B32, 29B33, 29B34.

Figure 67:
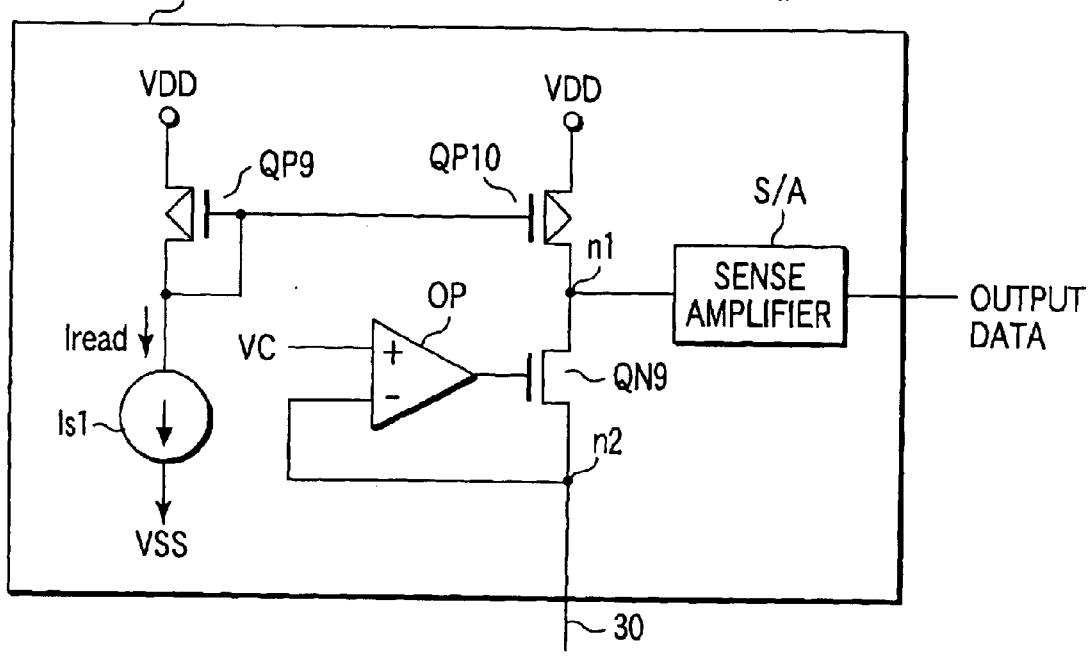
FIG. 67 is a diagram showing the circuit example of a sense amplifier & bias circuit.

FIG. 67 shows the circuit example of the sense amplifier & bit line bias circuit.

This sense amplifier & bit line bias circuit corresponds to one of four sense amplifier & bit line bias circuits of FIGS. 65 and 66.

A sense amplifier S/A is constituted, for example, of a differential amplifier.

A P-channel MOS transistor QP14 and N-channel MOS transistor QN13 are connected in series between the power source terminal VDD and column select switch 29C. A minus-side input terminal of an operation amplifier OP is connected to a node n2, the output terminal thereof is connected to the gate of the N-channel MOS transistor QN13, and a clamp potential VC is inputted to a plus-side input terminal.

The operation amplifier OP fulfils a function of setting the potential of the node n2 to be equal to the clamp potential VC. The value of the clamp potential VC is set to a predetermined positive value.

A constant-current source Is generates a read current Iread. The read current Iread flows through a bit line BLi via a current mirror circuit constituted of P-channel MOS transistors QP13, QP14. For example, the sense amplifier constituted of the differential amplifier senses data of the memory cell (TMR element) based on the potential of a node n1, when the read current Iread flows.

Figure 68:
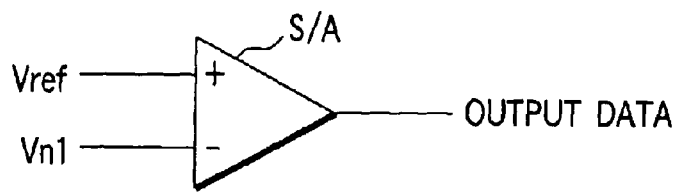
FIG. 68 is a schema of the sense amplifier in FIG. 67.
Figure 69:
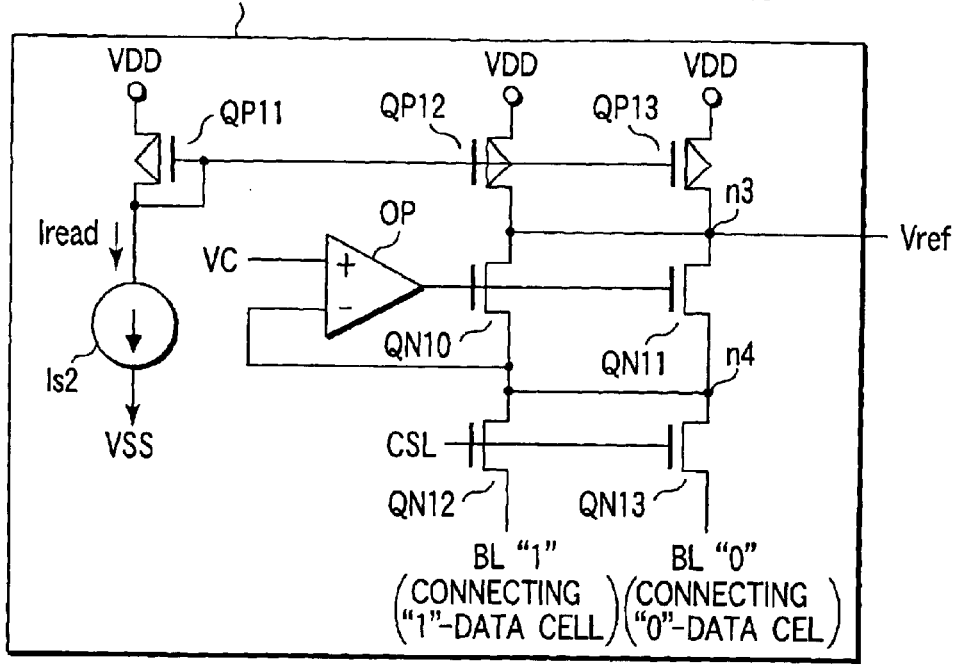
FIG. 69 is a diagram showing the circuit example of a reference potential generating circuit.
Figure 70:
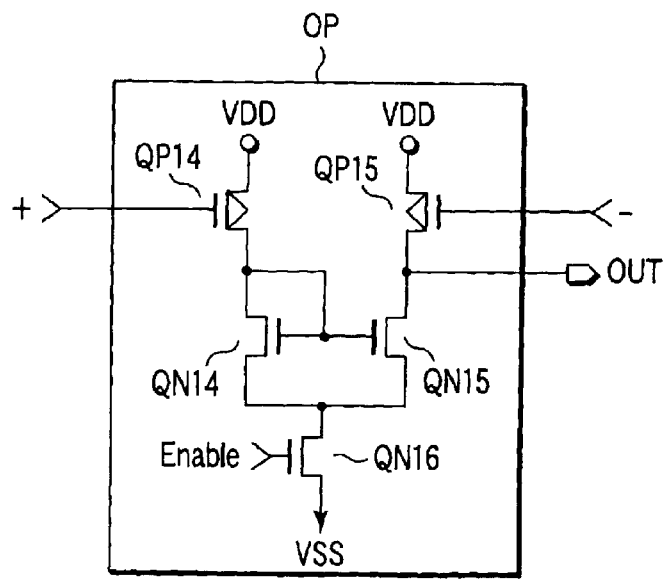
FIG. 70 is a diagram showing the circuit example of an differential amplifier; the OP in FIGS. 67, 69, 71 and the SA in FIG. 68.

FIG. 68 shows the circuit example of the sense amplifier. A concrete circuit example is shown in FIG. 70. FIG. 69 shows the circuit example of a reference potential generating circuit of a sense amplifier.

The sense amplifier. S/A is constituted, for example, of the differential amplifier. The sense amplifier S/A compares a potential Vn1 of the node n1 with a reference potential Vref.

The reference potential Vref is generated from the TMR elements which store data "1" and "0", respectively.

A P-channel MOS transistor QP16 and N-channel MOS transistors QN14, QN15 are connected in series between the power source terminal VDD and the TMR element which stores the data "1". Moreover, a P-channel MOS transistor QP17 and N-channel MOS transistors QN16, QN17 are connected in series between the power source terminal VDD and the TMR element which stores the data "0".

The drains of the P-channel MOS transistors QP16, QP17 are connected to each other, and the drains of the N-channel MOS transistors QN15, QN17 are also connected to each other.

The operation amplifier OP fulfills a function of setting the potential of a node n4 to be equal to the clamp potential VC. A constant-current source Is2 generates the read current Iread. The read current Iread flows through the TMR elements for storing the data "1" and "0", respectively, via a current mirror circuit constituted of P-channel MOS transistors QP15, QP16.

The reference potential Vref is outputted from a node n3.

FIG. 70 shows the circuit example of the operation amplifier OP of FIGS. 67 and 69.

The operation amplifier OP is constituted of P-channel MOS transistors QP18, QP19 and N-channel MOS transistors QN18, QN19, QN20. When an enable signal Enable becomes "H", the operation amplifier OP has an operation state.

Figure 71:
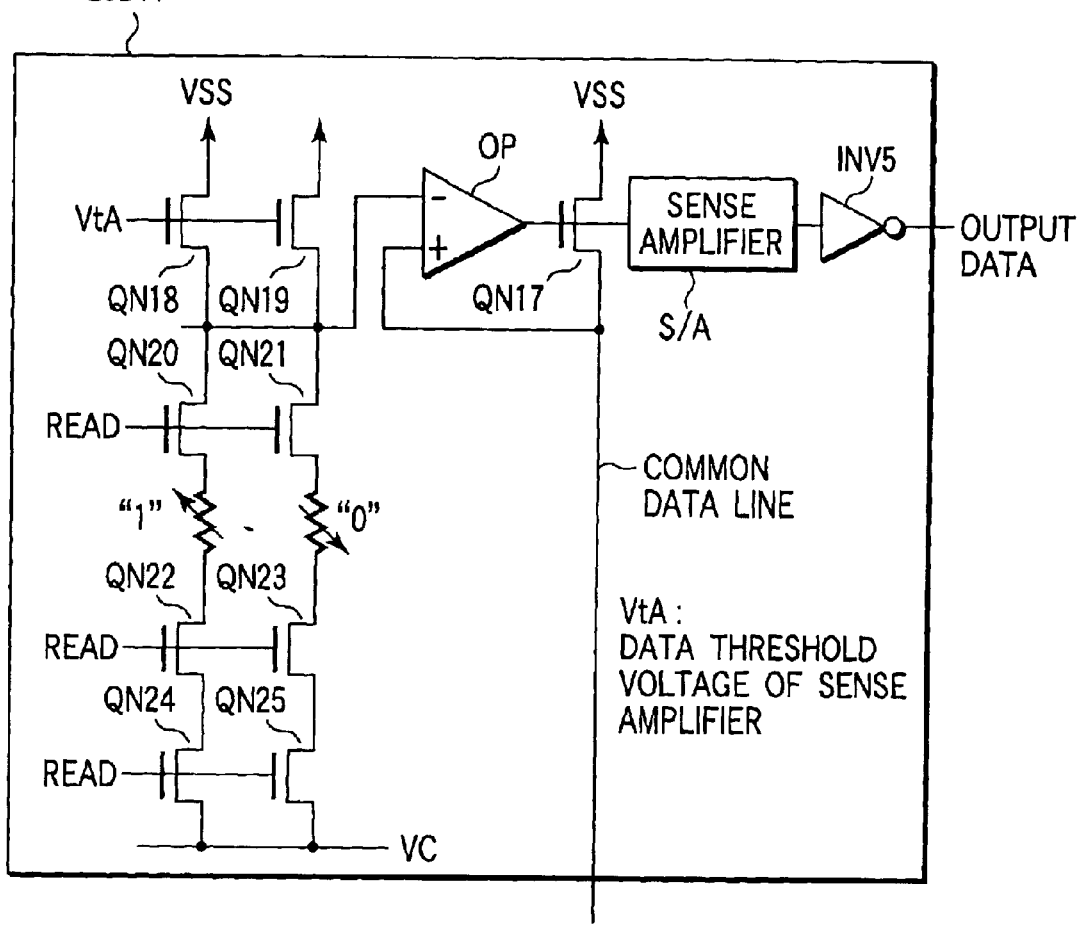
FIG. 71 is a diagram showing the circuit example of the sense amplifier & bias circuit.

FIG. 71 shows the circuit example of the sense amplifier & bit line bias circuit.

This sense amplifier & bit line bias circuit corresponds to one of four sense amplifier & bit line bias circuits of FIGS. 65 and 66.

The sense amplifier & bit line bias circuit of this example is applied to Structure Examples 4 (FIG. 26) and 9 (FIG. 41).

When the circuit is applied to Structure Example 4 (FIG. 26), QN24 and QN25 of FIG. 71 are set to have the same size as that of CSW of FIG. 26, QN22 and QN23 of FIG. 71 are set to have the same size as that of RSW1 of FIG. 26, and QN20 and QN21 of FIG. 71 are set to have the same size as that of RSW2 of FIG. 26.

Moreover, QN17, QN18 and QN19 of FIG. 71 are set to have the same size and the same driving capability.

Thereby, in FIG. 26, the minus-side input potential of the operation amplifier OP is substantially an intermediate potential between the plus-side input potential of the operation amplifier during reading of the data "1" and the plus-side input potential of the operation amplifier during the reading of the data "0", and fulfils a function as the reference potential during the data reading.

When the circuit is applied to Structure Example 9 (FIG. 41), QN24 and QN25 of FIG. 71 are set to have the same size as that of CSW1 of FIG. 41, QN22 and QN23 of FIG. 71 are set to have the same size as that of RSW1 of FIG. 41, and QN20 and QN21 of FIG. 71 are set to have the same size as that of CSW2 of FIG. 41.

Moreover, QN17, QN18 and QN19 of FIG. 71 are set to have the same size and the same driving capability.

Thereby, in FIG. 41, the minus-side input potential of the operation amplifier OP is substantially an intermediate potential between the plus-side input potential of the operation amplifier during the reading of the data "1" and the plus-side input potential of the operation amplifier during the reading of the data "0", and fulfils a function as the reference potential during the data reading.

A signal VtA inputted into the gates of the N-channel MOS transistors QN18, QN19 is equal to a data threshold voltage of the sense amplifier S/A. The read signal READ which indicates "H" during the read operation is inputted into the gates of the N-channel MOS transistors QN20 to QN25.

One concrete circuit example is a inverter which threshold voltage is VtA. Another example is the differential amplifier shown in FIG. 68 and Vref is biased to VtA. The VtA potential is the output voltage of OP, when the current of QN17 is equal to the half of the sum of the QN18 current and QN19 current. The VtA voltage generation circuit is the same circuit of OP and whose plus-side input and minus-side input are connected to the drain node of QN18 and QN19.

In FIG. 71, "1" indicates that the TMR element stores the data "1", "0" indicates that the TMR element stores the data "0", and VC is the same as the bias potential VC given to the bias line of Structure Examples 4, 9 (FIGS. 26 and 41).

4. Write/Read Operation Mechanism

A write/read operation mechanism of the magnetic random access memory according to the present invention will be described.

(1) For Structure Examples 1, 2, 4, 6 (FIGS. 1, 14, 26, 28)

(1)-1 Write Operation Principle

The writing into the TMR element is performed at random. For example, the row decoders 25-1, . . . 25-n select one row based on the row address signal. Since the row decoder 25-k has an output signal RLk of "H" in the selected row, the row select switch RSW2 obtains the on state.

Additionally, since the row decoder & read word line drivers 23B-1, . . . 23B-n and column decoder & read column select line driver 32 are activated only during the read operation, all the read word lines RWL1, . . . RWLn and all column select lines CSL1, . . . CSLj indicate "L".

The write word line driver 23A selects one of four write word lines WWL4(n−1)+1, WWL4(n−1)+2, WWL4(n−1)+3, WWL4(n−1)+4 arranged in one row based on the two low order bits CA0, CA1 of the column address signal, and gives the write current to the selected write word line via the data line (driver line) 30 and row select switch RSW2.

The column decoder & write bit line drivers/sinkers 29A, 31 select one column, and pass the write current through the write bit line WBLi in the selected column, for example, based on the high order column address signals (the column address signals excluding the two low order bits CA0, CA1 from the column address signals).

Moreover, the column decoder & write bit line drivers/sinkers 29A, 31 determine the direction of the write current passed through the write bit line WBLi in the selected column in accordance with the value of the write data.

Moreover, the direction of the magnetization of the free layer (storing layer) of the selected TMR element is determined by a synthesized magnetic field generated by the write currents flowing through the write word line and write bit line, and information "1"/"0" is stored in the TMR element.

(1)-2 Read Operation Mechanism

The reading with respect to the TMR element is performed by a unit of read block. For example, the row decoders 25-1, . . . 25-n select one row based on the row address signal. Since the output signal RLk of the row decoder 25-k indicates "H" in the selected row, the row select switch RSW2 obtains the on state.

The row decoder & read word line drivers 23B-1, . . . 23B-n similarly select one row based on the row address signal. Since the output signal of the row decoder & read word line driver 23B-k, that is, the read word line RWLk indicates "H" in the selected row, the read select switch RSW1 obtains the on state.

The column decoder & read column select line driver 32 selects one column based on the high order column address signal. Since the output signal of the column decoder & read column select line driver 32, that is, the column select signal CSLi indicates "H" in the selected column, the column select switch CSW obtains the on state.

Moreover, in Structure Example 6 (FIG. 28), only the block select switch BSW in the selected column is turned on. That is, only the TMR element 12 in the selected read block is electrically connected to the read bit lines RBL4(n−1)+1, RBL4(n−1)+2, RBL4(n−1)+3, RBL4(n−1)+4 in the selected row.

Additionally, during the read operation, the write word line driver 23A and column decoder & write bit line drivers/sinkers 29A, 31 are in an inoperative state.

The read circuit 29B generates, for example, the read current. The read current flows only through a plurality of TMR elements 12 in the read block present in the selected row and column.

That is, the read current is absorbed by the ground point VSS via the row select switch RSW2 in the selected row, TMR elements 12 in the read block, read select switch RSW1 in the selected row and column select switch CSW in the selected column.

The potentials of the read bit lines RBL4(n−1)+1, RBL4(n−1)+2, RBL4(n−1)+3, RBL4(n−1)+4 have values in accordance with the data of the TMR elements 12 in the read block. The potentials are sensed by the sense amplifier in the read circuit 29B.

The data of the plurality of TMR elements in the read block are sensed by the sense amplifier, and subsequently outputted to the outside of the magnetic random access memory. Here, the data of the plurality of TMR elements 12 in the read block may be outputted bit by bit or simultaneously.

When the data of the plurality of TMR elements are sequentially outputted bit by bit, for example, the low order column address signals CA0, CA1 are used to select one of the data of the plurality of TMR elements 12.

(2) For Structure Example 5 (FIG. 27)

(2)-1 Write Operation Principle

The row decoders 25-1, . . . 25-n select one row based on the row address signal. Since the output signals WLEN1 to WLEN4 of the row decoder 25-k indicate "H" in the selected row, the write word line driver 33-k is activated, and the write current is supplied to the write word lines WWL4(n−1)+1, WWL4(n−1)+2, WWL4(n−1)+3, WWL4(n−1)+4.

Here, to perform the writing with respect to the TMR element at random, for example, as shown in FIG. 63, the two low order bits CA0, CA1 of the column address signal for selecting one of four write word lines WWL4(n−1)+1, WWL4(n−1)+2, WWL4(n−1)+3, WWL4(n−1)+4 may be inputted into the row decoders 25-1, . . . 25-n.

That is, in Structure Example 5, as shown in FIG. 63, four row decoders are arranged in one row, and the two low order bits CA0, CA1 of different column address signals are inputted into the respective decoders. Moreover, four word line enable lines WLEN1 to WLEN4 are arranged in one row, so that four write word lines WWL4(n−1)+1, WWL4(n−1)+2, WWL4(n−1)+3, WWL4(n−1)+4 can independently be driven.

Additionally, since the row decoder & read word line drivers 23B-1, . . . 23B-n and column decoder & read column select line driver 32 are activated only during the read operation, all the read word lines RWL1, . . . RWLn and all column select lines CSL1, . . . CSLj indicate "L".

The column decoder & write bit line drivers/sinkers 29A, 31 select one column, and pass the write current through the write bit line WBLi in the selected column, for example, based on the superior column address signals (the column address signals excluding the two low order bits CA0, CA1 from the column address signals).

Moreover, the column decoder & write bit line drivers/sinkers 29A, 31 determine the direction of the write current passed through the write bit line WBLi in the selected column in accordance with the value of the write data.

Moreover, the direction of the magnetization of the free layer (storing layer) of the selected TMR element is determined by the synthesized magnetic field generated by the write currents flowing through the write word line and write bit line, and the information "1"/"0" is stored in the TMR element.

(2)-2 Read Operation Mechanism

The reading with respect to the TMR element is performed by the unit of read block. In Structure Example 5, during the read operation, the row decoders 25-1, . . . 25-n are in the inoperative state. That is, all the output signals WLEN1 to WLEN4 of the row decoders 25-1, . . . 25-n indicate "L".

The row decoder & read word line drivers 23B-1, . . . 23B-n select one row based on the row address signal. Since the output signal of the row decoder & read word line driver 23B-k, that is, the read word line RWLk indicates "H" in the selected row, the read select switch RSW1 and row select switch RSW2 obtain the on state.

The column decoder & read column select line driver 32 selects one column based on the high order column address signal. Since the output signal of the column decoder & read column select line driver 32, that is, the column select signal CSLi indicates "H" in the selected column, the column select switch CSW obtains the on state.

Additionally, during the read operation, the write word line driver 33-k and column decoder & write bit line drivers/sinkers 29A, 31 are in the inoperative state.

The read circuit 29B generates, for example, the read current. The read current flows only through the plurality of TMR elements 12 in the read block present in the selected row and column.

That is, the read current is absorbed by the ground point VSS via the row select switch RSW2 in the selected row, TMR elements 12 in the read block, read select switch RSWL in the selected row and column select switch CSW in the selected column.

The potentials of the read bit lines RBL4(n−1)+1, RBL4(n−1)+2, RBL4(n−1)+3, RBL4(n−1)+4 have values in accordance with the data of the TMR elements 12 in the read block. The potentials are sensed by the sense amplifier in the read circuit 29B.

The data of the plurality of TMR elements in the read block are sensed by the sense amplifier, and subsequently outputted to the outside of the magnetic random access memory. Here, the data of the plurality of TMR elements 12 in the read block may be outputted bit by bit or simultaneously.

When the data of the plurality of TMR elements are sequentially outputted bit by bit, for example, the low order column address signals CA0, CA1 are used to select one of the data of the plurality of TMR elements 12.

(3) For Structure Examples 7, 9, 11 (FIGS. 29, 41, 43)

(3)-1 Write Operation Principle

The writing with respect to the TMR element is performed at random. Since the row decoder & read word line drivers 23B-1, . . . 23B-n and column decoder and read column select line driver 32 are activated only during the read operation, all the read word lines RWL1, . . . RWLn and all column select lines CSL1, . . . CSLj indicate "L".

The column decoders 25X-1, . . . 25X-n select one column based on the superior column address signal. Since the output signal CLk of the column decoder 25X-k indicates "H" in the selected column, the column select switch CSW2 obtains the on state.

The write bit line driver 23AX selects one of four write bit lines WBL4(n−1)+1, WBL4(n−1)+2, WBL4(n−1)+3, WBL4(n−1)+4 arranged in one column, for example, based on the two low order bits CA0, CA1 of the column address signal, and the write current is given to the selected write bit line via the data line (driver line) 30 and column select switch CSW2.

The row decoder & write word line drivers/sinkers 29AX, 31X select one row, and pass the write current through the write word line WWLi in the selected row, for example, based on the row address signal.

Moreover, the row decoder & write word line drivers/sinkers 29AX, 31X determine the direction of the write current passed through the write word line WWLi in the selected row in accordance with the value of the write data.

Furthermore, the direction of the magnetization of the free layer (storing layer) of the selected TMR element is determined by the synthesized magnetic field generated by the write currents flowing through the write word line and write bit line, and the information "1"/"0" is stored in the TMR element.

(3)-2 Read Operation Mechanism

The reading with respect to the TMR element is performed by the unit of read block. For example, the column decoders 25X-1, . . . 25X-n select one column based on the high order column address signal. Since the output signal CLk of the column decoder 25X-k indicates "H" in the selected column, the column select switch CSW2 obtains the on state.

The row decoder & read word line drivers 23B-1, . . . 23B-n similarly select one row based on the row address signal. Since the output signal of the row decoder & read word line driver 23B-k, that is, the read word line RWLk indicates "H" in the selected row, the read select switch RSW1 obtains the on state.

The column decoder & read column select line driver 32 selects one column based on the high order column address signal. Since the output signal of the column decoder & read column select line driver 32, that is, the column select signal CSLi indicates "H" in the selected column, the column select switch CSW1 obtains the on state.

Moreover, in Structure Example 11 (FIG. 43), only the block select switch BSW in the selected row obtains the on state. Only the TMR elements 12 in the selected read block are electrically connected to the read bit lines RBL4(n−1)+1, RBL4(n−1)+2, RBL4(n−1)+3, RBL4(n−1)+4 in the selected column.

Additionally, during the read operation, the write bit line driver 23AX and row decoder & write word line drivers/sinkers 29AX, 31X are in the inoperative state.

The read circuit 29B generates, for example, the read current. The read current flows only through the plurality of TMR elements 12 in the read block present in the selected row and column.

That is, the read current is absorbed by the ground point VSS via the column select switch CSW2 in the selected row, TMR elements 12 in the read block, read select switch RSW1 in the selected row and column select switch CSW1 in the selected column.

The potentials of the read bit lines RBL4(n−1)+1, RBL4(n−1)+2, RBL4(n−1)+3, RBL4(n−1)+4 have values in accordance with the data of the TMR elements 12 in the read block. The potentials are sensed by the sense amplifier in the read circuit 29B.

The data of the plurality of TMR elements in the read block are sensed by the sense amplifier, and subsequently outputted to the outside of the magnetic random access memory. Here, the data of the plurality of TMR elements 12 in the read block may be outputted bit by bit or simultaneously.

When the data of the plurality of TMR elements are sequentially outputted bit by bit, for example, the low order column address signals CA0, CA1 are used to select one of the data of the plurality of TMR elements 12.

(4) For Structure Example 10 (FIG. 42)

(4)-1 Write Operation Principle

The column decoders 25X-1, . . . 25X-n select one column based on the superior column address signal. Since the output signals WLEN1 to WLEN4 of the column decoder 25X-k indicate "H" in the selected column, the write word line driver 33-k is activated, and the write current is supplied to the write word lines WWL4(n−1)+1, WWL4(n−1)+2, WWL4(n−1)+3, WWL4(n−1)+4.

Here, to perform the writing with respect to the TMR element at random, for example, as shown in FIG. 64, the two low order bits CA0, CA1 of the column address signal for selecting one of four write word lines WWL4(n−1)+1, WWL4(n−1)+2, WWL4(n−1)+3, WWL4(n−1)+4 may be inputted into the column decoders 25X-1, . . . 25X-n.

That is, in Structure Example 10, as shown in FIG. 64, four column decoders are arranged in one column, and the two low order bits CA0, CA1 of different column address signals are inputted into the respective decoders. Moreover, four bit line enable lines WLEN1 to WLEN4 are arranged in one column, so that four write word lines WWL4(n−1)+1, WWL4(n−1)+2, WWL4(n−1)+3, WWL4(n−1)+4 can independently be driven.

Additionally, since the row decoder & read word line drivers 23B-1, . . . 23B-n and column decoder & read column select line driver 32 are activated only during the read operation, all the read word lines RWL1, . . . RWLn and all column select lines CSL1, . . . CSLj indicate "L".

The row decoder & write word line drivers/sinkers 29AX, 31X select one row, and pass the write current through the write bit line WBLi in the selected row, for example, based on the row address signal.

Moreover, the row decoder & write word line drivers/sinkers 29AX, 31X determine the direction of the write current passed through the write bit line WBLi in the selected row in accordance with the value of the write data.

Furthermore, the direction of the magnetization of the free layer (storing layer) of the selected TMR element is determined by the synthesized magnetic field generated by the write currents flowing through the write word line and write bit line, and the information "1"/"0" is stored in the TMR element.

(4)-2 Read Operation Mechanism

The reading with respect to the TMR element is performed by the unit of read block. In Structure Example 10, during the read operation, the column decoders 25X-1, . . . 25X-n are in the inoperative state. That is, all the output signals BLEN1 to BLEN4 of the row decoders 25X-1, . . . 25X-n indicate "L".

The row decoder & read word line drivers 23B-1, . . . 23B-n select one row based on the row address signal. Since the output signal of the row decoder & read word line driver 23B-k, that is, the read word line RWLk indicates "H" in the selected row, the read select switch RSW1 is in the on state.

The column decoder & read column select line driver 32 selects one column based on the superior column address signal. Since the output signal of the column decoder & read column select line driver 32, that is, the column select signal CSLi indicates "H" in the selected column, the column select switches CSW1, CSW2 are in the on state.

Additionally, during the read operation, the write word line driver 33-k and row decoder & write word line drivers/sinkers 29AX, 31X are in the inoperative state.

The read circuit 29B generates, for example, the read current. The read current flows only through the plurality of TMR elements 12 in the read block present in the selected row and column.

That is, the read current is absorbed by the ground point VSS via the column select switch RSW2 in the selected column, TMR elements 12 in the read block, read select switch RSW1 in the selected row and column select switch CSW1 in the selected column.

The potentials of the read bit lines RBL4(n−1)+1, RBL4(n−1)+2, RBL4(n−1)+3, RBL4(n−1)+4 have values in accordance with the data of the TMR elements 12 in the read block. The potentials are sensed by the sense amplifier in the read circuit 29B.

The data of the plurality of TMR elements in the read block are sensed by the sense amplifier, and subsequently outputted to the outside of the magnetic random access memory. Here, the data of the plurality of TMR elements 12 in the read block may be outputted bit by bit or simultaneously.

When the data of the plurality of TMR elements are sequentially outputted bit by bit, for example, the low order column address signals CA0, CA1 are used to select one of the data of the plurality of TMR elements 12.

(5) For Structure Example 12 (FIG. 44)

(5)-1 Write Operation Principle

The writing with respect to the TMR element is performed at random. Since the read word line drivers 23B-1, . . . 23B-n and column decoder (read column select line driver) 32 are activated only during the read operation, all the read word lines RWL1, . . . RWLn and all column select lines CSL1, . . . CSLj indicate "L".

The write word line drivers 23A-1, . . . 23A-n select one row, for example, based on the row address signal, and pass the write current through the write word line WWLi in the selected row.

The column decoder & write bit line drivers/sinkers 29A, 31 select one column based on the superior column address signal, and select one of four write bit lines BL4(j−1)+1, BL4(j−1)+2, BL4(j−1)+3, BL4(j−1)+4 in the selected column based on the two low order bits CA0, CA1 of the column address signal.

Moreover, the column decoder & write bit line drivers/sinkers 29A, 31 determine the direction of the write current passed through the write bit line BLi in the selected column in accordance with the value of the write data.

Furthermore, the direction of the magnetization of the free layer (storing layer) of the selected TMR element is determined by the synthesized magnetic field generated by the write currents flowing through the write word line and write bit line, and the information "1"/"0" is stored in the TMR element.

(5)-2 Read Operation Mechanism

The reading with respect to the TMR element is performed by the unit of read block. The row decoders 25-1, . . . 25-n select one row based on the row address signal. Since the output signals RWL1, . . . RWLn of the read word line drivers 23B-1, . . . 23B-n indicate "H" in the selected row, the read select switch RSW and block select switch BSW are in the on state.

The column decoder 32 selects one column based on the high order column address signal, and additionally selects one of four read bit lines BL4(j−1)+1, BL4(j−1)+2, BL4(j−1)++3, BL4(j−1)+4 in the selected column based on the two low order bits CA0, CA1 of the column address signal.

Additionally, during the read operation, the write word line drivers 23A-1, . . . 23A-n and column decoder & write bit line drivers/sinkers 29A, 31 are in the inoperative state.

The read circuit 29B generates, for example, the read current. The read current flows only through the plurality of TMR elements 12 in the read block present in the selected row and column.

That is, the read current is absorbed by the ground terminal VSS via the block select switch BSW in the read block present in the selected row and column, TMR elements 12, read select switch RSW and column select switch CSW in the selected column.

The potentials of the read bit lines BL4(n−1)+1, BL4(n−1)+2, BL4(n−1)+3, BL4(n−1)+4 have values in accordance with the data of the TMR elements 12 in the read block. The potentials are sensed by the sense amplifier in the read circuit 29B.

The data of the plurality of TMR elements in the read block are sensed by the sense amplifier, and subsequently outputted to the outside of the magnetic random access memory. Here, the data of the plurality of TMR elements 12 in the read block may be outputted bit by bit or simultaneously.

When the data of the plurality of TMR elements are sequentially outputted bit by bit, for example, the low order column address signals CA0, CA1 are used to select one of the data of the plurality of TMR elements 12.

5. Manufacturing Method

The cell array structure of the magnetic random access memory of the present invention, the structure of the TMR element, the read circuit, and the read operation mechanism have been described above. A manufacturing method for realizing the magnetic random access memory of the present invention will finally be described.

The manufacturing method described hereinafter relates to Structure Example 1. Additionally, the following manufacturing method can also be used to easily form Structure Examples 2 to 12.

(1) Cell Array Structure as Object

First, a cell array structure completed by the manufacturing method of the present invention will briefly be described. Thereafter, the manufacturing method of the cell array structure will be described.

Figure 72:
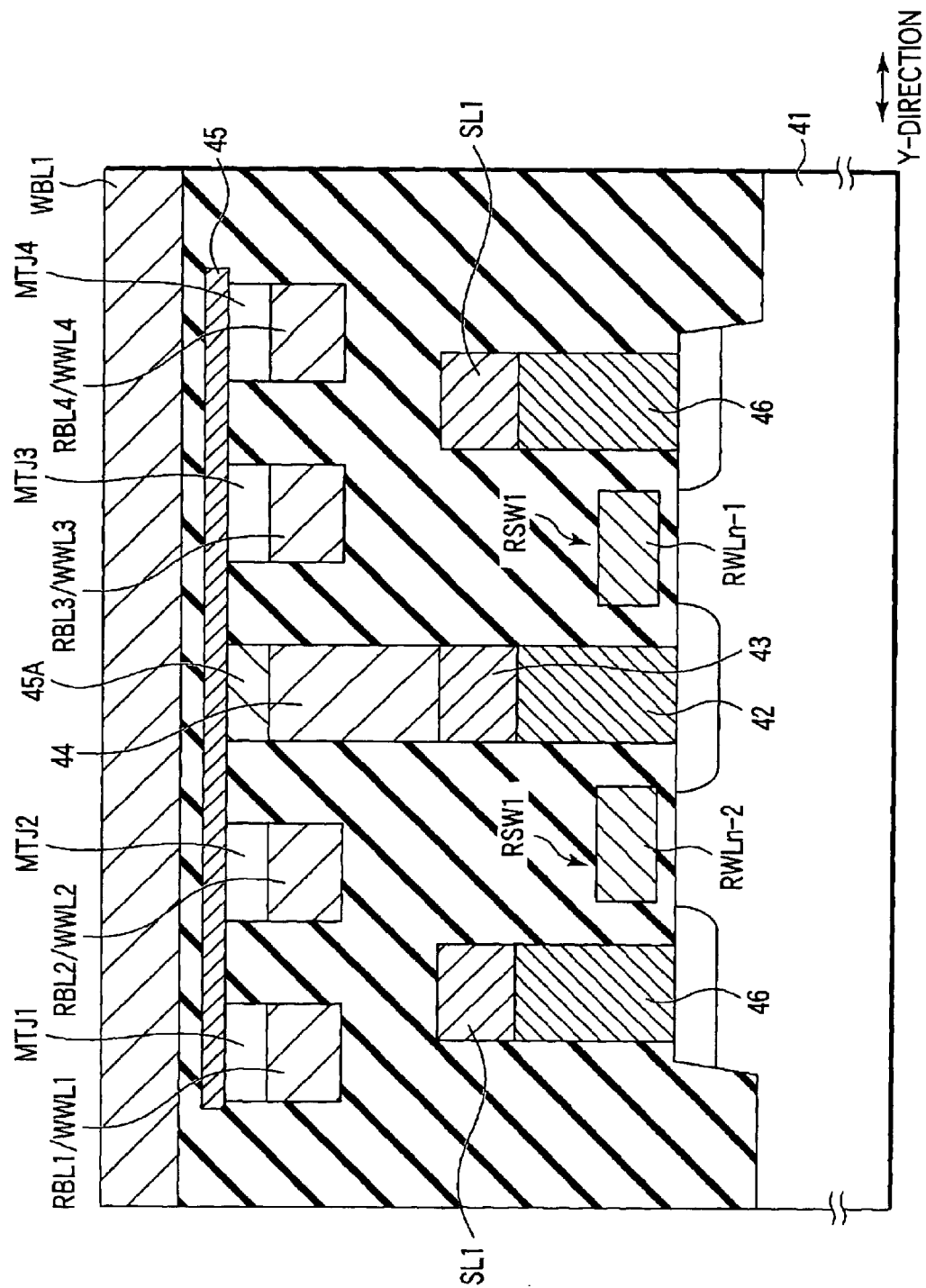
FIG. 72 is a diagram showing the device structure to which a manufacturing method of the present invention is applied.

FIG. 72 shows the cell array structure according to Structure Example 1.

The read select switch (MOS transistor) RSW1 is disposed in the surface region of the semiconductor substrate 41. The source of the read select switch RSW1 is connected to the source line SL1 via the contact plug 46. The source line SL1 linearly extends, for example, in the Y-direction (column direction), and is connected to the ground point VSS via the column select switch in the periphery of the memory cell array region.

The gate of the read select switch (MOS transistor) RSW1 forms the read word line RWLn-1. The read word line RWLn-1 has a comb shape. In FIG. 72, two read word lines RWLn-1 can be seen, and these are connected to each other.

On the read select switches RSW1, four TMR elements MTJ1, MTJ2, MTJ3, MTJ4 arranged in the Y-direction are disposed.

One end (upper end in this example) of each of the TMR elements MTJ1, MTJ2, MTJ3, MTJ4 is connected in common to the upper electrode 45. The contact plugs 42, 44 and intermediate layers 43, 45A electrically connect the upper electrode 45 to the drain of the read select switch RSW1.

The contact portion of the upper electrode 45 and read select switch RSW1 is disposed in the region between the TMR elements MTJ1, MTJ2 and the TMR elements MTJ3, MTJ4. When the TMR elements MTJ1, MTJ2, MTJ3, MTJ4 are symmetrically arranged with respect to the contact portion of the upper electrode 45 in this manner, the noise during the read operation by the wiring resistance can be minimized.

Additionally, the intermediate layer 45A may be formed integrally with the upper electrode 45. That is, the intermediate layer 45A and upper electrode 45 may be formed of the same material at the same time.

The other ends (lower ends in this example) of the TMR elements MTJ1, MTJ2, MTJ3, MTJ4 are electrically connected to the read bit lines RBL1, RBL2, RBL3, RBL4 (write word lines WWL1, WWL2, WWL3, WWL4). The read bit lines RBL1, RBL2, RBL3, RBL4 extend in the X-direction (row direction).

The respective TMR elements MTJ1, MTJ2, MTJ3, MTJ4 are independently connected to the read bit lines RBL1, RBL2, RBL3, RBL4. That is, four read bit lines RBL1, RBL2, RBL3, RBL4 are disposed for four TMR elements MTJ1, MTJ2, MTJ3, MTJ4.

The write bit line WBL1 is disposed right above the TMR elements MTJ1, MTJ2, MTJ3, MTJ4 and in the vicinity of the elements. The write bit line WBL1 extends in the Y-direction (column direction).

(2) Respective Steps of Manufacturing Method

The manufacturing method for realizing the cell array structure of FIG. 72 will be described hereinafter. Here, the concreted manufacturing method (e.g., the use of a dual damascene process) is described here, and it should therefore be noted that the elements not disposed in the cell array structure of FIG. 72 are also described. Additionally, the outline of the finally completed cell array structure is substantially the same as that of the cell array structure of FIG. 72.

[1] Active Region Isoration Step

First, as shown in FIG. 73, active areas are isolated by the shallow trench isolation (STI) method in a semiconductor substrate 51.

Field oxide films 52 are filled in shallow trenches, for example, by the following process.

A mask pattern (such as silicon nitride) is formed on the semiconductor substrate 51 by a photo engraving process (PEP). The mask pattern is used as a mask, the semiconductor substrate 51 is etched using reactive ion etching (RIE), and trenches are formed in the semiconductor substrate 51. For example, a chemical vapor deposition (CVD) process and chemical mechanical polishing (CMP) process are used, and the trenches are filled with the insulating material (such as silicon oxide).

Thereafter, if necessary, P-type impurities (such as B, $BF_2$), or N-type impurities (such as P, As) are implanted in the semiconductor substrate, for example, by ion implantation processes, and P-type well regions or N-type well regions are formed.

[2] Forming Step of MOSFET

Subsequently, as shown in FIG. 74, the MOS transistors including the read select switches are formed in the surface region of the semiconductor substrate 51.

The MOS transistor can be formed, for example, by the following process.

The impurities for controlling the threshold value of the MOS transistor are ion-implanted in necessitate channel portions in active areas surrounding by field oxides 52. A gate insulation film (such as silicon oxide) 53 is formed on the active areas by a thermal oxidation process. By the CVD process, on the gate insulation film 53, a gate electrode material (such as polysilicon including the impurities) and cap insulation film (such as silicon nitride) 55 is formed.

After the cap insulation film 55 is patterned by PEP, the cap insulation film 55 is used as the mask to etching process (RIE) the gate electrode material and gate insulation film 53. As a result, gate electrodes 54 extending in the X-direction are formed on the semiconductor substrate 51.

The cap insulation film 55 and electrode 54 are used as the masks, and the P-type or N-type impurities are implanted in the semiconductor substrate 51 using the ion implantation process. Subsequently, low concentration impurity doped regions (LDD region or extension region) are formed in the semiconductor substrate.

After the insulation film (such as silicon nitride) is formed on the whole semiconductor substrate 51 by the CVD process, the insulation film is etched by RIE, and sidewall spacers 57 are formed on side walls of the gate electrode 54 and cap insulation film 55. The cap insulation film 55, gate electrode 54 and sidewall spacers 57 are used as the masks, and the P-type or N-type impurities are implanted in the semiconductor substrate 51 using the ion implantation process. As a result, source regions 56A and drain regions 56B are formed in the semiconductor substrate 51.

Thereafter, an interlayer insulation film (such as silicon oxide) 58 with which the MOS transistors are completely covered is formed on the whole semiconductor substrate 51 by the CVD process. Moreover, a CMP technique is used to flat the surface of the interlayer insulation film 58.

[3] Forming Step of Contact Hole

Figure 75:
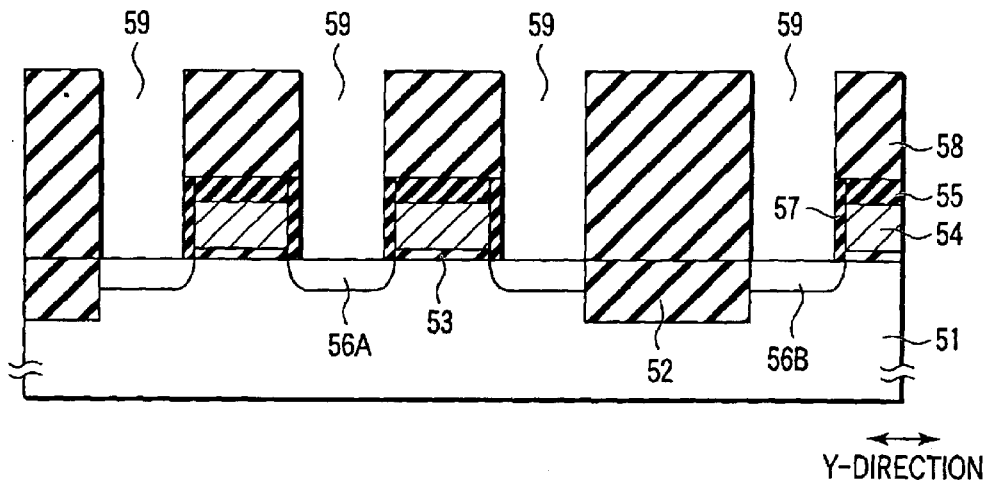
FIG. 75 is a plan view showing one step of the manufacturing method of the present invention.

Subsequently, as shown in FIG. 75, contact holes 59 reaching the source regions 56A and drain region 56B of the MOS transistor are formed in the interlayer insulation film 58 on the semiconductor substrate 51.

The contact holes 59 can easily be formed, for example, by forming the photoresist pattern on the interlayer insulation film 58 by PEP, and using the photoresist pattern as the mask to etch the interlayer insulation film 58 by RIE. After the etching, the photoresist pattern is removed.

[4] Forming Step of Wiring Trench and First Wiring Layer

Figure 76:
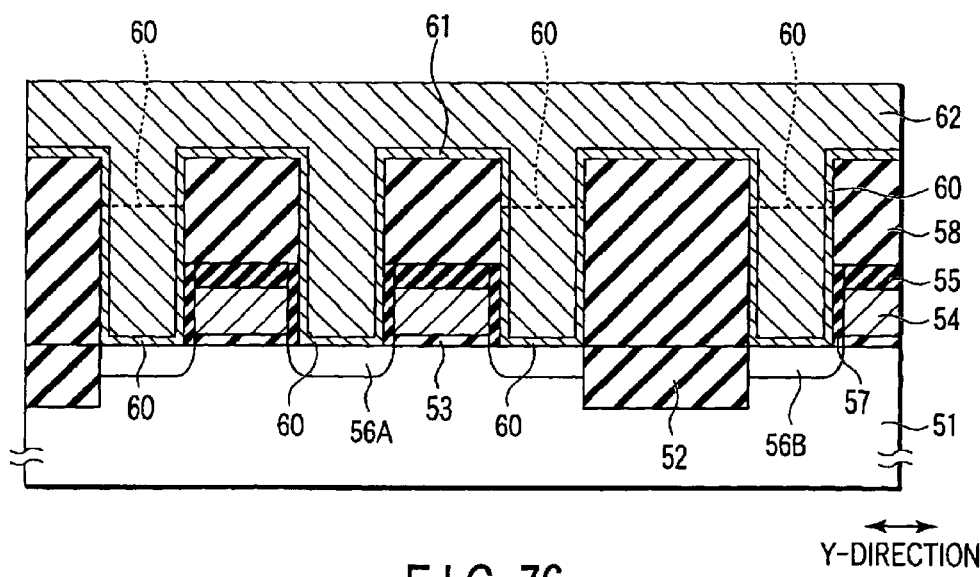
FIG. 76 is a sectional view showing one step of the manufacturing method of the present invention.

Subsequently, as shown in FIG. 76, wiring trenches 60 are formed in the interlayer insulation film 58 on the semiconductor substrate 51. In the example, the wiring trenches 60 are trenches for forming the source line, and extend, for example, in the X-direction (the direction vertical to a sheet surface). In FIG. 76, the wiring trenches 60 are shown by broken lines.

The wiring trenches 60 can easily be formed, for example, by forming the photoresist pattern on the interlayer insulation film 58 by PEP and using the photoresist pattern as the mask to etch the interlayer insulation film 58 by RIE. After the etching, the photoresist pattern is removed.

Subsequently, as shown in FIG. 76, respective barrier metal layers (such as a lamination of Ti and TiN) 61 are formed on the interlayer insulation film 58 and the inner surfaces of the contact holes 59 and wiring trenches 60, for example, using a sputter process. Continuously, a metal layer (such as W) 62 with which the contact holes 59 and wiring trenches 60 are completely filled is formed on the barrier metal layers 61, for example, by the sputter process.

Thereafter, the metal layer 62 is polished, and left only in the contact holes 59 and wiring trenches 60, for example, using a CMP process. The metal layers 62 left in the contact holes 59 form the contact plugs, and the metal layers 62 left in the wiring trenches 60 form the first wiring layer (source line).

Figure 77:
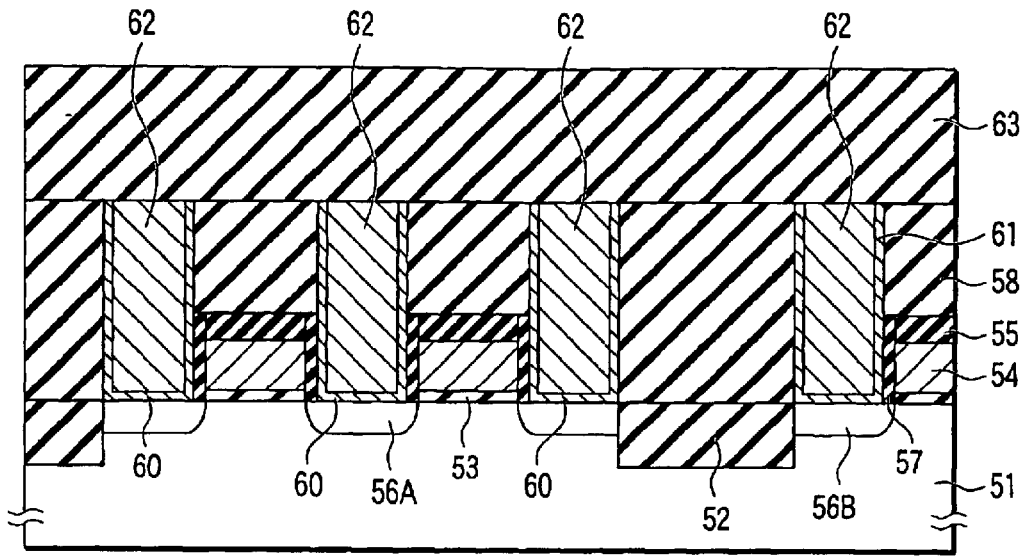
FIG. 77 is a sectional view showing one step of the manufacturing method of the present invention.

Subsequently, as shown in FIG. 77, an interlayer insulation film (such as silicon oxide) 63 is formed on the interlayer insulation film 58.

Additionally, the steps including the forming steps of the contact holes, wiring trenches and first wiring layer are called the dual damascene process.

[5] Forming Step of Wiring Trenches

Figure 78:
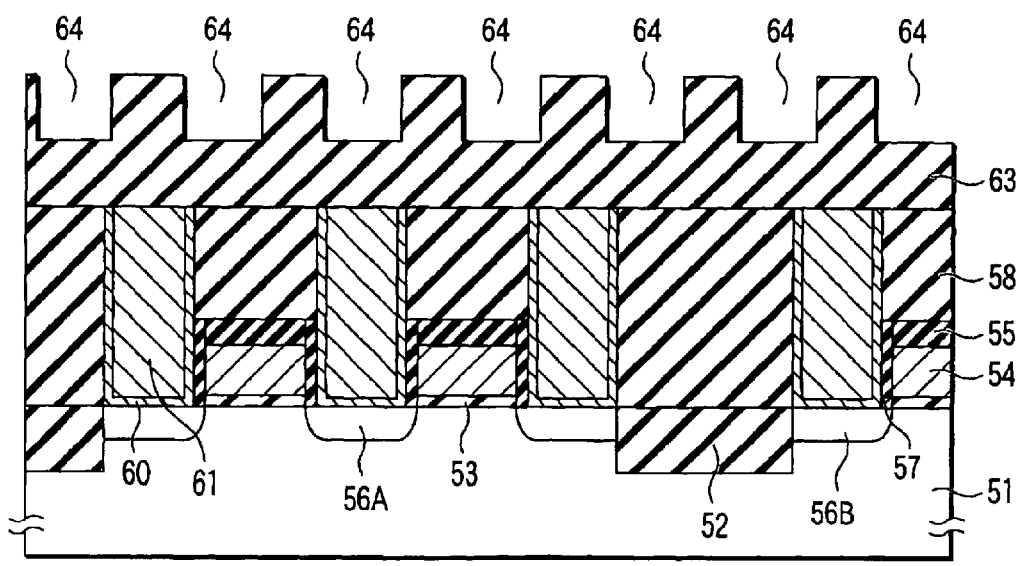
FIG. 78 is a sectional view showing one step of the manufacturing method of the present invention.

Subsequently, as shown in FIG. 78, wiring trenches 64 are formed in the interlayer insulation film 63. In this example, the wiring trenches 64 are trenches for forming the write word lines (read bit lines), and extend in the X-direction. If the metal layer material is Cu, the sidewall barriers (such as silicon nitride) are needed for preventing from Cu diffusion and corrosion may be formed on the side of the wiring trenches 64.

The wiring trenches 64 can easily be formed, for example, by forming the resist pattern on the interlayer insulation film 63 by PEP and using the photoresist pattern as the mask to etch the interlayer insulation film 63 by RIE. After the etching, the photoresist pattern is removed.

The sidewall barriers can easily be formed by forming the insulation film (such as silicon nitride) on the whole interlayer insulation film 63 by the CVD process and etching the insulation film by RIE.

[6] Forming Step of Second Wiring Layer

Figure 79:
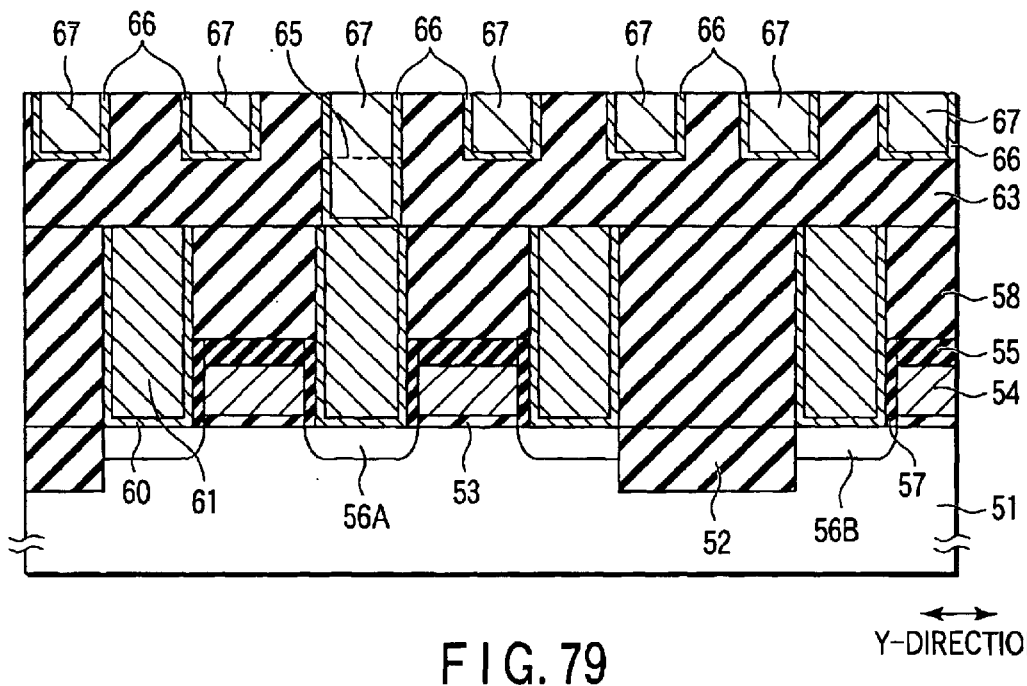
FIG. 79 is a sectional view showing one step of the manufacturing method of the present invention.

Subsequently, as shown in FIG. 79, contact holes 65 reaching the contact plugs 62 are formed on the drains of the MOSFET are formed in the wiring trenches 64.

The contact holes 65 can easily be formed, for example, by forming the photoresist pattern on the interlayer insulation film 63 by PEP and using the photoresist pattern as the mask to etch the interlayer insulation film 63 by RIE. After the etching, the photoresist pattern is removed.

Thereafter, respective barrier metal layers (such as a lamination of Ta and TaN) 66 are formed on the interlayer insulation film 63 and the inner surfaces of the wiring trenches 64 and contact holes 65, for example, using the sputter process. Continuously, a metal layer (such as Al, electroplating for Cu) 67 with which the wiring trenches 64 and contact holes 65 are completely filled is formed on the barrier metal layer 66, for example, by the sputter process.

Thereafter, the metal layer 67 is polished, and left only in the wiring trenches 64 and contact holes 59, for example, using the CMP process. The metal layers 67 left in the wiring trenches 64 form the second wiring layer functioning as the write word lines (read bit lines), and the metal layers 67 left in the contact holes 65 form the contact plugs.

[7] Forming Step of MTJ Element and Lower Electrode

Figure 80:
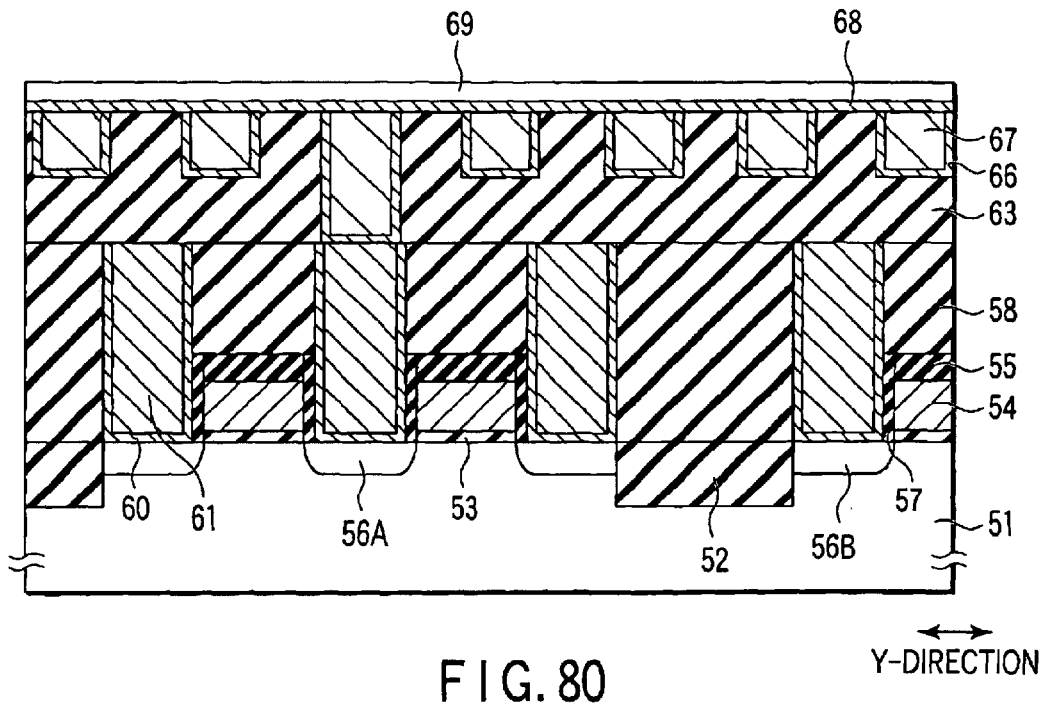
FIG. 80 is a sectional view showing one step of the manufacturing method of the present invention.

Subsequently, as shown in FIG. 80, a lower electrode (such as Ta) 68 is formed on the interlayer insulation film 63 by the sputter process. Subsequently, a plurality of layers 69 for the MTJ elements are formed on the lower electrode 68. The plurality of layers 69 include, for example, the tunneling barrier layer, two ferromagnetic layers for holding the barrier layer therebetween, and antiferromagnetic layer.

Figure 81:
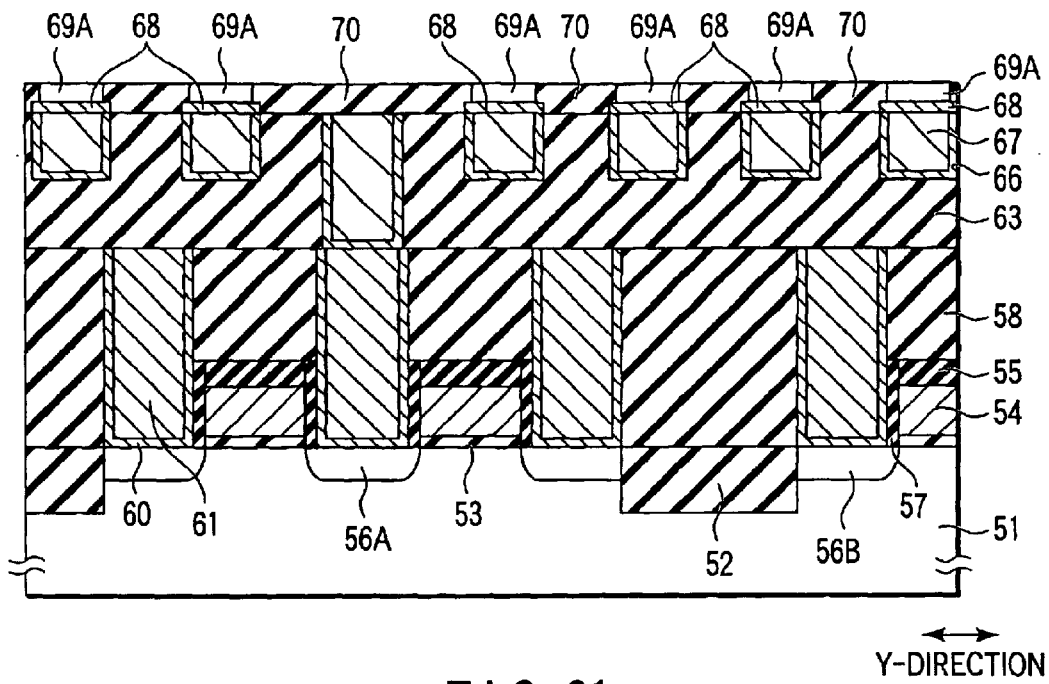
FIG. 81 is a sectional view showing one step of the manufacturing method of the present invention.

Thereafter, as shown in FIG. 81, the plurality of layers 69 for the MTJ elements are patterned, and a plurality of MTJ elements 69A are formed on the lower electrode 68. The plurality of MTJ elements 69A finally have the structure shown, for example, in FIG. 47, 48 or 49.

Additionally, the plurality of layers 69 for the MTJ elements are easily patterned by forming the photoresist patterns on the plurality of layers 69 by PEP, and using the photoresist patterns as the masks to etch the plurality of layers 69 by RIE. Subsequently, the lower electrode 68 of the MTJ element is patterned. Thereafter, the photoresist patterns are removed.

Thereafter, an interlayer insulation film 70 with which the MTJ elements 69A are completely coated is formed using the CVD process. Moreover, the interlayer insulation film 70 is polished and flatted by the CMP process, and the interlayer insulation film 70 is left only between the MTJ elements 69A.

If the metal layer material is Cu, the cap barrier (such as silicon nitride) is deposited for preventing from Cu diffusion and corrosion.

[8] Forming Step of Upper Electrode of MTJ Element

Figure 82:
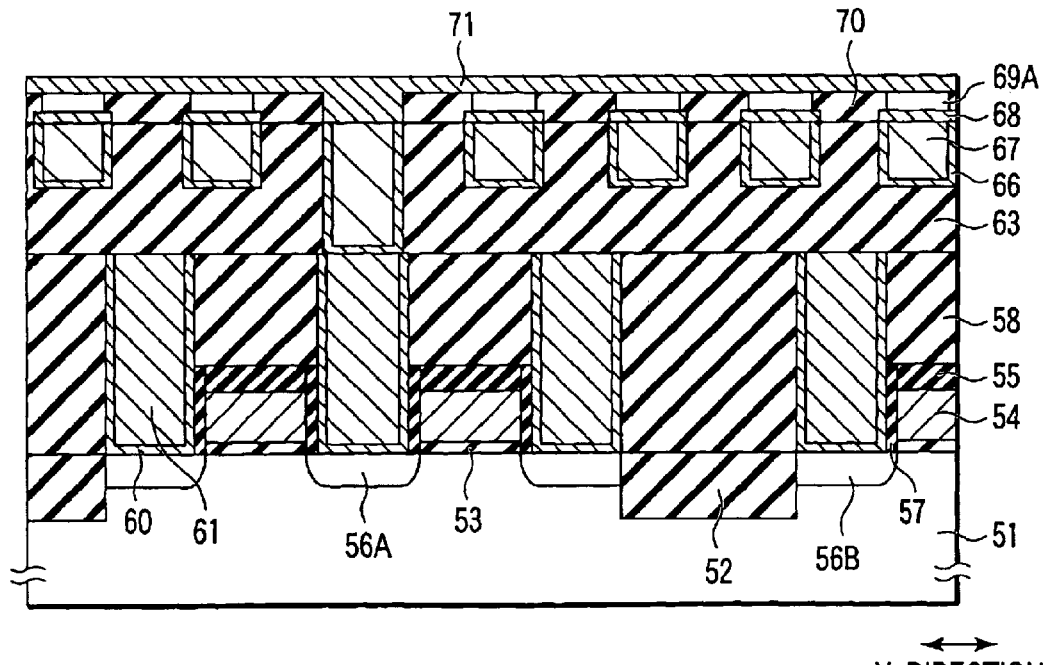
FIG. 82 is a plan view showing one step of the manufacturing method of the present invention.

Subsequently, as shown in FIG. 82, the contact holes reaching the contact plugs 67 are formed in the interlayer insulation film 70.

The contact holes can easily be formed, for example, by forming the photoresist pattern on the interlayer insulation film 70 by PEP and using the photoresist pattern as the mask to etch the interlayer insulation film 70 by RIE. After the etching, the resist pattern is removed.

Thereafter, a metal layer (such as Ta) 71 as the upper electrode of the MTJ element 69A is formed on the MTJ element 69A and interlayer insulation film 70 using the sputter process so that the contact holes are completely filled up. Moreover, the metal layer 71 is polished, and the surface of the metal layer 71 is flatted by the CMP process.

Furthermore, the upper electrode 71 of the MTJ element 69A is patterned.

The upper electrode 71 of the MTJ element 69A can easily be patterned by forming the photoresist pattern on the upper electrode 71 by PEP, and using the photoresist pattern as the mask to etch the upper electrode 71 by RIE. After the etching, the photoresist pattern is removed.

[9] Forming Step of Third Wiring Layer

Subsequently, as shown in FIG. 83, an interlayer insulation film 72 with which the upper electrode 71 of the MTJ element 69A is completely coated is formed on the interlayer insulation film 70 using the CVD process. Moreover, the interlayer insulation film 72 is polished, and the surface of the interlayer insulation film 72 is flatted by the CMP process.

Furthermore, the wiring trenches are formed in the interlayer insulation film 72. Each wiring trench is a trench for forming the write bit line, and extends in the Y-direction. If the metal layer material is Cu, the sidewall barriers (such as silicon nitride) are needed for preventing from Cu diffusion and corrosion may be formed on the side surfaces of the wiring trenches.

The wiring trenches can easily be formed, for example, by forming the resist pattern on the interlayer insulation film 72 by PEP and using the resist pattern as the mask to etch the interlayer insulation film 72 by RIE. After the etching, the resist pattern is removed.

The side wall tunneling barrier can easily be formed by forming the insulation film (such as silicon nitride) on the whole interlayer insulation film 72 by the CVD process and etching the insulation film by RIE.

Thereafter, respective barrier metal layers (such as the lamination of Ta and TaN) 73 are formed on the interlayer insulation film 72 and the inner surfaces of the wiring trenches, for example, using the sputter process. Continuously, a metal layer (such as Cu) 74 with which the wiring trenches are completely filled is formed on the barrier metal layer 73, for example, by the sputter process.

Moreover, the metal layer 74 is polished, and left only in the wiring trenches, for example, using the CMP process. The metal layers 74 left in the wiring trenches form the third wiring layer functioning as the write bit lines.

If the metal layer material is Cu, the cap barrier (such as silicon nitride) is deposited for preventing from Cu diffusion and corrosion.

(3) Conclusions

According to the manufacturing method, the cell array structure (1 switch-nMTJs structure) can be realized in which one end of each of the plurality of TMR elements in the read block is connected in common, and the other ends of the plurality of TMR elements are independently connected to the read bit lines.

Additionally, in this example, to form the wiring layer, the damascene process and dual damascene process are used. Instead, for example, a process of processing the wiring layer by etching may be used.

6. Others

In the above description, it is assumed that the TMR element is used as the memory cell of the magnetic random access memory. However, even when the memory cell is a giant magneto resistance (GMR) element, the present invention, that is, concrete examples of various cell array structures, read operation mechanism, and read circuit can also be applied.

Moreover, for the structure of the TMR element or the GMR element, the materials constituting the element, and the like, the application of the present invention is not particularly limited. The example in which the number of TMR elements is four has been described, but the number of TMR elements in the read block is not limited to four, and can freely be set.

The MOS transistor, bipolar transistor and diode have been described as the read select switch of the magnetic random access memory. However, other switch elements such as a metal insulator semiconductor (MIS) transistor (including MOSFET), metal semiconductor (MES) transistor, and junction transistor can also be used as the read select switch.

As described above, according to the present invention, there can be provided the magnetic random access memory which has an inventive cell array structure suitable for the increase of the memory capacity, and the manufacturing method of the memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   memory cells which use a magneto resistive effect to store data, and which are arranged in parallel with a surface of a semiconductor substrate;
   a read select switch connected in common to one end of each of said memory cells; and
   bit lines which are disposed for said memory cells, and which extend in a first direction,
   wherein the other ends of said memory cells are independently connected to one of said bit lines.

2. A magnetic random access memory according to claim 1, wherein said memory cells are arranged in a second direction intersecting said first direction.

3. A magnetic random access memory according to claim 2, further comprising: a write line which is disposed in common in said memory cells, and which extends in said second direction.

4. A magnetic random access memory according to claim 3, wherein said write line is apart from said memory cells.

5. A magnetic random access memory according to claim 3, wherein said write line is disposed on a one-end side of said memory cells, and said bit lines are disposed on an other-end side of said memory cells.

6. A magnetic random access memory according to claim 5, wherein said read select switch is disposed on the one-end side of said memory cells.

7. A magnetic random access memory according to claim 5, wherein said read select switch is disposed on the other-end side of said memory cells.

8. A magnetic random access memory according to claim 1, wherein said bit lines function as read lines and write lines.

9. A magnetic random access memory according to claim 1, wherein said read select switch is disposed right under said memory cells.

10. A magnetic random access memory according to claim 9, further comprising:
    an electrode connected in common to one end of each of said memory cells; and
    a contact plug which connects said electrode to said read select switch.

11. A magnetic random access memory according to claim 1, further comprising:
    a source line which extends in a second direction intersecting said first direction connected to said read select switch.

12. A magnetic random access memory according to claim 11, further comprising:
    a power source terminal; and
    a column select switch connected between said source line and said power source terminal.

13. A magnetic random access memory according to claim 12, wherein a ground potential or a bias potential is supplied to said power source terminal.

14. A magnetic random access memory according to claim 11, further comprising: a read word line which is connected to a control terminal of said read select switch, and which extends in said first direction.

15. A magnetic random access memory according to claim 14, wherein said read select switch is controlled by a row address signal.

16. A magnetic random access memory according to claim 1, further comprising a source line which extends in said first direction connected to said read select switch.

17. A magnetic random access memory according to claim 16, further comprising:
    a power source terminal; and
    a column select switch connected between said source line and said power source terminal.

18. A magnetic random access memory according to claim 17, wherein a ground potential or a bias potential is supplied to said power source terminal.

19. A magnetic random access memory according to claim 16, further comprising: a read word line which is connected to a control terminal of said read select switch, and which extends in a second direction intersecting said first direction.

20. A magnetic random access memory according to claim 19, wherein said read select switch is controlled by a row address signal.

21. A magnetic random access memory according to claim 1, further comprising:
    a read circuit; and
    a row select switch connected between said bit lines and said read circuit.

22. A magnetic random access memory according to claim 21, wherein said read select switch operates only during a read operation, and said row select switch operates during the read operation and a write operation.

23. A magnetic random access memory according to claim 22, wherein both said read select switch and said row select switch are controlled by a row address signal.

24. A magnetic random access memory according to claim 21, further comprising:
    a common data line connected between said read circuit and said row select switch,
    wherein said common data line is connected to row blocks when each of said row blocks has said memory cells, said read select switch, said row select switch and said bit lines.

25. A magnetic random access memory according to claim 1, further comprising:
    a read circuit; and
    a column select switch connected between said bit lines and said read circuit.

26. A magnetic random access memory according to claim 25, wherein said read select switch operates only during a read operation, and said column select switch operates during the read operation and a write operation.

27. A magnetic random access memory according to claim 26, wherein said read select switch is controlled by a row address signal, and said column select switch is controlled by a column address signal.

28. A magnetic random access memory according to claim 25, further comprising:
   a common data line connected between said read circuit and said column select switch,
   wherein said common data line is connected to column blocks when each of said column blocks has said memory cells, said read select switch, said column select switch and said bit lines.

29. A magnetic random access memory according to claim 21 or 25, wherein said read circuit is constituted of sense amplifiers disposed for said bit lines, and output buffers disposed for said sense amplifiers.

30. A magnetic random access memory according to claim 21 or 25, wherein said read circuit is constituted of sense amplifiers disposed for said bit lines, an output buffer to output data from one of said sense amplifiers, and a selector connected between said sense amplifiers and said output buffer.

31. A magnetic random access memory according to claim 1, further comprising:
   a write driver which is connected to one end of each of said bit lines, and which supplies a write current to said bit lines; and
   a write sinker which is connected to the other ends of said bit lines, and which sinks said write current.

32. A magnetic random access memory according to claim 1, further comprising: a write driver/sinker which is connected to each of opposite ends of said bit lines, and which flows a write current having a direction in accordance with write data to said bit lines.

33. A magnetic random access memory according to claim 1, further comprising: block select switches which are connected between the other ends of said memory cells and said bit lines.

34. A magnetic random access memory according to claim 33, wherein said block select switch is controlled by a row address signal.

35. A magnetic random access memory according to claim 34, wherein said read select switch and said block select switch perform the same operation.

36. A magnetic random access memory according to claim 33, wherein said block select switch is controlled by a column address signal.

37. A magnetic random access memory according to claim 1, further comprising:
   a read circuit;
   a row select switch connected between said bit lines and said read circuit; and
   a write driver connected to said bit lines.

38. A magnetic random access memory according to claim 37, wherein said write driver supplies a write current to the bit line selected from said bit lines by a row address signal.

39. A magnetic random access memory according to claim 1, further comprising:
   a read circuit;
   a column select switch connected between said bit lines and said read circuit; and
   a write driver connected to said bit lines.

40. A magnetic random access memory according to claim 39, wherein said write driver supplies a write current to the bit line selected from said bit lines by a column address signal.

41. A magnetic random access memory according to claim 1, wherein said memory cells constitute a read block, and data of said memory cells are read out at the same time.

42. A magnetic random access memory according to claim 1, wherein each of said memory cells is constituted of a magnetic storing element including a pinning layer whose direction of magnetization is fixed, a storing layer whose direction of magnetization changes in accordance with write data and a tunneling barrier layer disposed between said pinning layer and said storing layer.

43. A magnetic random access memory according to claim 42, wherein an axis of easy magnetization of said magnetic storing element turns to said first direction.

44. A magnetic random access memory according to claim 42, wherein an axis of easy magnetization of said magnetic storing element turns to a second direction intersecting said first direction.

45. A magnetic random access memory according to claim 1, wherein said read select switch is any one of an MIS transistor, an MES transistor, a junction transistor, a bipolar transistor, and a diode.

46. A magnetic random access memory comprising:
   first and second memory cells which use a magneto resistive effect to store data, and which are arranged in parallel with a surface of a semiconductor substrate;
   a read select switch connected in common to one end of each of said first and second memory cells;
   a first bit line connected to the other end of said first memory cell; and
   a second bit line connected to the other end of said second memory cell.

47. A magnetic random access memory according to claim 1, wherein said first and second bit lines are connected to read blocks when each of said read blocks has said memory cells and said read select switch.

48. A magnetic random access memory according to claim 47, wherein sources of the read select switches in the read blocks disposed adjacent to each other in said read blocks are connected to one another.

49. A manufacturing method of a magnetic random access memory comprising:
   forming a read select switch in a surface region of a semiconductor substrate;
   forming bit lines which extend in a first direction on said read select switch, and which are arranged in parallel with a surface of said semiconductor substrate;
   forming MTJ elements connected to said bit lines right above said bit lines, and which are arranged in parallel with the surface of said semiconductor substrate;
   forming an electrode connected in common to said MTJ elements, and connected to said read select switch right above said MTJ elements; and
   forming a write line which extends in a second direction intersecting said first direction in the vicinity of said MTJ elements.

50. A manufacturing method according to claim 49, wherein said write line is formed right above said MTJ elements.

51. A manufacturing method according to claim 49, wherein said bit lines or said write line, at least metal lines under MTJs, are formed by a damascene process.

52. A manufacturing method according to claim 49, wherein said bit lines and said write line are formed by a step of forming a wiring trench in an interlayer dielectric, a step of forming a metal layer with which said wiring trench is completely filled, and a step of removing said metal layer other than the metal layer in said wiring trench.

53. A manufacturing method according to claim 52, further comprising: forming a barrier metal layer before forming said metal layer.

54. A manufacturing method according to claim 53, further comprising:

forming a side wall barrier layer on a side wall of said wiring trench before forming said barrier metal layer; and removing said metal layer other than the metal layer in said wiring trench, and forming a cap barrier layer constituted of the same material as a material of said side wall barrier layer on said metal layer.

55. A manufacturing method according to claim 54, wherein said side wall barrier layer and said cap barrier layer are constituted of silicon nitride.

* * * * *

UNITED STATES PATENT AND TRADEMARK OFFICE
CERTIFICATE OF CORRECTION

PATENT NO. : 6,724,653 B1
DATED : April 20, 2004
INVENTOR(S) : Iwata et al.

It is certified that error appears in the above-identified patent and that said Letters Patent is hereby corrected as shown below:

<u>Title page,</u>
Items [45] and [*] Notice, should read as follows:
-- [45] Date of Patent:     *Apr. 20, 2004

[*] Notice:   Subject to any disclaimer, the term of this patent is extended or adjusted under 35 U.S.C. 154(b) by 0 days.

This patent is subject to a terminal disclaimer. --

Signed and Sealed this

Seventh Day of December, 2004

JON W. DUDAS
*Director of the United States Patent and Trademark Office*